United States Patent
Iwata

(10) Patent No.: US 7,054,189 B2
(45) Date of Patent: *May 30, 2006

(54) MAGNETIC RANDOM ACCESS MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/147,270

(22) Filed: Jun. 8, 2005

(65) Prior Publication Data

US 2005/0232002 A1 Oct. 20, 2005

Related U.S. Application Data

(62) Division of application No. 10/160,184, filed on Jun. 4, 2002.

(30) Foreign Application Priority Data

Nov. 29, 2001 (JP) .............................. 2001-365236

(51) Int. Cl.
*G11C 11/00* (2006.01)
*G11C 11/14* (2006.01)

(52) U.S. Cl. ........................ 365/158; 365/171; 365/173
(58) Field of Classification Search ................ 365/158, 365/171, 173
See application file for complete search history.

(56) References Cited

U.S. PATENT DOCUMENTS 5,894,447 A 4/1999 Takashima
5,986,925 A 11/1999 Naji et al.
6,169,688 B1 1/2001 Noguchi
6,169,689 B1 1/2001 Naji
6,188,615 B1 2/2001 Perner et al.
2001/0035545 A1 11/2001 Schuster-Woldan et al.

FOREIGN PATENT DOCUMENTS

| JP | 11-39858 | 2/1999 |
|---|---|---|
| JP | 2001-217398 | 8/2001 |
| JP | 2001-357666 | 12/2001 |
| KR | 1998-024995 | 7/1998 |
| WO | WO 99/18578 | 4/1999 |

OTHER PUBLICATIONS

Roy Scheuerlein, et al., "A 10ns Read and Write Non-Volatile Memory Array Using a Magnetic Tunnel Junction and FET Switch in each Cell", ISSCC 2000 Technical Digest, ISSCC 2000/SESSION 7/TD :Emerging Memory & Device Technologies/Paper TA 7.2, Feb. 7, 2000, 6 pages.
M. Durlam, et al., "Nonvolatile RAM based on Magnetic Tunnel Junction Elements", ISSCC 2000 Technical Digest, ISSCC 2000/SESSION 7/TD: Emerging Memory & Device Technologies/Paper TA 7.3, 2000 IEEE International Solid-State Circuits Conference, Feb. 7, 2000, 6 pages.

*Primary Examiner*—Trong Phan
(74) *Attorney, Agent, or Firm*—Oblon, Spivak, McClelland, Maier & Neustadt, P.C.

(57) ABSTRACT

Blocks are connected to a read bit line. One block has MTJ elements which are connected to each other in series between the read bit line and a ground terminal. A MTJ elements are superposed on, e.g., a semiconductor substrate. A read bit line is arranged on the superposed MTJ elements. A write word line extending in a X-direction and a write bit line extending in a Y-direction are arranged in the vicinity of the MTJ elements in the block.

20 Claims, 136 Drawing Sheets

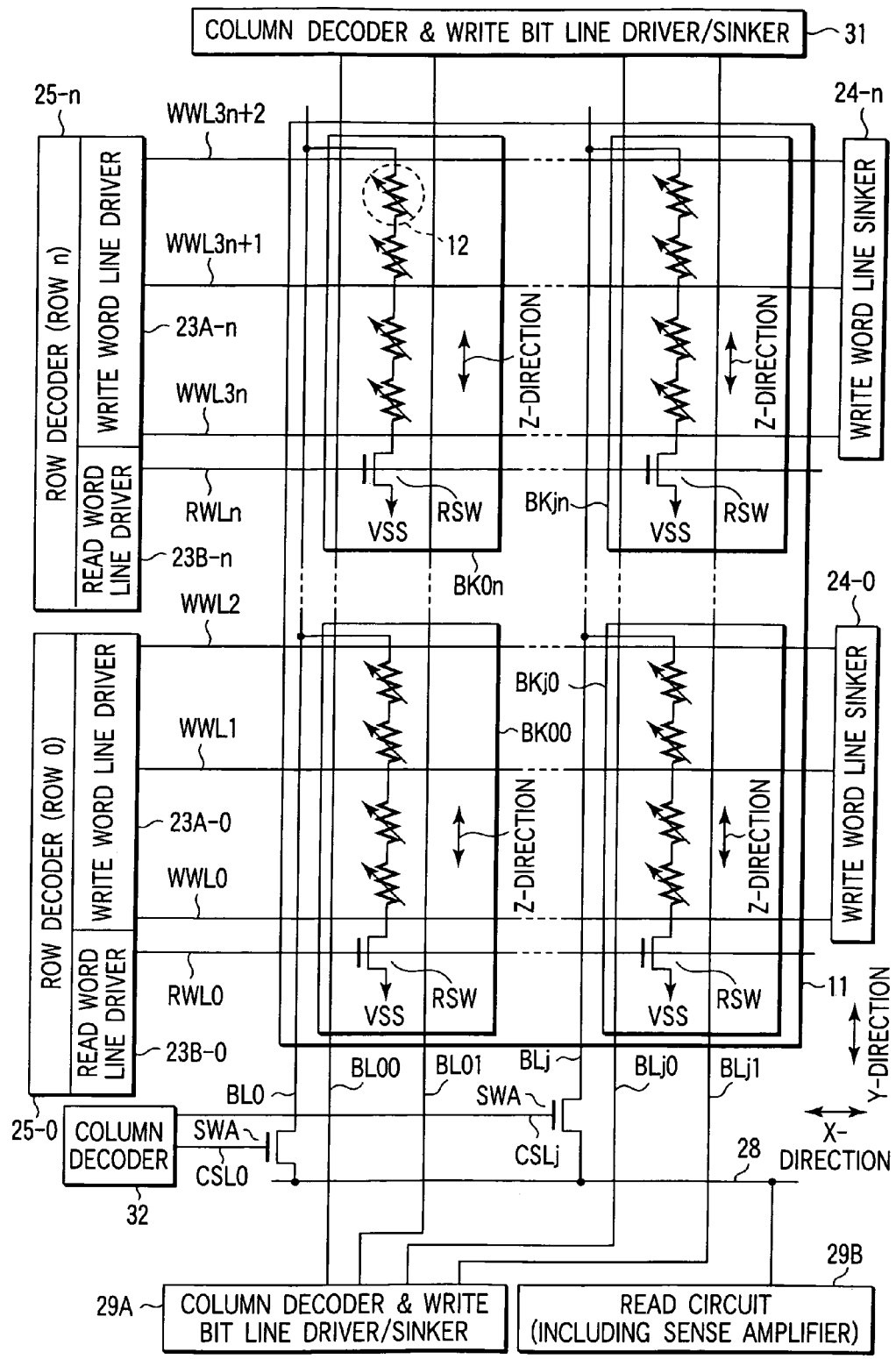
F I G. 1

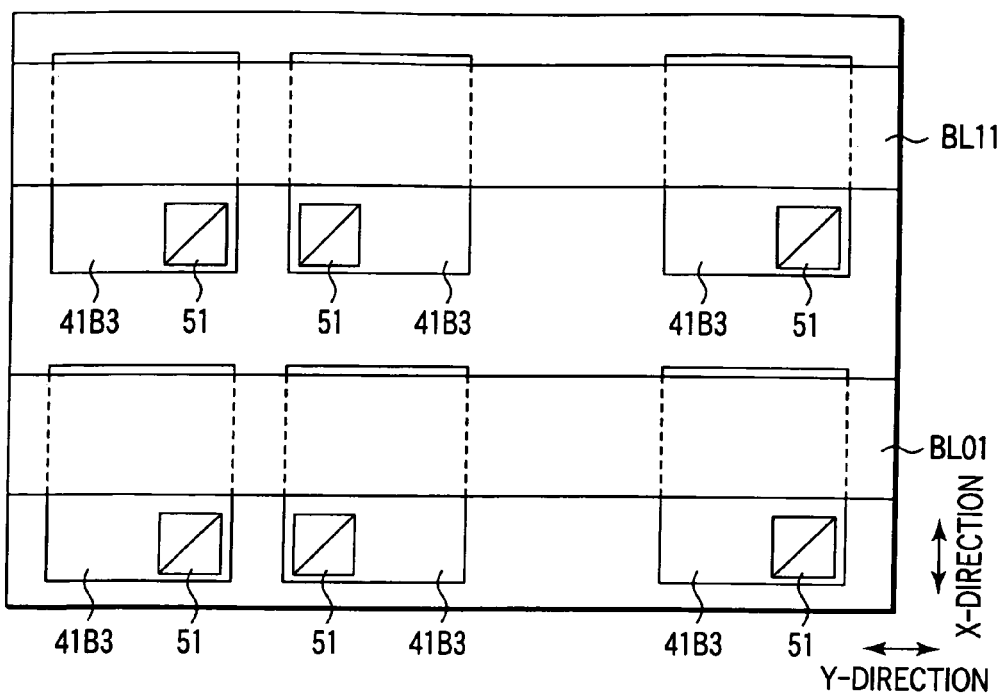
F I G. 30
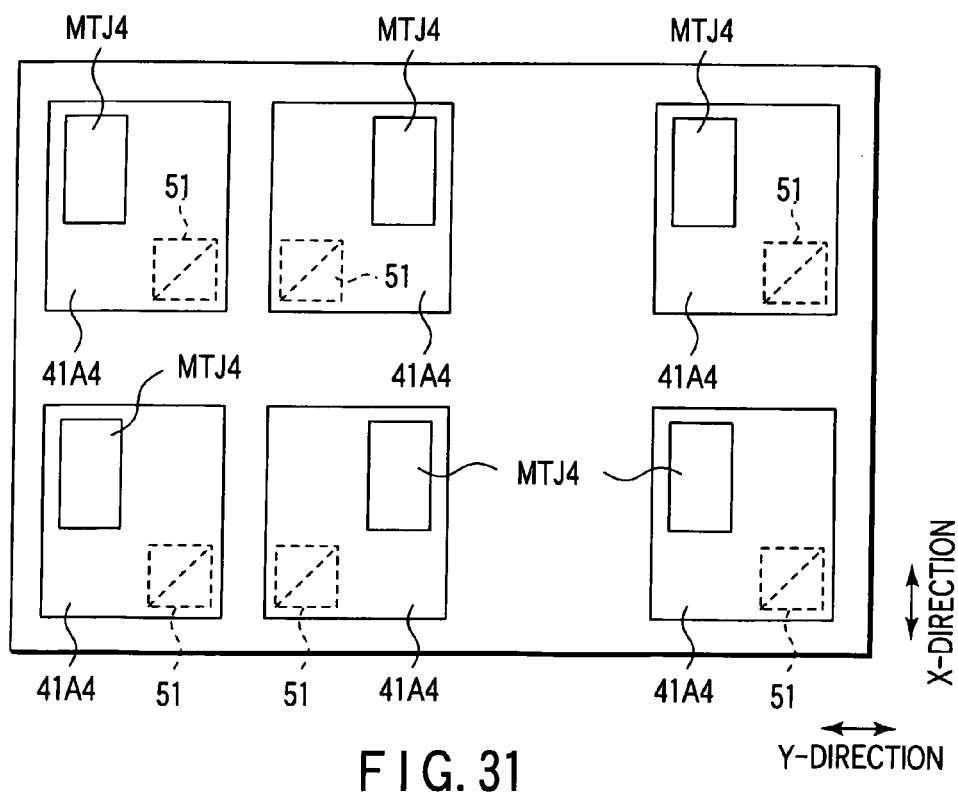
F I G. 31

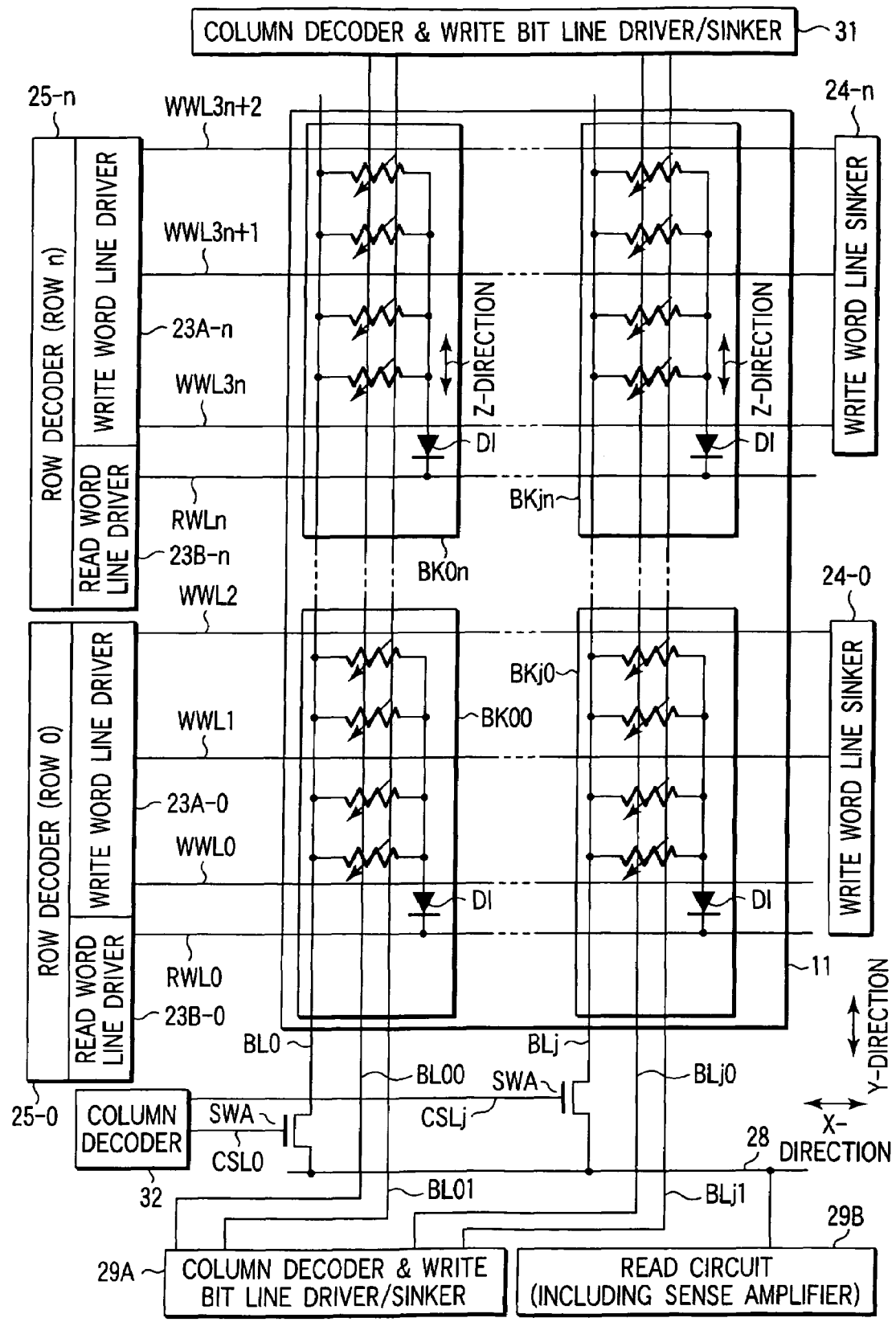
F I G. 36

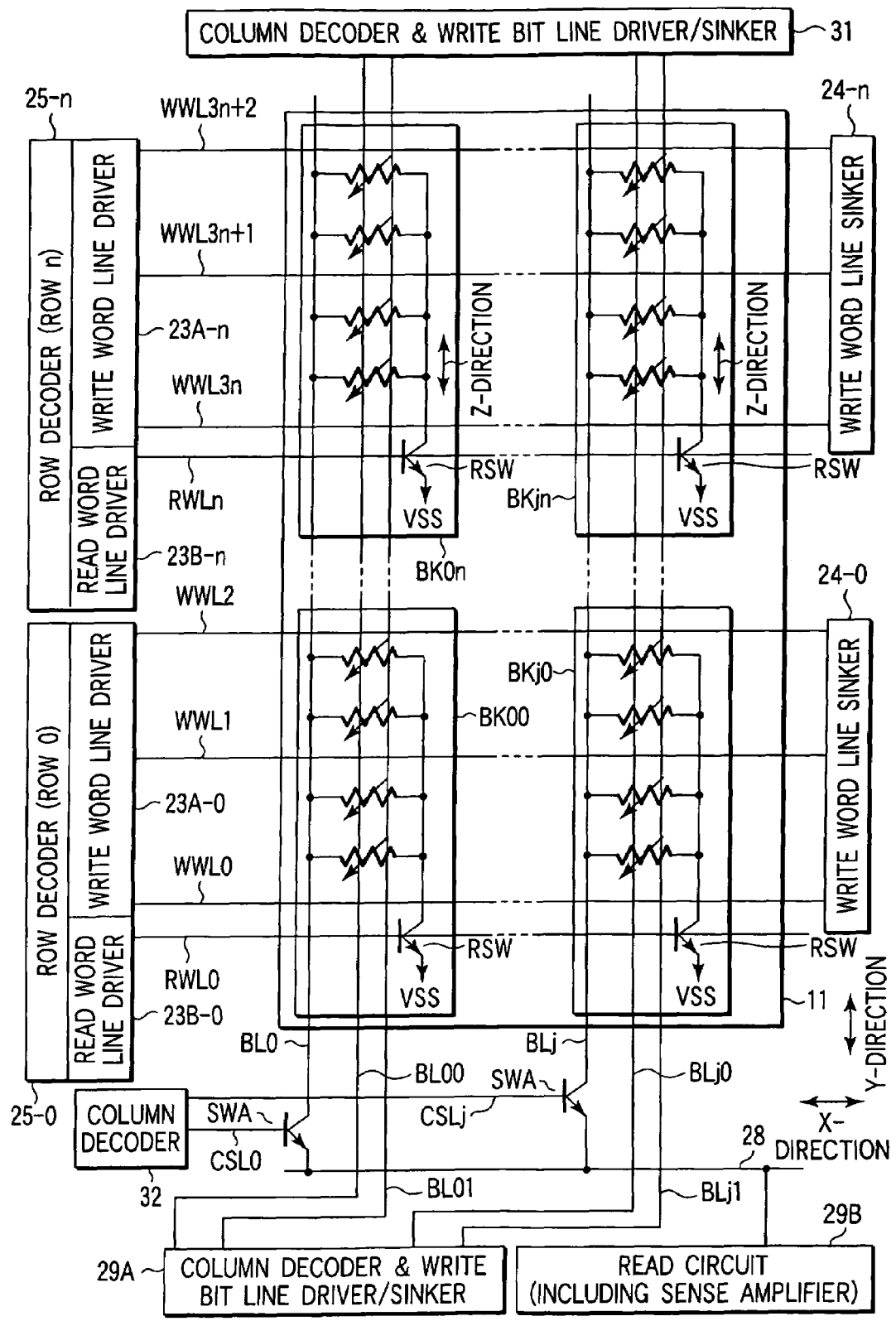
F I G. 38

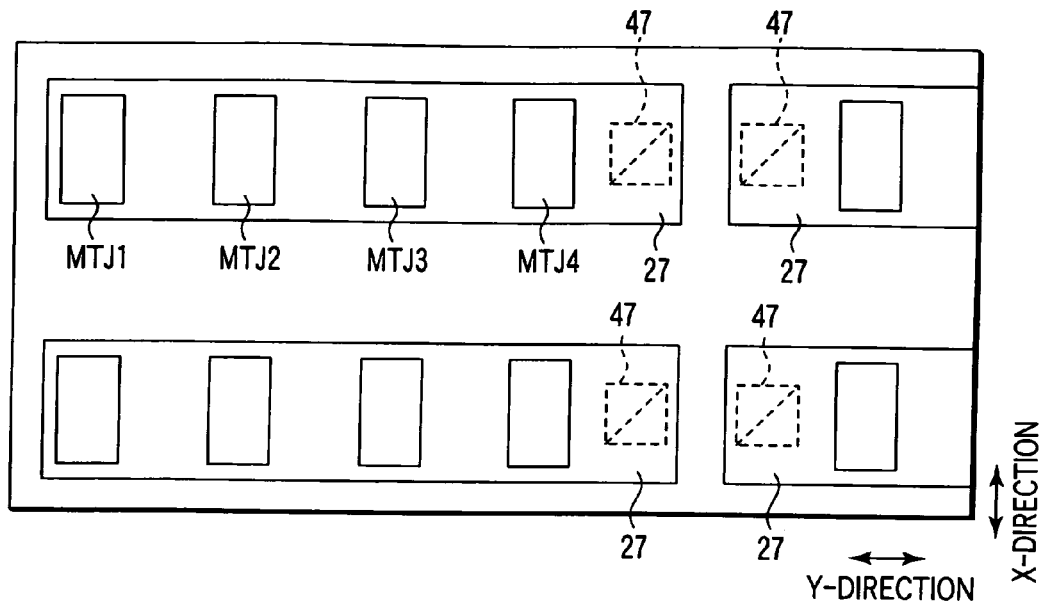
F I G. 49
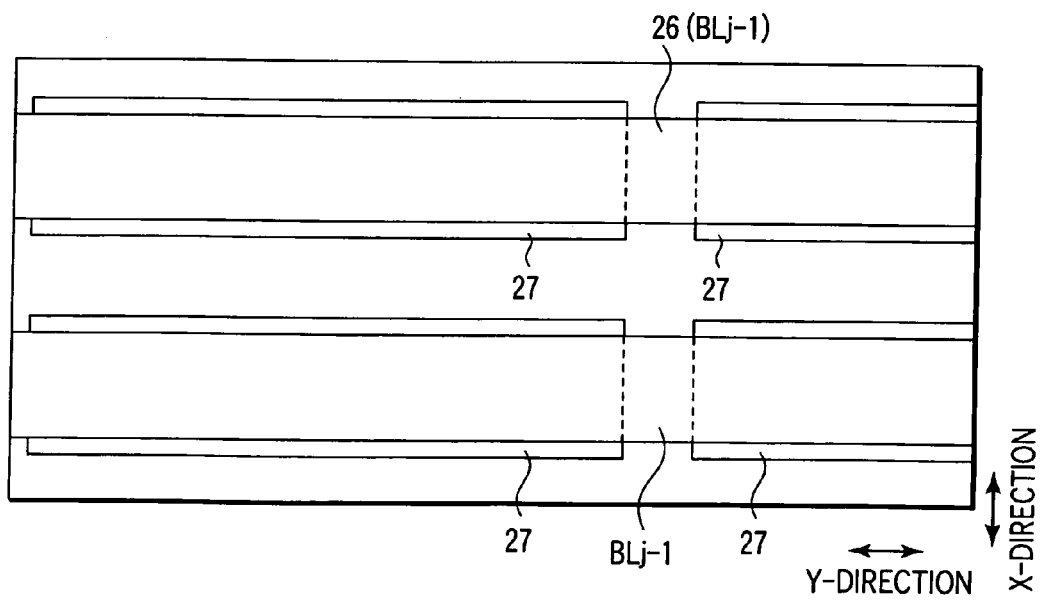
F I G. 50

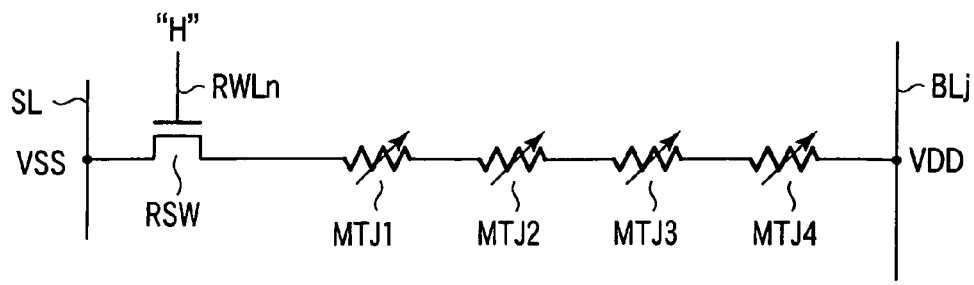
F I G. 51
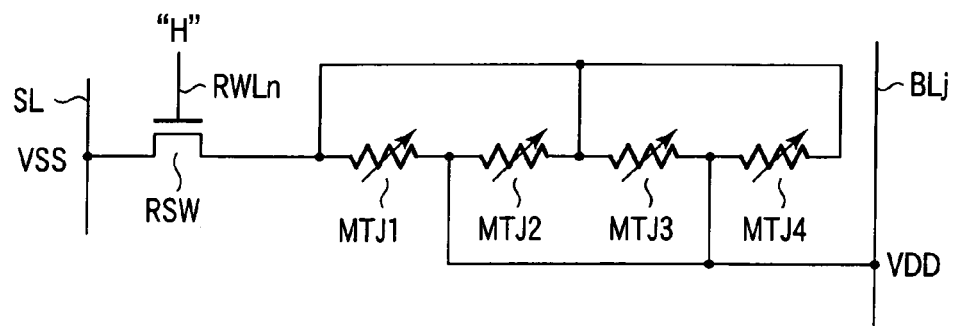
F I G. 52
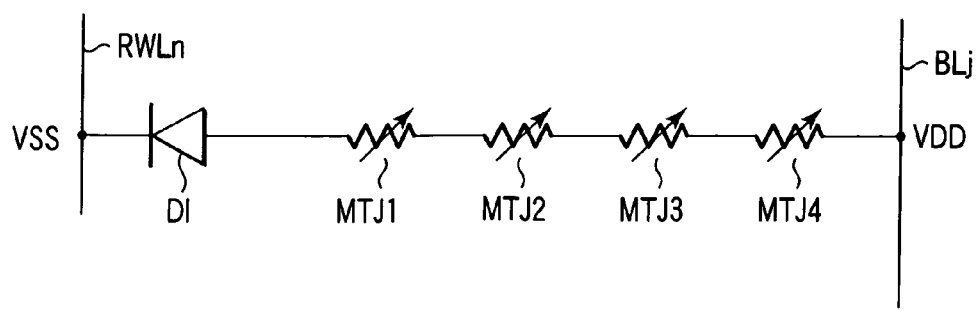
F I G. 53

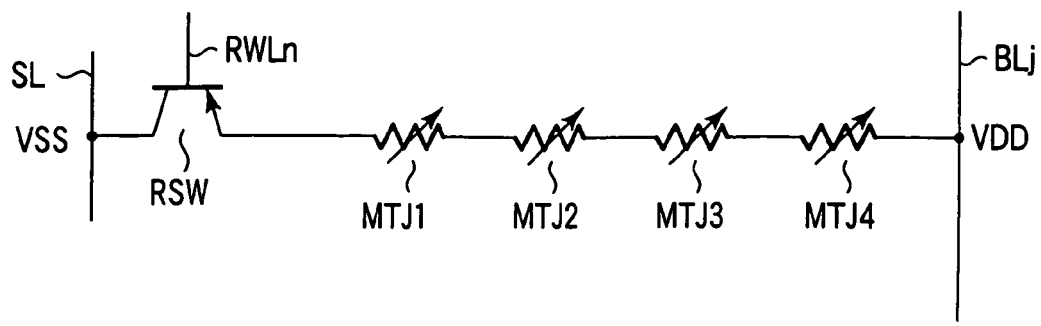
F I G. 54
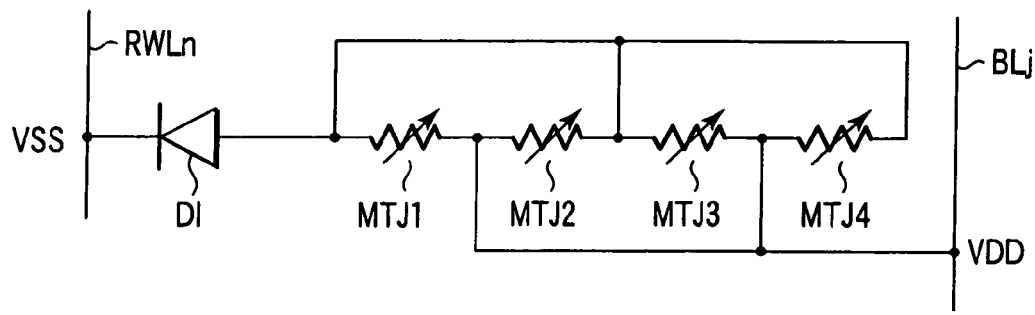
F I G. 55
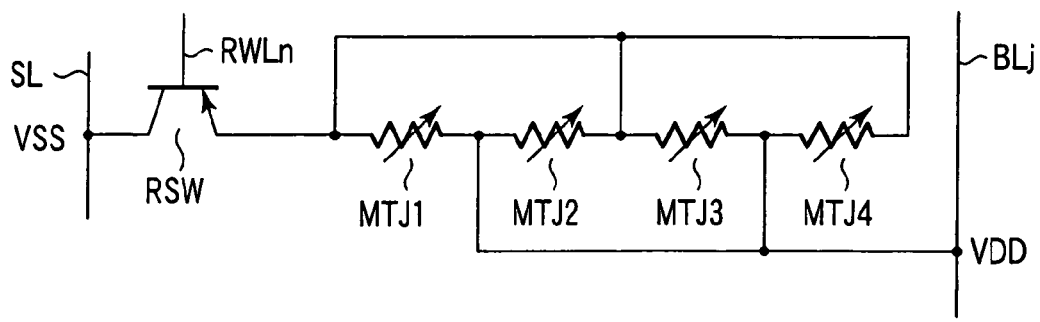
F I G. 56

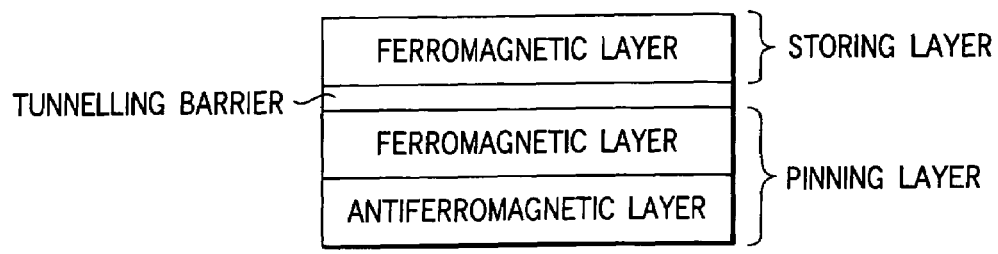
F I G. 57    EXAMPLE MTJ1
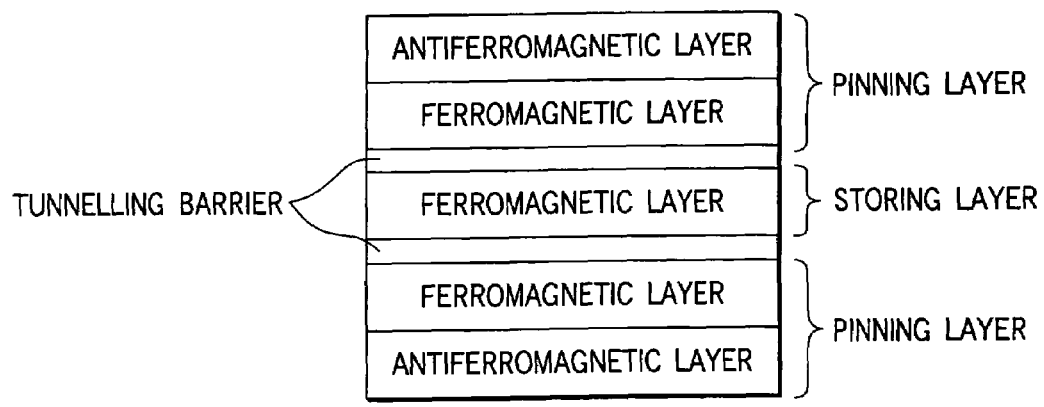
F I G. 58    EXAMPLE MTJ2

EXAMPLE MTJ4

EXAMPLE MTJ1

EXAMPLE MTJ2

EXAMPLE MTJ3

EXAMPLE MTJ4

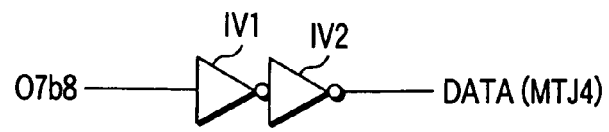
F I G. 66
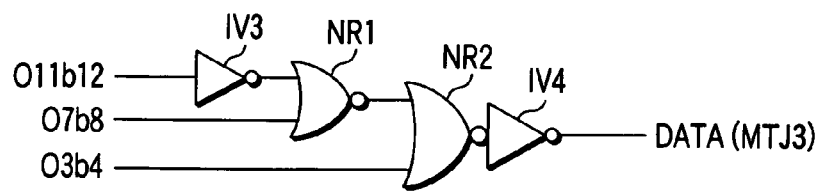
F I G. 67
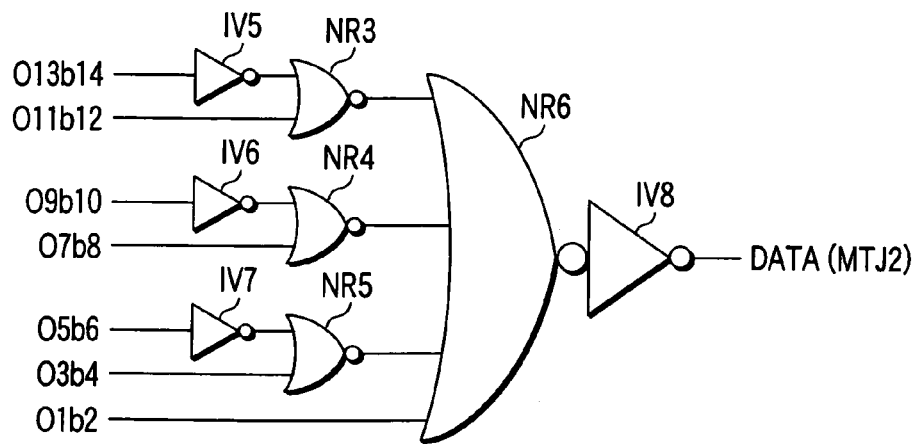
F I G. 68

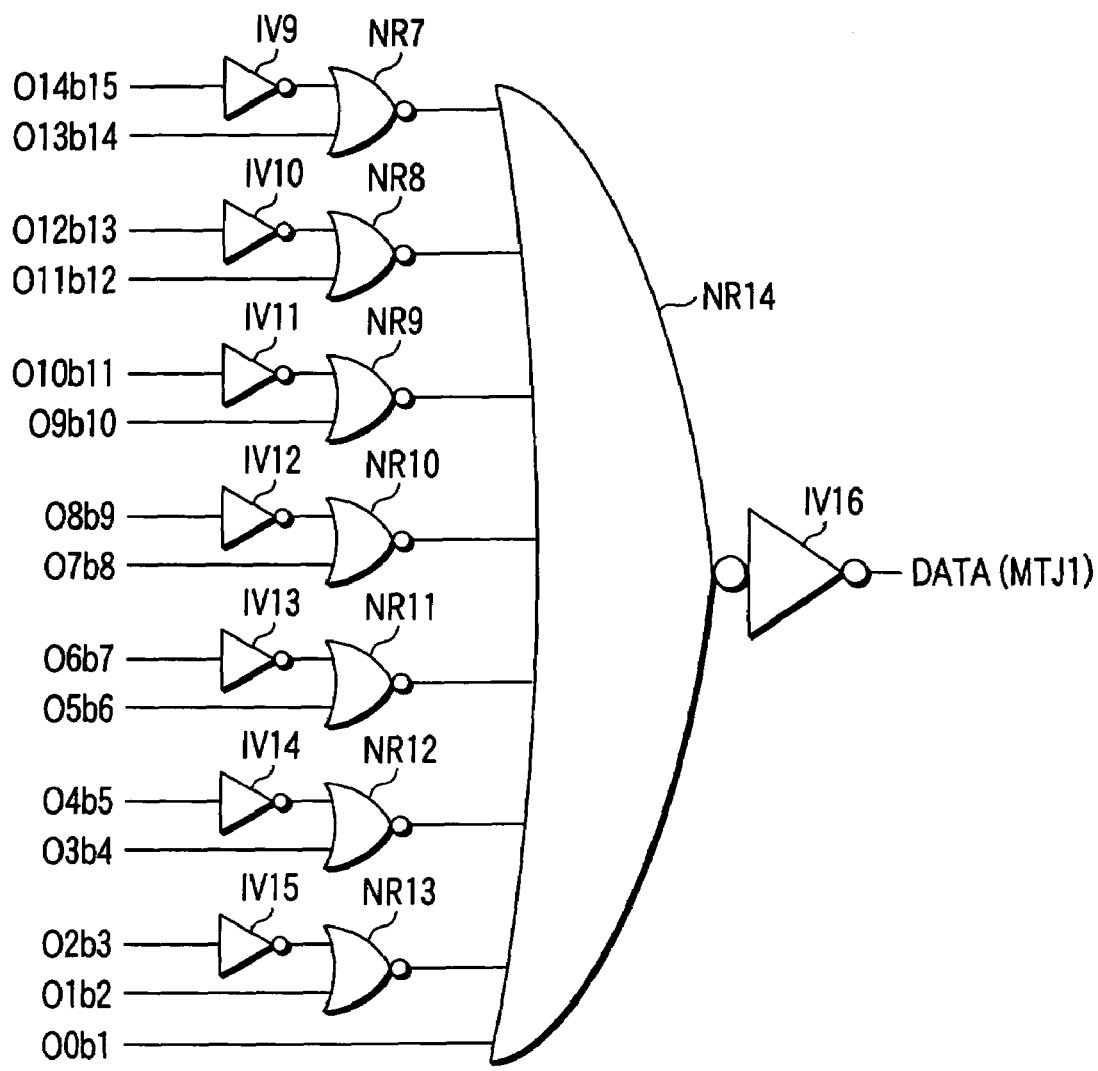
F I G. 69

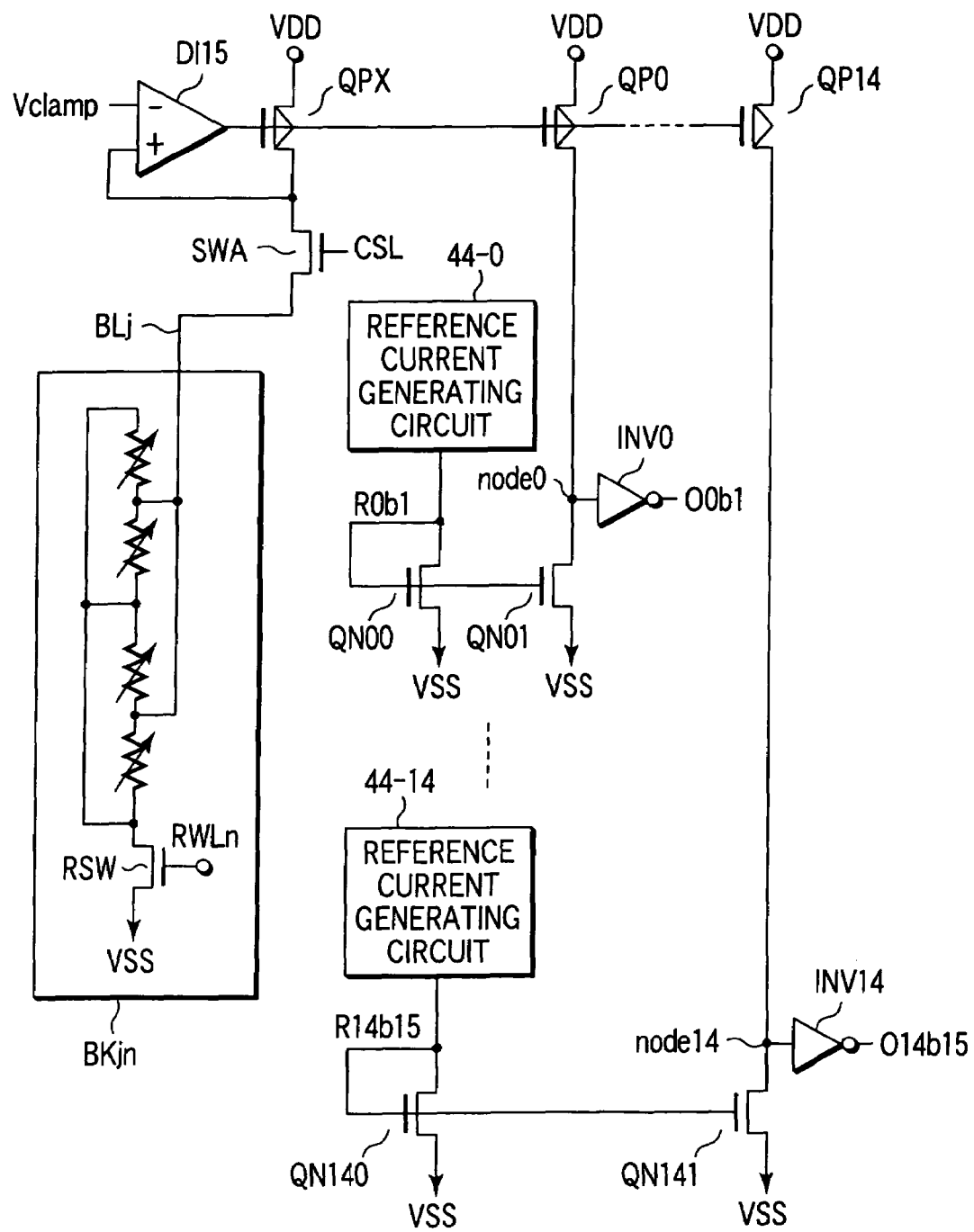
F I G. 70

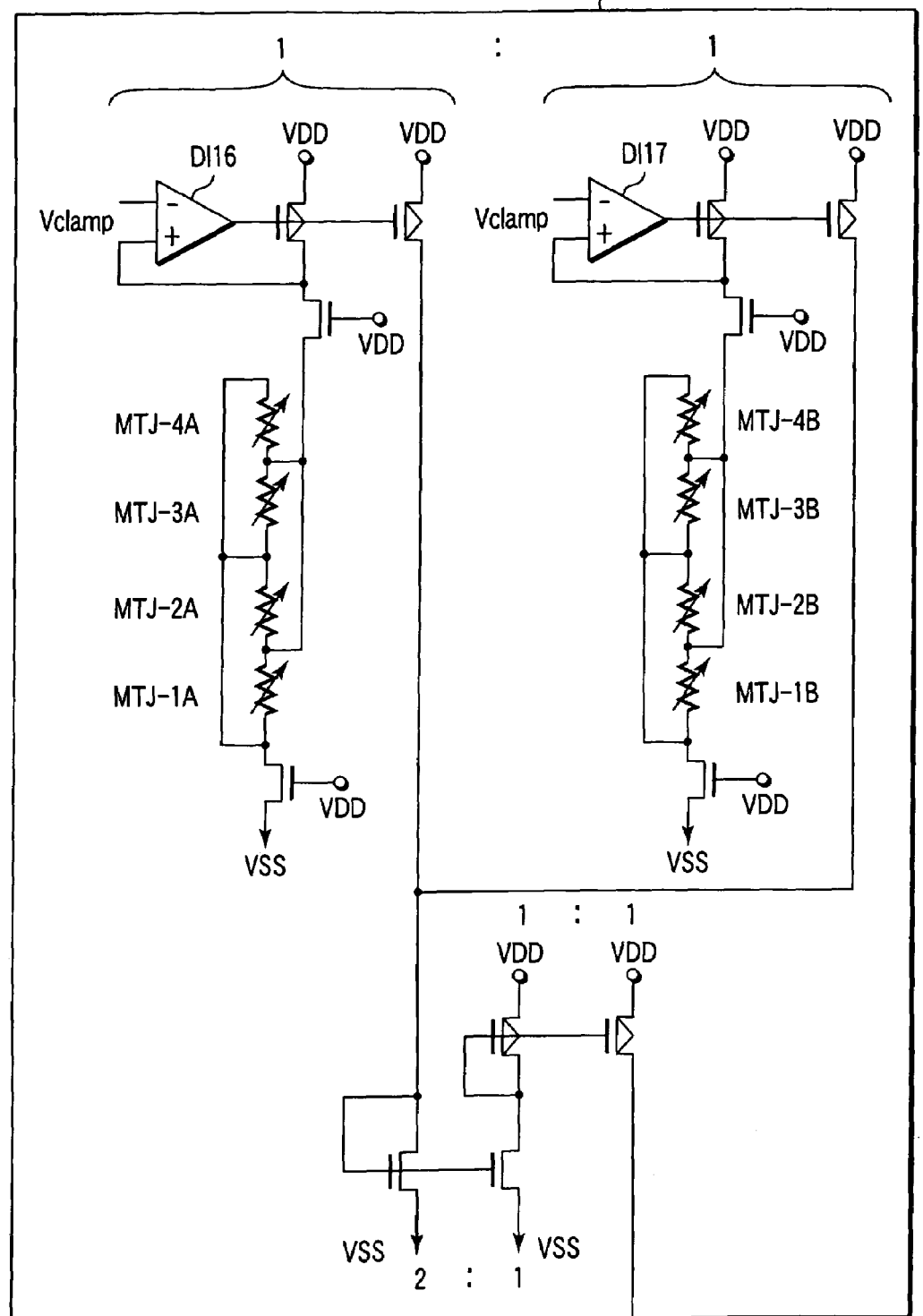
F I G. 71

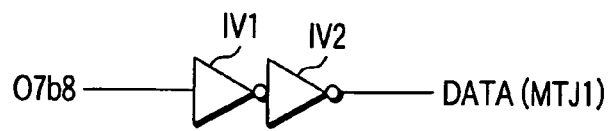
F I G. 72
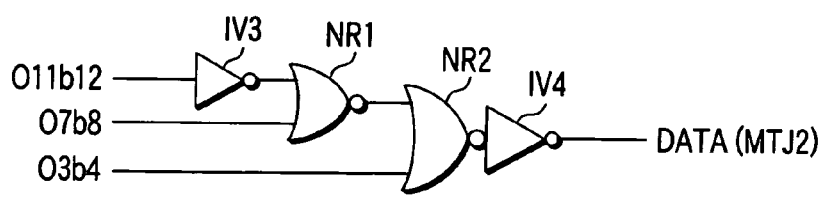
F I G. 73
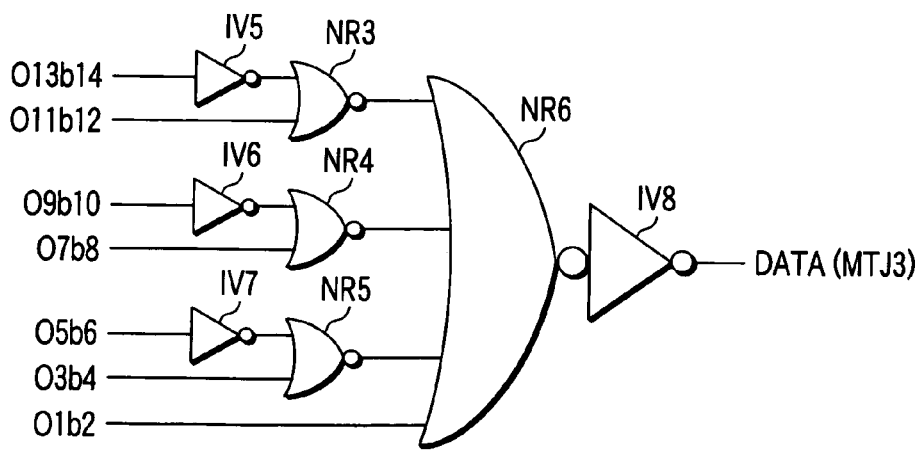
F I G. 74

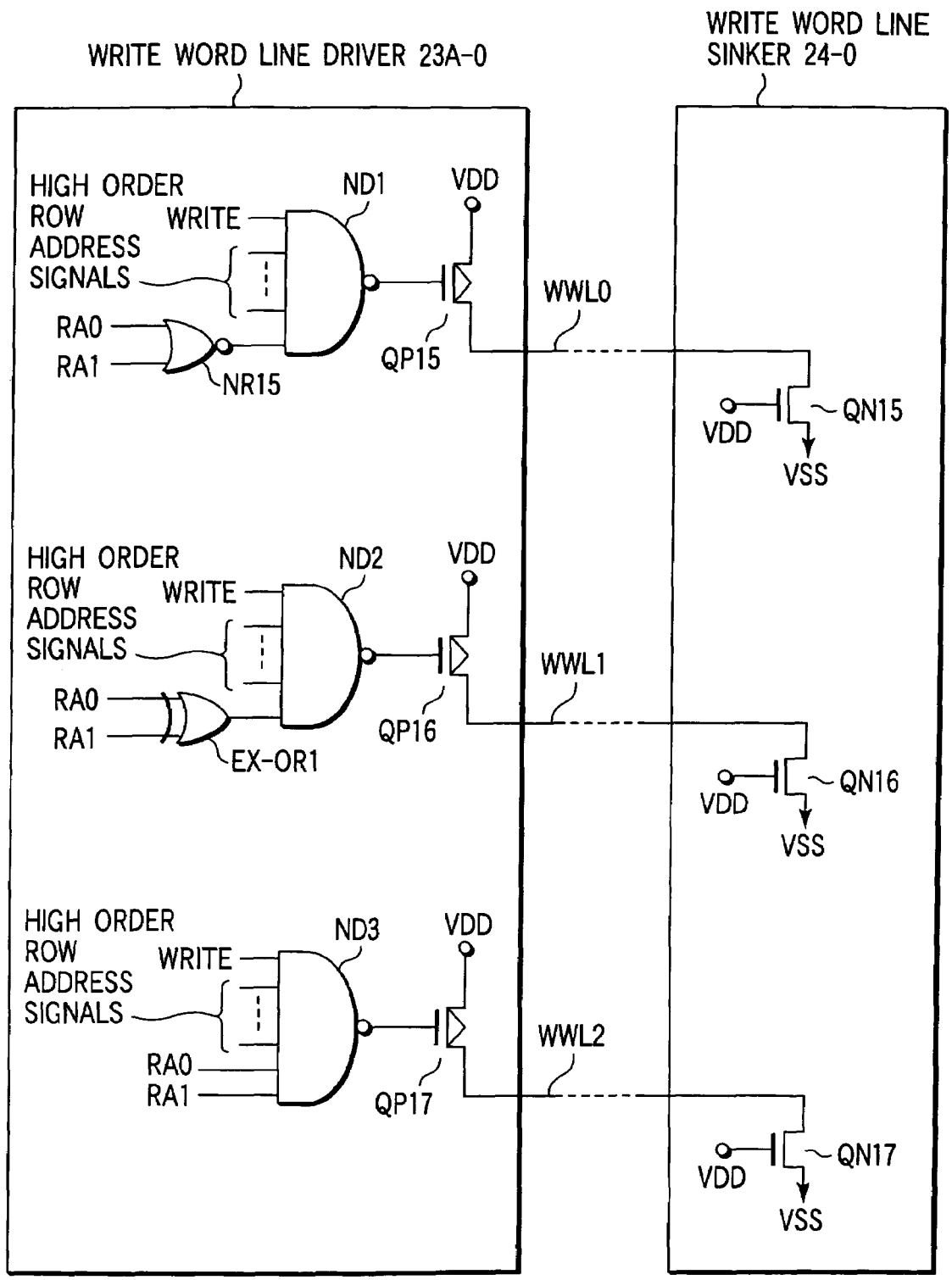
F I G. 77

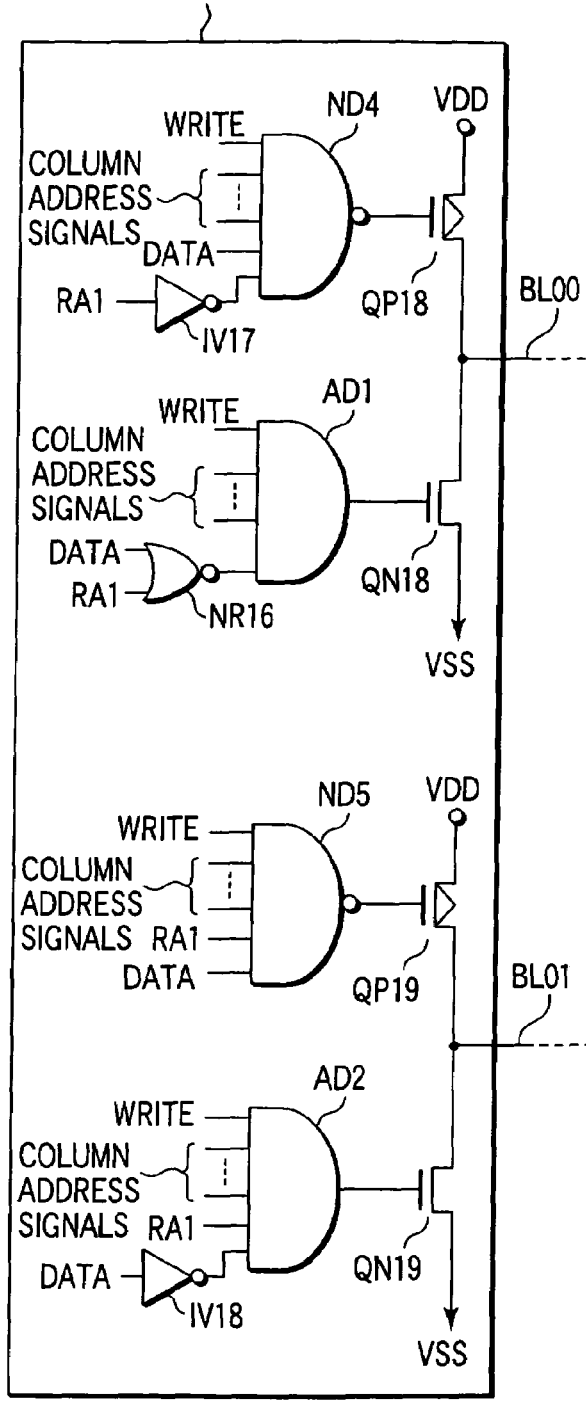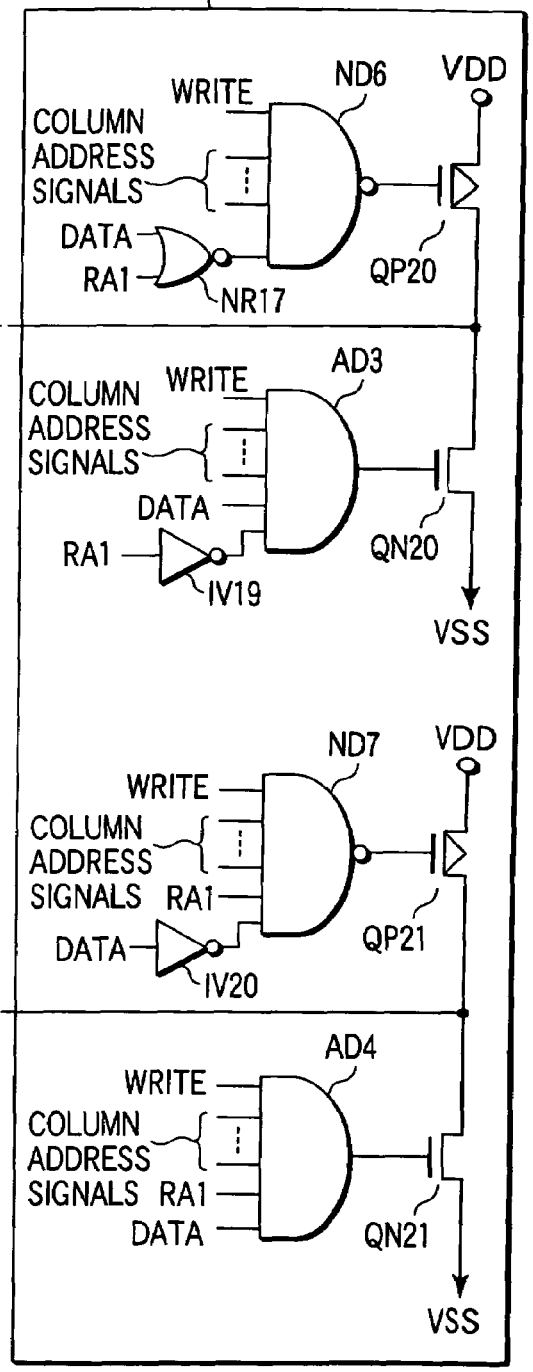
FIG. 78

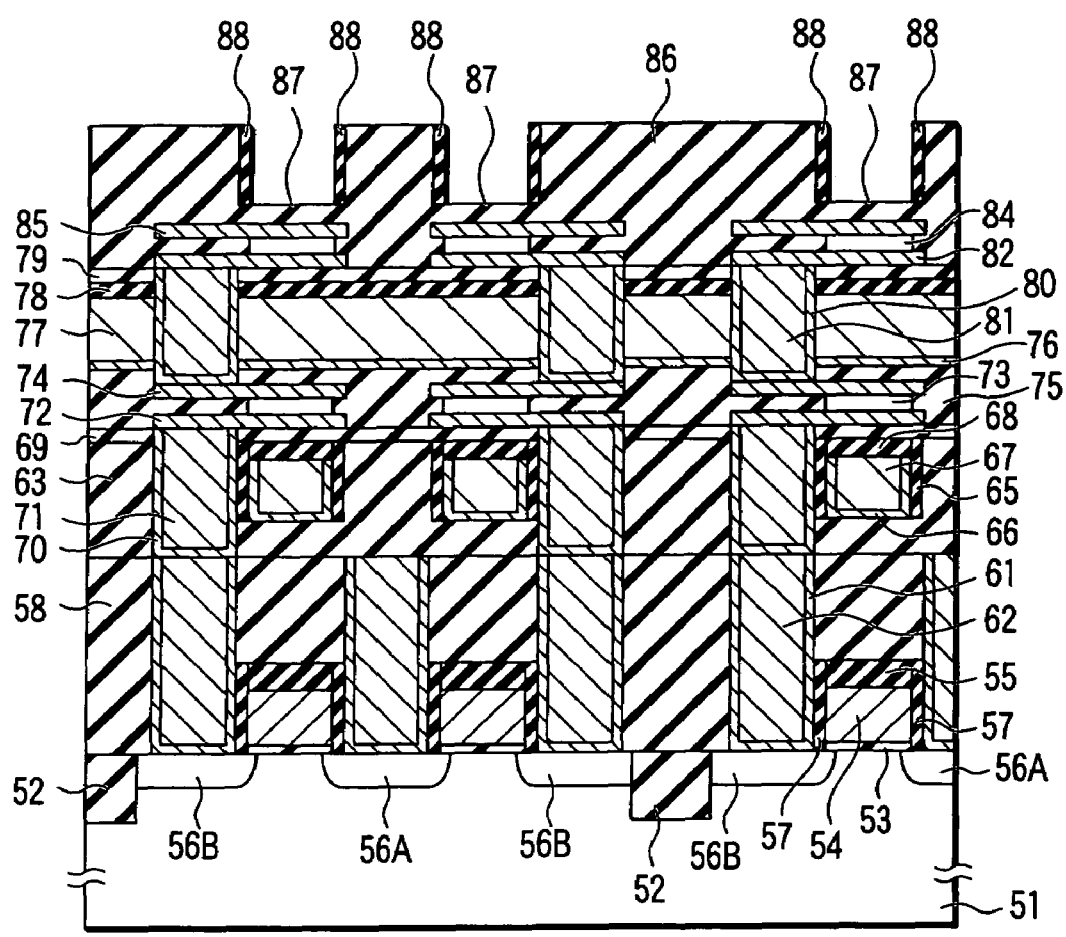
F I G. 100

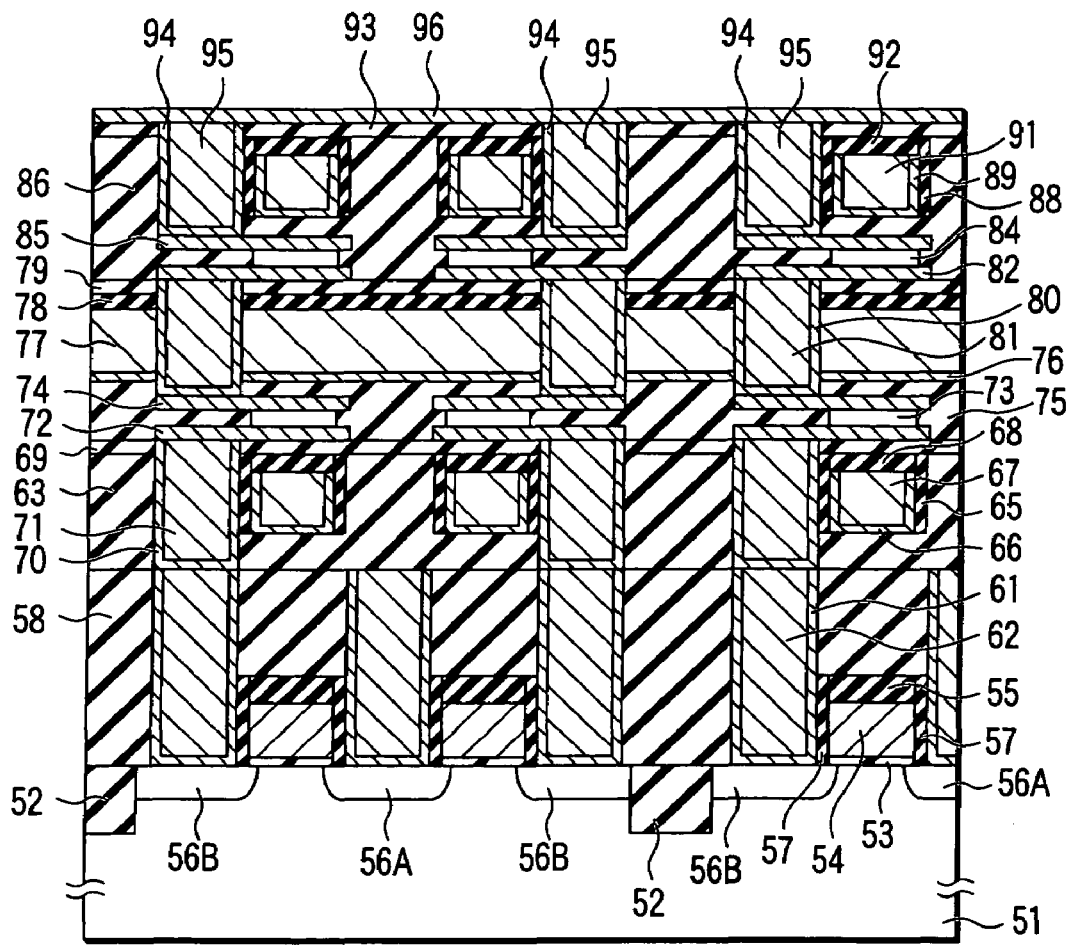
F I G. 103
Y-DIRECTION

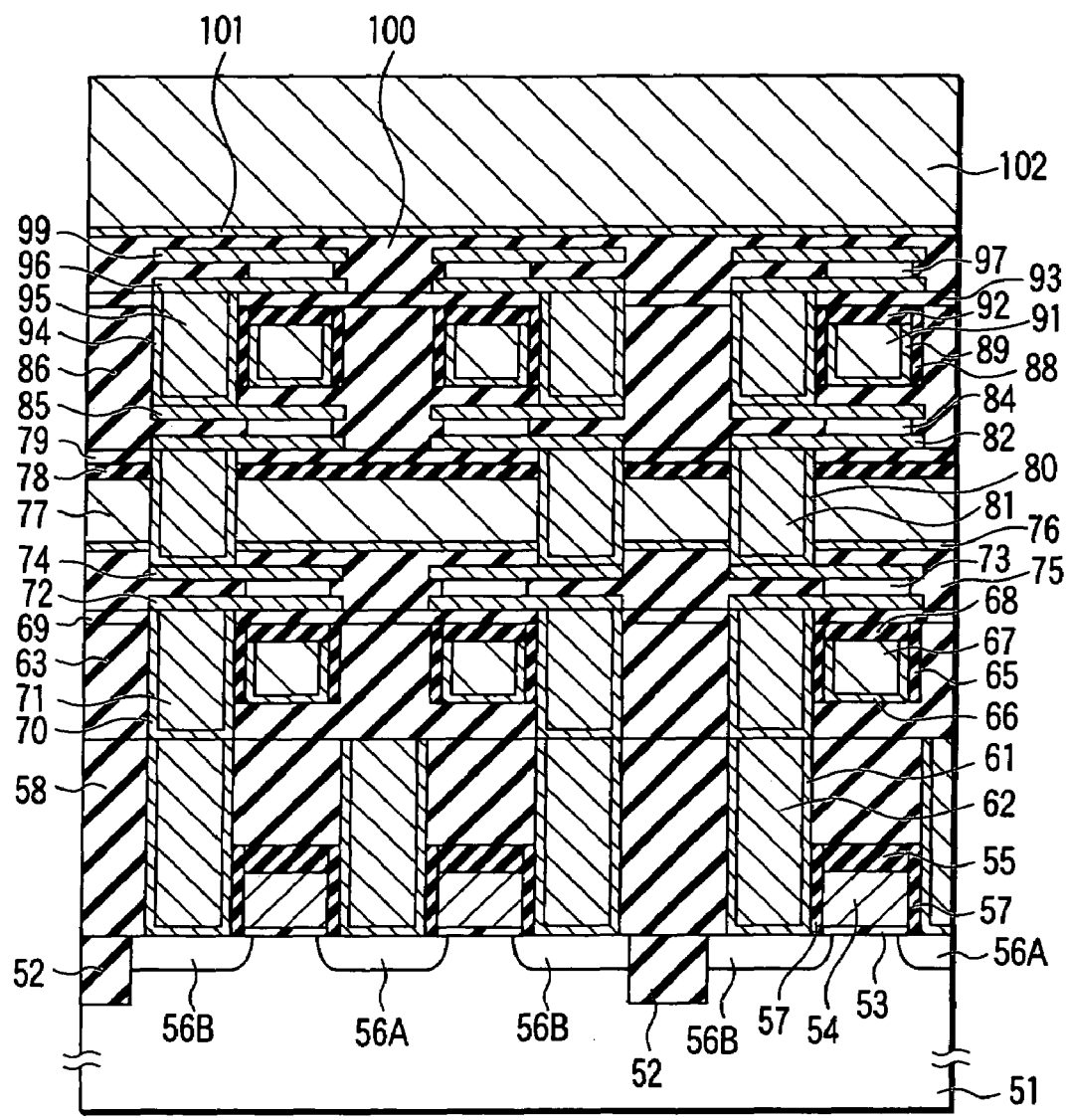
F I G. 107
Y-DIRECTION

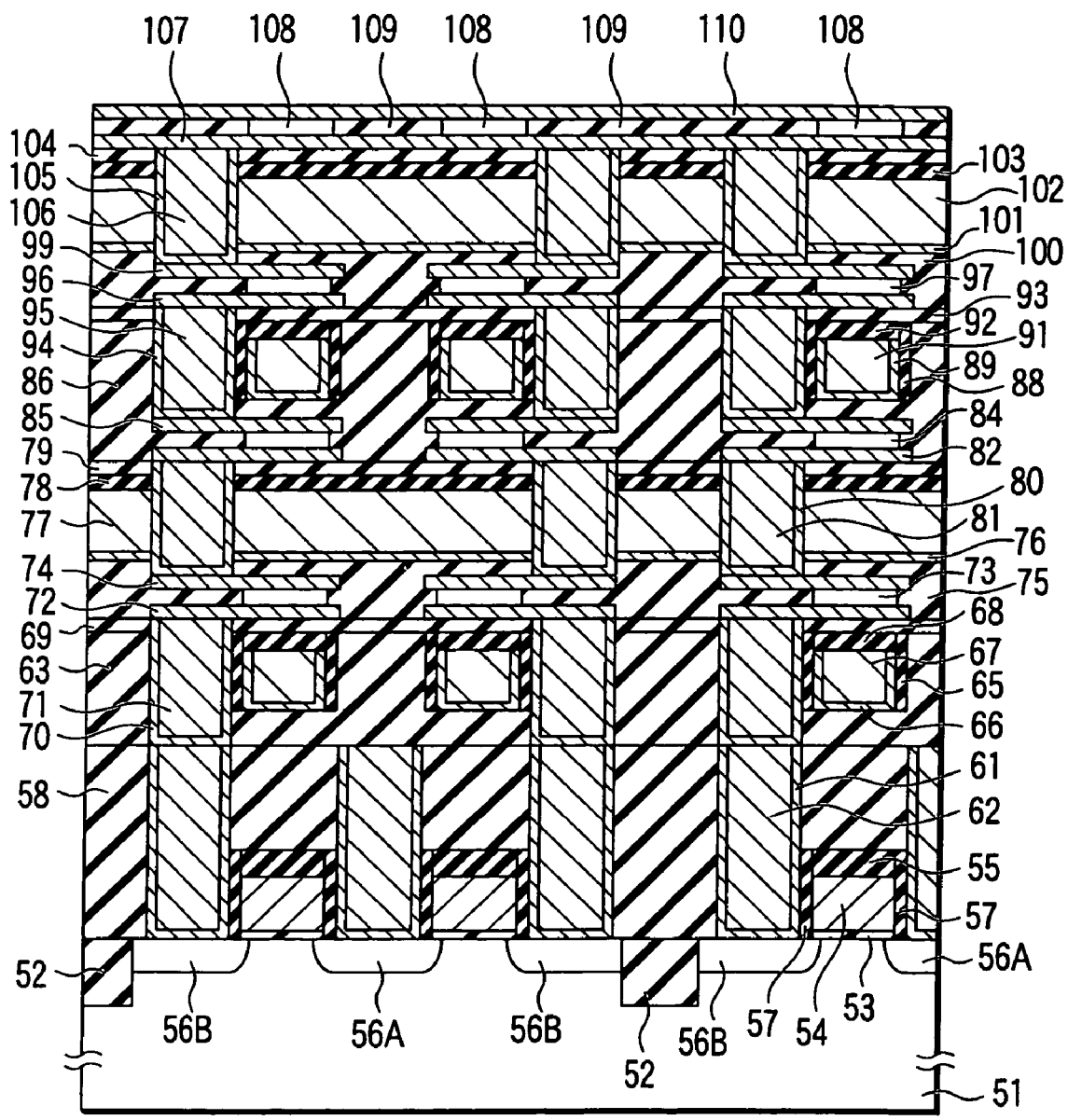
F I G. 110

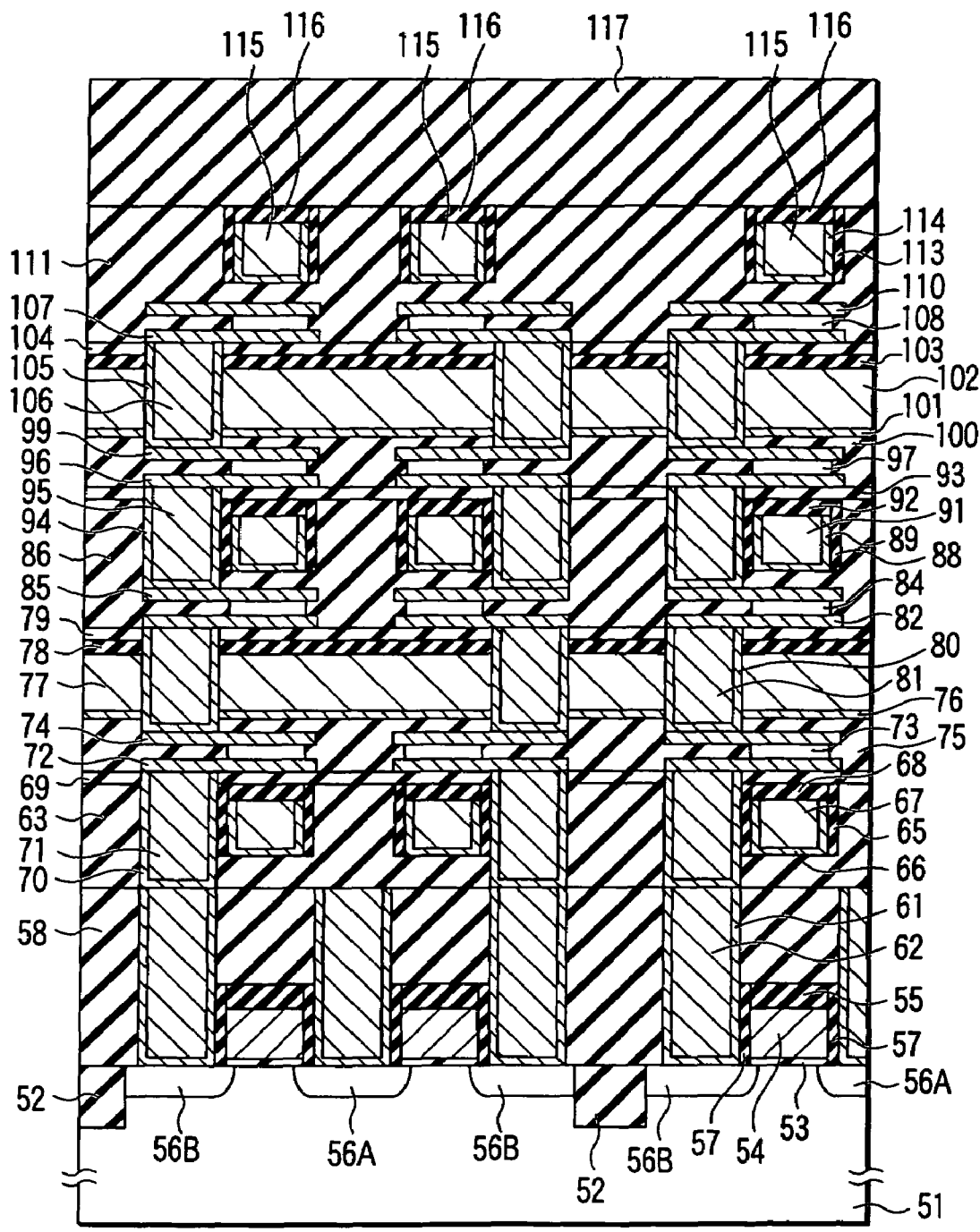
F I G. 114

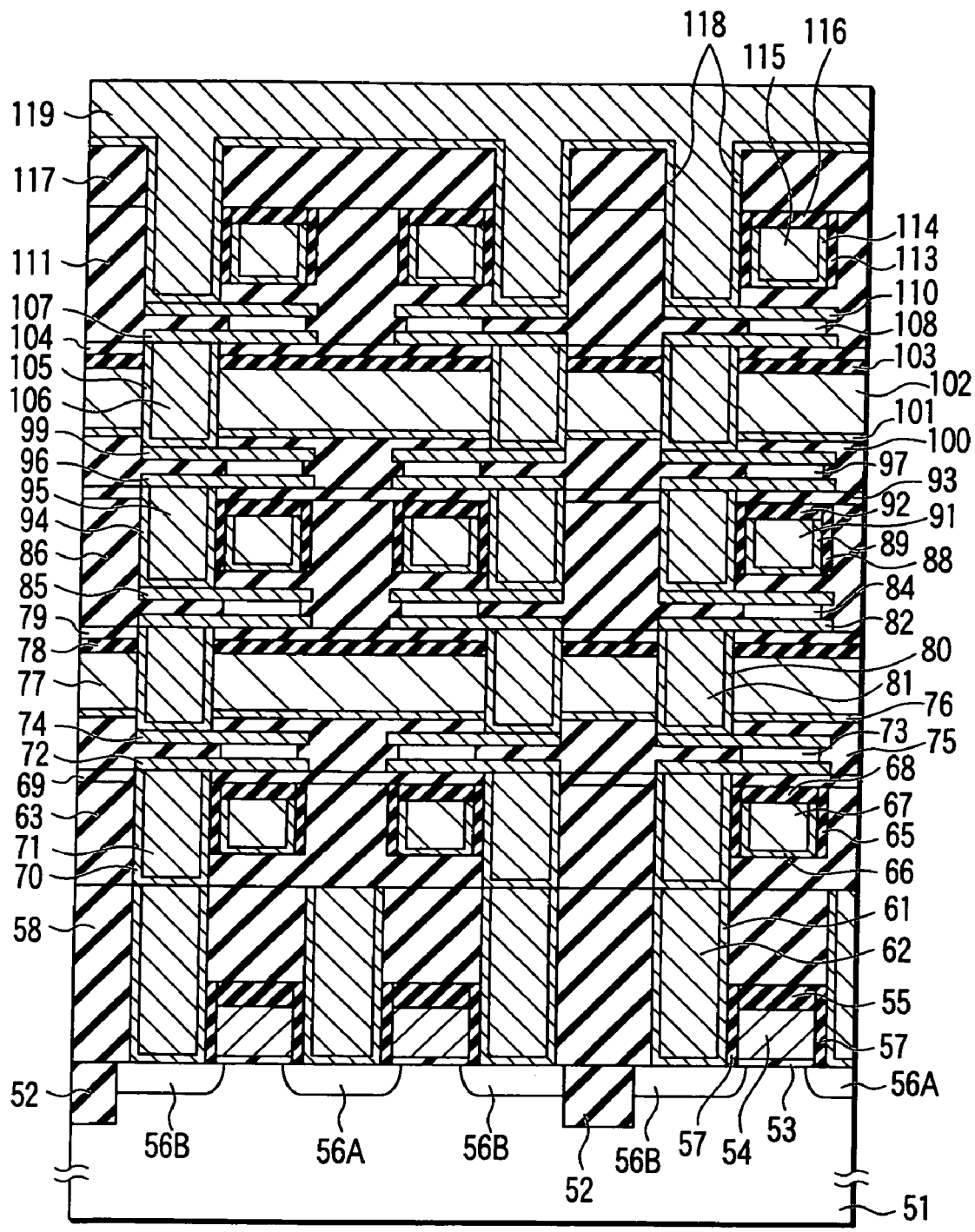
F I G. 115

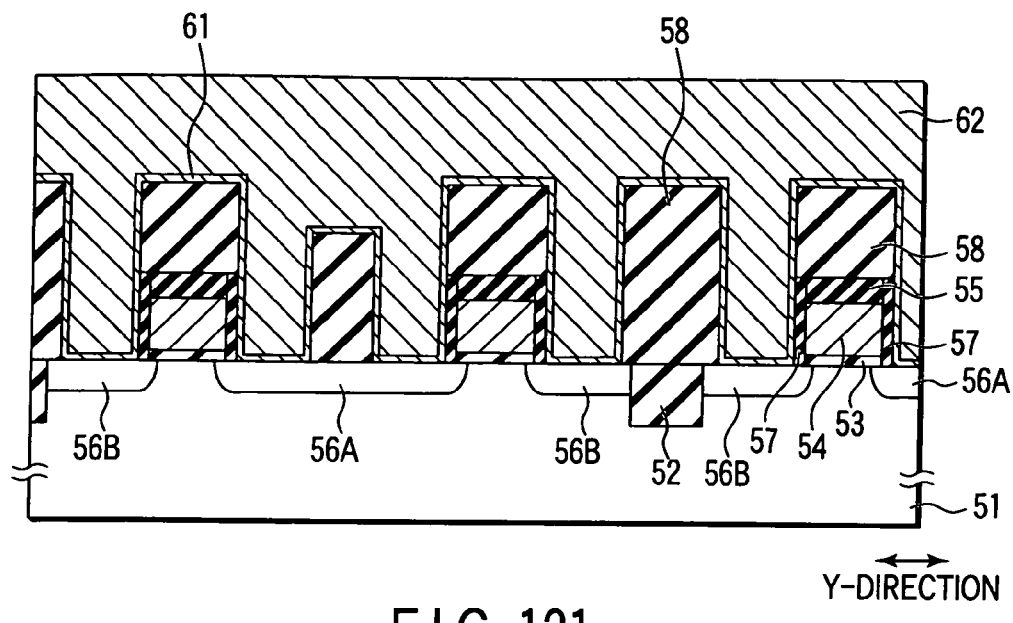
F I G. 121
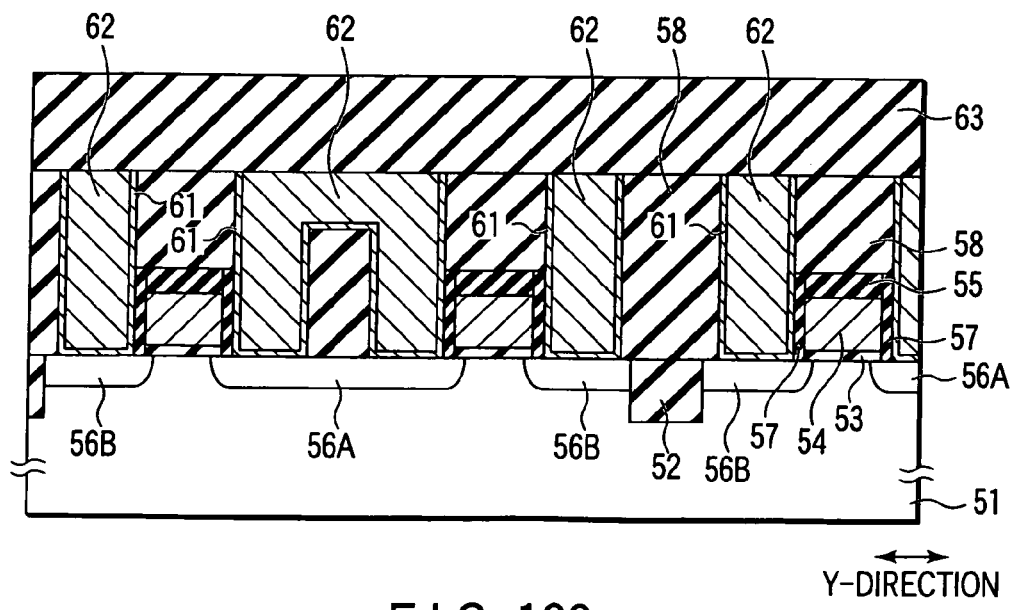
F I G. 122

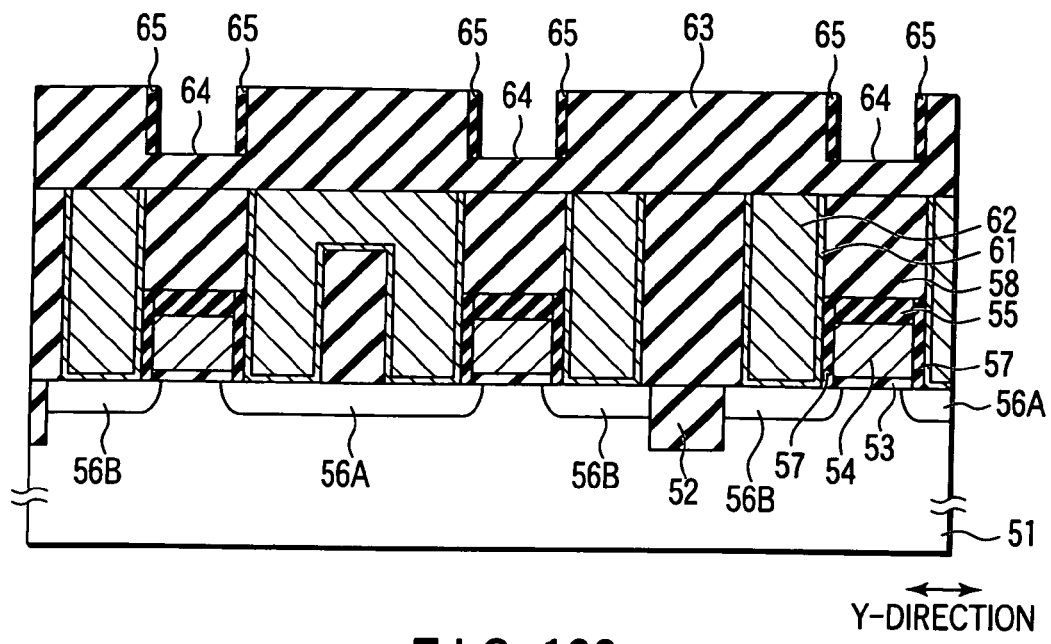
F I G. 123
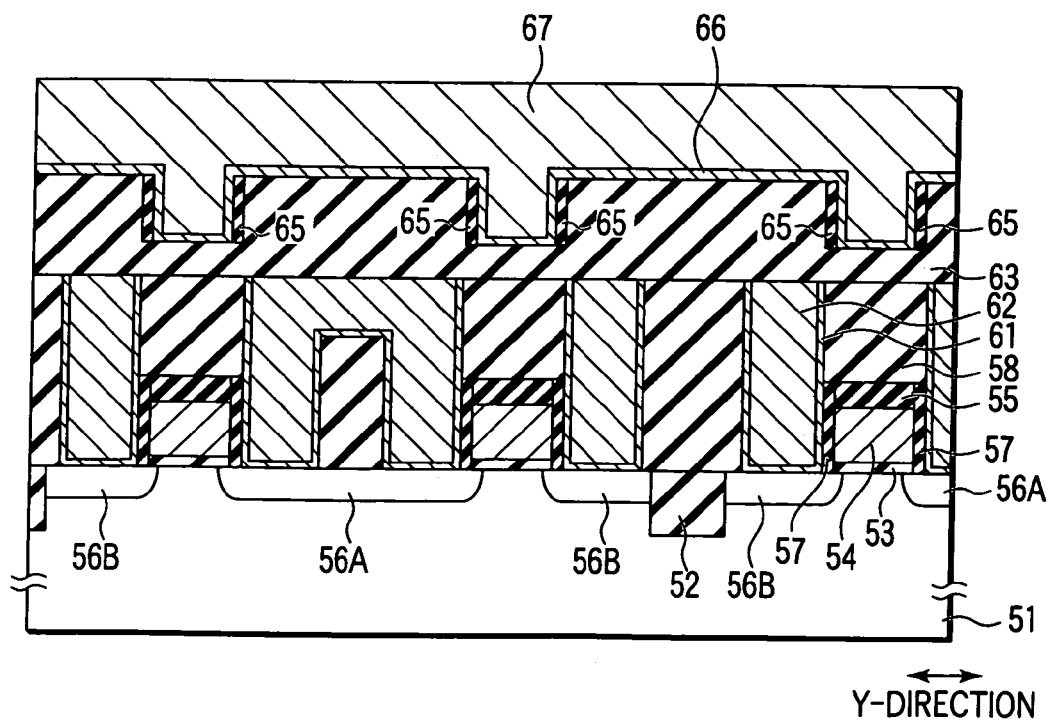
F I G. 124

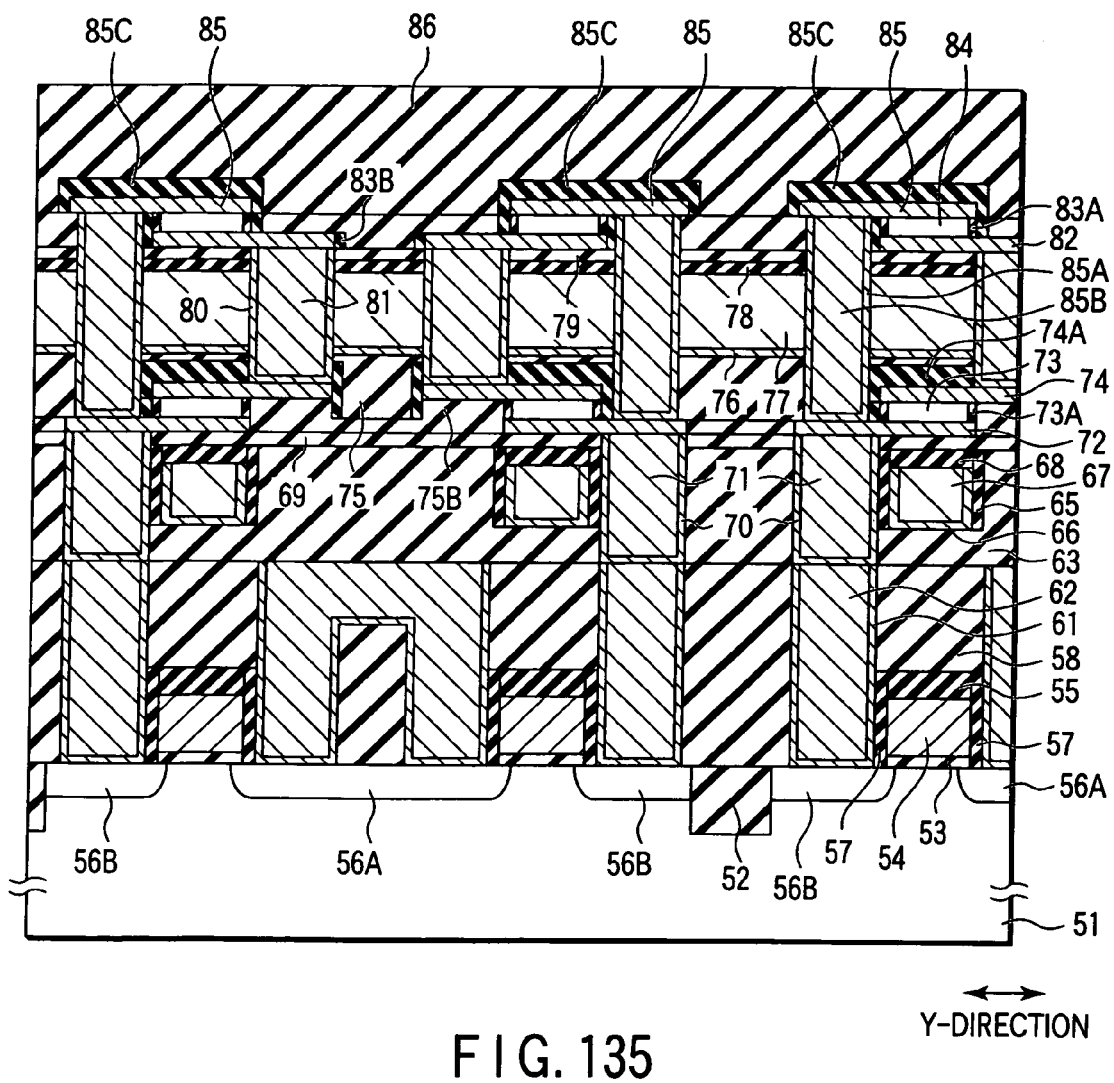
F I G. 135

Y-DIRECTION

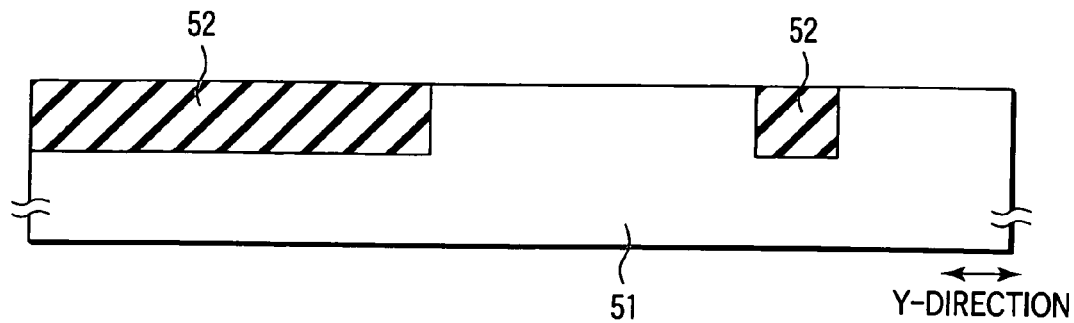
F I G. 151
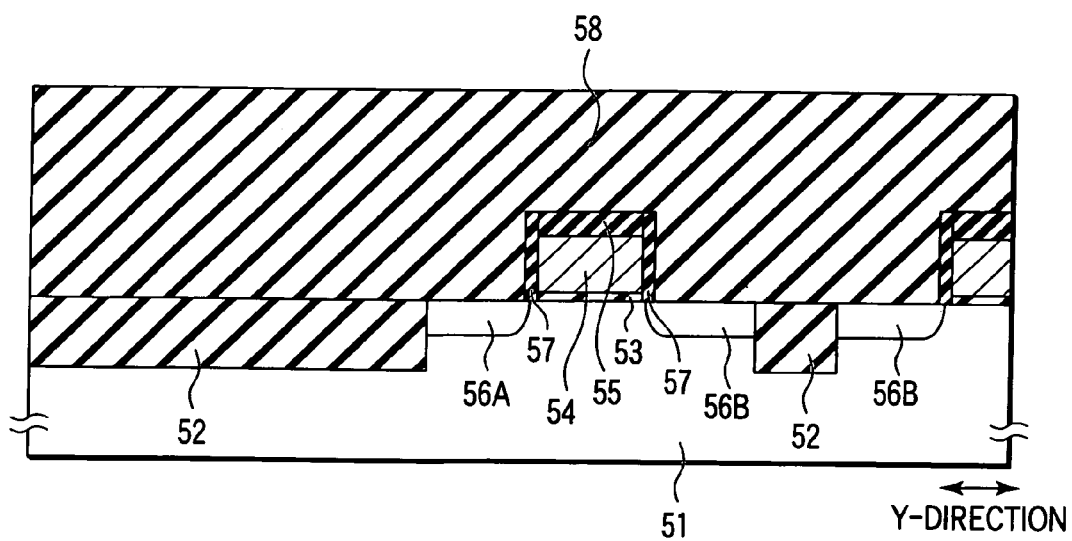
F I G. 152

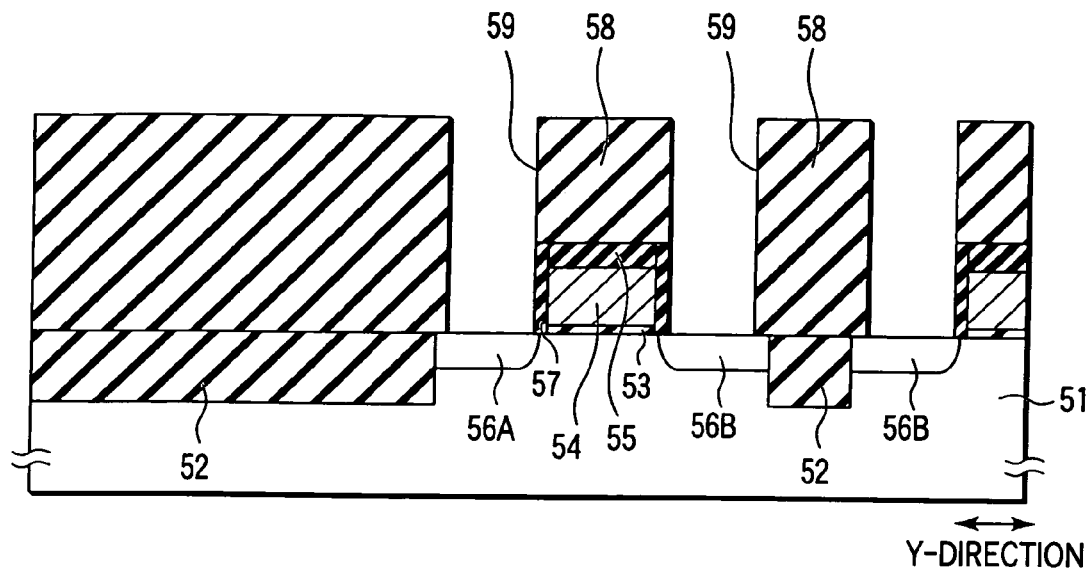
F I G. 153
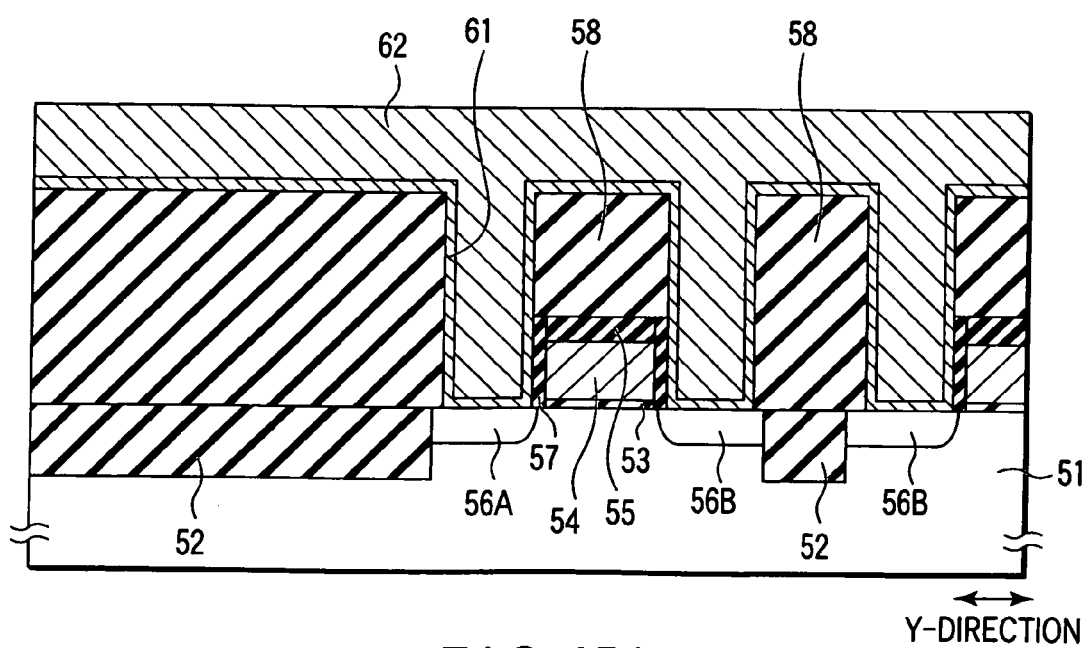
F I G. 154

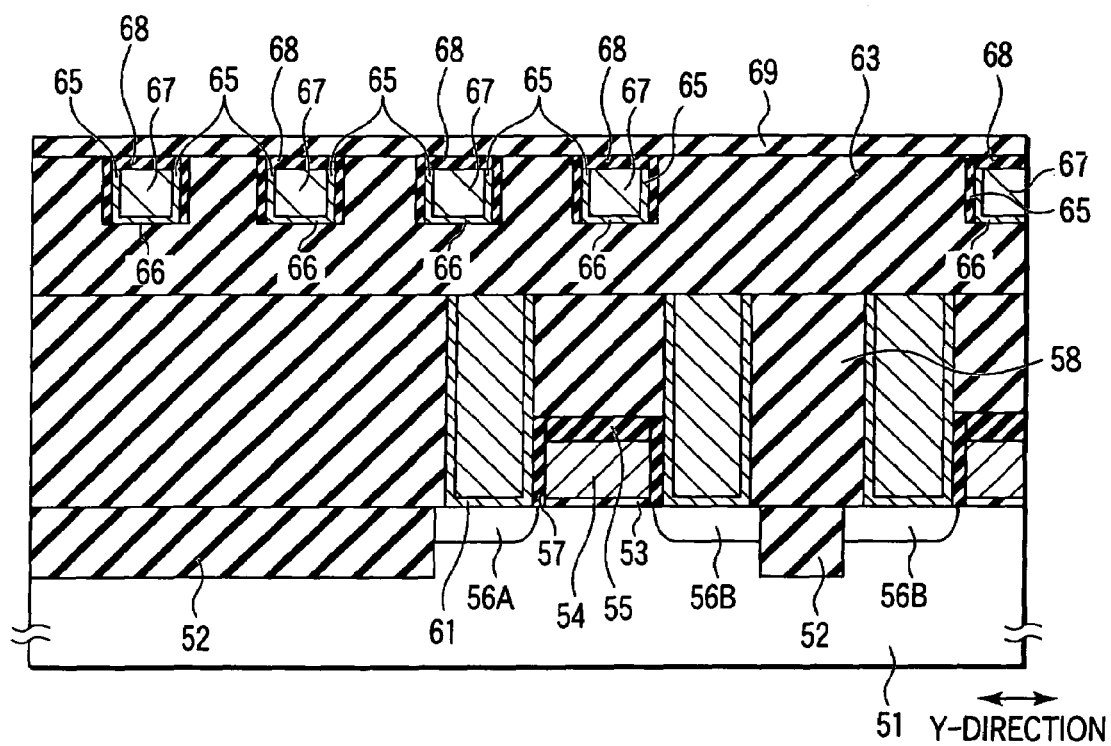
F I G. 157

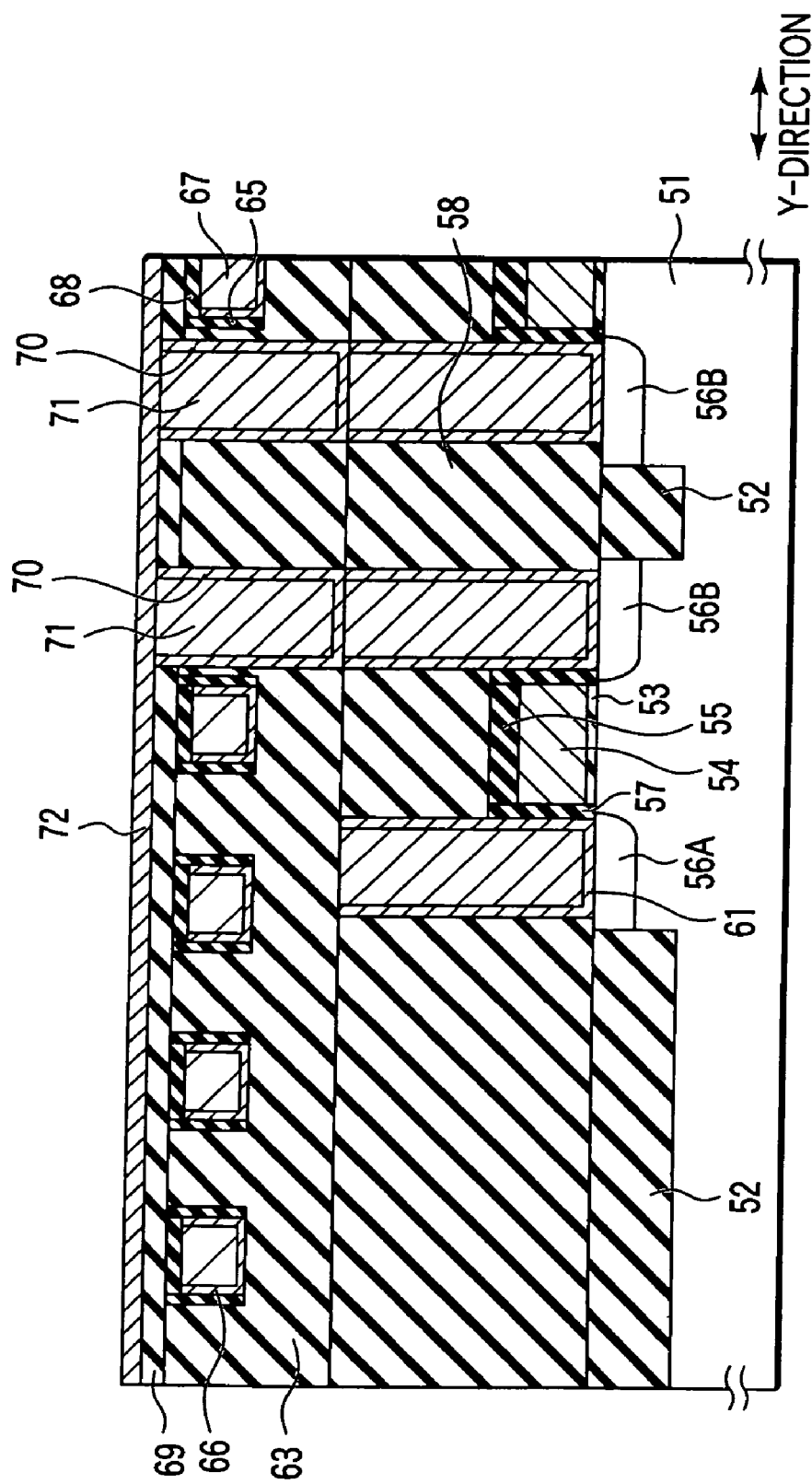
F I G. 158

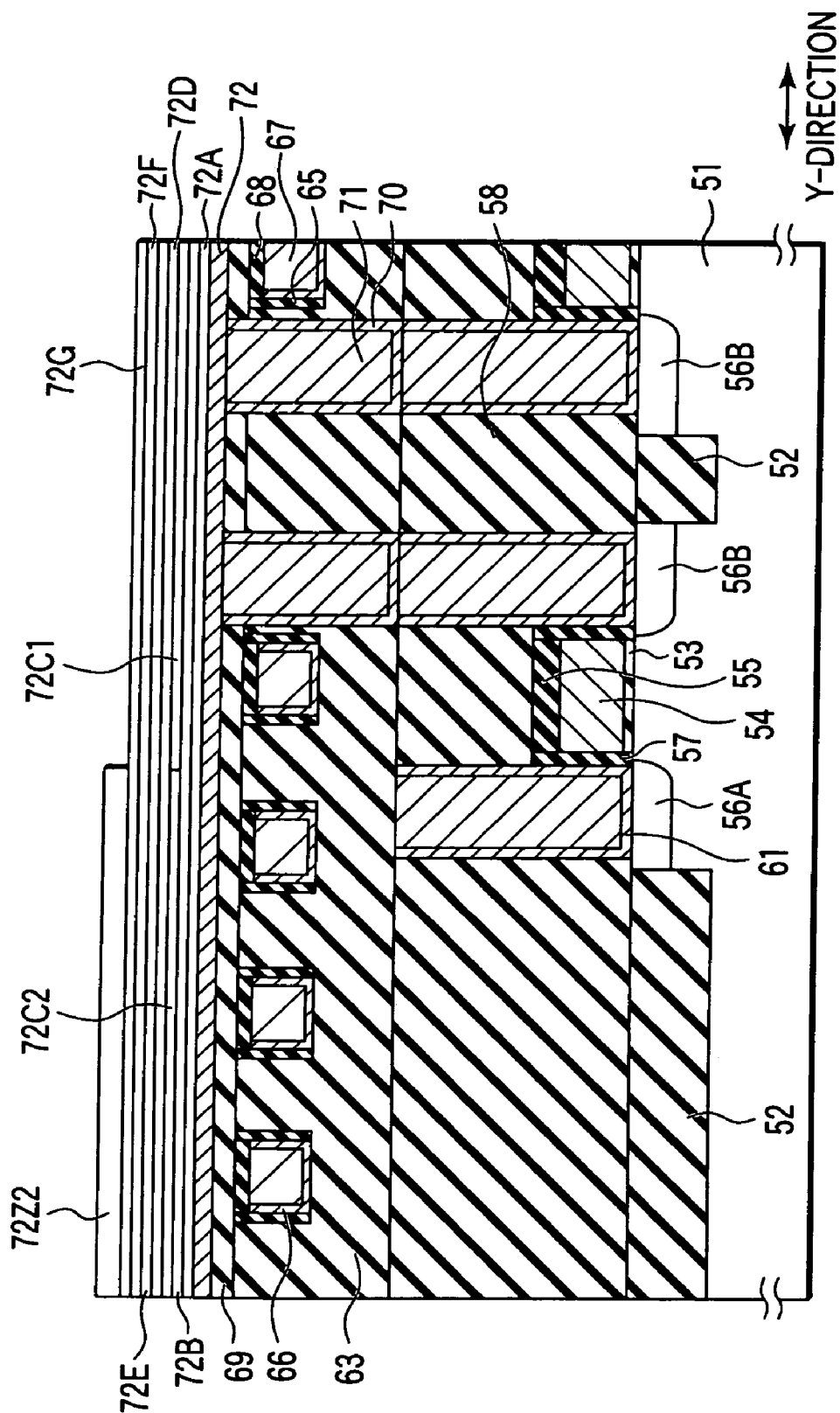
F I G. 160

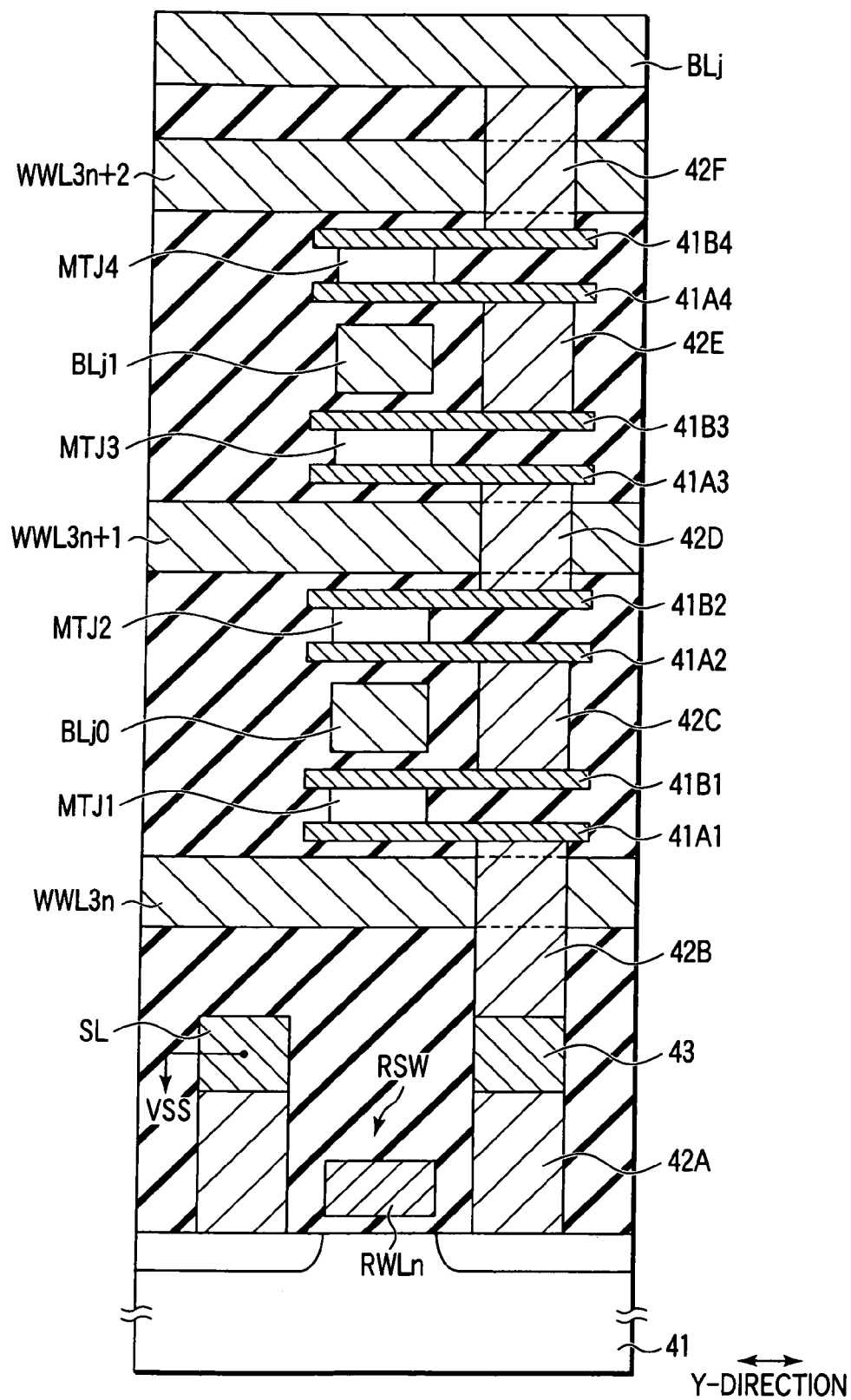
F I G. 169

MAGNETIC RANDOM ACCESS MEMORY

CROSS-REFERENCE TO RELATED APPLICATIONS

This application is a Divisional application of U.S. patent application Ser. No. 10/160,184, filed Jun. 4, 2002, and is based upon and claims the benefit of priority from the prior Japanese Patent Application No. 2001-365236, filed Nov. 29, 2001. The entire contents of these applications are incorporated herein by reference.

BACKGROUND OF THE INVENTION

1. Field of the Invention

The present invention relates to a magnetic random access memory (MRAM) which uses the magneto resistive effect.

2. Description of the Related Art

In recent years, although many memories which store therein data based on the new principle have been proposed, one of such memories is a magnetic random access memory which uses the tunneling magneto resistive (which will be referred to as TMR hereinafter) effect.

As a proposal of the magnetic random access memory, there is known, for example, "A 10 ns Read and Write Non-Volatile Memory Array Using a Magnetic Tunnel Junction and FET Switch in each Cell" by Roy Scheuerlein at. al, ISSCC2000 Technical Digest p. 128.

The magnetic random access memory stores therein data of "1" and "0" by using TMR elements. The basic structure of the TMR element has a tunneling barrier sandwiched between two magnetic layers (ferromagnetic layers).

Data stored in the TMR element is judged by whether the magnetizing states of the two magnetic layers are parallel or anti-parallel. Here, "parallel" means that magnetizing directions of the two magnetic layers are the same, and "anti-parallel" means that magnetizing directions of the two magnetic layers are opposed.

Usually, an anti-ferromagnetic layer is provided as one (fixed layer) of the two magnetic layers. The anti-ferromagnetic layer is a member which fixes the direction of magnetization of the fixed layer. Actually, therefore, data ("1" or "0") stored in the TMR element is determined by the direction of magnetization of the other one (free layer) of the two magnetic layers.

When the magnetizing states of the TMR element are parallel, the resistance of the tunneling barrier sandwiched between the two magnetic layers constituting the TMR element becomes lowest. For example, this state is determined as the state "1". Further, when the magnetizing states of the TMR element are anti-parallel, the resistance of the tunneling barrier sandwiched between the two magnetic layers constituting the TMR element becomes highest. For example, this state is determined as the state "0".

In regard to a cell array structure of the magnetic random access memory, various structures are currently examined in view of realization of the high memory capacity, stabilization of the write/read operation and others.

For example, nowadays, there is known a cell array structure in which one memory cell is constituted by one MOS transistor and one TMR element (or MTJ (Magnetic Tunnel Junction) element). Furthermore, in order to realize stabilization of the read operation, there is known a magnetic random access memory which has such a cell array structure and stores one-bit data by using two memory cell arrays.

However, the memory capacity can be hardly increased by these magnetic random access memory. That is because one MOS transistor corresponds to one TMR element in these cell array structures.

BRIEF SUMMARY OF THE INVENTION (1) According to a first aspect of the present invention, there is provided a magnetic random access memory including: a plurality of memory cells which are connected to each other in series and use the magneto resistive effect; a bit line which is connected to one end of a plurality of the memory cells and extends in a first direction; and a read circuit connected to the bit line.

According to a second aspect of the present invention, there is provided a magnetic random access memory including: a plurality of memory cells which are connected to each other in parallel and use the magneto resistive effect; a bit line which is connected to one end of a plurality of the memory cells and extends in a first direction; and a read circuit connected to the bit line, wherein resistance values of a plurality of the memory cells are different from each other even if magnetizing states of a plurality of the memory cells are the same.

(2) According to a first aspect of the present invention, there is provided a read method of a magnetic random access memory, the magnetic random access memory having a plurality of memory cells which use the magneto resistive effect, resistance values of a plurality of the memory cells being different from each other, the read method including: passing a read current to a plurality of the memory cells when a plurality of the memory cells are connected to each other in series; subjecting the read current or a read potential generated from the read current to analog/digital conversion; and judging data values of a plurality of the memory cells based on data obtained by the analog/digital conversion.

According to a second aspect of the present invention, there is provided a read method of a magnetic random access memory, the magnetic random access memory having a plurality of memory cells which use the magneto resistive effect, resistance values of a plurality of the memory cells being different from each other, the read method including: passing a read current to a plurality of the memory cells when a plurality of the memory cells are connected to each other in parallel; subjecting the read current or a read potential generated from the read current to analog/digital conversion; and judging data values of a plurality of the memory cells based on data obtained by the analog/digital conversion.

(3) According to a first aspect of the present invention, there is provided a magnetic random access memory, the read circuit being applied to a magnetic random access memory having a plurality of memory cells which use the magneto resistive effect and are connected in series or parallel, the magnetic random access memory including: a current source which supplies a read current to a plurality of the memory cells; an analog/digital converter which compares the read current and a plurality of reference currents or a read potential generated from the read current with a plurality of reference potentials; and a logic circuit which judges data values of a plurality of the memory cells based on an output signal from the analog/digital converter.

According to a second aspect of the present invention, there is provided a magnetic random access memory, the read circuit being applied to a magnetic random access memory having a plurality of memory cells which use the magneto resistive effect and are connected to each other in series or parallel, the magnetic random access memory including: a current source which supplies a read current to a plurality of the memory cells; an analog/digital converter which compares the read current and a plurality of reference currents or a read potential generated from the read current with a plurality of reference potentials; and a logic circuit which judges data values of a plurality of the memory cells based on an output signal from the analog/digital converter.

(4) According to a first aspect of the present invention, there is provided a manufacturing method of a magnetic random access memory comprising: forming a read selection switch in a surface area of a semiconductor substrate; forming on the read selection switch a first write word line which extends in a first direction; forming a first MTJ element directly above the first write word line; forming directly above the first MTJ element a first write bit line which extends in a second direction crossing the first direction; forming a second MTJ element directly above the first MTJ element; forming directly above the second MTJ element a second write word line which extends in the first direction; forming a third MTJ element directly above the second MTJ element; forming directly above the third MTJ element a second write bit line which extends in the second direction; forming a fourth MTJ element directly above the third MTJ element; forming directly above the fourth MTJ element a third write word line which extends in the first direction; and forming on the fourth MTJ active regions a bit line which extends in the second direction.

According to a second aspect of the present invention, there is provided a manufacturing method of a magnetic random access memory comprising: forming a read selection switch in a surface area of a semiconductor substrate; forming N (N is a plural number) write word lines which extends in a first direction on the read selection switch; forming a lower electrode directly above the N write word lines; forming N MTJ elements which contact the lower element directly above the N write word lines; and a read bit line which contacts the N MTJ elements and extends in a second direction crossing the first direction.

BRIEF DESCRIPTION OF THE SEVERAL
VIEWS OF THE DRAWING

FIG. 1 is a circuit diagram concerning Structure Example 1 of a magnetic random access memory according to the present invention;

FIG. 30 is a view showing a layout of the third TMR element and its upper electrode of Structure Example 2;

FIG. 31 is a view showing a layout of a fourth TMR element and its lower electrode of Structure Example 2;

FIG. 36 is a circuit diagram showing a second modification of Structure Example 2;

FIG. 38 is a circuit diagram showing a third modification of Structure Example 2;

FIG. 49 is a view showing a layout of a TMR element and its lower electrode of Structure Example 3;

FIG. 50 is a view showing a layout of a TMR element and its upper electrode of Structure Example 3;

FIG. 51 is a view showing an equivalent circuit during a read operation in Structure Example 1;

FIG. 52 is a view showing an equivalent circuit during the read operation in Structure Examples 2 and 3;

FIG. 53 is a view showing an equivalent circuit during the read operation in the second modification of Structure Example 1;

FIG. 54 is a view showing an equivalent circuit during the read operation in the third modification of Structure Example 1;

FIG. 55 is a view showing an equivalent circuit during the read operation in the second modification of Structure Example 2;

FIG. 56 is a view showing an equivalent circuit during the read operation in the third modification of Structure Example 2;

FIG. 57 is a view showing a structure example of a first TMR element having a lowest resistance value;

FIG. 58 is a view showing a structure example of a second TMR element having a second lowest resistance value;

FIG. 66 is a view showing a logic circuit which Judges a data value of the fourth TMR element;

FIG. 67 is a view showing a logic circuit which judges a data value of the third TMR element;

FIG. 68 is a view showing a logic circuit which judges a data value of the second TMR element;

FIG. 69 is a view showing a logic circuit which judges a data value of the first TMR element;

FIG. 70 is a view showing Circuit Example 2 of the read circuit concerning the present invention;

FIG. 71 is a view showing a concrete example of a reference current generation circuit;

FIG. 72 is a view showing a logic circuit which judges a data value of the first TMR element;

FIG. 73 is a view showing a logic circuit which judges a data value of the second TMR element;

FIG. 74 is a view showing a logic circuit which judges a data value of the third TMR element;

FIG. 77 is a view showing a circuit example of a write word line driver/sinker;

FIG. 78 is a view showing a circuit example of a bit word line driver/sinker;

FIG. 100 is a sectional view showing one step of the manufacturing method 1 according to the present invention;

FIG. 103 is a sectional view showing one step of the manufacturing method 1 according to the present invention;

FIG. 107 is a sectional view showing one step of the manufacturing method 1 according to the present invention;

FIG. 110 is a sectional view showing one step of the manufacturing method 1 according to the present invention;

FIG. 114 is a sectional view showing one step of the manufacturing method 1 according to the present invention;

FIG. 115 is a sectional view showing one step of the manufacturing method 1 according to the present invention;

FIG. 121 is a sectional view showing one step of the manufacturing method 2 according to the present invention;

FIG. 122 is a sectional view showing one step of the manufacturing method 2 according to the present invention;

FIG. 123 is a sectional view showing one step of the manufacturing method 2 according to the present invention;

FIG. 124 is a sectional view showing one step of the manufacturing method 2 according to the present invention;

FIG. 135 is a sectional view showing one step of the manufacturing method 2 according to the present invention;

FIG. 151 is a sectional view showing one step of the manufacturing method 3 according to the present invention;

FIG. 152 is a sectional view showing one step of the manufacturing method 3 according to the present invention;

FIG. 153 is a sectional view showing one step of the manufacturing method 3 according to the present invention;

FIG. 154 is a sectional view showing one step of the manufacturing method 3 according to the present invention;

FIG. 157 is a sectional view showing one step of the manufacturing method 3 according to the present invention;

FIG. 158 is a sectional view showing one step of the manufacturing method 3 according to the present invention;

FIG. 160 is a sectional view showing one step of the manufacturing method 3 according to the present invention;

FIG. 169 is a sectional view showing a modification of the device structure according to the present invention;

DETAILED DESCRIPTION OF THE INVENTION

Figure 2:
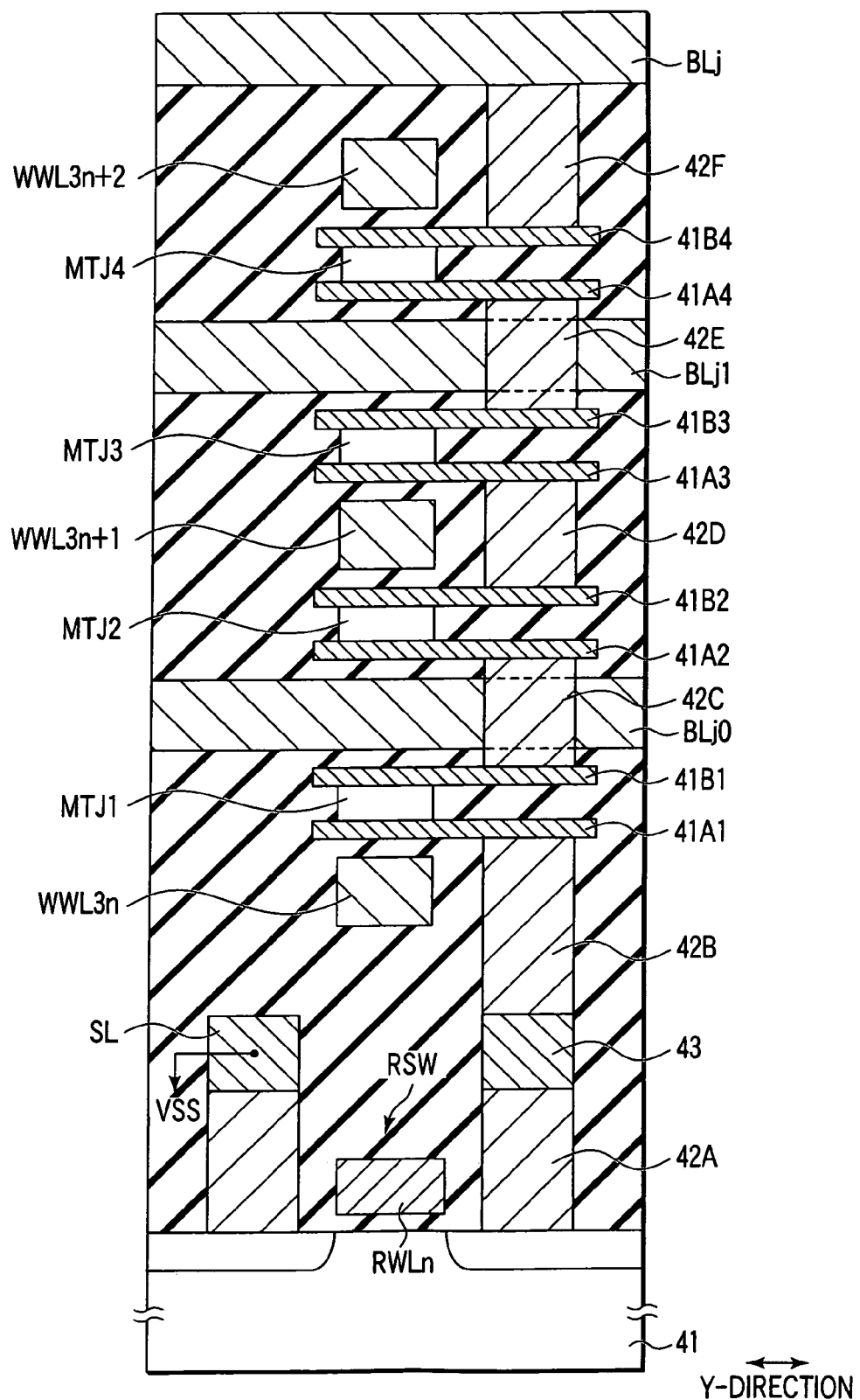
FIG. 2 is a sectional view concerning Structure Example 1 of the magnetic random access memory according to the present invention.

A magnetic random access memory of an aspect of the present invention will be described below in detail with reference to the accompanying drawings.

1. Cell Array Structure

First, a cell array structure of a magnetic random access memory of an aspect of the present invention will be described below in detail.

(1) Structure Example (1)

Structure example 1 concerns the cell array structure in which a plurality of TMR elements superposed in a plurality of stages are connected to each other in series.

① Circuit Structure

The circuit structure will first be described.

FIG. 1 shows primary parts of a magnetic random access memory as Structure Example 1 according to the present invention.

The memory cell array 11 has a plurality of TMR elements 12 arranged in the form of an array in directions X, Y and Z. Here, the Z-direction means a direction which is orthogonal to the directions X and Y.

In this example, the memory cell array 11 has a cell array structure consisting of j+1 TMR elements 12 arranged in the X-direction, n+1 TMR elements 12 arranged in the Y-direction and four TMR elements 12 superposed in the Z-direction. Although a number of the TMR elements 12 superposed in the Z-direction is four in this example, it can be any number as long as it is a plural number.

The four TMR elements 12 superposed in the Z-direction are connected to each other in series and constitute one block BKik (i=0, 1, . . . j, k=0, 1, . . . n). The four TMR elements 12 in the block BKik are actually superposed each other in a direction vertical to the memory cell array plane (Z-direction).

One end of the four TMR elements 12 in the block BKik is connected to a ground point through a read selection switch (MOS transistor) RSW.

In this example, one row is constituted by j+1 blocks BKik arranged in the X-direction. The memory cell array 11 has n+1 rows. Further, one column is constituted by n+1 blocks BKik arranged in the Y-direction. The memory cell array 11 has j+1 columns.

A plurality of (three in this example) write word liens WWL3n, WWL3n+1, WWL3n+2 which extend in the X-direction and are superposed in the Z-direction are arranged in the vicinity of the four TMR elements 12 constituting the block BKik. However, n is a number of each row, and n=0, 1, 2, . . . .

In regard to the write word line extending in the X-direction, one write word line can be arranged on one stage in one row. In this case, a number of the write word lines in one row extending in the X-direction is four, namely, equal to a number of stages in which the TMR elements 12 are superposed.

Here, however, at least one of the write word lines in one row extending in the X-direction is shared by the two TMR elements (the upper TMR element and the lower TMR element). Specifically, in this example, the write word line WWL3n+1 is shared by the TMR elements on the second and third stages. In this case, since a number of the write word lines is decreased, planation of the insulating film directly below the TMR elements 12 or reduction in the manufacturing cost can be realized.

Figure 170:
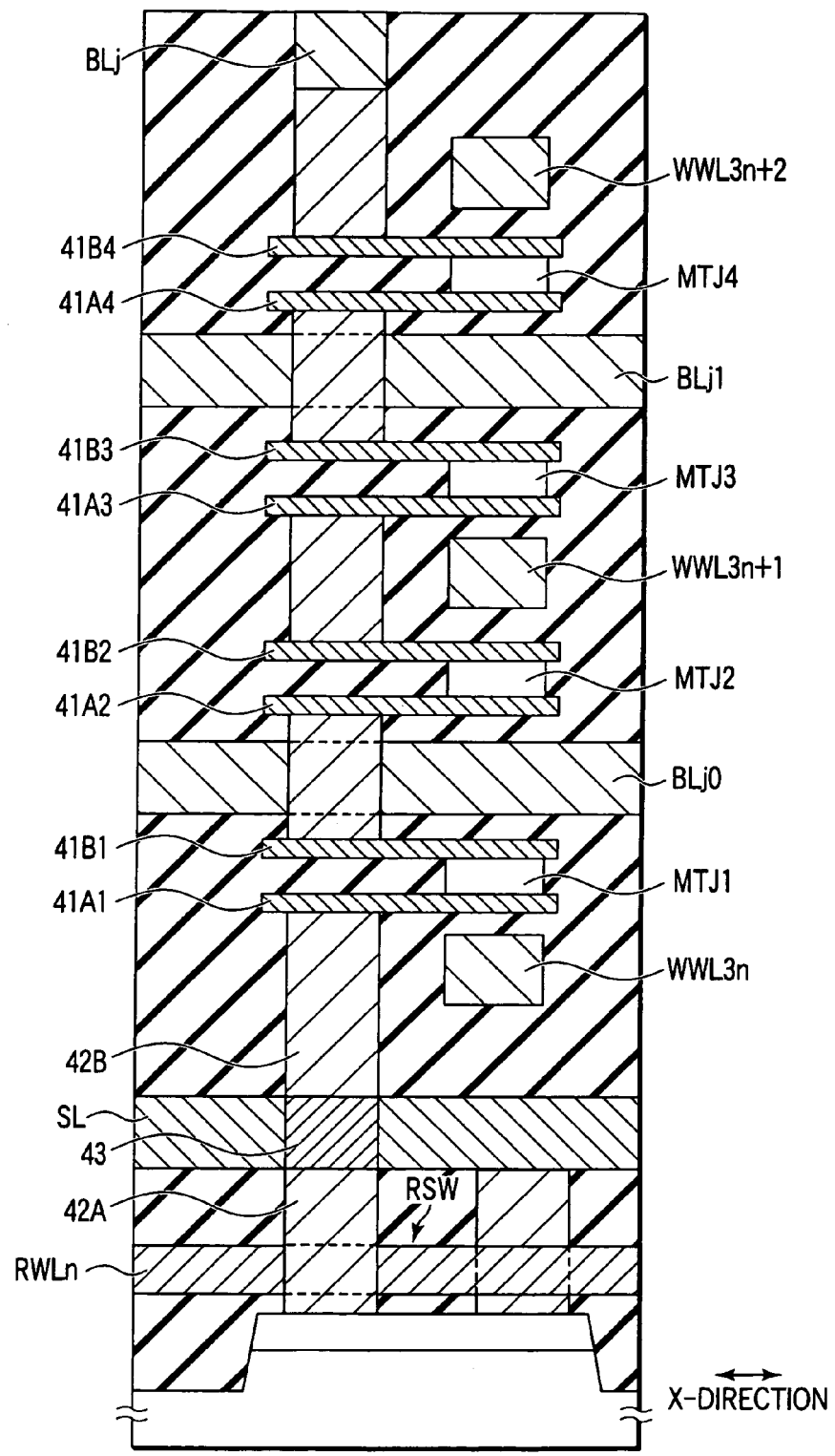
FIG. 170 is a sectional view showing the modification of the device structure according to the present invention.

In terms of the block structure, a number of the write word lines in one row extending in the X-direction can be two when one write word line is shared by the TMR elements on the first and second stages and one write word line is shared by the TMR elements on the third and fourth stages, as shown in FIGS. 169 and 170.

Nevertheless, a number of the write word lines in one row extending in the X-direction is determined as three in this example because positions of the write bit lines in one column extending in the Y-direction are taken into consideration.

That is, in this example, one write bit line BLj0 extending in the Y-direction is arranged between the TMR element 12 on the first stage and the TMR element 12 on the second stage, and one write bit line BLj1 extending in the Y-direction is arranged between the TMR element 12 on the third stage and the TMR element 12 on the fourth stage.

As a result, as to the write bit lines in one column extending in the Y-direction, the TMR elements on the first and second stages share one write bit line, and the TMR elements on the third and fourth stages share one write bit line. In this case, a number of write bit lines in one column extending in the Y-direction is two.

Incidentally, in FIG. 1, the two write bit lines BLj0 and BLj1 sandwich the four TMR elements 12 in the block BKjn there between in the drawing since the TMR elements 12 can not be three-dimensionally drawn. Actually, however, one write bit line BLj0 is arranged between the TMR element on the first stage and the TMR element on the second stage and one write bit line BLj1 is arranged between the TMR element on the third stage and the TMR element on the fourth stage as described above.

The concrete structures of the TMR elements in the block and those in the vicinity thereof will become apparent in explanation of the later-described device structure.

One end of the write word lines WWL3n, WWL3n+1, WWL3n+2 extending in the X-direction is connected to a write word line driver 23A-n, and the other end of the same is connected to a write word line sinker 24-n.

A gate of the read selection switch RSW is connected to read word lines RWLn (n=0, 1, 2, . . . ). One read word line RWLn corresponds to one block BKjk in one column and is common to a plurality of blocks BKjk arranged in the X-direction.

For example, when one column is constituted by four blocks, a number of read word lines RWLn is four. The read word lines RWLn extend in the X-direction, and one end thereof is connected to a read word line driver 23B-n.

A row decoder 25-n selects one of the write word lines WWL3n, WWL3n+1 and WWL3n+2 based on a row address signal during the write operation. The write word line driver 23A-n supplies a write current to the selected write word line. The write current flows through the selected word line and is absorbed into the write word line sinker 24-n.

The row decoder 25-n selects blocks in one row during the read operation based on, e.g., high order row address signals. The read word line driver 23B-n supplies a word line voltage to the read word line RWLn connected to the selected blocks BK0n, . . . BKjn. Since the read selection switch RSW enters on the on state in the selected blocks BK0n, . . . BKjn, the read current flows to a ground point through a plurality of the TMR elements in the selected blocks BK0n, . . . BKjn.

The other end of the four TMR elements in the block BKik is connected to the read bit line BLj. One end of the read bit lines BLj is connected to a common data line 28 through a column selection switch (MOS transistor) SWA. The common data line 28 is connected to a read circuit (including a sense amplifier) 29B.

One end of the write bit lines BLj0 and BLj1 is connected to a circuit block 29A including the write bit line driver and the write bit line sinker.

The other end of the write bit lines BLj0 and BLj1 is connected to a circuit block 31 including the write bit line driver and the write bit line sinker.

A column selection line signal CSLj (j=0, 1, . . . ) is inputted to a gate of a column selection switch SWA. A column decoder 32 outputs the column selection line signal CSLj.

In the magnetic random access memory of this example, one column is constituted by a plurality of blocks and performs reading in units of block. Furthermore, one block is constituted by a plurality of TMR elements which are superposed in a plurality of stages and connected to each other in series.

When such a cell array structure is adopted, the TMR elements can be three-dimensionally arranged on the semiconductor substrate, and associating one MOS transistor (read selection switch) with a plurality of the TMR elements can suffice. Thus, as a result, this can contribute to increase in the memory capacity.

② Device Structure 1

The device structure will now be described.

Figure 3:
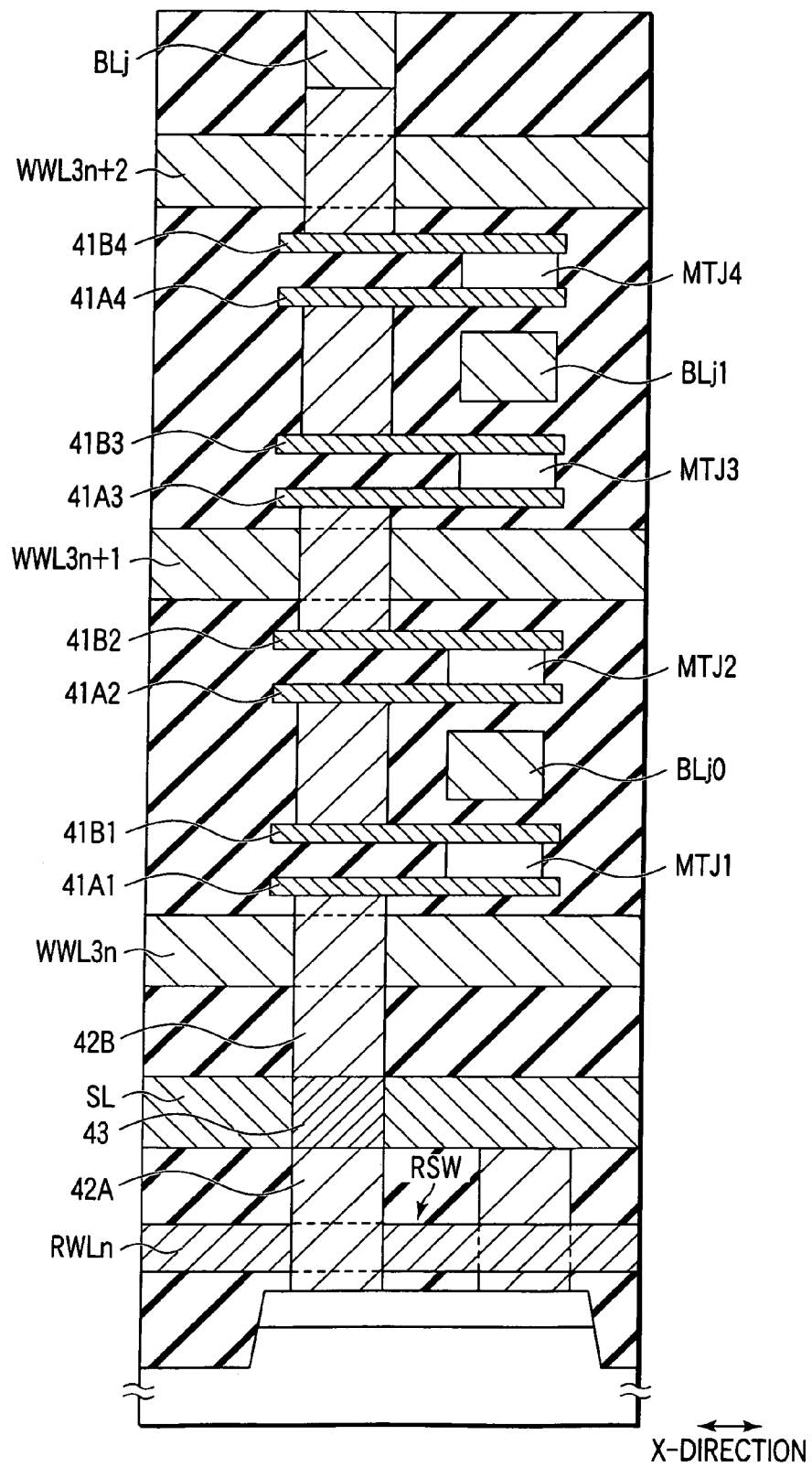
FIG. 3 is a sectional view concerning Structure Example 1 of the magnetic random access memory according to the present invention.

FIGS. 2 and 3 show the device structure of one block of the magnetic random access memory as Structure Example 1 according to the present invention.

FIG. 2 shows a cross section of one block of the magnetic random access memory in the Y-direction, and FIG. 3 shows a cross section of one block of the magnetic random access memory in the X-direction. Elements shown in FIGS. 2 and 3 are denoted by the same reference numerals as those in FIG. 1 so that they can correspond to the elements in the circuit of FIG. 1.

A read selection switch (MOS transistor) RSW is arranged in a surface area of a semiconductor substrate 41. A source of the read selection switch RSW is connected to a ground point through the source line SL. The source line SL extends straightway in, e.g., the X-direction.

A gate of the read selection switch (MOS transistor) RSW is a read word line RWLn. The read word line RWLn extends in the X-direction. Four TMR elements (MTJ (Magnetic Tunnel Junction) elements) MTJ1, MTJ2, MTJ3 and MTJ4 are superposed on the read selection switch RSW.

The respective TMR elements MTJ1, MTJ2, MTJ3 and MTJ4 are arranged between the lower electrodes 41A1, 41A2, 41A3 and 41A4 and the upper electrodes 41B1, 41B2, 41B3 and 41B4. Contact plugs 42B, 42C, 42D, 42E and 42F connects the four TMR elements MTJ1, MTJ2, MTJ3 and MTJ4 to each other in series.

The lower electrode 41A1 of the TMR element MTJ1 on the lowermost stage is connected to a drain of the read selection switch (MOS transistor) RSW through the contact plugs 42A and 42B and an intermediate layer 43. The upper electrode 41B4 of the TMR element MTJ4 on the uppermost stage is connected to the read bit line BLj which extends in the Y direction through the contact plug 42F.

The write word line WWL3n is arranged directly below the TMR element MTJ1, the write word line WWL3n+1 is arranged between the TMR element MTJ2 and the TMR element MTJ3, and the write word line WWL3n+2 is arranged directly above the TMR element MTJ4. The write word lines WWL3n, WWL3n+1 and WWL3n+2 extend in the X-direction.

The write bit line BLj0 is arranged between the TMR element MTJ1 and the TMR element MTJ2, and the write bit line BLj1 is arranged between the TMR element MTJ3 and the TMR element MTJ4. The write bit lines BLj0 and BLj1 extend in the Y-direction.

According to such a device structure, a plurality of (four in this example) the TMR elements MTJ1, MTJ2, MTJ3 and MTJ4 are provided with respect to one read selection switch RSW. Further, these TMR elements MTJ1, MTJ2, MTJ3 and MTJ4 are superposed on the read selection switch RSW and connected to each other in series.

Furthermore, in this case, providing only one read bit line BLj to, e.g., the uppermost layer can suffice. Moreover, at least one of the write word lines WWL3n, WWL3n+1 and WWL3n+2 and the write bit lines BLj0 and BLj1 can be shared by two TMR elements.

Therefore, according to such a device structure, the TMR elements can be arranged on the semiconductor substrate with the high density, which contributes to increase in the memory capacity. In addition, since a number of wirings arranged in the array of the TMR elements (for example, the write word lines, the write bit lines, the read bit lines or the like) can be reduced, planation of the insulating film directly below the TMR elements can be realized, thereby improving the characteristic of the TMR elements.

③ Device Structure 2

Description will now be given as to a plane layout in each stage (or each wiring layer) of the magnetic random access memory shown in FIGS. 2 and 3.

Figure 4:
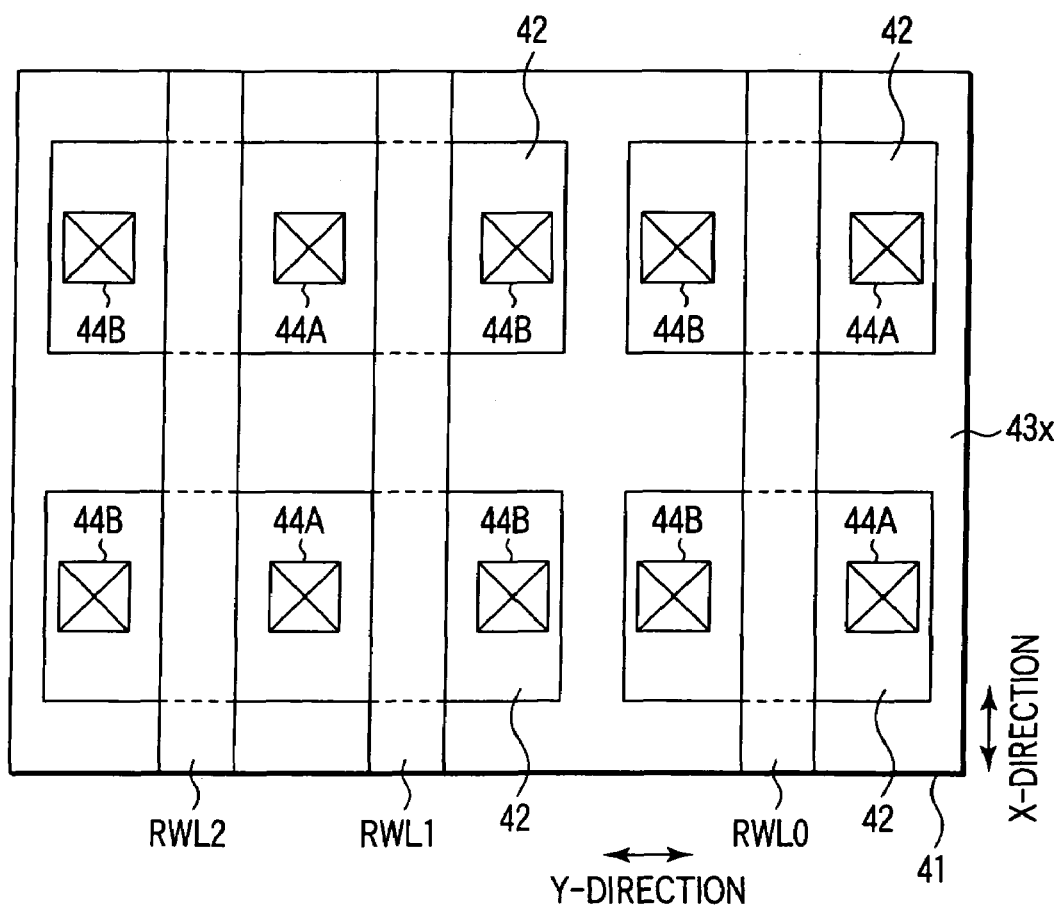
FIG. 4 is a view showing a layout of an active regions and read word lines of Structure Example 1.

FIG. 4 shows a layout of the active regions and the read word lines.

The active regions 42 on the semiconductor substrate 41 is surrounded by an element separation area 43x. The active regions 42 means an area forming the read selection switch (MOS transistor).

The read word lines RWL0, RWL1 and RWL2 which extend in the X-direction and cut across the active regions 42 are arranged on the semiconductor substrate 41. Each read word lines of RWL0, RWL1 and RWL2 is a gate electrode of a group of the read selection switches (MOS transistors), respectively.

The active regions on one side of the read word lines RWL0, RWL1 and RWL2 becomes a source of the read selection switch, and the active regions on the other side of the read word lines RWL0, RWL1 and RWL2 becomes a drain of the read selection switch.

A contact portion 44A is a source contact portion with respect to the source of the read selection switch, and a contact portion 44B is a drain contact portion with respect to the drain of the read selection switch.

Figure 5:
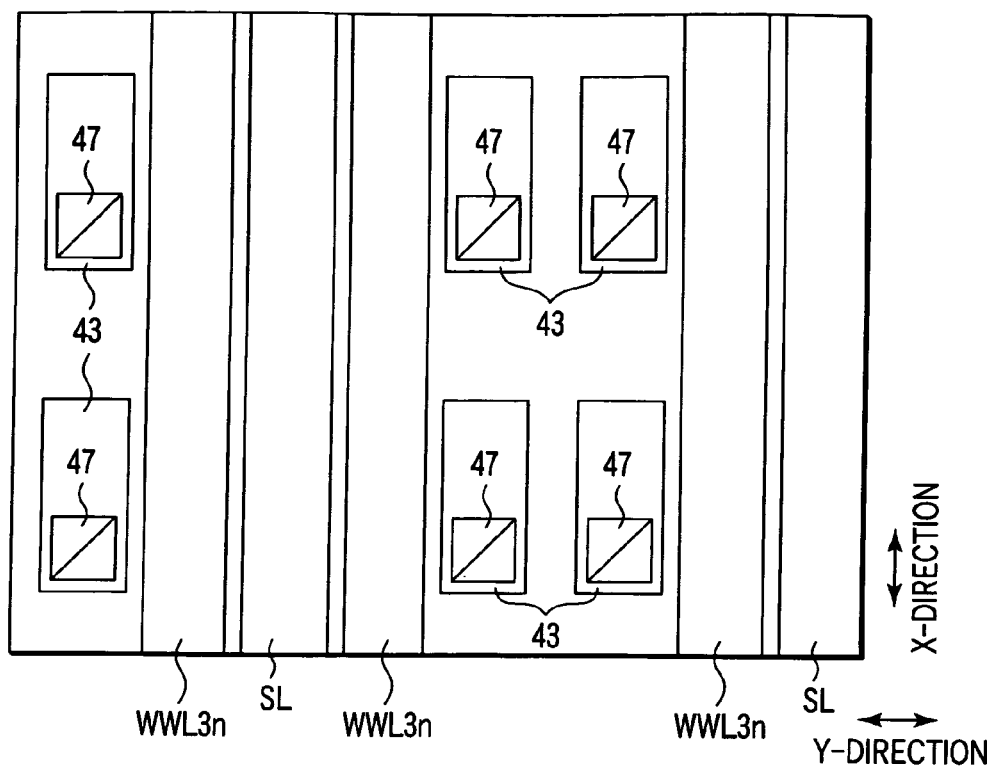
FIG. 5 is a view showing a layout of source lines and write word lines of Structure Example 1.

FIG. 5 shows a layout of the source lines SL and the write word lines WWL3n.

The source lines SL extend in the X-direction. The intermediate layer 43 is formed in the same wiring layer as the source line SL. The intermediate layer 43 serves to prevent a contact hole having a high aspect ratio from being formed. A contact portion 47 represents a contact portion relative to the intermediate layer 43 and the lower electrode of the TMR element on the first stage (lowermost stage).

The write word line WWL3n acts as a write word line with respect to the TMR element on the first stage. The write word line WWL3n is, as apparent from FIGS. 2 and 3, arranged above the source line SL and the intermediate layer 43 and directly below the TMR element MTJ1 on the first stage. The write word line WWL3n extends in the X-direction.

Figure 6:
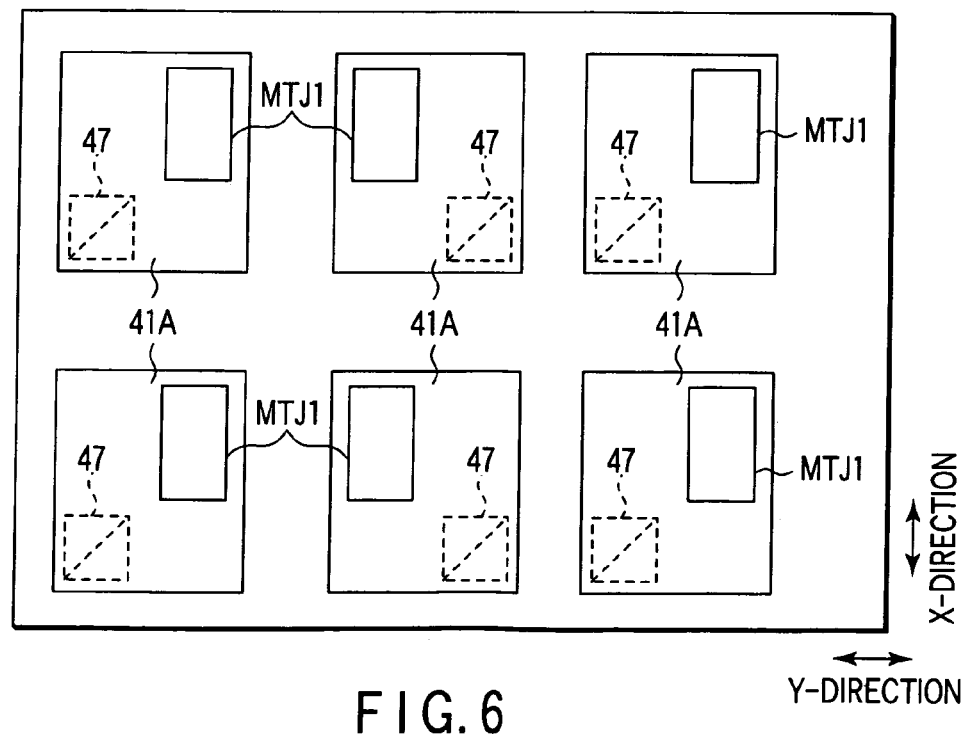
FIG. 6 is a view showing a layout of a first TMR element and its lower electrode of Structure Example 1.

FIG. 6 shows a layout of the TMR element MTJ1 on the first stage and its lower electrode 41A1.

The lower electrode 41A1 is, for example, rectangular and regularly arranged. The TMR element MTJ1 on the first stage is arranged above the lower electrode 41A1. A position at which the TMR element MTJ1 is arranged is, for example, a position at which it does not overlap the contact portion 47.

Figure 7:
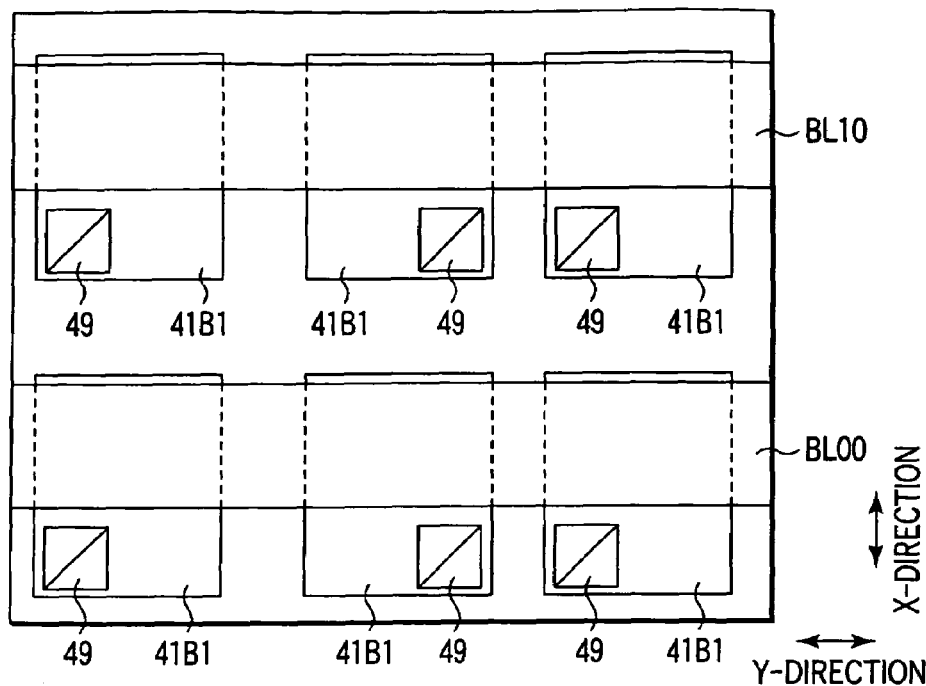
FIG. 7 is a view showing a layout of the first TMR element and its upper electrode of Structure Example 1.

FIG. 7 shows a layout of the upper electrode 41B1 of the TMR element MTJ1 on the first stage and the write bit lines BL00 and BL10.

The upper electrode 41B1 is, for example, rectangular and is arranged so as to overlap the lower electrode of the TMR element on the first stage. The contact portion 49 represents a contact portion with respect to the upper electrode 41B1 of the TMR element on the first stage and the lower electrode of the TMR element on the second stage.

The write bit lines BL00 and BL10 are arranged directly above the TMR element on the first stage and extend in the Y-direction. Additionally, as apparent from FIGS. 2 and 3, the write bit liens BL00 and BL10 are arranged directly below the TMR element on the second stage. The write bit lines BL00 and BL10 act as the write bit lines with respect to the TMR elements on the first and second stages.

Figure 8:
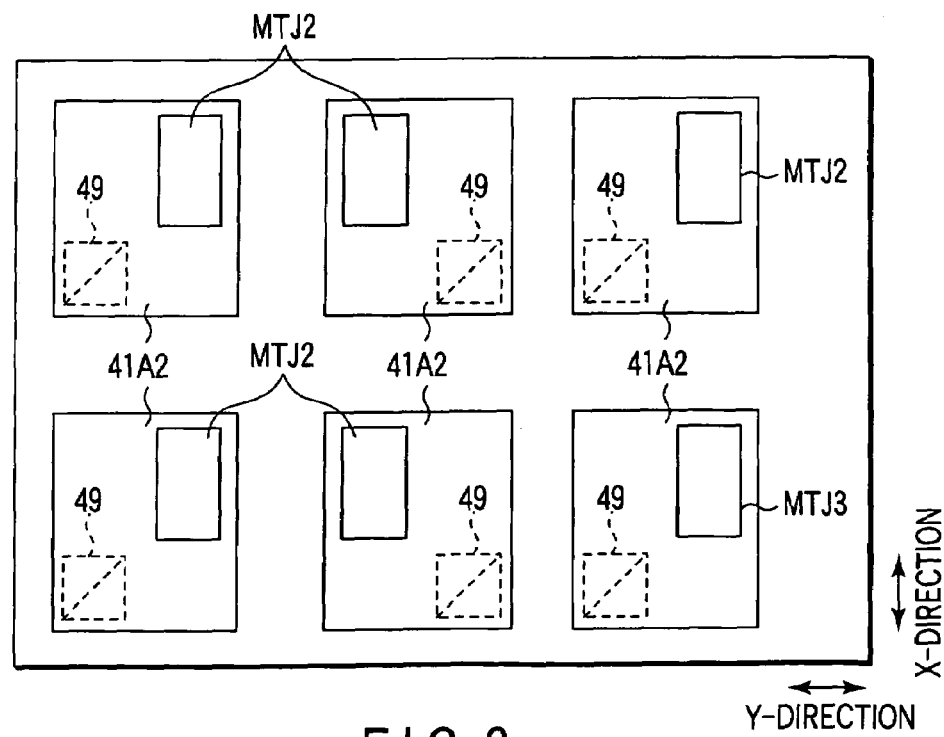
FIG. 8 is a view showing a layout of a second TMR element and its lower electrode of Structure Example 1.

FIG. 8 shows a layout of the TMR element MTJ2 on the second stage and its lower electrode 41A2.

The lower electrode 41A2 is, for example, rectangular and is regularly arranged. The TMR element on the second stage is arranged above the lower electrode 41A2. A position at which the TMR element MTJ2 is arranged is, for example, a position at which it does not overlap the contact portion 49.

Figure 9:
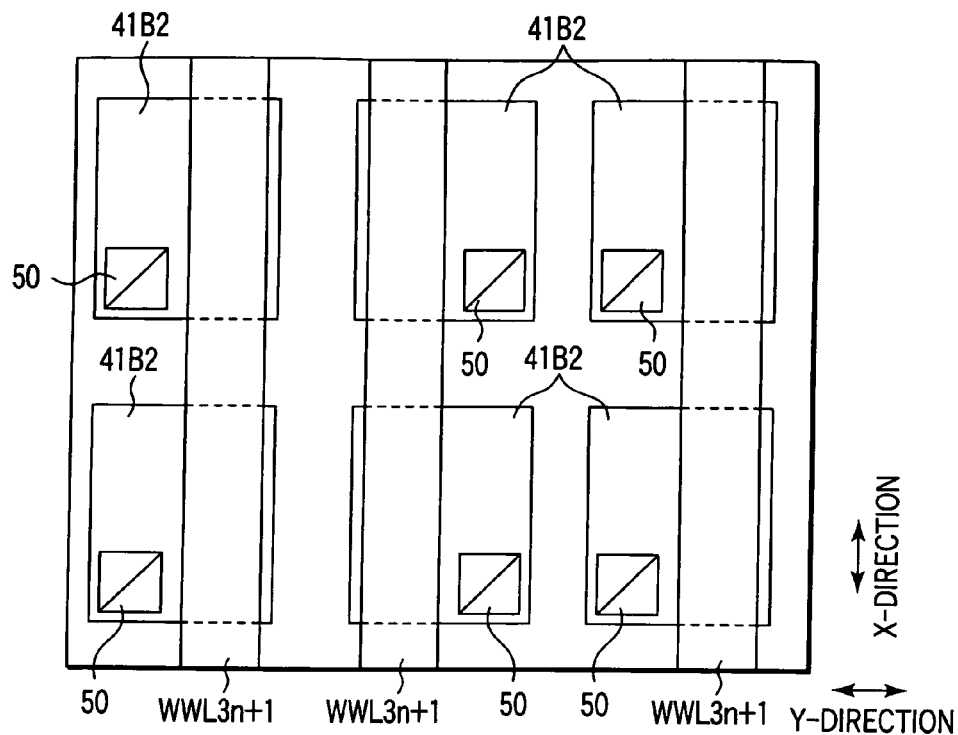
FIG. 9 is a view showing a layout of the second TMR element and its upper electrode of Structure Example 1.

FIG. 9 shows a layout of the upper electrode 41B2 of the TMR element MTJ2 on the second stage and the write word line WWL3+n.

The upper electrode 41B2 is, for example, rectangular and is arranged so as to overlap the lower electrode of the TMR element on the second stage. The contact portion 50 represents a contact portion with respect to the upper electrode 41B2 of the TMR element on the second stage and the lower electrode of the TMR element on the third stage.

The write word line WWL3n+1 acts as the write word line relative to the TMR elements on the second and third stages. As apparent from FIGS. 2 and 3, the write word line WWL3n+1 is arranged between the TMR element MTJ2 on the second stage and the TMR element MTJ3 on the third stage and extends in the X-direction.

Figure 10:
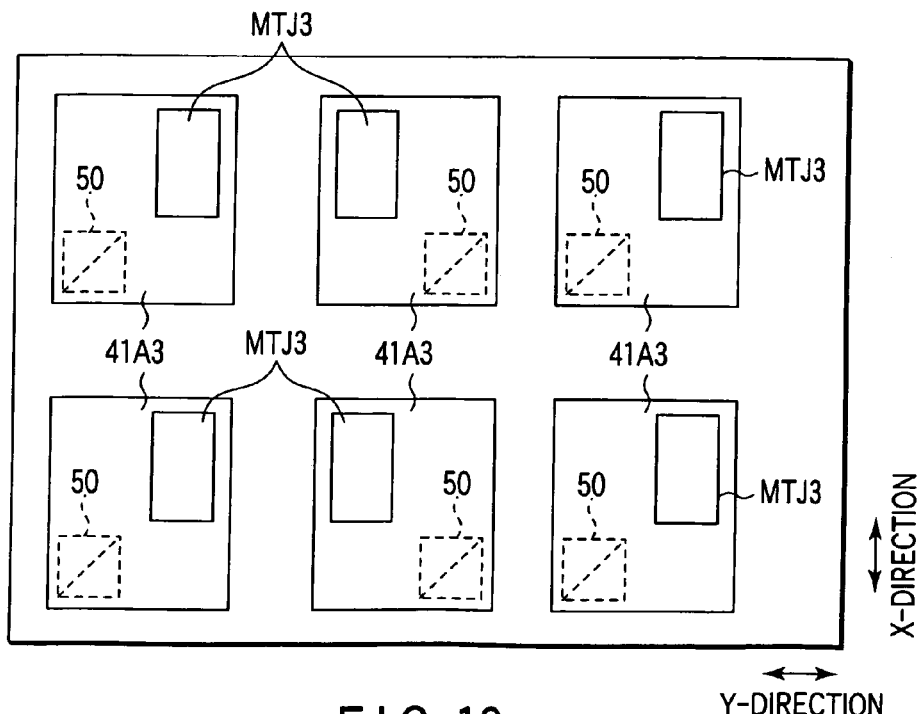
FIG. 10 is a view showing a layout of a third TMR element and its lower electrode of Structure Example 1.

FIG. 10 shows a layout of the TMR element MTJ3 on the third stage and its lower electrode 41A3.

The lower electrode 41A3 is, for example, rectangular and is regularly arranged. The TMR element MTJ3 on the third stage is arranged on the lower electrode 41A3. A position at which the TMR element MTJ3 is arranged, for example, a position at which it does not overlap the contact portion 50.

Figure 11:
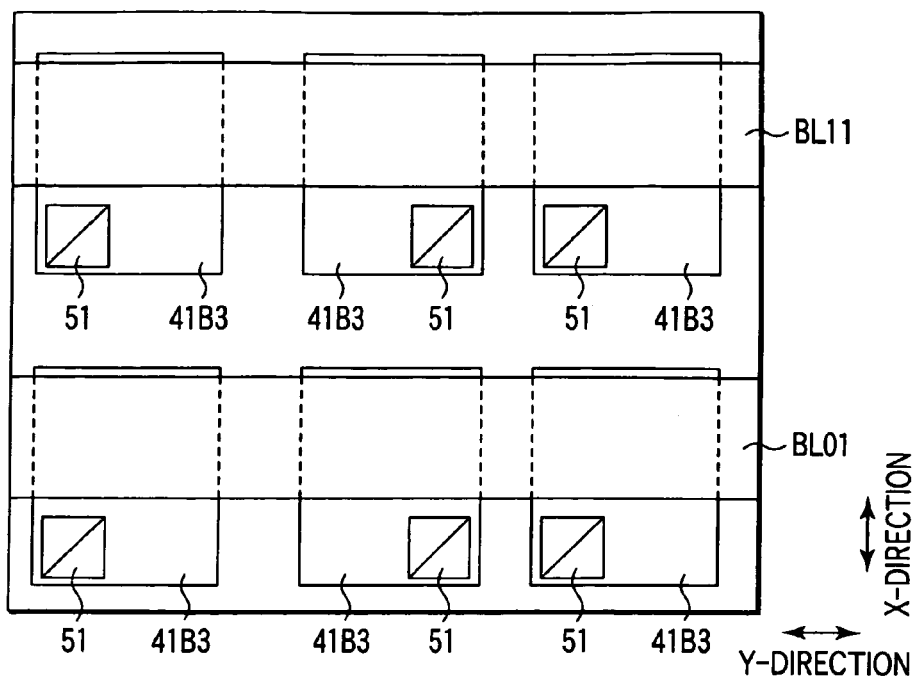
FIG. 11 is a view showing a layout of the third TMR element and its upper electrode of Structure Example 1.

FIG. 11 shows a layout of the upper electrode 41B3 of the TMR element MTJ3 on the third stage and the write bit lines BL01 and BL11.

The upper electrode 41B3 is, for example, rectangular and is arranged so as to overlap the lower electrode of the TMR element on the third stage. The contact portion 51 represents a contact portion with respect to the upper electrode 41B3 of the TMR element on the third stage and the lower electrode of the TMR element on the fourth stage.

The write bit lines BL01 and BL11 are arranged directly above the TMR element on the third stage and extend in the Y-direction. Further, as apparent from FIGS. 2 and 3, the write bit lines BL01 and BL11 are arranged directly below the TMR element on the fourth stage. The write bit lines BL01 and BL11 act as the write bit lines with respect to the TMR elements on the third and fourth stages.

Figure 12:
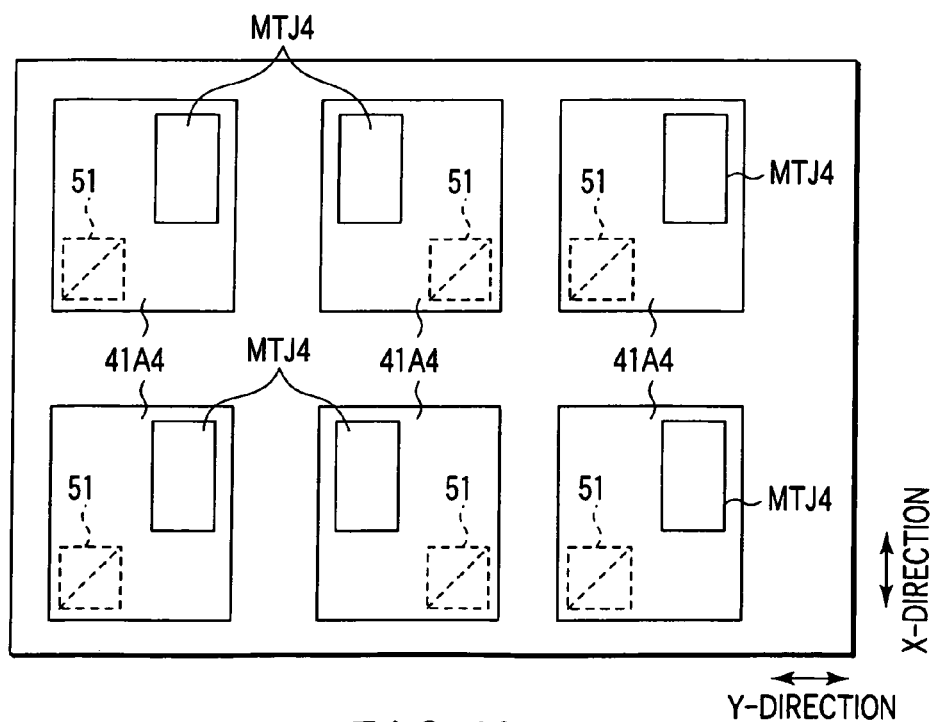
FIG. 12 is a view showing a layout of a fourth TMR element and its lower electrode of Structure Example 1.

FIG. 12 shows a layout of the TMR element MTJ4 on the fourth stage and its lower electrode 41A4.

The lower electrode 41A4 is, for example, rectangular and is regularly arranged. The TMR element MTJ4 on the fourth stage is arranged on the lower electrode 41A4. A position at which the TMR element MTJ4 is arranged is, for example, a position at which it does not overlap the contact portion 51.

Figure 13:
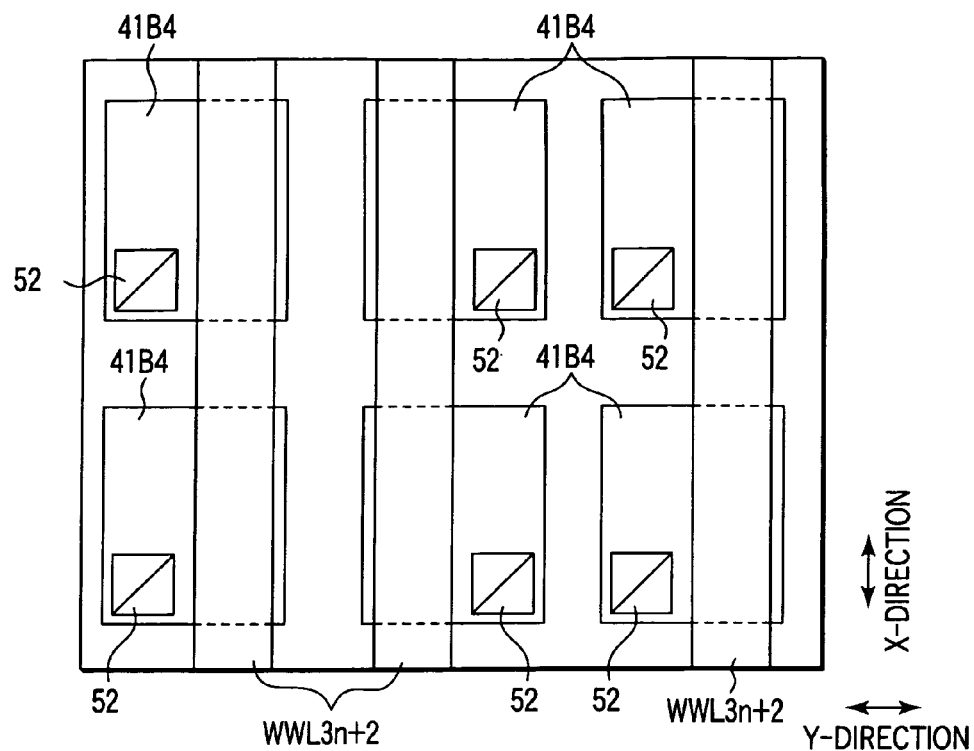
FIG. 13 is a view showing a layout of a fourth TMR element and its upper electrode of Structure Example 1.

FIG. 13 shows a layout of the upper electrode 41B4 of the TMR element MTJ4 on the fourth stage and the write word line WWL3n+2.

The upper electrode 41B4 is, for example, rectangular and is arranged so as to overlap the lower electrode of the TMR element on the fourth stage. The contact portion 52 represents a contact portion between the upper electrode 41B4 of the TMR element on the fourth stage and the read bit line.

The write word line WWL3n+2 acts as the write word line with respect to the TMR element on the fourth stage. The write word line WWL3n+2 is, as apparent from FIGS. 2 and 3, arranged directly above the TMR element MTJ4 on the fourth stage and extends in the X-direction.

Figure 14:
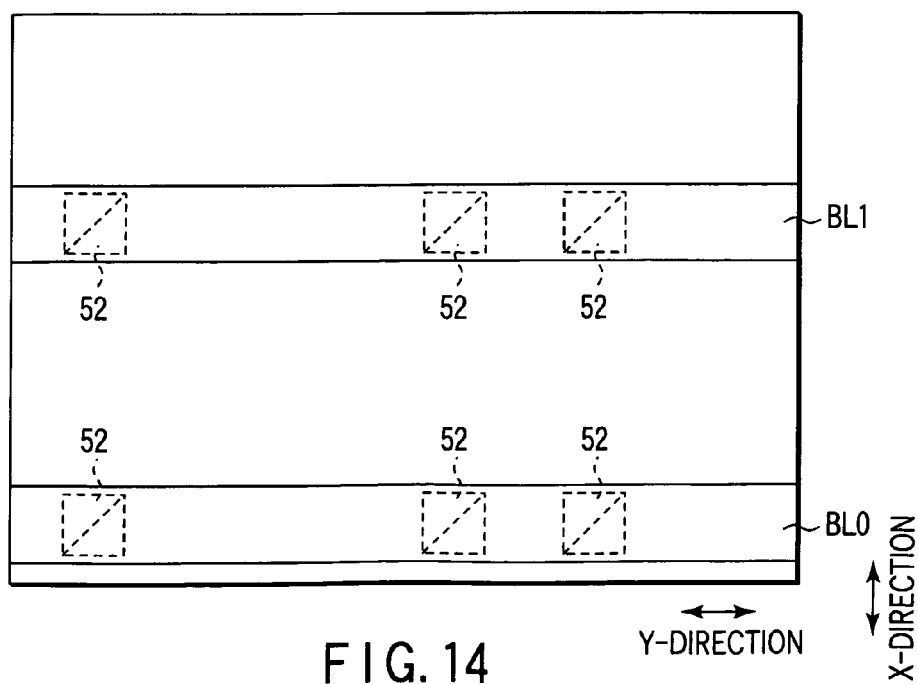
FIG. 14 is a view showing a layout of read bit lines of Structure Example 1.

FIG. 14 shows a layout of the read bit lines BL0 and BL1.

The read bit lines BL0 and BL1 extend in the Y-direction. Each one of the read bit lines BL0 and BL1 is arranged in one column and commonly connected to the block in one column. The contact portion 52 represents a contact portion between the upper electrode of the TMR element on the fourth stage and the read bit liens BL0 and BL1.

④ Modifications

Modifications of Structure Example 1 will now be described.

Figure 15:
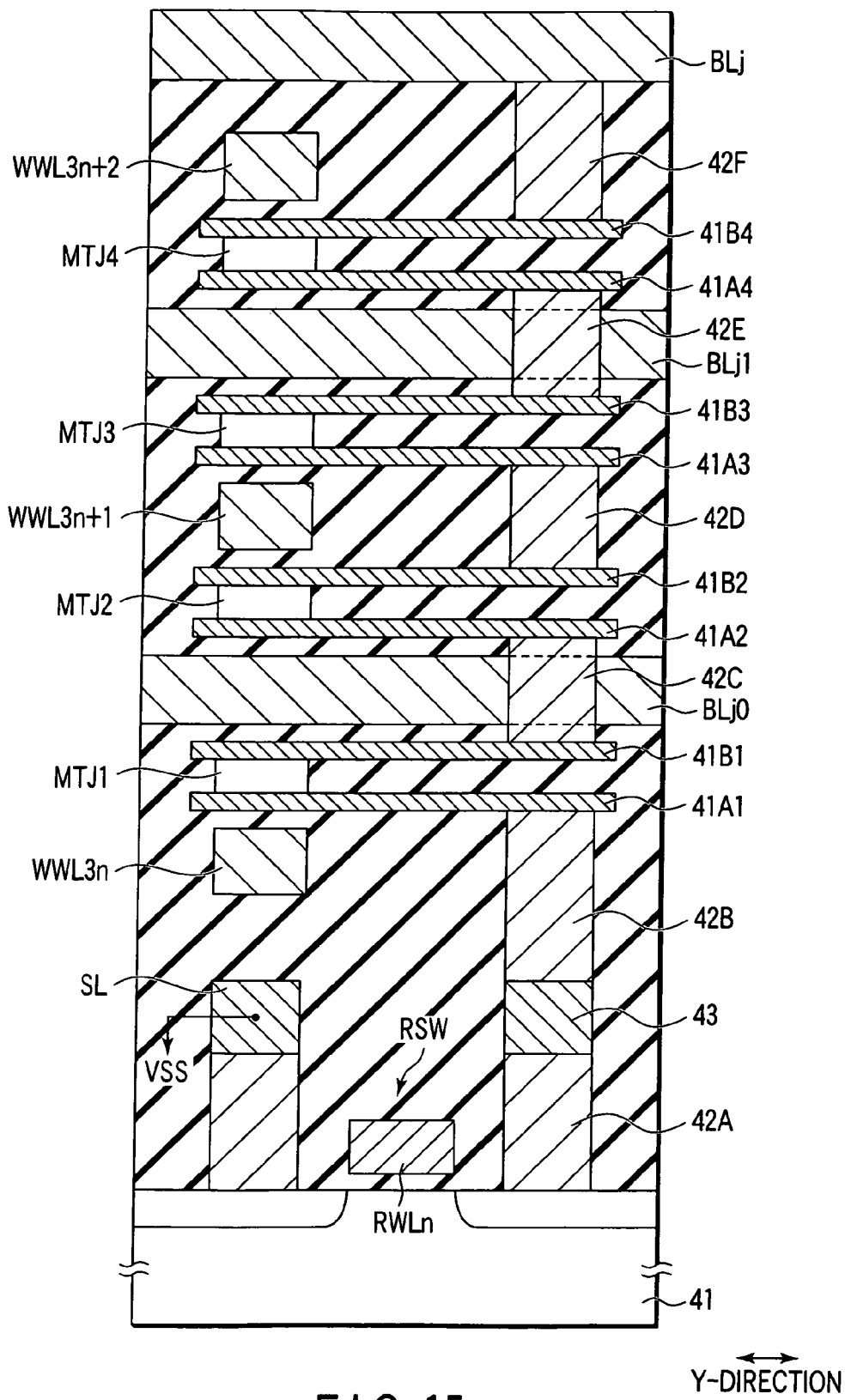
FIG. 15 is a view showing a first modification of Structure Example 1.

FIG. 15 shows a first modification of Structure Example 1.

This drawing corresponds to FIG. 2. The device structure of this example is different from that in FIG. 2 in the positions at which the TMR elements MTJ1, MTJ2, MTJ3 and MTJ4 are superposed.

That is, in the device structure shown in FIG. 2, the TMR elements MTJ1, MTJ2, MTJ3 and MTJ4 are superposed directly above the gate electrode of the read selection switch (MOS transistor) RSW, i.e., the read word line RWLn. On the contrary, in the device structure of this example, the TMR elements MTJ1, MTJ2, MTJ3 and MTJ4 are superposed directly above the source line SL connected to the source of the read selection switch (MOS transistor) RSW.

In order to realize high integration of the TMR elements, for example, sharing one source line SL by two blocks adjacent in the Y-direction is effective. When such sharing of the source line is taken into consideration, it can be said that the device structure shown in FIG. 2 is superior to the device structure illustrated in FIG. 15.

Figure 16:
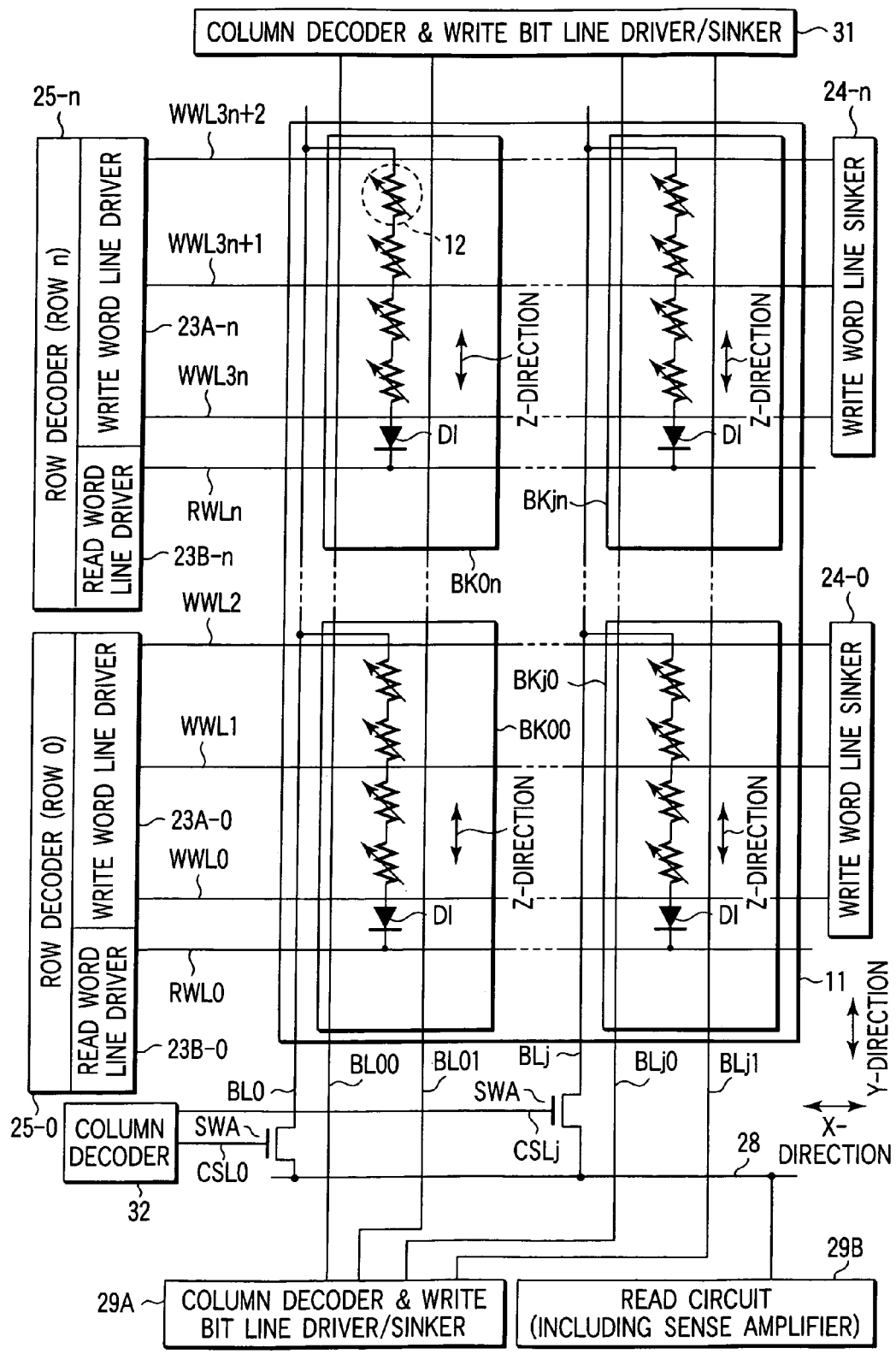
FIG. 16 is a circuit diagram showing a second modification of Structure Example 1.
Figure 17:
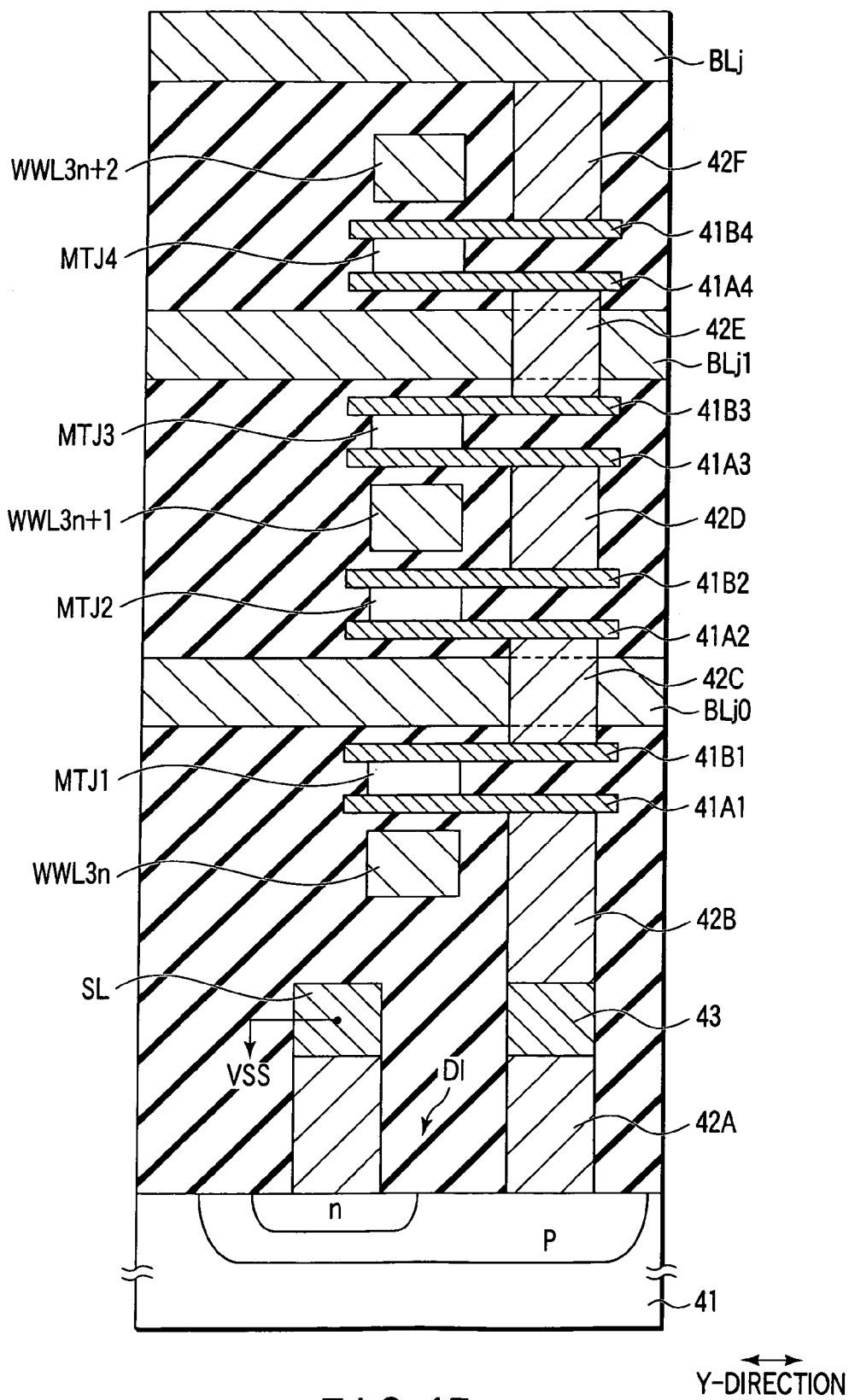
FIG. 17 is a sectional view showing the second modification of Structure Example 1.

FIGS. 16 and 17 show a second modification of Structure Example 1.

The circuit diagram of FIG. 16 corresponds to the circuit diagram of FIG. 1, and a sectional view showing the device structure in FIG. 17 corresponds to a sectional view showing the device structure in FIG. 2. The structure of this example is different from the structures shown in FIGS. 1 and 2 in an element which realizes the read selection switch.

That is, in the structures shown in FIGS. 1 and 2, the read selection switch is constituted by the MOS transistor. On the other hand, in the structure of this example, the read selection switch is constituted by a diode DI. Herewith, the read word lines RWL0, ..., RWLn are connected to a cathode of the diode DI.

When adopting the structure of this example, the read word line RWLi of the selected row is set to "L", i.e., the ground potential during the read operation. At this moment, the read current can be caused to flow to a plurality of the TMR elements which constitute the block of the selected row and connected to each other in series.

Figure 18:
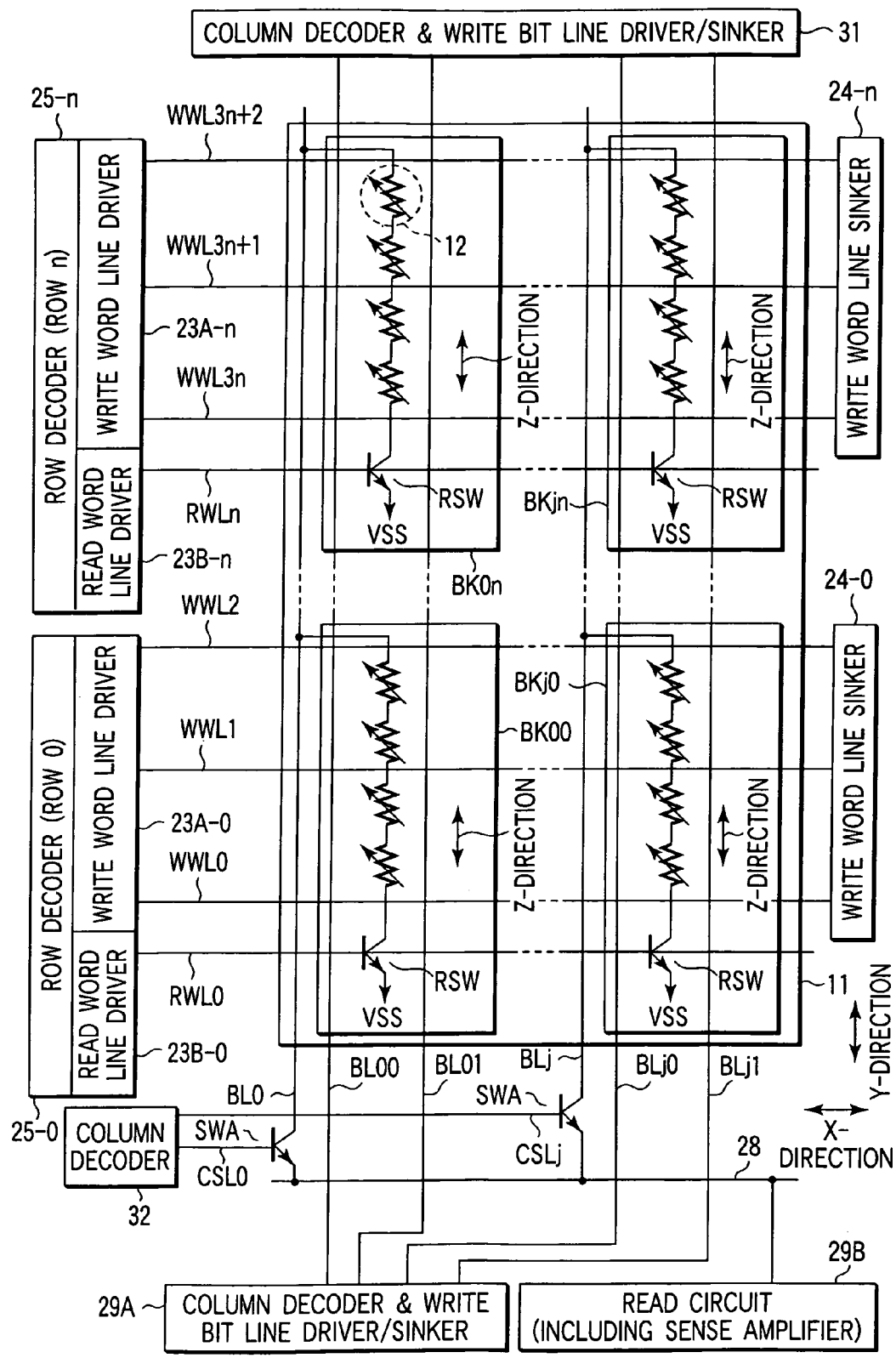
FIG. 18 is a circuit diagram showing a third modification of Structure Example 1.
Figure 19:
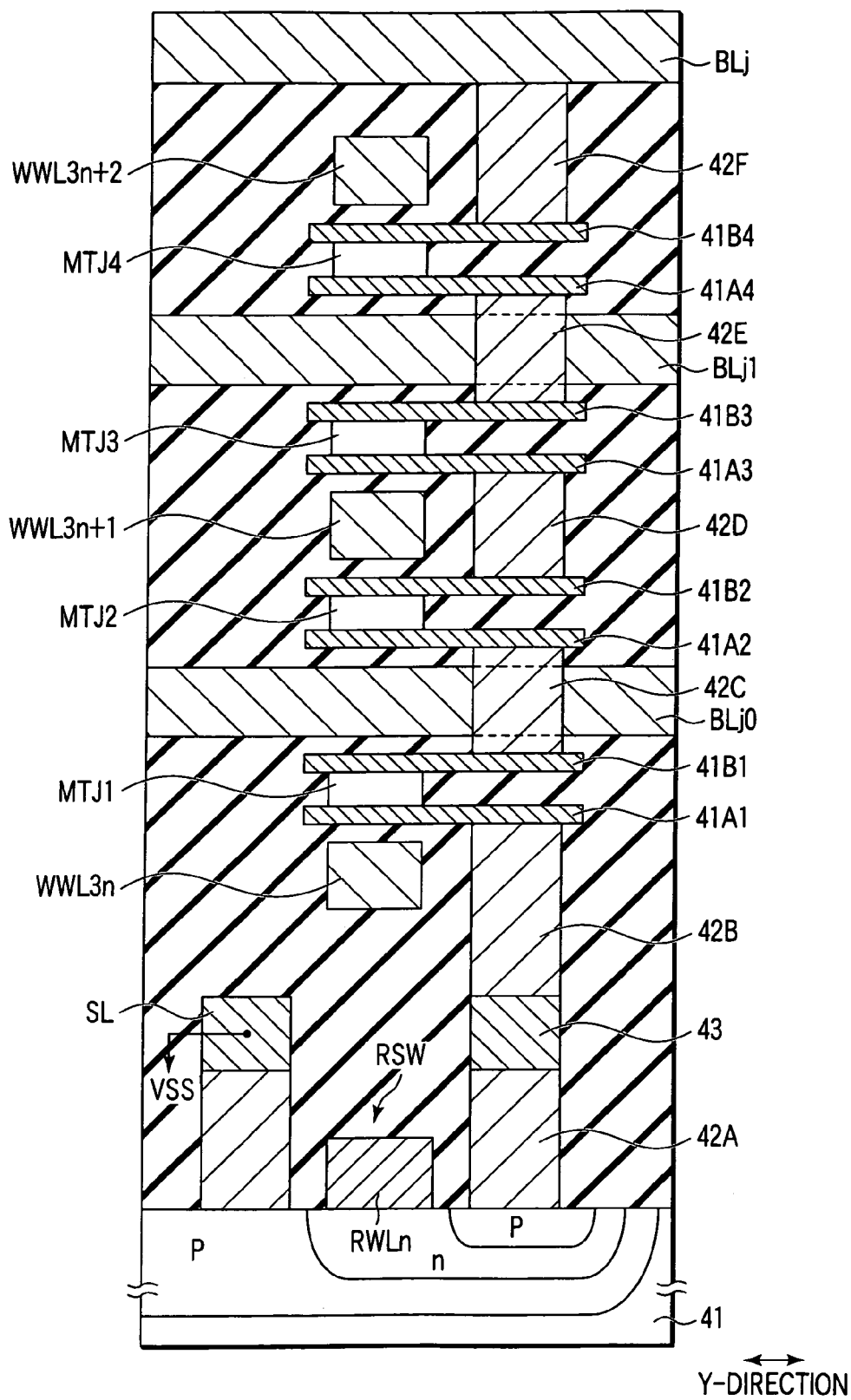
FIG. 19 is a sectional view showing the third modification of Structure Example 1.

FIGS. 18 and 19 show a third modification of Structure Example 1.

A circuit diagram of FIG. 18 corresponds to a circuit diagram of FIG. 1, and a sectional view showing the device structure in FIG. 19 corresponds to a sectional view showing the device structure in FIG. 2. The structure of this example is different from the structures in FIGS. 1 and 2 in types of the transistors constituting the memory cell array 11 and the peripheral circuit thereof.

That is, in the structures of FIGS. 1 and 2, the transistors constituting the memory cell array 11 and its peripheral circuit are the MOS transistors. On the contrary, in the structure of this example, the transistors constituting the memory cell array 11 and its peripheral circuit are bipolar transistors.

In case of the structure of this example, all of the transistors constituting the memory cell array 11 and its peripheral circuit may be bipolar transistors or some of them may be bipolar transistors.

(2) Structure Example 2

Structure example 2 concerns a cell array structure in which a plurality of TMR elements superposed in a plurality of stages are connected to each other in parallel.

① Circuit Configuration

The circuit configuration will be first described.

Figure 20:
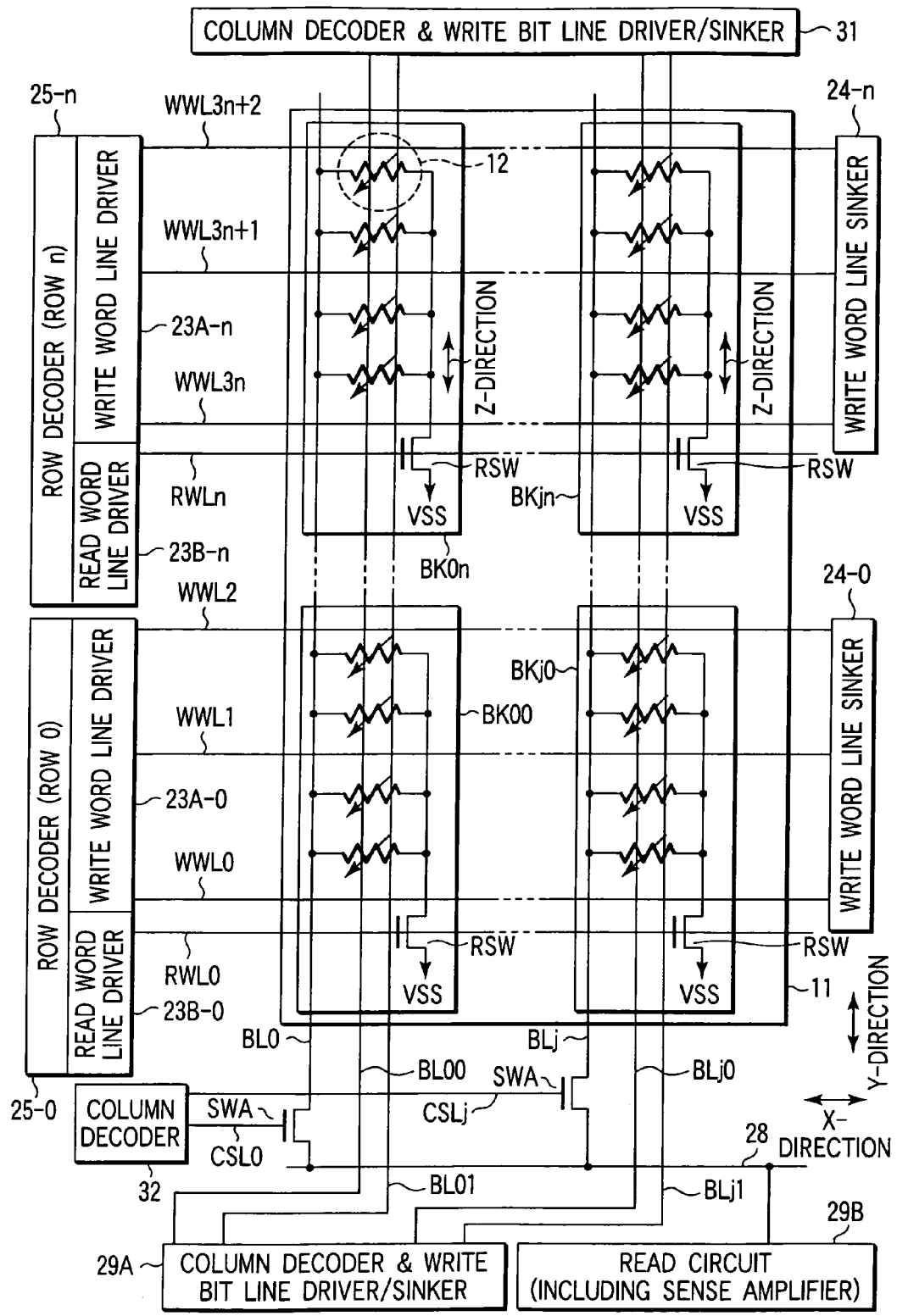
FIG. 20 is a circuit diagram concerning Structure Example 2 of a magnetic random access memory according to the present invention.

FIG. 20 shows primary parts of the magnetic random access memory as Structure Example 2 according to the present invention.

The memory cell array 11 has a plurality of TMR elements 12 arranged in the form of an array in directions X, Y and Z. The Z-direction means a direction which is orthogonal to the directions X and Y.

The memory cell array 11 has a cell array structure consisting of j+1 TMR elements 12 arranged in the X-direction, n+1 TMR elements 12 arranged in the Y-direction and four TMR elements 12 superposed in the Z-direction. Although a number of the TMR elements 12 superposed in the Z-direction is four in this example, it may be any number as long as it is a plural number.

The four TMR elements 12 superposed in the Z-direction are connected to each other in parallel and constitute one block BKik (i=0, 1, ..., j, k=0, 1, ... n). The four TMR elements in the block BKik actually overlap each other in the direction vertical to the memory cell array plane (Z-direction).

One end of the four TMR elements in the block BKik is connected to the contact point through the read selection switch (MOS transistor) RSW.

In this example, one row is constituted by j+1 blocks BKik arranged in the X-direction. The memory cell array 11 has n+1 rows. Furthermore, one column is constituted by n+1 blocks BKik arranged in the Y-direction. The memory cell array 11 has j+1 columns.

In the vicinity of the four TMR elements 12 constituting the block BKik, a plurality of (three in this example) write word lines WWL3n, WWL3n+1 and WWL3n+2 which extend in the X-direction and are superposed in the Z-direction are arranged. However, n is a number of each row, and n=0, 1, 2, ....

In regard to the write word lines extending in the X-direction, one write word line can be arranged on one stage in one row. In this case, a number of the write word lines in one row which extend in the X-direction is four, namely, equal to a number of stages on which the TMR elements 12 are superposed. As described in connection with Structure Example 1, however, increase in number of the write word lines in one row which extend in the X-direction is disadvantageous in planation of the insulating film directly below the TMR elements 12 or reduction in the manufacturing cost.

Thus, in this example, at least one of the write word lines in one row which extend in the X-direction is shared by two TMR elements (the TMR element on the upper stage and the TMR element on the lower stage). Specifically, in this example, the write word line WWL3n+1 is shared by the TMR element on the second stage and the TMR element on the third stage.

In terms of the block structure, if one write word line is shared by the TMR elements on the first and second stages and one write word line is shared by the TMR elements on the third and fourth stages, a number of the write word lines in one row which extend in the X-direction can be two. Nevertheless, a number of the write word lines in one row which extend in the X-direction is three in this example because positions of the write bit lines in one column which extend in the Y-direction are taken into consideration.

That is, in this example, one write bit line BLj0 which extends in the Y-direction is arranged between the TMR element 12 on the first stage and the TMR element on the second stage, and one write bit line BLj1 which extends in the Y-direction is arranged between the TMR element 12 on the third stage and the TMR element 12 on the fourth stage.

As a result, in regard to the write bit lines in one column which extend in the Y-direction, one write bit line is shared by the TMR elements on the first and second stages and one write bit line is shared by the TMR elements on the third and fourth stages. In this case, a number of the write bit lines in one column which extend in the Y-direction is two.

Incidentally, in FIG. 20, the two write bit lines BLj0 and BLj1 are illustrated so as to cross the four TMR elements in the block BKjn because the TMR elements 12 can not be three-dimensionally drawn. Practically, however, as described above, one write bit line BLj0 is arranged between the TMR element on the first stage and the TMR element on the second stage, and one write bit line BLj1 is arranged between the TMR element on the third stage and the TMR element on the fourth stage.

The concrete structure of the TMR elements in the block and in the vicinity thereof will be revealed in explanation of the later-described device structure.

One end of the write word lines WWL3n, WWL3n+1 and WWL3n+2 which extend in the X-direction is connected to the write word line driver 23A-n, and the other end of the same is connected to the write word line sinker 24-n.

A gate of the read selection switch RSW is connected to the read word line RWLn (n=0, 1, 2, ... ). One read word line RWLn corresponds to one block BKjk in one column and are common to a plurality of blocks BKjk arranged in the X-direction.

For example, when one column is constituted by four blocks, a number of the read word lines RWLn is four. The read word lines RWLn extend in the X-direction and one end thereof is connected to the read word line driver 23B-n.

The row decoder 25-n selects one of the write word lines WWL3n, WWL3n+1, WWL3n+2 based on a row address signal during the write operation. The write word line driver 23A-n supplies the write current to the selected write word line. The write current flows through the selected word line and is absorbed into the write word line sinker 24-n.

The row decoder 25-n selects blocks in one row based on, e.g., high order row address signals during the read operation. The read word line driver 23B-n supplies the read word line voltage to the read word line RWLn connected to the selected blocks BK0n, . . . BKjn. Since the read selection switch RSW enters the on state in the selected blocks BK0n, . . . BKjn, the read current passes through a plurality of the TMR elements in the selected blocks BK0n, . . . BKjn and flows to the ground point.

The other end of the four TMR elements in the block BKik is connected to the read bit line BLj. One end of the read bit lines BLj is connected to the common data line 28 through the column selection switch (MOS transistor) SWA. The common data line 28 is connected to the read circuit (including a sense amplifier) 29B.

One end of the write bit lines BLj0 and BLj1 is connected to the circuit block 29A including the write bit line driver and the write bit line sinker.

The other end of the write bit lines BLj0 and BLj1 is connected to the circuit block 31 including the write bit line driver and the write bit line sinker.

A column selection line signal CSLj (j=0, 1, . . . ) is inputted to a gate of the column selection switch SWA. The column decoder 32 outputs the column selection line signal CSL.

In the magnetic random access memory of this example, one column is constituted by a plurality of blocks and performs reading in units of block. Moreover, one block is constituted by a plurality of TMR elements which are superposed in a plurality of stages and connected to each other in parallel.

With such a cell array structure, the TMR elements can be three-dimensionally arranged on the semiconductor substrate and associating one MOS transistor (read selection switch) with a plurality of the TMR elements can suffice, and hence this contributes to increase in the memory capacity.

② Device Structure 1

The device structure will now be described.

Figure 21:
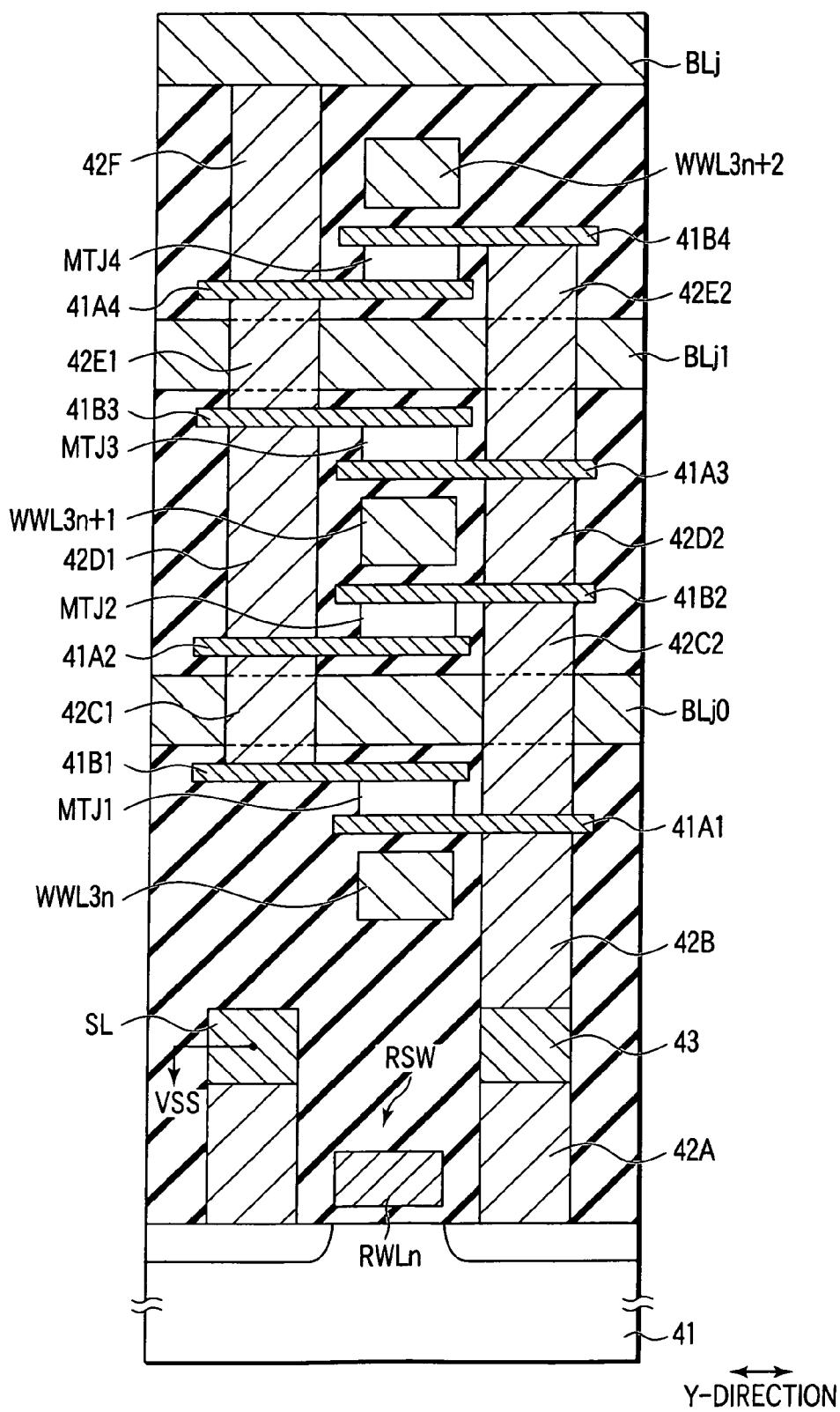
FIG. 21 is a sectional view concerning Structure Example 2 of the magnetic random access memory according to the present invention.
Figure 22:
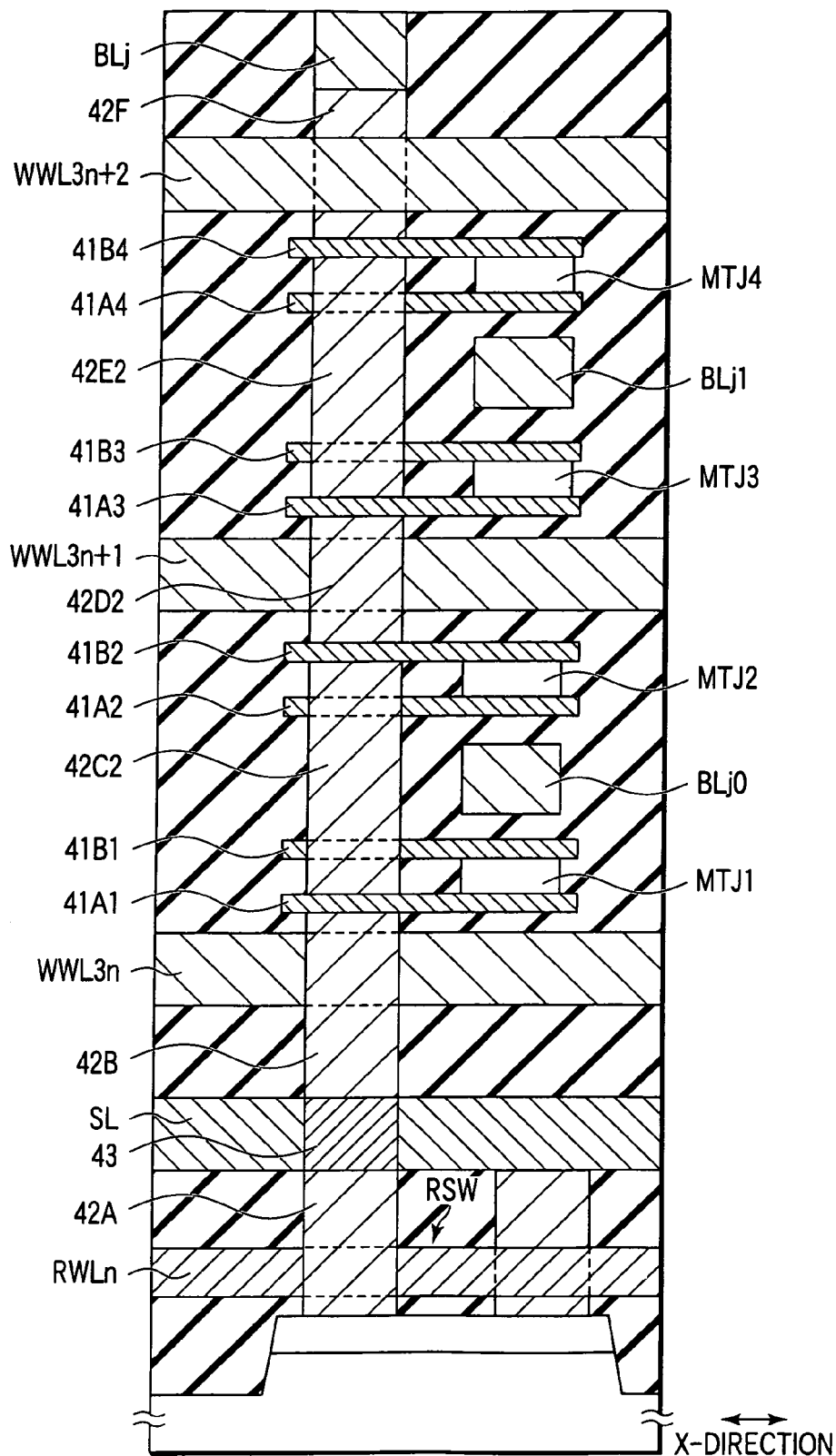
FIG. 22 is a sectional view concerning Structure Example 2 of the magnetic random access memory according to the present invention.

FIGS. 21 and 22 show the device structure of one block of the magnetic random access memory as Structure Example 2 according to the present invention.

FIG. 21 shows a cross section of one block of the magnetic random access memory in the Y-direction, and FIG. 22 shows a cross section of one block of the magnetic random access memory in the X-direction. Elements shown in FIGS. 21 and 22 are denoted by the same reference numerals as those in FIG. 20 so that they can correspond to elements of the circuit in FIG. 20.

A read selection switch (MOS transistor) RSW is arranged in a surface area of the semiconductor substrate 41. A source of the read selection switch RSW is connected to the ground point through a source line SL. The source line SL extends in, for example, the X-direction straightway.

A gate of the read selection switch (MOS transistor) RSW is the read word line RWLn. The read word line RWLn extends in the X-direction. Four TMR elements (MTJ (Magnetic Tunnel Junction) elements) MTJ1, MTJ2, MTJ3 and MTJ4 are superposed on the read selection switch RSW.

The respective TMR elements MTJ1, MTJ2, MTJ3 and MTJ4 are arranged between the lower electrodes 41A1, 41A2, 41A3 and 41A4 and the upper electrodes 41B1, 41B2, 41B3 and 41B4. Contact plugs 42C1, 42C2, 42D1, 42E1 and 42E1 are connect the four TMR elements MTJ1, MTJ2, MTJ3 and MTJ4 to each other in parallel.

The lower electrode 41A1 of the TMR element MTJ1 on the lowermost stage is connected to a drain of the read selection switch (MOS transistor) RSW through the contact plugs 42A and 42B and an intermediate layer 43. The upper electrode 41B4 of the TMR element MTJ4 on the uppermost stage is connected to the read bit line BLj which extends in the Y-direction through the contact plug 42F.

The write word line WWL3n is arranged directly below the TMR element MTJ1, the write word line WWL3n+1 is arranged between the TMR element MTJ2 and the TMR element MTJ3, and the write word line WWL3n+2 is arranged directly above the TMR element MTJ4. The write word lines WWL3n, WWL3n+1 and WWL3+2 extend in the X-direction.

The write bit line BLj0 is arranged between the TMR element MTJ1 and the TMR element MTJ2, and the write bit line BLj1 is arranged between the TMR element MTJ3 and the TMR element MTJ4. The write bit lines BLj0 and BLj1 extend in the Y-direction.

According to such a device structure, a plurality of (four in this example) the TMR elements MTJ1, MTJ2, MTJ3 and MTJ4 are provided to one read selection switch RSW. In addition, these TMR elements MTJ1, MTJ2, MTJ3 and MTJ4 are superposed on the read selection switch RSW and connected to each other in parallel.

Additionally, in this case, providing only one read bit line BLj to, e.g., the uppermost layer can suffice. Further, at least one of the write word lines WWL3n, WWL3n+1, WWL3n+2 and the write bit lines BLj0 and BLj1 can be shared by two TMR elements.

Therefore, according to such a device structure, the TMR elements can be arranged on the semiconductor substrate with the high density, which contributes to increase in the memory capacity. Further, since a number of wirings arranged in the array of the TMR elements (for example, the write word lines, the write bit lines, the read bit lines or the like) can be reduced, planation of the insulating film directly below the TMR elements can be realized, thereby improving the characteristic of the TMR elements.

③ Device Structure 2

Description will now be given as to a plane layout in each stage (or each wiring layer) of the magnetic random access memory shown in FIGS. 21 and 22.

Figure 23:
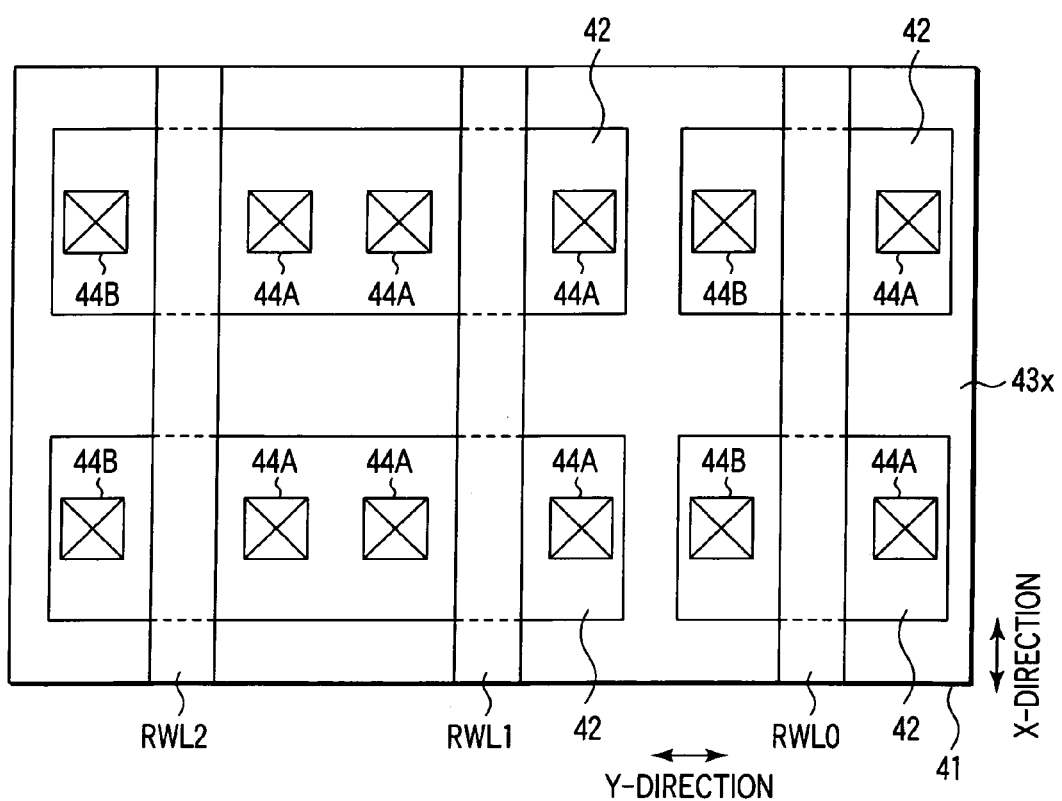
FIG. 23 is a view showing a layout of an active regions and read word lines of Structure Example 2.

FIG. 23 shows a layout of an active regions and read word lines.

The active regions 42 on the semiconductor substrate 41 is surrounded by the element separation area 43x. The active regions 42 means an area forming the read selection switch (MOS transistor).

Read word lines RWL0, RWL1 and RWL2 which extend in the X-direction and cut across the active regions 42 are arranged on the semiconductor substrate 41. Each read word lines of RWL0, RWL1 and RWL2 is a gate electrode of a group of the read selection switches (MOS transistors), respectively.

The active regions on one side of the read word lines RWL0, RWL1 and RWL2 becomes a source of the read selection switch, and the active regions on the other side of the read word lines RWL0, RWL1 and RWL2 becomes a drain of the read selection switch.

The contact portion 44A is a source contact portion relative to the source of the read selection switch, and the contact portion 44B is a drain contact portion relative to the drain of the read selection switch.

In this example, as apparent from FIGS. 21 and 22, since the TMR elements are connected to each other in parallel, a number of the contact plugs increases, and it is hard to reduce the distance between the two blocks adjacent to each other in the column direction.

Thus, in this example, the contact portion 44A with respect to the source of the read selection switch is provided in accordance with each block.

However, two block which are adjacent to each other in the column direction likewise share one source line. That is, two blocks which are adjacent to each other in the column direction share one source line also in Structure Example 2, as similar to Structure Example 1.

Figure 24:
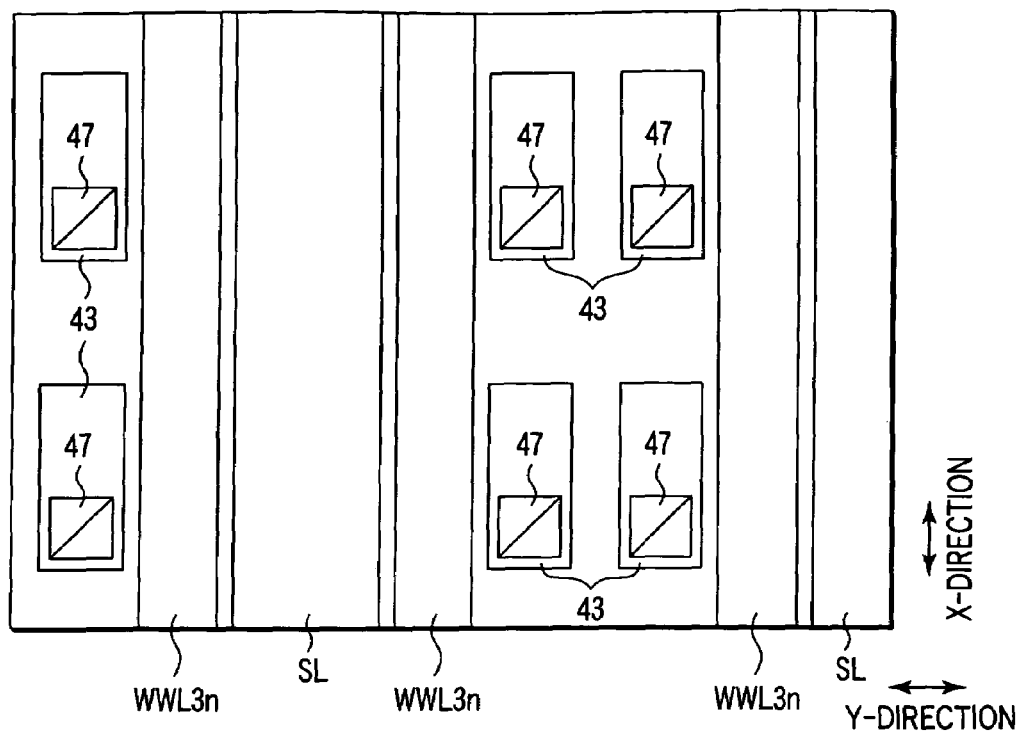
FIG. 24 is a view showing a layout of source lines and write word lines of Structure Example 2.

FIG. 24 shows a layout of the source lines SL and the write word lines WWL3n.

The source line SL extends in the X-direction. The source line SL is connected to the source of the read selection switch in two blocks which are adjacent to each other in the column direction.

The intermediate layer 43 is formed in the same wiring layer as that of the source line SL. The intermediate layer 43 serves to prevent a contact hole having a high aspect ratio from being formed. The contact portion 47 represents a contact portion between the intermediate layer 43 and the lower electrode of the TMR element on the first stage (lowermost stage).

The write word line WWL3n acts as the write word line with respect to the TMR element on the first stage. As apparent from FIGS. 21 and 22, the write word line WWL3n is arranged above the source line SL and the intermediate layer 43 and directly below the TMR element on the first stage. The write word line WWL3n extends in the X-direction.

Figure 25:
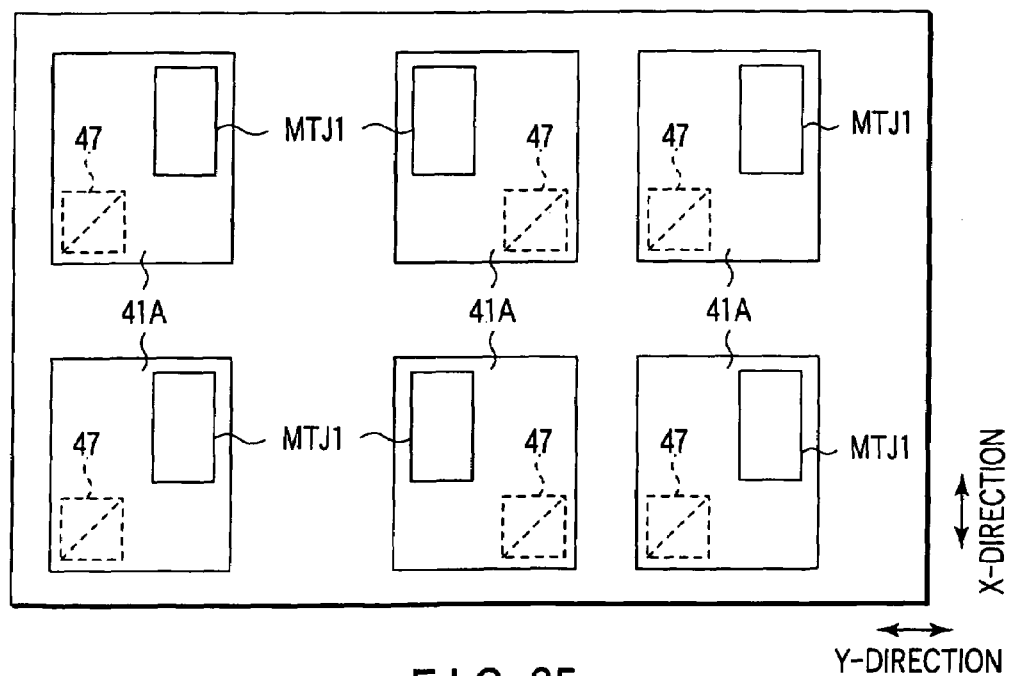
FIG. 25 is a view showing a layout of a first TMR element and its lower electrode of Structure Example 2.

FIG. 25 shows a layout of the TMR element MTJ1 on the first stage and its lower electrode 41A1.

The lower electrode 41A1 is, for example, rectangular and is regularly arranged. The TMR element MTJ1 on the first stage is arranged on the lower electrode 41A1. A position at which the TMR element MTJ1 is arranged is, for example, a position at which it does not overlap the contact portion 47.

Figure 26:
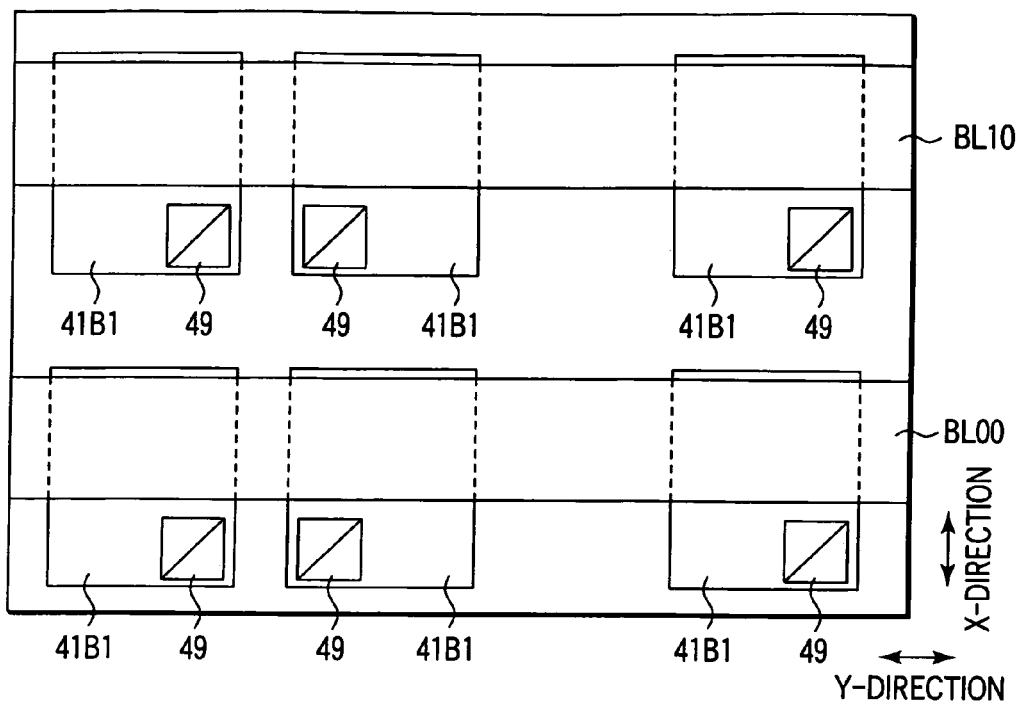
FIG. 26 is a view showing a layout of the first TMR element and its upper electrode of Structure Example 2.

FIG. 26 shows a layout of the upper electrode 41B1 of the TMR element MTJ1 on the first stage and the write bit lines BL00 and BL10.

The upper electrode 41B1 is, for example, rectangular and is arranged so as to overlap the lower electrode of the TMR element on the first stage. The contact portion 49 represents a contact portion between the upper electrode 41B1 of the TMR element on the first stage and the lower electrode of the TMR element on the second stage.

The write bit lines BL00 and BL10 are arranged directly above the TMR element on the first stage and extend in the Y-direction. Furthermore, as apparent from FIGS. 21 and 22, the write bit lines BL00 and BL10 are arranged directly below the TMR element on the second stage. The write bit lines BL00 and BL10 act as the write bit lines with respect to the TMR elements on the first and second stages.

Figure 27:
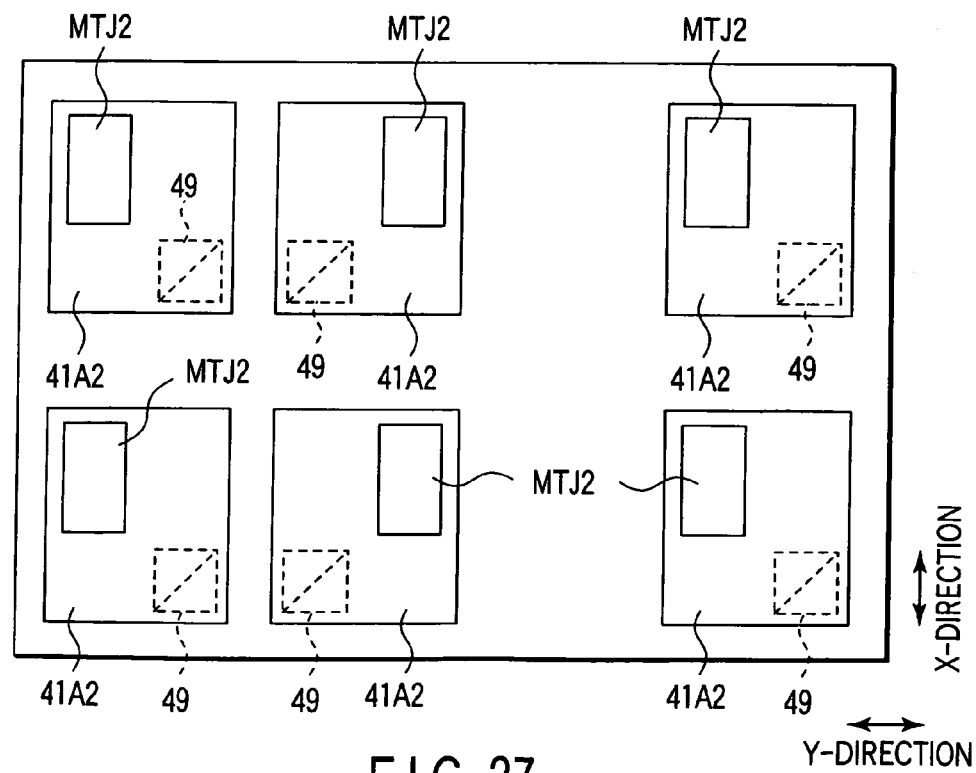
FIG. 27 is a view showing a layout of a second TMR element and its lower electrode of Structure Example 2.

FIG. 27 shows a layout of the TMR element MTJ2 on the second stage and its lower electrode 41A2.

The lower electrode 41A2 is, for example, rectangular and is regularly arranged. The TMR element MTJ2 on the second stage is arranged on the lower electrode 41A2. A position at which the TMR element MTJ2 is arranged is, for example, a position at which it does not overlap the contact portion 49.

Figure 28:
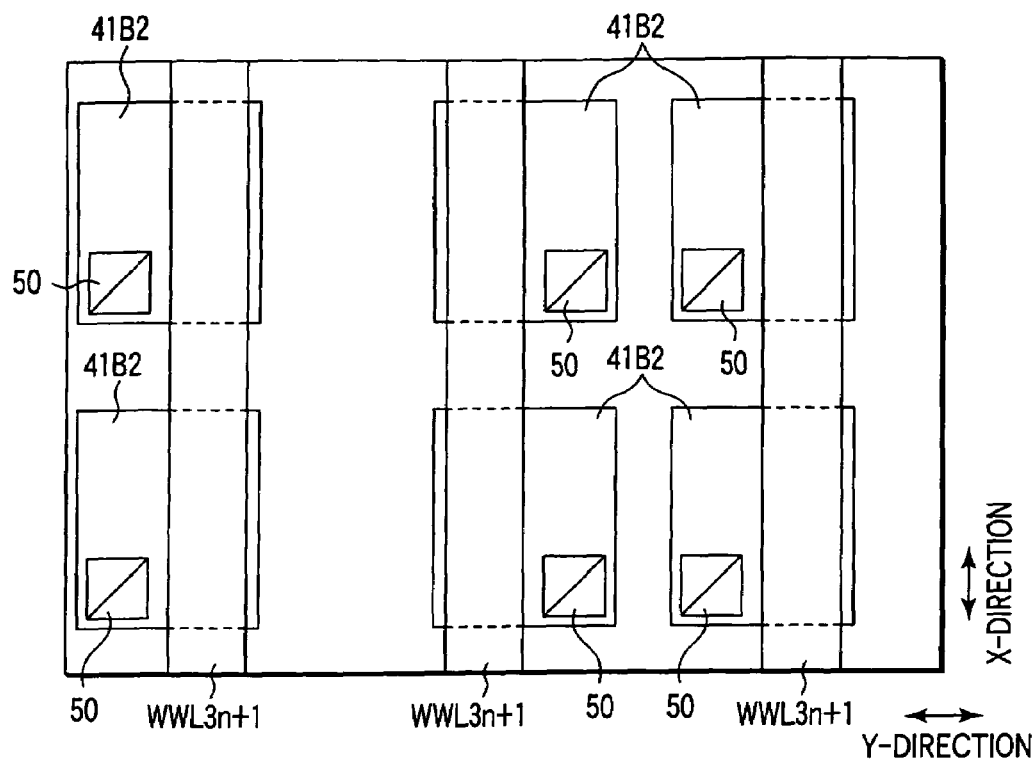
FIG. 28 is a sectional view showing a layout of the second TMR element and its upper electrode of Structure Example 2.

FIG. 28 shows a layout of the upper electrode 41B2 of the TMR element MTJ2 on the second stage and the write word line WWL3n+1.

The upper electrode 41B2 is, for example, rectangular and is arranged so as to overlap the lower electrode of the TMR element on the second stage. The contact portion 50 represents a contact portion between the upper electrode 41B2 of the TMR element on the second stage and the lower electrode of the TMR element on the third stage.

The write word line WWL3n+1 acts as a write word line with respect to the TMR elements on the second and third stages. The write word line WWL3n+1 is, as apparent from FIGS. 21 and 22, arranged between the TMR element MTJ2 on the second stage and the TMR element MTJ3 on the third stage and extends in the X-direction.

Figure 29:
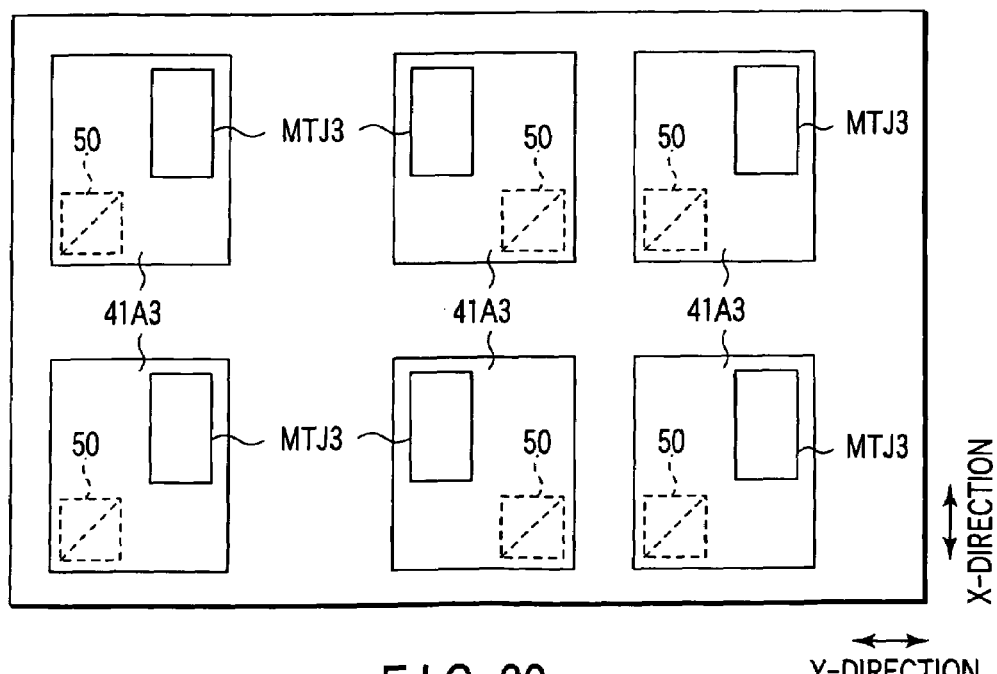
FIG. 29 is a view showing a layout of a third TMR element and its lower electrode of Structure Example 2.

FIG. 29 shows a layout of the TMR element MTJ3 on the third stage and its lower electrode 41A3.

The lower electrode 41A3 is, for example, rectangular and is regularly arranged. The TMR element MTJ3 on the third stage is arranged on the lower electrode 41A3. A position at which the TMR element MTJ3 is arranged is, for example, a position at which it does not overlap the contact portion 50.

FIG. 30 shows a layout of the upper electrode 41B3 of the TMR element MTJ3 on the third stage and the write bit lines BL01 and BL11.

The upper electrode 41B3 is, for example, rectangular and is arranged so as to overlap the lower electrode of the TMR element on the third stage. The contact portion 51 represents a contact portion between the upper electrode 41B3 of the TMR element on the third stage and the lower electrode of the TMR element on the fourth stage.

The write bit lines BL01 and BL11 are arranged directly above the TMR element on the third stage and extend in the Y-direction. In addition, as apparent from FIGS. 2 and 3, the write bit liens BL01 and BL11 are arranged directly below the TMR element on the fourth stage. The write bit lines BL01 and BL11 act as write bit lines with respect to the TMR elements on the third and fourth stages.

FIG. 31 shows a layout of the TMR element MTJ4 on the fourth stage and its lower electrode 41A4.

The lower electrode 41A4 is, for example, rectangular and is regularly arranged. The TMR element MTJ4 on the fourth stage is arranged on the lower electrode 41A4. A position at which the TMR element MTJ4 is arranged is, for example, a position at which it does not overlap the contact portion 51.

Figure 32:
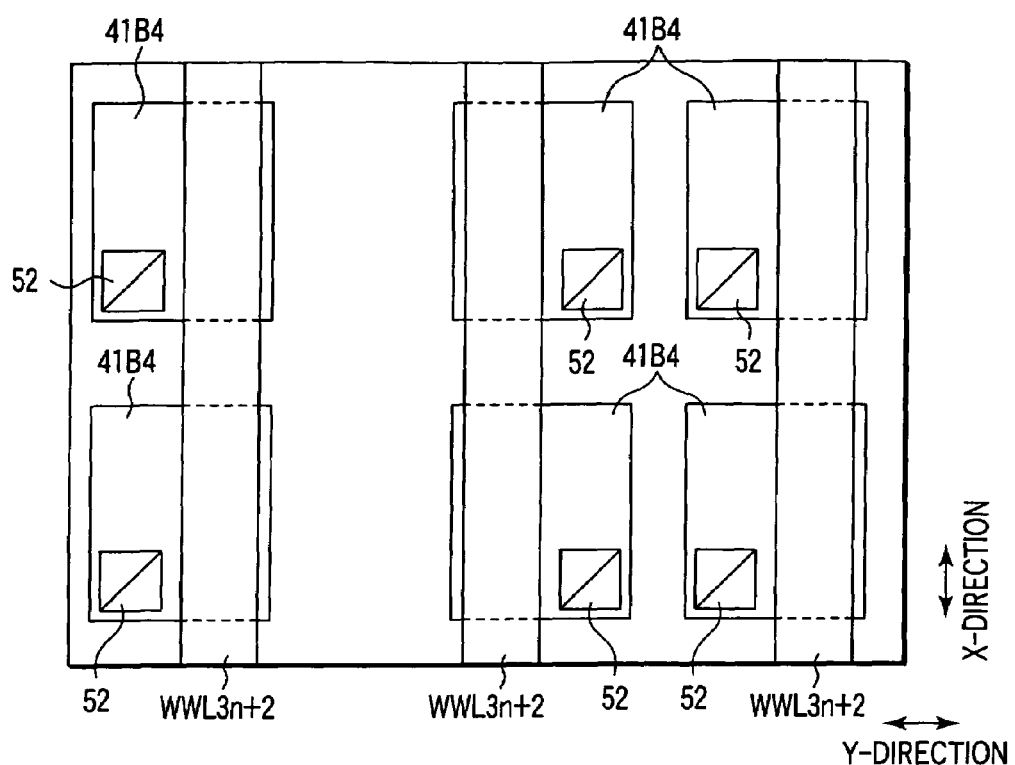
FIG. 32 is a view showing a layout of the fourth TMR element and its upper electrode of Structure Example 2.

FIG. 32 shows a layout of the upper electrode 41B4 of the TMR element MTJ4 on the fourth stage and the write word line WWL3n+2.

The upper electrode 41B4 is, for example, rectangular and is arranged so as to overlap the lower electrode of the TMR element on the fourth stage. The contact portion 52 represents a contact portion between the upper electrode 41B4 of the TMR element on the fourth stage and the read bit line.

The write word line WWL3n+2 acts as the write word line relative to the TMR element on the fourth stage. The write word line WWL3n+2 is, as apparent from FIGS. 2 and 3, arranged directly above the TMR element MTJ4 on the fourth stage and extends in the X-direction.

Figure 33:
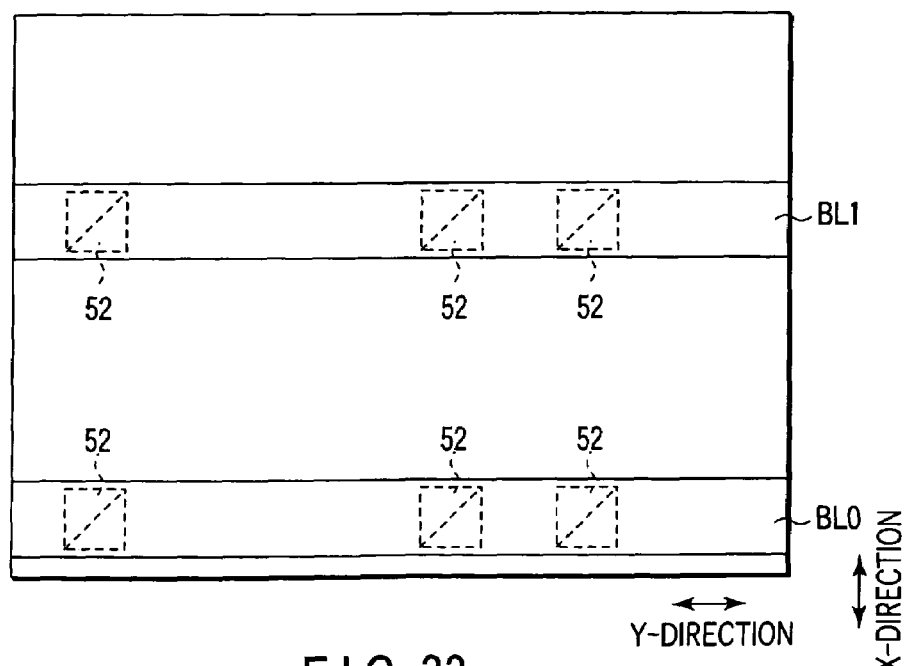
FIG. 33 is a view showing a layout of read bit lines of Structure Example 2.

FIG. 33 shows a layout of the read bit lines BL0 and BL1.

The read bit lines BL0 and BL1 extend in the Y-direction. Each one of the read bit lines BL0 and BL1 is arranged in one column and commonly connected to the blocks in one column. The contact portion 52 represents a contact portion between the upper electrode of the TMR element on the fourth stage and the read bit lines BL0 and BL1.

④ Modifications

Modifications of Structure Example 2 will now be described.

Figure 34:
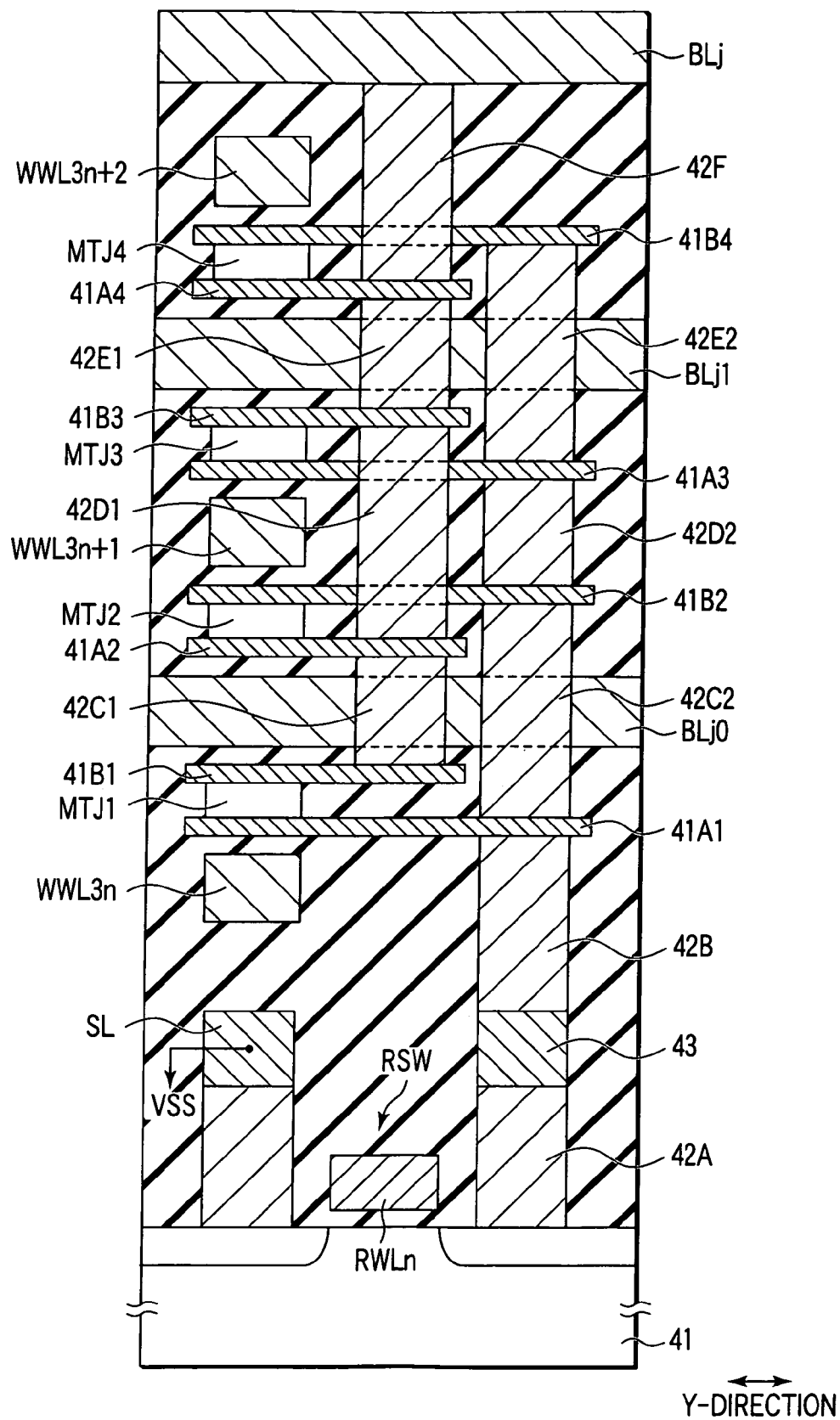
FIG. 34 is a view showing a first modification of Structure Example 2.

FIG. 34 shows a first modification of Structure Example 2.

This drawing corresponds to FIG. 21. The device structure of this example is different from the device structure shown in FIG. 21 in a position at which the TMR elements MTJ1, MTJ2, MTJ3 and MTJ4 are superposed.

That is, in the device structure shown in FIG. 21, the TMR elements MTJ1, MTJ2, MTJ3 and MTJ4 are superposed directly above the gate electrode of the read selection switch (MOS transistor) RSW, i.e., the read word line RWLn.

In this case, the lower electrodes 41A1 and 41A3 and the upper electrodes 41B2 and 41B4 extend from the TMR elements to one side, whilst the lower electrodes 41A2 and 41A4 and the upper electrodes 41B1 and 41B3 extend from the TMR elements to the other side. Further, contact portions relative to the lower electrodes and the upper electrodes are provided on the both sides of the TMR element.

On the contrary, in the device structure of this example, the TMR elements MTJ1, MTJ2, MTJ3 and MTJ4 are superposed directly above the source line SL connected to the source of the read selection switch (MOS transistor) RSW.

In this case, the lower electrodes 41A1, 41A2, 41A3 and 41A4 and the upper electrodes 41B1, 41B2, 41B3 and 41B4 are both extend from the TMR elements to one side. Furthermore, a contact portion relative to the lower electrodes and the upper electrodes is provided on only one side of the TMR element.

Figure 35:
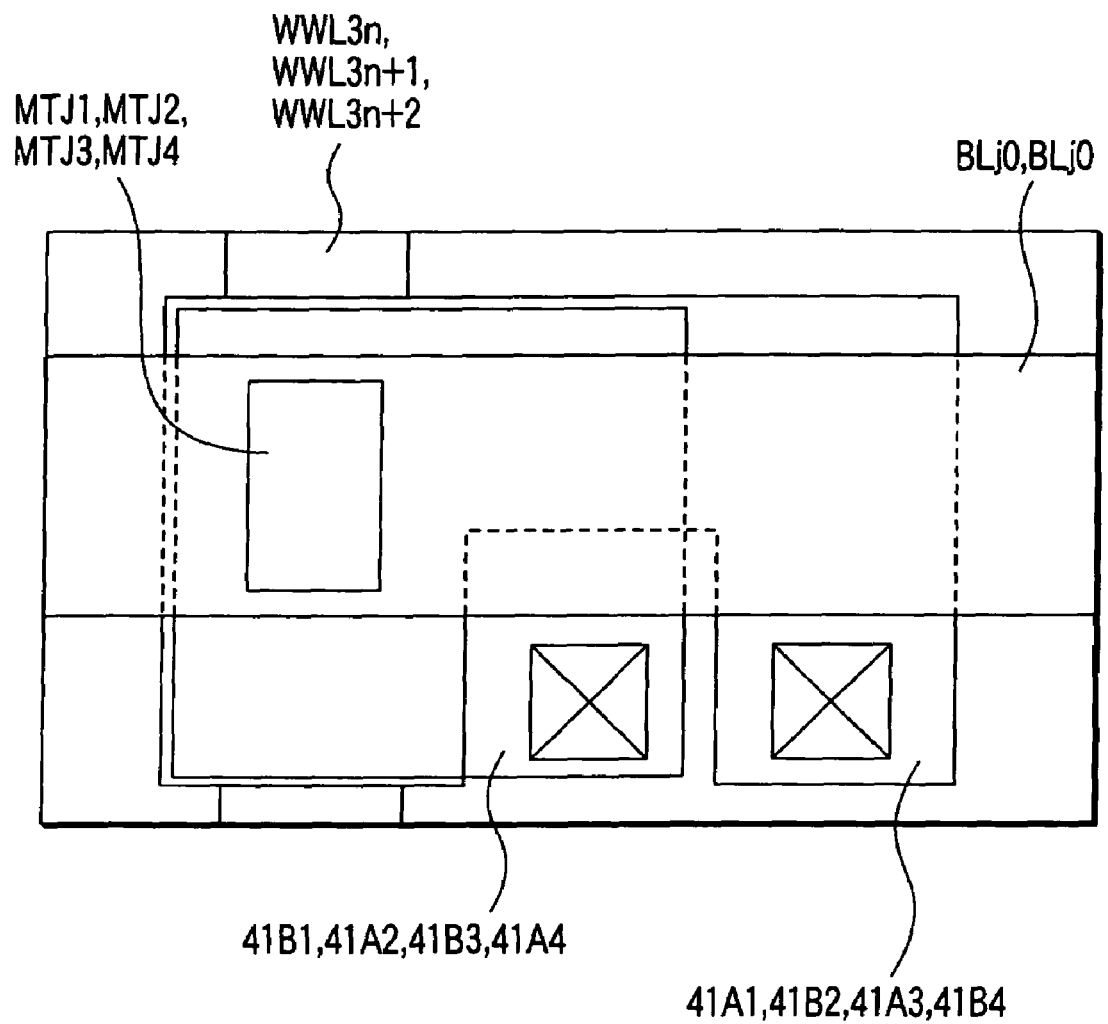
FIG. 35 is a view showing the first modification of Structure Example 2.

FIG. 35 is a plane view showing the positional relationship between the TMR elements, the lower electrodes and the upper electrodes in the device structure illustrated in FIG. 34.

In this example, the shapes of the lower electrodes 41A1 and 41A3 and the upper electrodes 41B2 and 41B4 are different from those of the lower electrodes 41A2 and 41A4 and the upper electrodes 41B1 and 41B3. Moreover, a part of the lower electrodes 41A1 and 41A3 and the upper electrodes 41B2 and 41B4, namely, a part overlapping the lower electrodes 41A2 and 41A4 and the upper electrodes 41B1 and 41B3 is eliminated.

Figure 37:
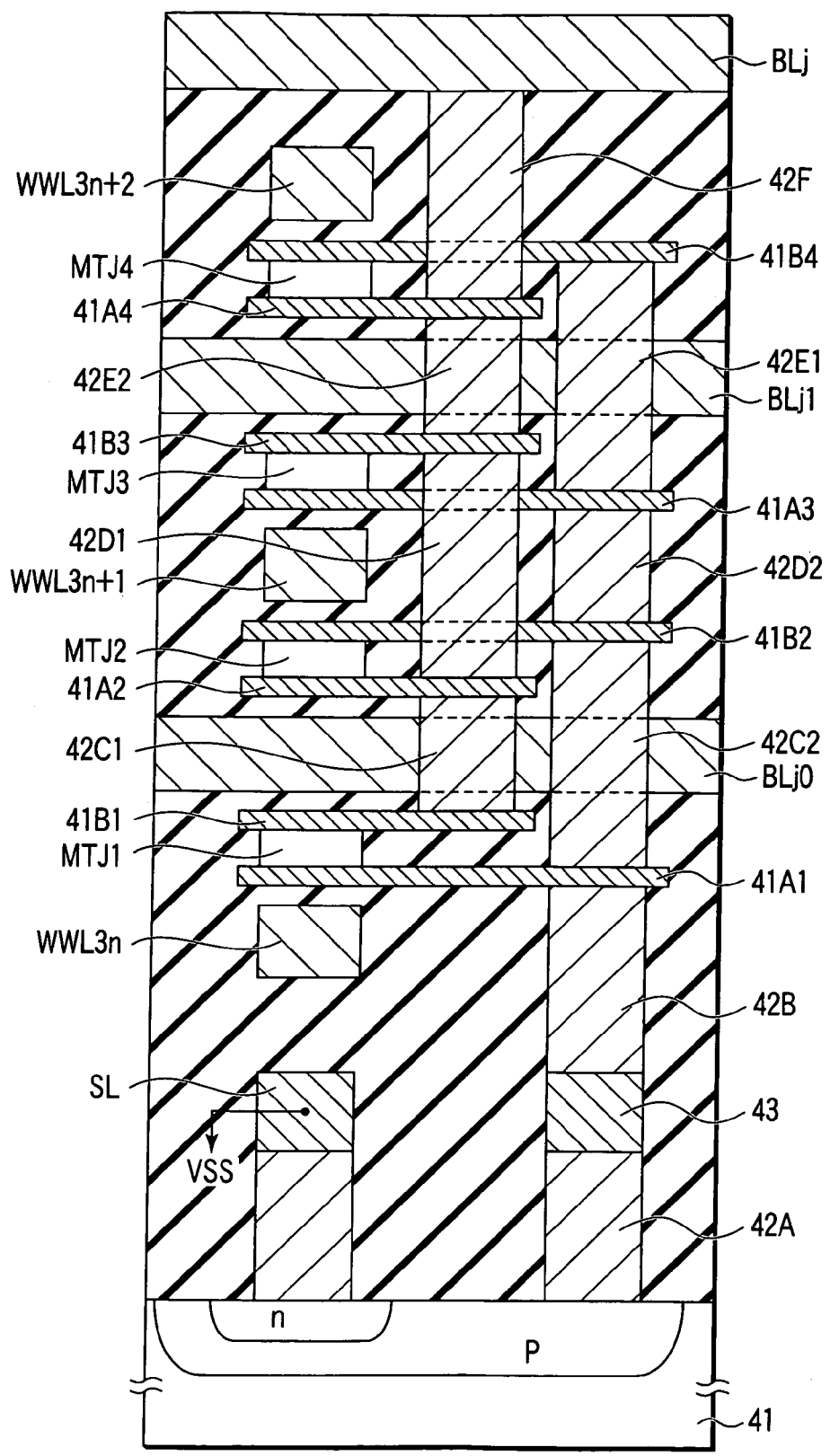
FIG. 37 is a sectional view showing the second modification of Structure Example 2.

FIGS. 36 and 37 show a second modification of Structure Example 2.

A circuit diagram of FIG. 36 corresponds to the circuit diagram of FIG. 20, and a sectional view of the device structure illustrated in FIG. 37 corresponds to the sectional view of the device structure depicted in FIG. 34. The structure of this example is different from the structures shown in FIGS. 20 and 34 in the element which realizes the read selection switch.

That is, in the structures depicted in FIGS. 20 and 34, the read selection switch is constituted by the MOS transistor. On the contrary, in the structure of this example, the read selection switch is constituted by a diode DI. Based on this, the read word lines RWL0, . . . , RLWn are connected to a cathode of the diode DI.

When adopting the structure of this example, in the read operation, the read word line RWLi of a selected row is set to "L", namely, a ground potential. At this moment, a read current can be caused to flow to a plurality of TMR elements which constitute the block of the selected row and are connected to each other in series.

Figure 39:
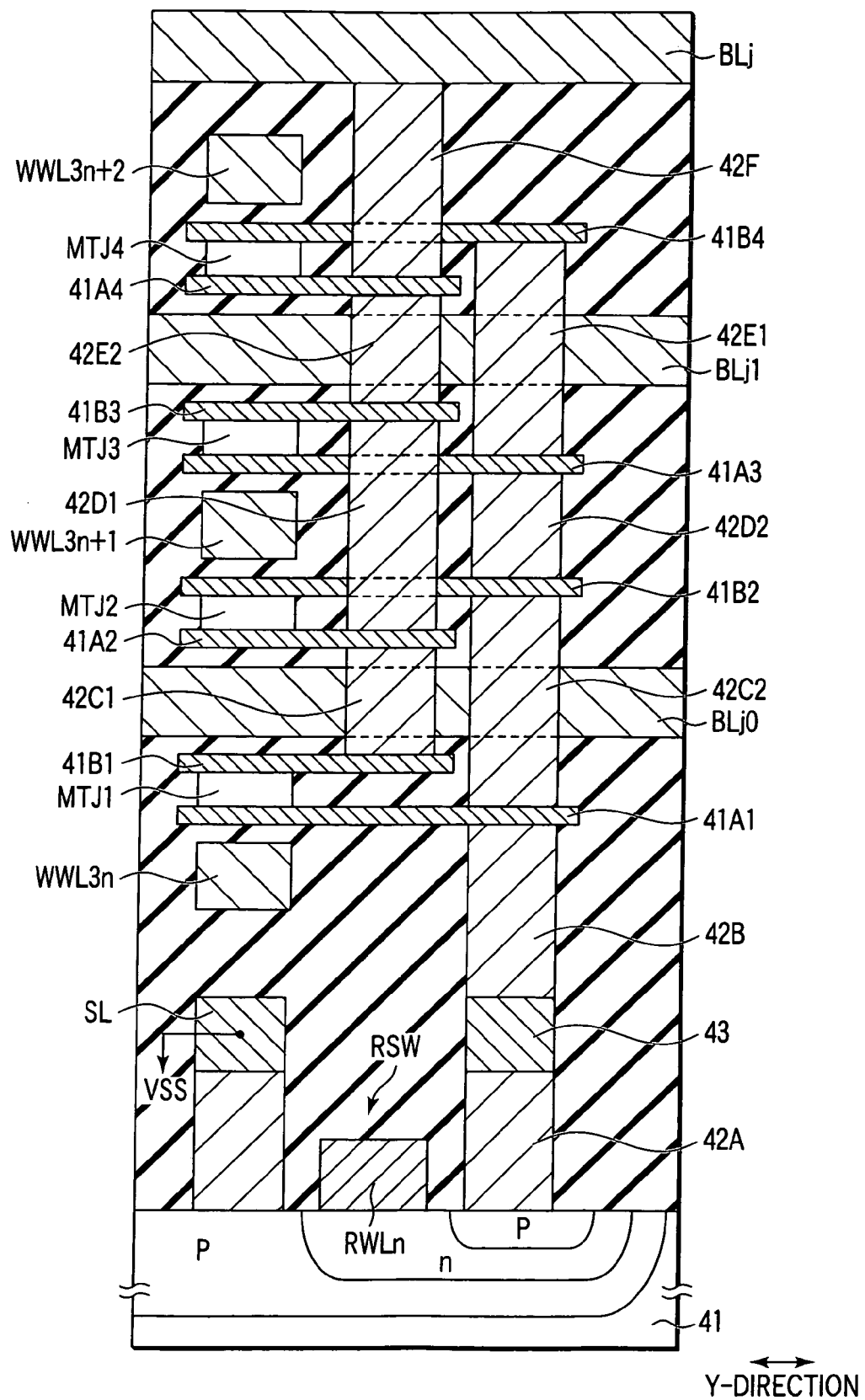
FIG. 39 is a sectional view showing the third modification of Structure Example 2.

FIGS. 38 and 39 show a third modification of Structure Example 2.

A circuit diagram of FIG. 38 corresponds to the circuit diagram of FIG. 20, and a sectional view of the device structure illustrated in FIG. 39 corresponds to the sectional view of the device structure depicted in FIG. 34. The structure of this example is different from the structures illustrated in FIGS. 20 and 34 in a type of transistors constituting the memory cell array 11 and its peripheral circuits.

That is, in the structure of FIGS. 20 and 34, the transistors constituting the memory cell array 11 and its peripheral circuits are MOS transistors. On the contrary, in the structure of this example, the transistors constituting the memory cell array 11 and its peripheral circuits are bipolar transistors.

In case of the structure of this example, all the transistors constituting the memory cell array 11 and its peripheral circuits may be bipolar transistors, or some of them may be bipolar transistors.

(3) Structure Example 3

Structure Example 3 concerns a cell array structure in which a plurality of TMR elements are connected to each other in parallel.

In Structure Example 3, each of a plurality of blocks in one column does not have a plurality of TMR elements superposed on a plurality of stages in a direction vertical to the surface of the semiconductor substrate (Z-direction). Each block is constituted by a plurality of TMR elements aligned in the Y-direction parallel to the surface of the semiconductor substrate (column direction).

However, a later-described read operation principle according to the present invention can be applied also in Structure Example 3. Moreover, in such a case, a later-described structure according to the present invention must be adopted with respect to the structure of the TMR element.

Thus, description will now be given as to Structure Example 3, namely, the structure in which a plurality of TMR elements are connected to each other in series in a direction parallel to the surface of the semiconductor substrate.

① Circuit Configuration

The circuit configuration will now be described.

Figure 40:
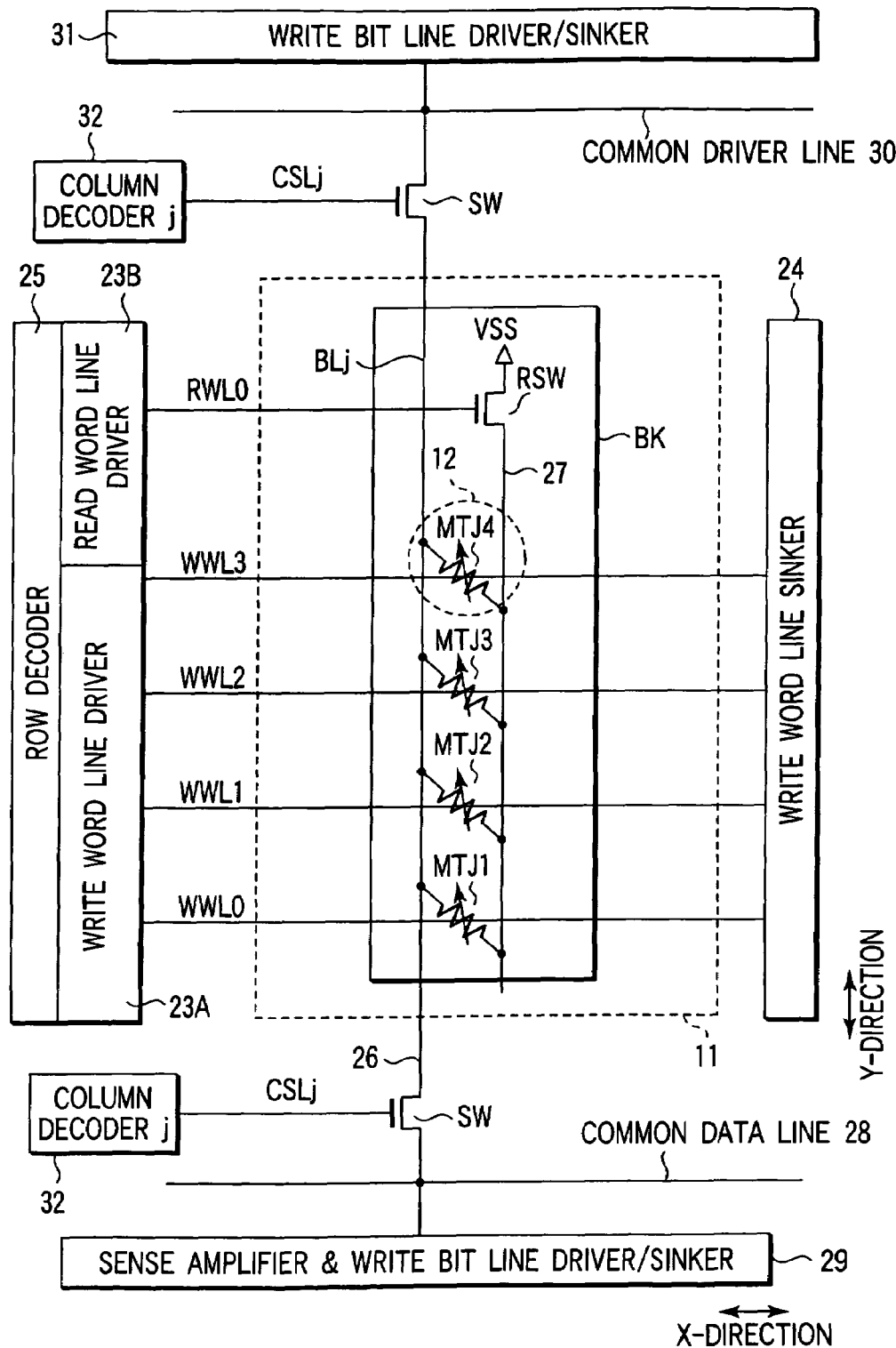
FIG. 40 is a circuit diagram concerning Structure Example 3 of a magnetic random access memory according to the present invention.

FIG. 40 shows primary parts of the magnetic random access memory as Structure Example 3 according to the present invention.

The memory cell array 11 has a plurality of blocks BK arranged in the form of an array in the directions X and Y. In the drawing, however, only one block BK is illustrated in the memory cell array 11 in order to facilitate understanding the figure.

The block BK is constituted by four TMR elements (MTJ1, MTJ2, MTJ3 and MTJ4) connected to each other in parallel between an upper wiring 26 and a lower wiring 27. Although a number of the TMR elements 12 constituting one block BK is four in this example, it may be any number as long as it is a plural number.

One end of the upper wiring 26 is connected to a common data line 28 through a column selection switch (MOS transistor) SW. The common data line 28 is connected to a circuit block 29 including a read circuit (including a sense amplifier) and a write bit line driver/sinker.

The other end of the upper wiring 26 is connected to a common driver line 30 through the column selection switch (MOS transistor) SW. The common driver line 30 is connected to the write bit line driver/sinker 31.

A column selection line signal CSLj (j=0, 1, ...) is inputted to a gate of the column selection switch SW. A column decoder 32 outputs the column selection line signal CSLj.

The upper wiring 26 functions as a read bit line BLj in the read operation, and also serves as a write bit line in the write operation.

The lower wiring 27 is connected to a ground point through a read selection switch (MOS transistor) RSW. In the read operation, since a level of a read word line RWL0 becomes "H" in the selected block BK, the read selection switch RSW enters the on state, and a read current flows to a plurality of TMR elements 12 in the block BK.

In the memory cell array 11, four write word lines WWL0, WWL1, WWL2 and WWL3 which extend in the X-direction are arranged in accordance with the four TMR elements 12 constituting the block BK.

One end of the write word lines WWL0, WWL1, WWL3 and WWL4 is connected to the write word line driver 23A, and the other end of these lines is connected to the write word line sinker 24. A gate of the read selection switch RSW, namely, the read word line RWL0 extends in the X-direction, and one end of this line is connected to the read word line driver 23B.

A row decoder 25 selects one of the write word lines WWL0, WWL1, WWL2 and WWL3 based on a row address signal in the write operation. The write word line driver 23A supplies the write current to the selected write word line. The write current flows through the selected word line and is absorbed in the write word line sinker 24.

The row decoder 25 selects a block in one row based on, e.g., a superior row address signal in the read operation. The read word line driver 23B supplies a read word line voltage (level "H") to the read word line RWL0 connected to the selected block BK.

In the magnetic random access memory of this example, one column is constituted by a plurality of blocks, and the read operation is carried out in units of block. In addition, one block is constituted by a plurality of TMR elements connected to each other in parallel.

Even in such a cell array structure, since associating one MOS transistor (read selection switch) with a plurality of the TMR elements can suffice, this can consequently contribute to increase in the memory capacity.

② Device Structure 1

The device structure will now be described.

Figure 41:
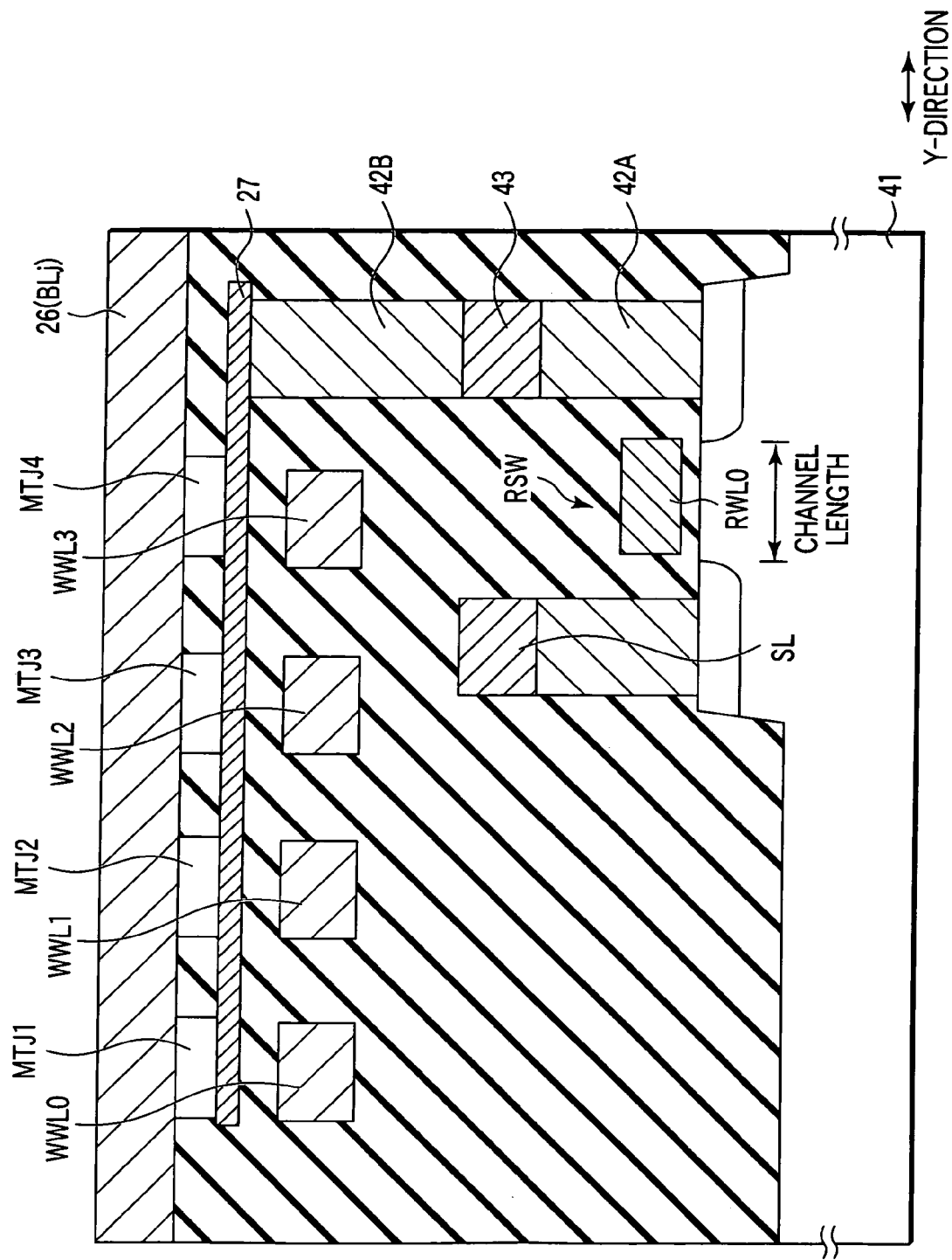
FIG. 41 is a sectional view concerning Structure Example 3 of the magnetic random access memory according to the present invention.

FIG. 41 shows a device structure of one block of the magnetic random access memory as Structure Example 3 according to the present invention. Elements shown in FIG. 41 are denoted by like reference numerals in FIG. 40 so that they can correspond to elements in the circuit of FIG. 40.

A read selection switch (MOS transistor) RSW is arranged in the surface area of the semiconductor substrate 41. A source of the read selection switch RSW is connected to a ground point through the source line SL. The source line SL extends in, for example, the X-direction straightway.

A gate of the read selection switch (MOS transistor) RSW is the read word line RWL0. The read word line RWL0 extends in the X-direction. On the read selection switch RSW, four TMR elements (MTJ (Magnetic Tunnel Junction) elements) MTJ1, MTJ2, MTJ3 and MTJ4 are arranged in a line in the Y-direction.

Figure 171:
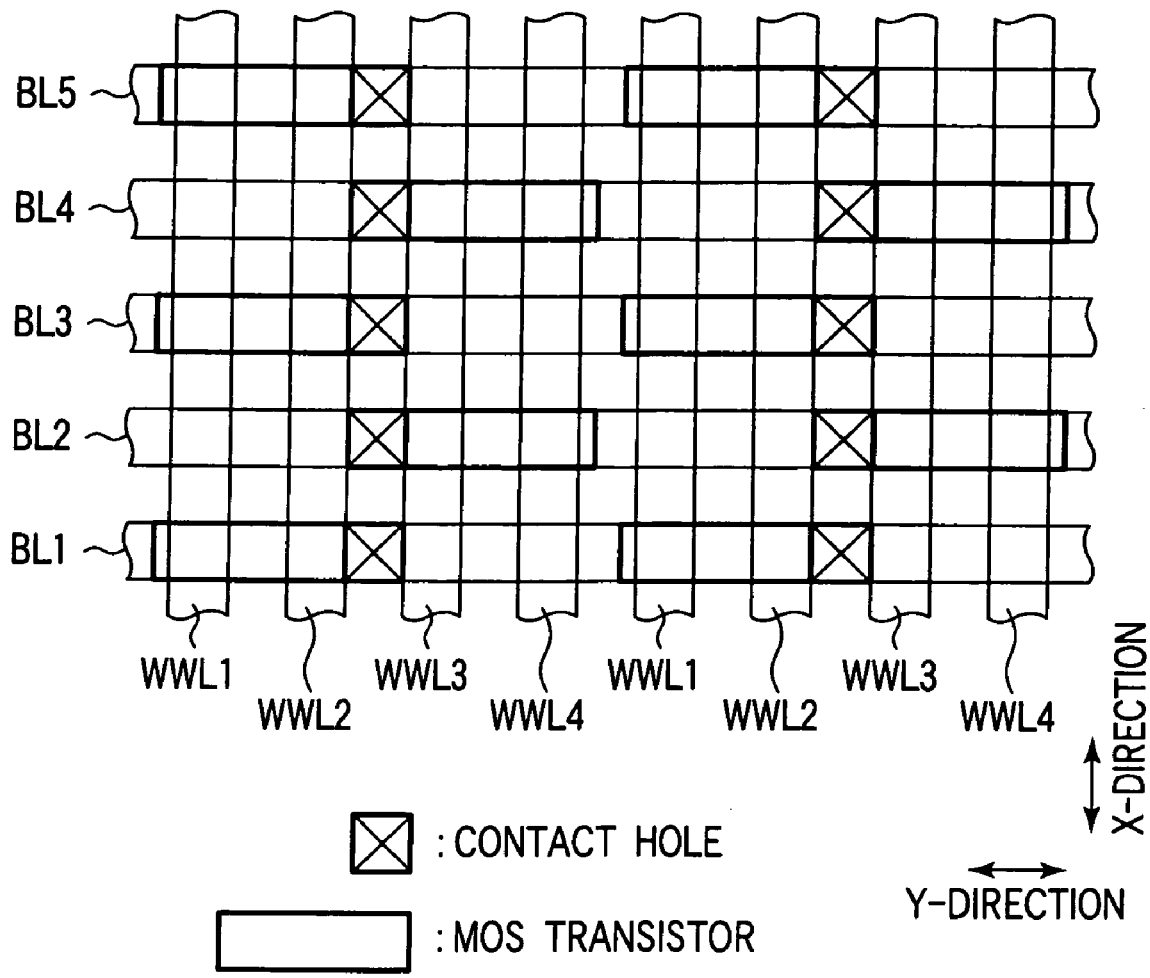
FIG. 171 is a plane view showing the modification of the device structure according to the present invention.

Therefore, an area directly below the TMR elements MTJ1, MTJ2, MTJ3 and MTJ4 is narrow in the X-direction and wide in the Y-direction. That is, in this example, a channel length of the read selection switch (MOS transistor) RSW can be freely changed. For example, as shown in FIG. 171, a channel width of the read selection switch RSW can be freely set by arranging the read selection switch (MOS transistor) RSW in the hound's-tooth form.

The respective TMR elements MTJ1, MTJ2, MTJ3 and MTJ4 are connected to each other in parallel between the upper electrode 26 and the lower electrode 27. Contact plugs 42A and 42B and an intermediate layer 43 connect the lower wiring 27 and a drain of the read selection switch (MOS transistor) RSW to each other.

The write word lines WWL0, WWL1, WWL2 and WWL3 correspond to the TMR elements MTJ1, MTJ2, MTJ3 and MTJ4. The write word lines WWL0, WWL1, WWL2 and WWL3 are arranged directly below the TMR elements MTJ1, MTJ2, MTJ3 and MTJ4 and extend in the X-direction.

According to such a device structure, a plurality of (four in this example) the TMR elements MTJ1, MTJ2, MTJ3 and MTJ4 correspond to one read selection switch RSW, and one block is constituted by these members. Additionally, these TMR elements MTJ1, MTJ2, MTJ3 and MTJ4 are connected to each other in parallel on the read selection switch RSW.

Therefore, a number of the read selection switches can be reduced, which contributes to realization of the high density of the TMR elements and increase in the memory capacity. Further, since a number of wirings (for example, the write word lines, the write bit lines, the read bit lines or the like) arranged in the array of the TMR element can be reduced, planation of the insulating film directly below the TMR elements can be realized, thereby improving the characteristic of the TMR elements.

③ Device Structure 2

Description will now be given as to a plane layout in each wiring layer of the magnetic random access memory shown in FIG. 41

Figure 42:
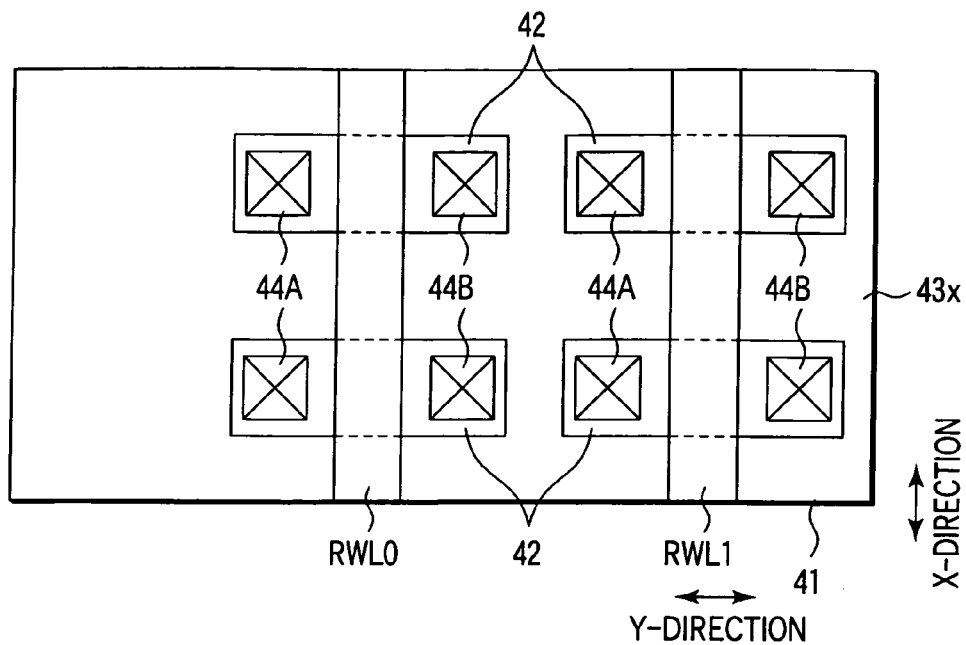
FIG. 42 is a view showing a layout of an active regions and read word lines of Structure Example 3.

FIG. 42 shows a layout of the active regions and the read word line.

The active regions 42 on the semiconductor substrate 41 is surrounded by an element separation area 43x. The active regions 42 means an area which forms a read selection switch (MOS transistor).

On the semiconductor substrate 41 are arranged the read word lines RWL0 and RWL1 which extend in the X-direction and cut across the active regions 42. Each read word lines of RWL0, RWL1 and RWL2 is a gate electrode of a group of the read selection switches (MOS transistors), respectively.

The active regions on one side of the read word lines RWL0 and RWL1 is a source of the read selection switch, and the active regions on the other side of the read word lines RWL0 and RWL1 is a drain of the read selection switch.

A contact portion 44A is a source contact portion with respect to the source of the read selection switch, and a contact portion 44B is a drain contact portion with respect to the drain of the read selection switch.

Figure 43:
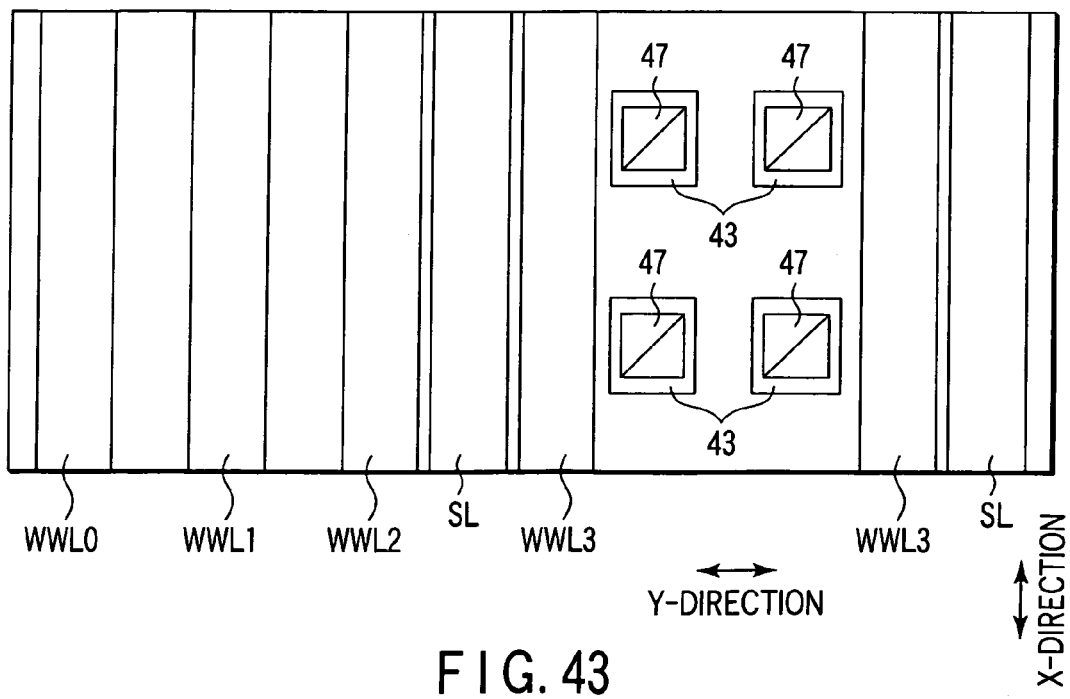
FIG. 43 is a view showing a layout of source lines and write word lines of Structure Example 3.

FIG. 43 shows a layout of the source line SL and the write word lines WWL0, WWL1, WWL2 and WWL3.

The source line SL extends in the X-direction. The source line SL is connected to the source of the read selection switch.

An intermediate layer 43 is formed in the same wiring layer as the source line SL. The intermediate layer 43 plays a role of preventing a contact hole having a high aspect ratio from being formed. A contact portion 47 represents a contact portion between the intermediate layer 43 and the lower wiring of the TMR elements.

As apparent from FIG. 41, the write word lines WWL0, WWL1, WW2 and WWL3 are arranged above the source line SL and the intermediate layer 43 and directly below the TMR elements MTJ1, MTJ2, MTJ3 and MTJ4. The write word lines WWL0, WWL1, WWL2 and WWL3 extend in the X-direction.

Figure 44:
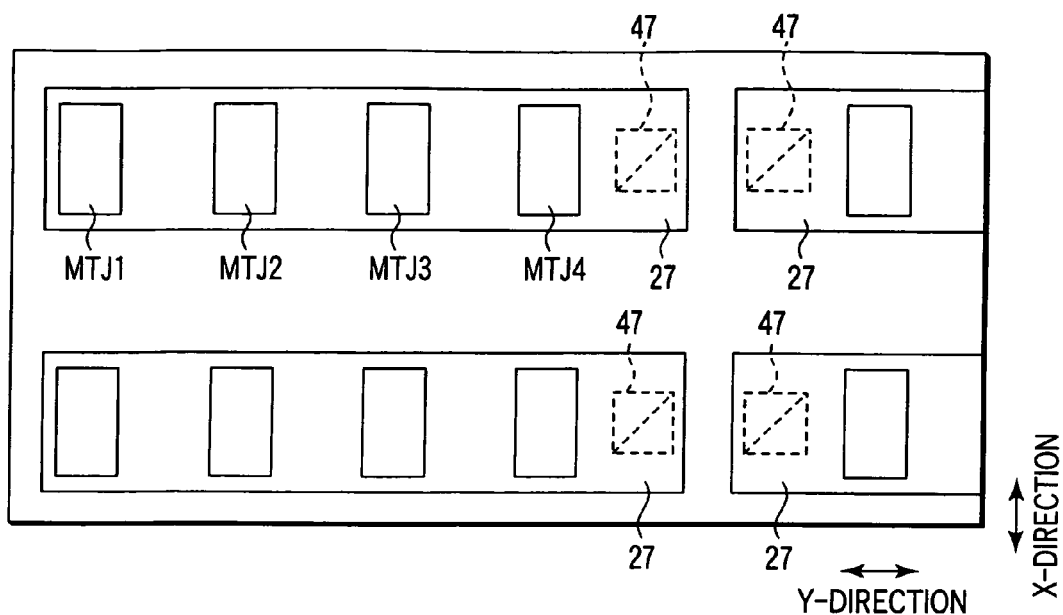
FIG. 44 is a view showing a layout of a TMR element and its lower electrode of Structure Example 3.

FIG. 44 shows a layout of the TMR elements MTJ1, MTJ2, MTJ3 and MTJ4 and their lower wiring 27.

The lower wiring 27 has an enough width that the TMR elements MTJ1, MTJ2, MTJ3 and MTJ4 can be arranged thereon, and extends in the Y-direction. In the contact portion 47 at one end of the lower wiring 27, a contact plug is connected. The TMR elements MTJ1, MTJ2, MTJ3 and MTJ4 are arranged at predetermined intervals in the Y-direction and directly above the write word line.

Figure 45:
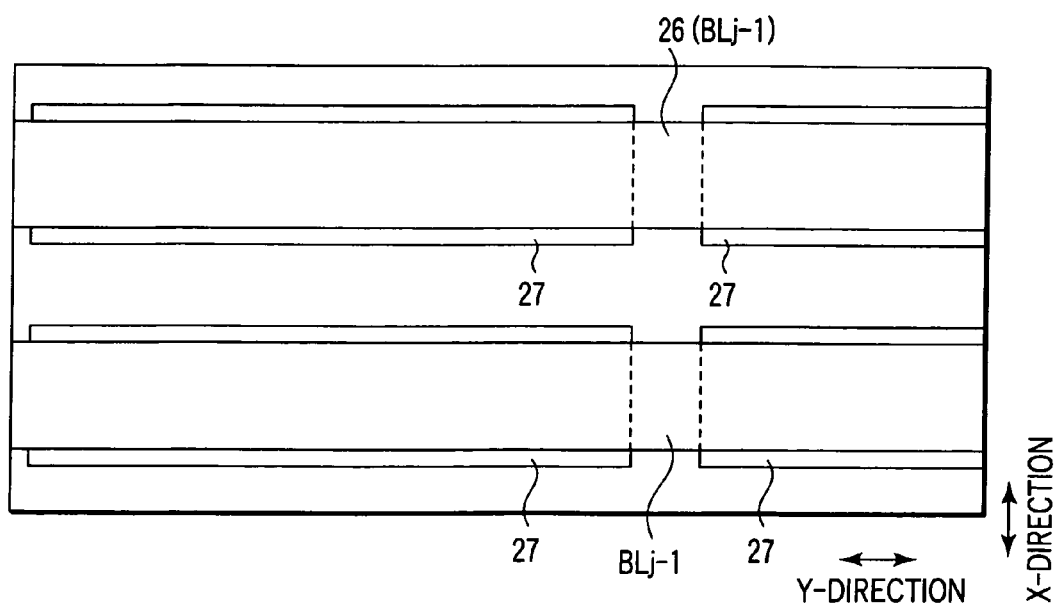
FIG. 45 is a view showing a layout of the TMR element and its upper electrode of Structure Example 3.

FIG. 45 shows a layout of the upper electrode 26 and the lower electrode 27 of the TMR elements.

The upper electrode 26 is arranged directly above the TMR element and extends in the Y-direction. The upper electrode 26 functions as the write bit line and the read bit line. One upper wiring 26 is arranged in one column and commonly connected to a plurality of the TMR elements in the block in one column.

④ Device Structure 3

A modification of the device structure 1 will now be described.

The device structure 3 relates to the modification of the device structure 1.

Comparing with the device structure 1, a characteristic of the device structure 3 lines in a direction of the read selection switch RSW. That is, the direction of the read selection switch RSW of the device structure 3 corresponds to that obtained by rotating the direction of the read selection switch RSW of the device structure 1 by 90° in the plane X-Y.

Figure 46:
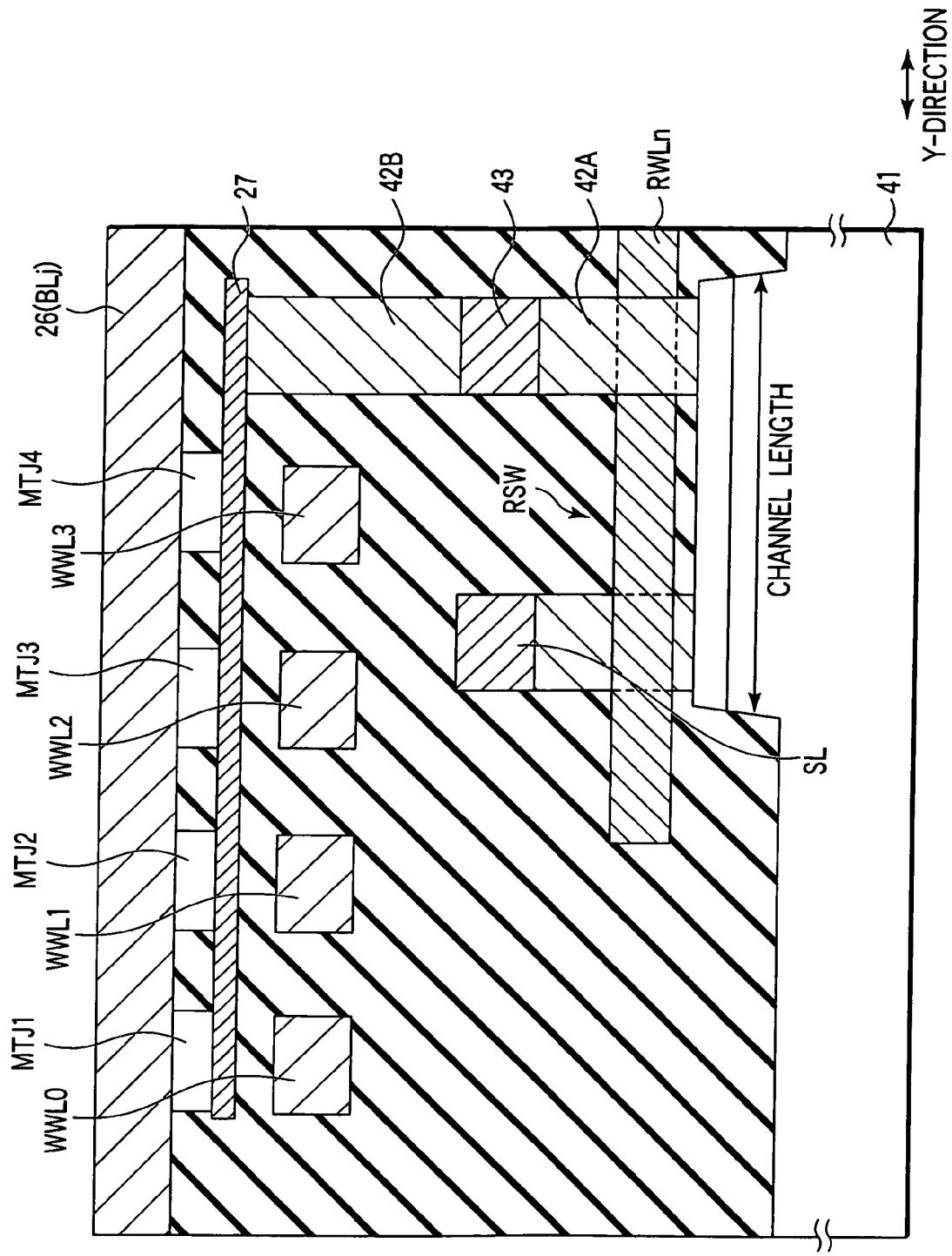
FIG. 46 is a sectional view concerning Structure Example 3 of the magnetic random access memory according to the present invention.

FIG. 46 shows a device structure of one block of the magnetic random access memory as Structure Example 3 according to the present invention. Elements shown in FIG. 46 are denoted by the same reference numerals as those in FIG. 40 so that they can correspond to elements in the circuit illustrated in FIG. 40.

A read selection switch (MOS transistor) RSW is arranged in the surface area of the semiconductor substrate 41. A source of the read selection switch RSW is connected to a ground point through the source line SL. The source line SL extends in, e.g., the X-direction straightway.

A gate of the read selection switch (MOS transistor) RSW is a read word line RWL0. The read word line RWL0 extends in the Y-direction, is bent at 90° in midstream, and further extends in the X-direction.

In this example, a channel width of the read selection switch (MOS transistor) RSW is parallel with the Y-direction.

Since the four TMR elements (MTJ (Magnetic Tunnel Junction) elements) MTJ1, MTJ2, MTJ3 and MTJ4 on the read selection switch RSW are arranged in a line in the Y-direction, an area directly below the TMR elements MTJ1, MTJ2, MTJ3 and MTJ4 is narrow in the X-direction and wide in the Y-direction.

Therefore, in this example, a channel width of the read selection switch (MOS transistor) RSW can be freely changed.

The respective TMR elements MTJ1, MTJ2, MTJ3 and MTJ4 are connected to each other in parallel between the upper electrode 26 and the lower electrode 27. Contact plugs 42A and 42B and an intermediate layer 43 connect the lower wiring 27 and the drain of the read selection switch (MOS transistor) RSW with each other.

Write word lines WWL0, WWL1, WWL2 and WWL3 correspond to the TMR elements MTJ1, MTJ2, MTJ3 and MTJ4. The write word lines WWL0, WWL1, WWL2 and WWL3 are arranged directly below the TMR elements MTJ1, MTJ2, MTJ3 and MTJ4 and extend in the X-direction.

In such a device structure, associating one read selection switch RSW with a plurality of (four in this example) the TMR elements MTJ1, MTJ2, MTJ3 and MTJ4 can suffice. Furthermore, the TMR elements MTJ1, MTJ2, MTJ3 and MTJ4 are connected to each other in parallel on the read selection switch RSW.

Therefore, a number of the read selection switches can be reduced, which can contribute to realization of the high density of the TMR elements and increase in the memory capacity. Moreover, since a number of wirings (for example, the write word lines, the write bit lines, the read bit lines or the like) arranged in the array of the TMR elements can be reduced, planation of the insulating film directly below the TMR elements can be realized, thereby improving the characteristic of the TMR elements.

⑤ Device Structure 4

Description will be given as to a plane layout in each wiring layer of the magnetic random access memory illustrated in FIG. 46.

Figure 47:
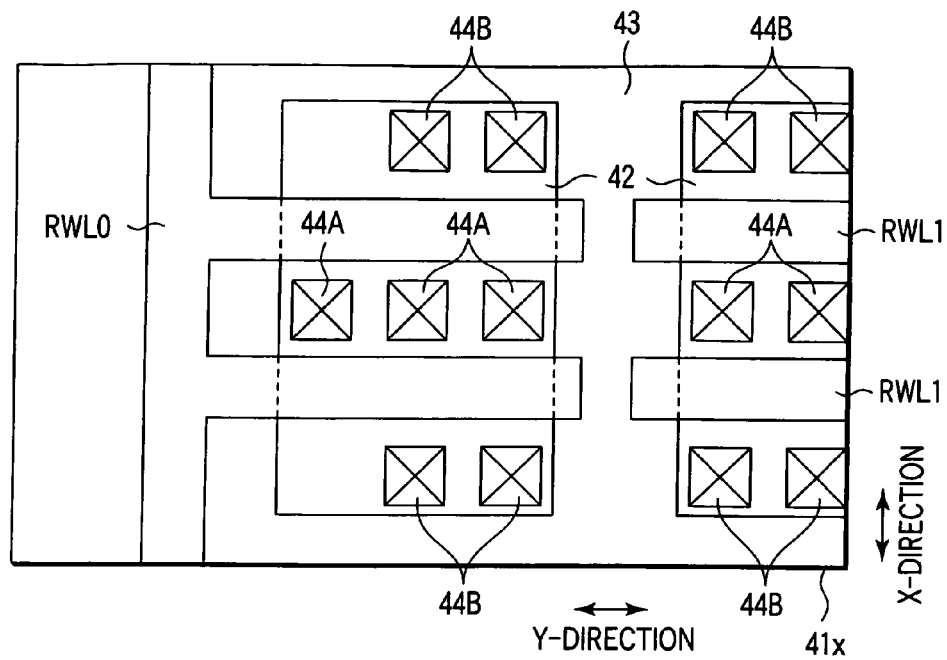
FIG. 47 is a view showing a layout of an active regions and read word lines of Structure Example 3.

FIG. 47 shows a layout of an active regions and read word lines.

The active regions 42 on the semiconductor substrate 41 is surrounded by an element separation area 43. The active regions 42 means an area forming the read selection switch (MOS transistor).

On the semiconductor substrate 41 are arranged read word lines-RWL0 and RWL1 which extend in the Y-direction and cut across the active regions 42. In addition, the read word lines RWL0 and RWL1 are bent at 90° and extend in the X-direction on the element separation area 43x.

Each read word lines of RWL0, RWL1 and RWL2 is a gate electrode of a group of the read selection switches (MOS transistors), respectively. The active regions on one side of the read word lines RWL0 and RWL1 is a source of the read selection switch whilst the active regions on the other side of the read word lines RWL0 and RWL1 is a drain of the read selection switch.

A contact portion 44A is a source contact portion with respect to the source of the read selection switch, and a contact portion 44B is a drain contact portion with respect to a drain of the read selection switch.

Figure 48:
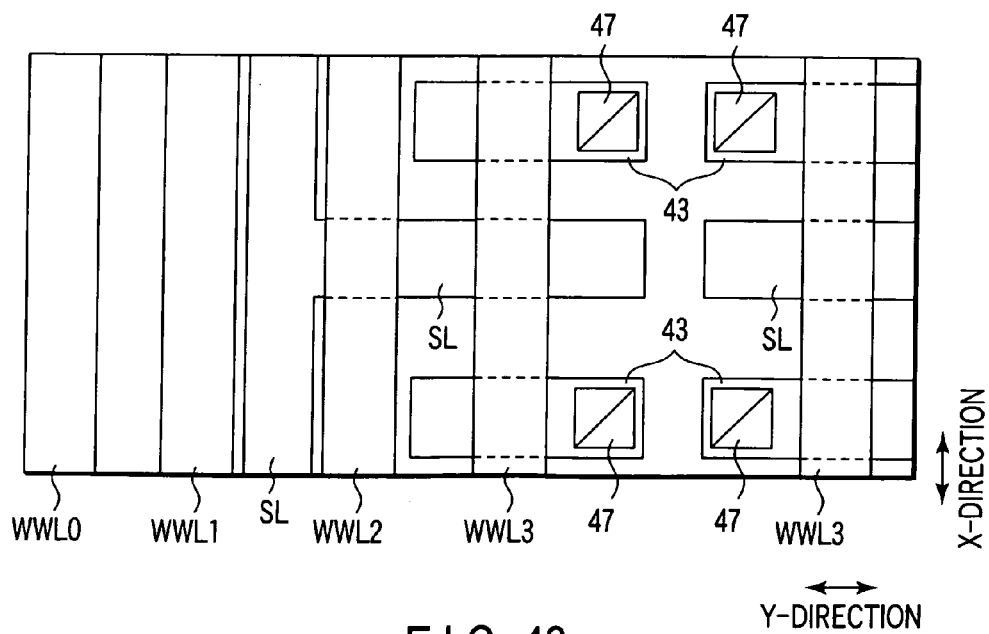
FIG. 48 is a view showing a layout of source lines and write word lines of Structure Example 3.

FIG. 48 shows a layout of the source line SL and the write word lines WWL0, WWL1, WWL2 and WWL3.

The source line SL extends in the Y-direction, and is bent at 90° and extends in the X-direction in the element separation area. The source line SL is connected to the source of the read selection switch.

An intermediate layer 43 is formed in the same wiring layer as the source line SL. The intermediate layer 43 plays a role of preventing a contact hole having a high aspect ratio from being formed. A contact portion 47 represents a contact portion between the intermediate layer 43 and the lower wiring of the TMR elements.

As apparent from FIG. 46, the write word lines WWL0, WWL1, WWL2 and WWL3 are arranged above the source line SL and the intermediate layer 43 and directly below the TMR elements MTJ1, MTJ2, MTJ3 and MTJ4. The write word lines WWL0, WWL1, WWL2 and WWL3 extend in the X-direction.

FIG. 49 shows a layout of the TMR elements MTJ1, MTJ2, MTJ3 and MTJ4 and their lower wiring 27.

The lower wiring 27 has an enough width that the TMR elements MTJ1, MTJ2, MTJ3 and MTJ4 can be arranged thereon, and extends in the Y-direction. In a contact portion 47 at one end of the lower wiring 27, a contact plug is connected. The TMR elements MTJ1, MTJ2, MTJ3 and MTJ4 are arranged at fixed intervals in the Y-direction and arranged directly above the write word lines.

FIG. 50 shows a layout of the upper electrode 26 and the lower electrode 27 of the TMR elements.

The upper electrode 26 is arranged directly above the TMR elements and extends in the Y-direction. The upper electrode 26 functions as the write bit line and the read bit line. One upper wiring 26 is arranged in one column and commonly connected to a plurality of the TMR elements in the block in one column.

⑥ Others

In the above-described Structure Example 3 (device structures 1, 2, 3 and 4), it is presumed that the read selection switch RSW is the MOS transistor. As the read selection switch RSW, however, a diode, a bipolar transistor or the like may be used in place of the MOS transistor.

2. Structure of TMR Element

In the cell array structure mentioned above, a plurality of the TMR elements in one block are connected to each other in series or in parallel.

In case of presuming such a cell array structure, when the structures of a plurality of the TMR elements in one block are the same, a special read operation principle such as a destructive read operation principle may be adopted. In the destructive read operation principle, however, the read operation for two times and the write operation for two times are required in order to complete the data read operation for one time.

Thus, here, there is proposed a so-called non-destructive read operation principle by which data is not destroyed when reading data from one of a plurality of the TMR elements connected to each other in series or in parallel.

The read operation principle will be described later, and the structure of the TMR element for realizing this read operation principle will now be explained.

(1) Equivalent Circuit in Read Operation

Description will be first given as to an equivalent circuit of the TMR elements (memory cells) in one block in the read operation.

FIG. 51 shows an equivalent circuit during the read operation in Structure Example 1 of the cell array structure.

The four TMR elements MTJ1, MTJ2, MTJ3 and MTJ4 are connected to each other in series, and one end of these elements is connected to a read bit line BLj. The potential of the read bit line BLj is set to, e.g., a power supply potential VDD. A read selection switch (MOS transistor) RSW is connected between the other end of the TMR elements MTJ1, MTJ2, MTJ3 and MTJ4 connected in series and a source line SL.

Since the potential of the gate of the read selection switch RSW, namely, the read word line RWLn is set to "H", the read selection switch RSW enters the on state. The source line SL is set to, e.g., a ground potential VSS.

FIG. 52 shows an equivalent circuit during the read operation in Structure Examples 2 and 3 of the cell array structure.

The four TMR elements MTJ1, MTJ2, MTJ3 and MTJ4 are connected to each other in parallel, and one end of these elements is connected to the read bit line BLj. The potential of the read bit line BLj is set to, e.g., the power supply potential VDD. The read selection switch (MOS transistor) RSW is connected between the other end of the TMR elements MTJ1, MTJ2, MTJ3 and MTJ4 connected in parallel and the source line SL.

Since the potential of the gate of the read selection switch RSW, namely, the read word line RWLn is set to "H", the read selection switch RSW enters the on state. The source line SL is set to, e.g., the ground potential VSS.

FIG. 53 shows an equivalent circuit during the read operation in a second modification of Structure Example 1 of the cell array structure.

The four TMR elements MTJ1, MTJ2, MTJ3 and MTJ4 are connected to each other in series, and one end of these elements is connected to the read bit line BLj. The potential of the read bit line BLj is set to, for example, the power supply potential VDD. A diode DI is connected between the other end of the TMR elements MTJ1, MTJ2, MTJ3 and MTJ4 connected in series and the read word line RWLn.

Since the potential of the read word line RWLn is set to the ground potential VSS, a read current flows to the TMR elements MTJ1, MTJ2, MTJ3 and MTJ4 connected to each other in series.

FIG. 54 shows an equivalent circuit during the read operation in the third modification of Structure Example 1 of the cell array structure.

The four TMR elements MTJ1, MTJ2, MTJ3 and MTJ4 are connected to each other in series, and one end of these elements is connected to the read bit line BLj. The potential of the read bit line BLj is set to, for example, the power supply potential VDD. The read selection switch (bipolar transistor) RWS is connected between the other end of the TMR elements MTJ1, MTJ2, MTJ3 and MTJ4 connected in series and the source line SL.

Since the potential of the gate of the read selection switch RSW, namely, the read word line RWLn is set to "H", the read selection switch RSW enters the on state. The source line SL is set to, for example, the ground potential VSS.

FIG. 55 shows an equivalent circuit during the read operation in the second modification of Structure Example 2 of the cell array structure.

The four TMR elements MTJ1, MTJ2, MTJ3 and MTJ4 are connected to each other in parallel, and one end of these elements is connected to the read bit line BLj. The potential of the read bit line BLj is set to, for example, the power supply potential VDD. The diode DI is connected between the other end of the TMR elements MTJ1, MTJ2, MTJ3 and MTJ4 connected in parallel and the read word line RWLn.

Since the potential of the read word line RWLn is set to the ground potential VSS, the read current flows to the TMR elements MTJ1, MTJ2, MTJ3 and MTJ4 connected to each other in parallel.

FIG. 56 shows an equivalent circuit during the read operation in the third modification of Structure Example 2 of the cell array structure.

The four TMR elements MTJ1, MTJ2, MT-J3 and MTJ4 are connected to each other in parallel, and one end of these elements is connected to the read bit line BLj. The potential of the read bit line BLj is set to, e.g., the power supply potential VDD. The read selection switch (bipolar transistor) RSW is connected between the other end of the TMR elements MTJ1, MTJ2, MTJ3 and MTJ4 connected in parallel and the source line SL.

Since the potential of the gate of the read selection switch RSW, namely, the read word line RWLn is set to "H", the read selection switch RSW enters the on state. The source line SL is set to, for example, the ground potential VSS.

(2) Structure of TMR Element

A characteristic of the structure of the TMR element according to the present invention lies in that the structures of the TMR elements connected to each other in series or in parallel in one block are different from each other.

Specifically, in the present invention, the structures of a plurality of the TMR elements are determined in such a manner the respective TMR elements have resistance values different from each other when the magnetizing states of a plurality of the TMR elements in one block are all parallel (as to definition of parallel and anti-parallel, see the section of prior art).

For example, resistance values of the respective TMR elements when the magnetizing states of a plurality of the TMR elements in one block are all parallel are set as follows.

It is assumed that i (i is a plural number) TMR elements connected to each other in series or parallel are MTJ1, MTJ2, . . . MTJi and their resistance values when the magnetizing states are parallel are RTMR1, RTMR2, RMTRi. At that time, the resistance values RTMR1, RTMR2, . . . RTMRi are set as the following expressions:

$$RTMR1=R,\ RTMR2=2\times R,\ \ldots\ RTMRi=2^{i-1}\times R \quad (1)$$

That is, the resistance values of the respective TMR elements when the magnetizing states of a plurality of the TMR elements in one block are doubly different from each other.

It is to be noted that positions of the i TMR elements MTJ1, MTJ2, . . . MTJi in the block are not fixed. For example, the TMR element closest to the read selection switch RSW may be MTJ1 or any other element.

In order to realize the relationship between the resistance values of such TMR elements, the structures of a plurality of the TMR elements in the block are determined to be different from each other.

The relationship represented by the above expression (1) can be realized by changing an area of each TMR element (area of a tunneling barrier of each TMR element).

That is, assuming that areas of i TMR elements MTJ1, MTJ2, . . . MTJi connected to each other in series or parallel are STMR1, STMR2, . . . STMRi, the relationship of the above expression (1) can be realized by setting these areas as follows:

$$STMR1=S,\ STMR2=R/2,\ \ldots\ STMRi=R/2^{i-1} \quad (2)$$

Further, as a method other than that which changes an area of each TMR element, a plurality of the TMiR elements which satisfy the relationship of the above expression (1) can be realized by changing a number of the MTJ elements having the same structure and the same area to be superposed (number of tunneling barriers).

For example, it is assumed that the MTJ element consisting of a storage layer, a pinned layer and a tunneling barrier is determined as one unit and a resistance value of one unit is R. In this case, the resistance value of the TMR element consisting of two units is 2×R, the resistance value of the TMR element consisting of four units is 4×R, and the resistance value of the TMR element consisting of eight units is 8×R.

In this manner, the resistance value of the TMR element can be changed by varying a number of units constituting one TMR element (number of tunneling barriers).

In case of realizing the relationship of the resistance values of the TMR elements in one block by a method other than that which changes an area of each TMR element, since an area of each TMR element does not change, the degree of the magneto resistive effect of each TMR element remains unchanged. Furthermore, since an area of the TMR element (area in the plane X-Y) is fixed, this is advantageous for realization of high integration of the TMR elements.

① Structure Example 1

FIG. 57 shows an example of the TMR element MTJ1.

The TMR element MTJ1 is constituted by a basic unit. The basic unit means a unit consisting of a tunneling barrier, a ferromagnetic layer (storage layer) arranged on one side of the tunneling barrier, and a ferromagnetic layer arranged on the other side of the tunneling barrier and an anti-ferromagnetic layer.

Since the ferromagnetic layer arranged on the other side of the tunneling barrier is in contact with the anti-ferromagnetic layer, the direction of its magnetization is fixed. The ferromagnetic layer arranged on the other side of the tunneling barrier and the anti-ferromagnetic layer which is in contact with the ferromagnetic layer constitute the pinned layer.

A resistance value of the TMR element MTJ1 realized by this structure is determined as R.

FIG. 58 shows an example of the TMR element MTJ2.

The TMR element MTJ2 is constituted by the two basic units. However, one ferromagnetic layer (storage layer) is shared by the two basic units. That is, the pinned layer consisting of the ferromagnetic layer and the anti-ferromagnetic layer is arranged on one side of the ferromagnetic layer as the storage layer through the tunneling barrier, and the pinned layer consisting of the ferromagnetic layer and the anti-ferromagnetic layer is also arranged on the other side of the ferromagnetic layer as the storage layer through the tunneling barrier.

The TMR element MTJ2 has a structure in which the tunneling barrier and the pinned layer (the ferromagnetic layer and the anti-ferromagnetic layer) are symmetrically arranged with respect to the ferromagnetic layer as the storage layer.

A resistance value of the TMR element MTJ2 realized by this structure is 2×R.

Figure 59:
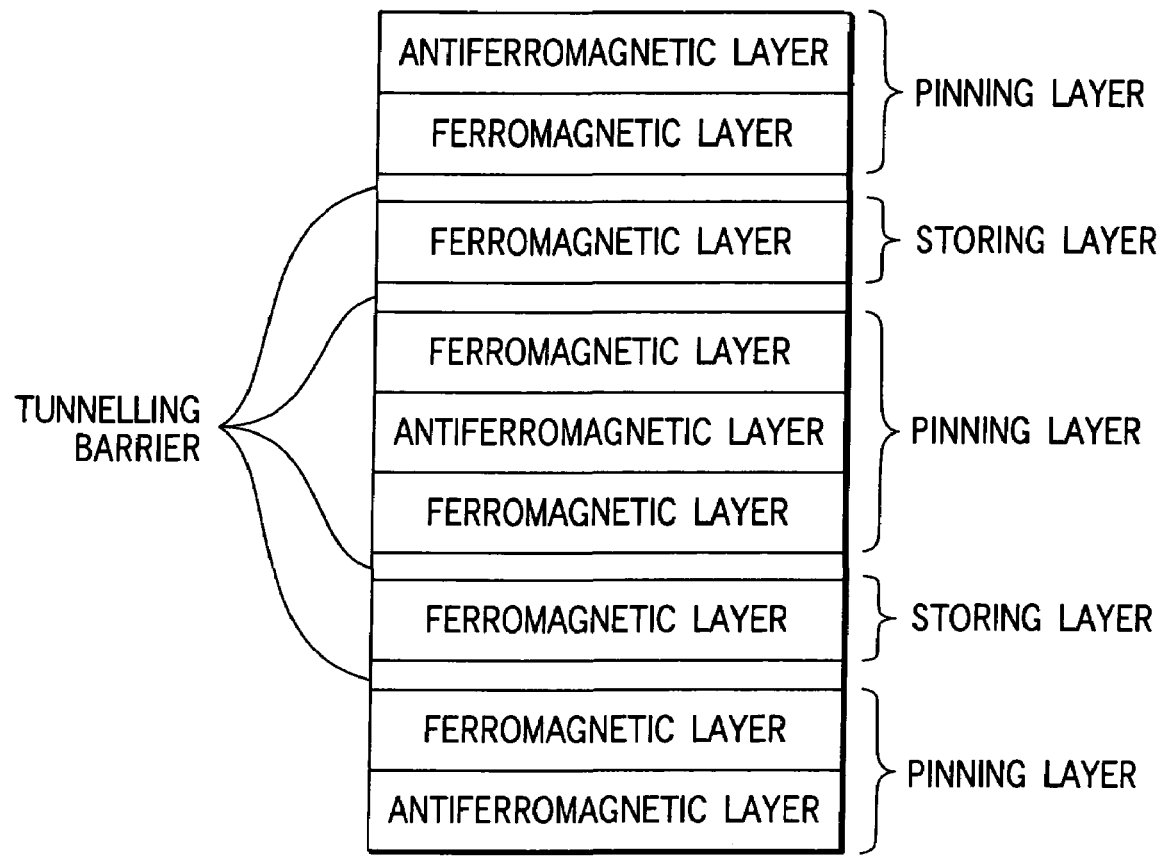
FIG. 59 is a view showing a structure example of a third TMR element having a third lowest resistance value.

FIG. 59 shows an example of the TMR element MTJ3.

The TMR element MTJ3 is constituted by the four basic units. In addition, the TMR element MTJ3 may be obtained by connecting the two TMR elements MTJ2 to each other in series. That is, the TMR element MTJ3 has a structure that the two TMR elements MTJ2 are connected to each other in series and the anti-ferromagnetic layer at their connection portion is shared by the two TMR elements.

Although the two storage layers exist in the TMR element MTJ3, the same data is naturally stored in these two storage layers. That is, one-bit data is stored in the TMR element MTJ3 by the two storage layers.

A resistance value of the TMR element MTJ3 realized by this structure is 4×R.

Figure 60:
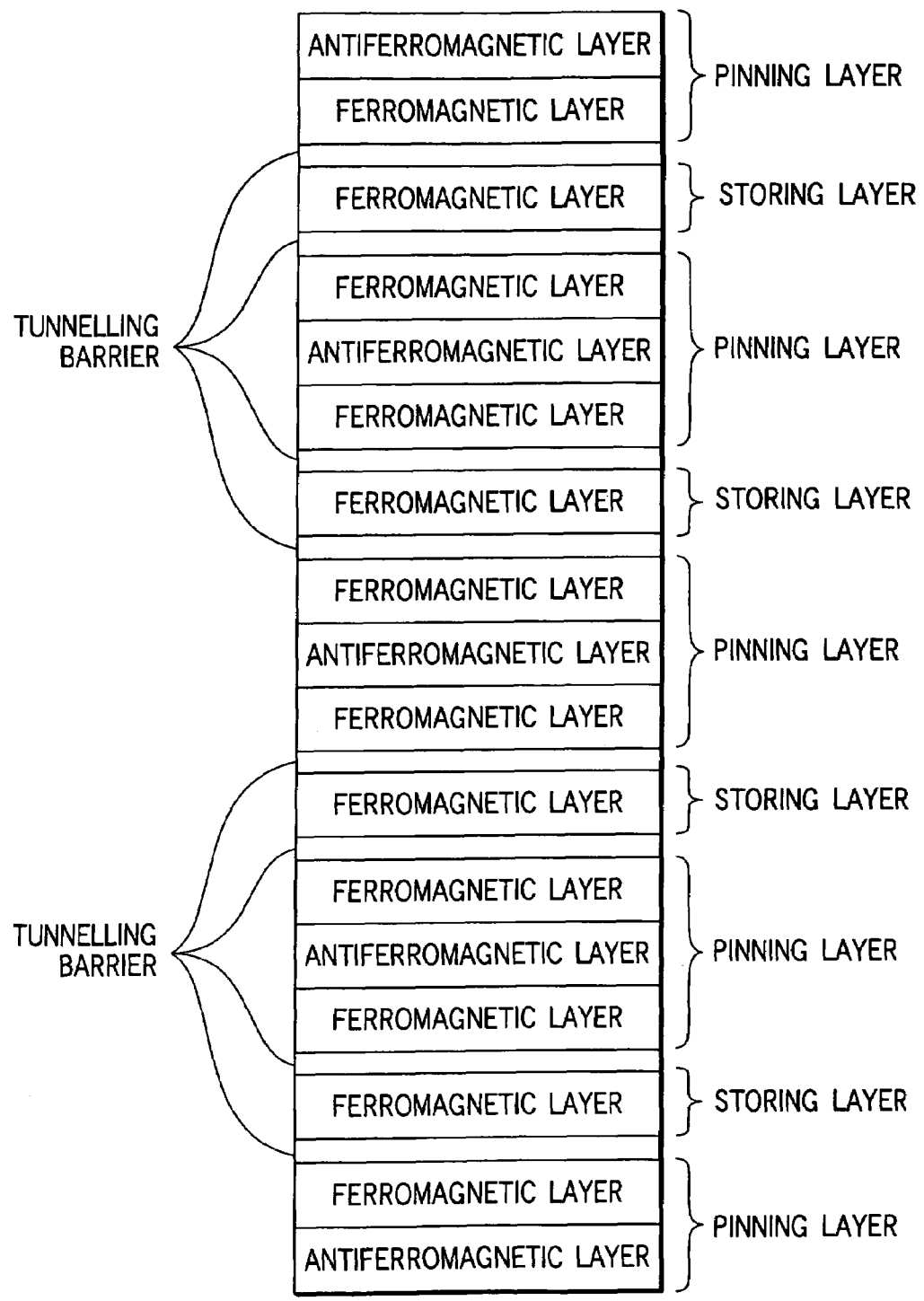
FIG. 60 is a view showing a structure example of a fourth TMR element having a highest resistance value.

FIG. 60 shows an example of the TMR element MTJ4.

The TMR element MTJ4 is constituted by eight basic units. Additionally, the TMR element MTJ4 may be obtained by connecting the two TMR elements MTJ3 to each other in series. That is, the TMR element MTJ4 has a structure in which the two TMR elements MTJ3 are connected to each other in series and the anti-ferromagnetic layer at their connection portion is shared by the two TMR elements MTJ3.

Although the four storage layers exist in the TMR element MTJ4, the same data is naturally stored in these four storage layers. That is, one-bit data is stored in the TMR element MTJ4 by the four storage layers.

A resistance value of the TMR element MTJ4 realized by this structure is 8×R.

② Structure Example 2

In Structure Example 1, description has been given as to the technique which changes a number of tunneling barriers in accordance with a number of basic unit (MTJ elements) and varies a resistance value of the TMR element. In this case, however, since a number of the basic units varies in accordance with each TMR element in on block, the thickness of each TMR element differs.

Thus, in Structure Example 2, in order to solve the problem that the thickness of each TMR element differs in one block, all the TMR elements in one block are constituted by the same number of units and they have the same thickness.

For example, when one block is constituted by four TMR elements, each TMR element is constituted by eight units.

Further, a resistance value of the TMR element is adjusted by determining some of a plurality of units constituting that TMR element as dummy units. The dummy unit means a unit in which the tunneling barrier of the basic unit is changed to non-magnetic metal.

By doing so, when a resistance value of one basic unit is determined as R for example, a resistance value of the TMR element constituted by eight basic units is 8×R (eight tunneling barriers). Furthermore, a resistance value of the TMR element in which four out of eight units are basic units and the remaining four units are dummy units is 4×R (four tunneling barriers).

Moreover, a resistance value of the TMR element in which two out of eight units are basic units and the remaining six units are dummy units is 2×R (two tunneling barriers). In addition, a resistance value of the TMR element in which one out of eight units is a basic unit and the remaining seven units are dummy unit is R (one tunneling barrier).

A resistance value between the two ferromagnetic layers sandwiching the non-magnetic metal there between is sufficiently smaller than a resistance value between the two ferromagnetic layers sandwiching the tunneling barrier there between. Therefore, all the TMR elements can have the same thickness by equaling a number of units constituting the respective TMR elements, and a ratio of the resistance values of the TMR elements in one block can be set to, e.g., 1:2:4:8.

The tunneling barrier in the basic unit can be formed of, for example, alumina. Alumina is formed by oxidizing aluminium.

Thus, after forming aluminium, when the unit is formed without oxidizing the aluminium, that unit becomes a dummy unit. Additionally, after forming aluminium, when this aluminium is oxidized to obtain alumina, the finally completed unit becomes a basic unit having the resistance value R.

It is to be noted that a method for forming a plurality of TMR elements having different resistance values will be described in the section of description of a manufacturing method.

Figure 61:
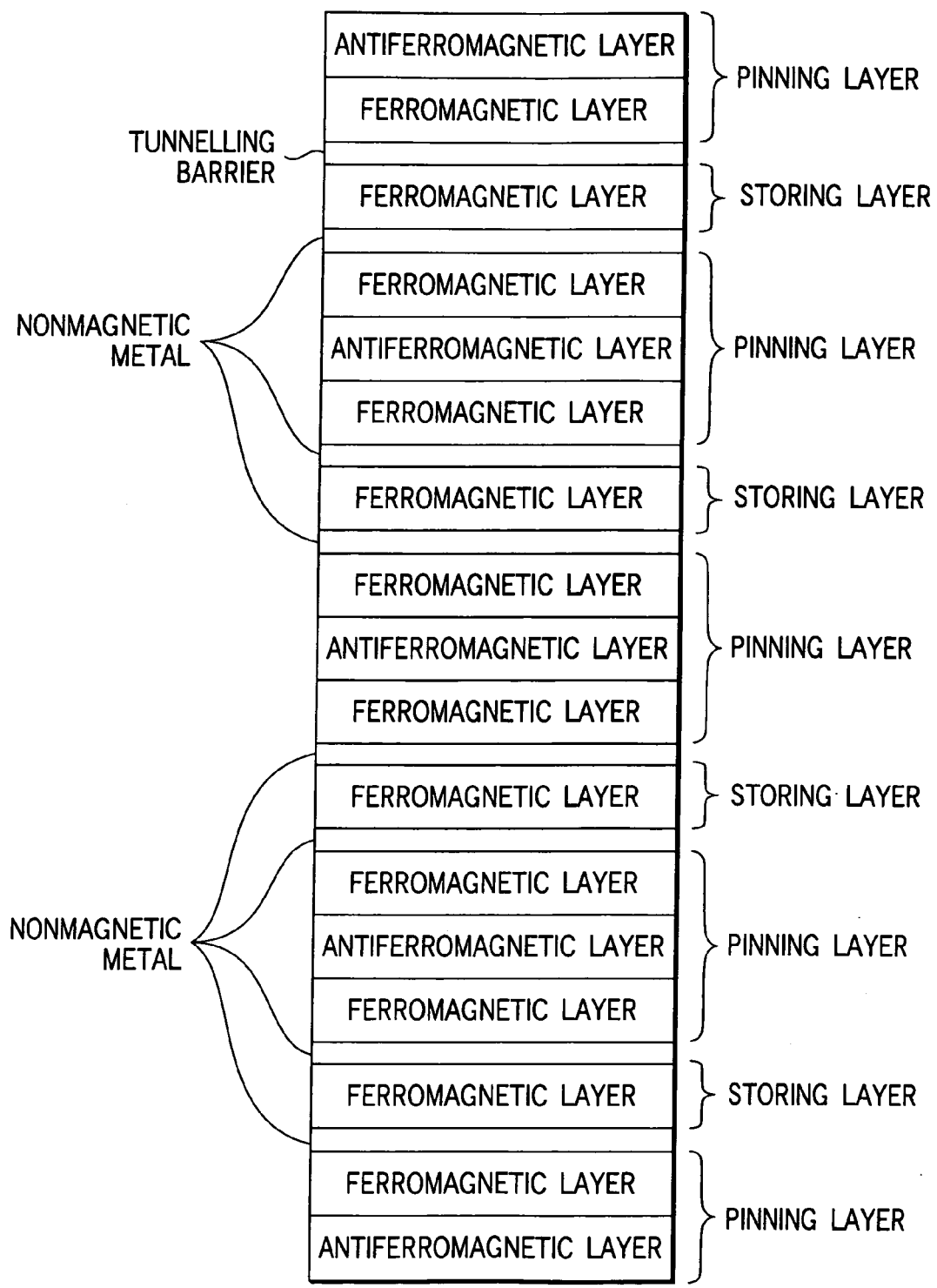
FIG. 61 is a view showing a structure example of the first TMR element having the lowest resistance value.

FIG. 61 shows an example of the TMR element MTJ1.

The TMR element MTJ1 is constituted by eight units. One in the eight units is a basic unit having the tunneling barrier, and the remaining seven units are dummy units having no tunneling barrier (having the non-magnetic metal).

Thus, the resistance value of the TMR element MTJ1 realized by this structure becomes the resistance value R corresponding to one unit (or tunneling barrier).

Figure 62:
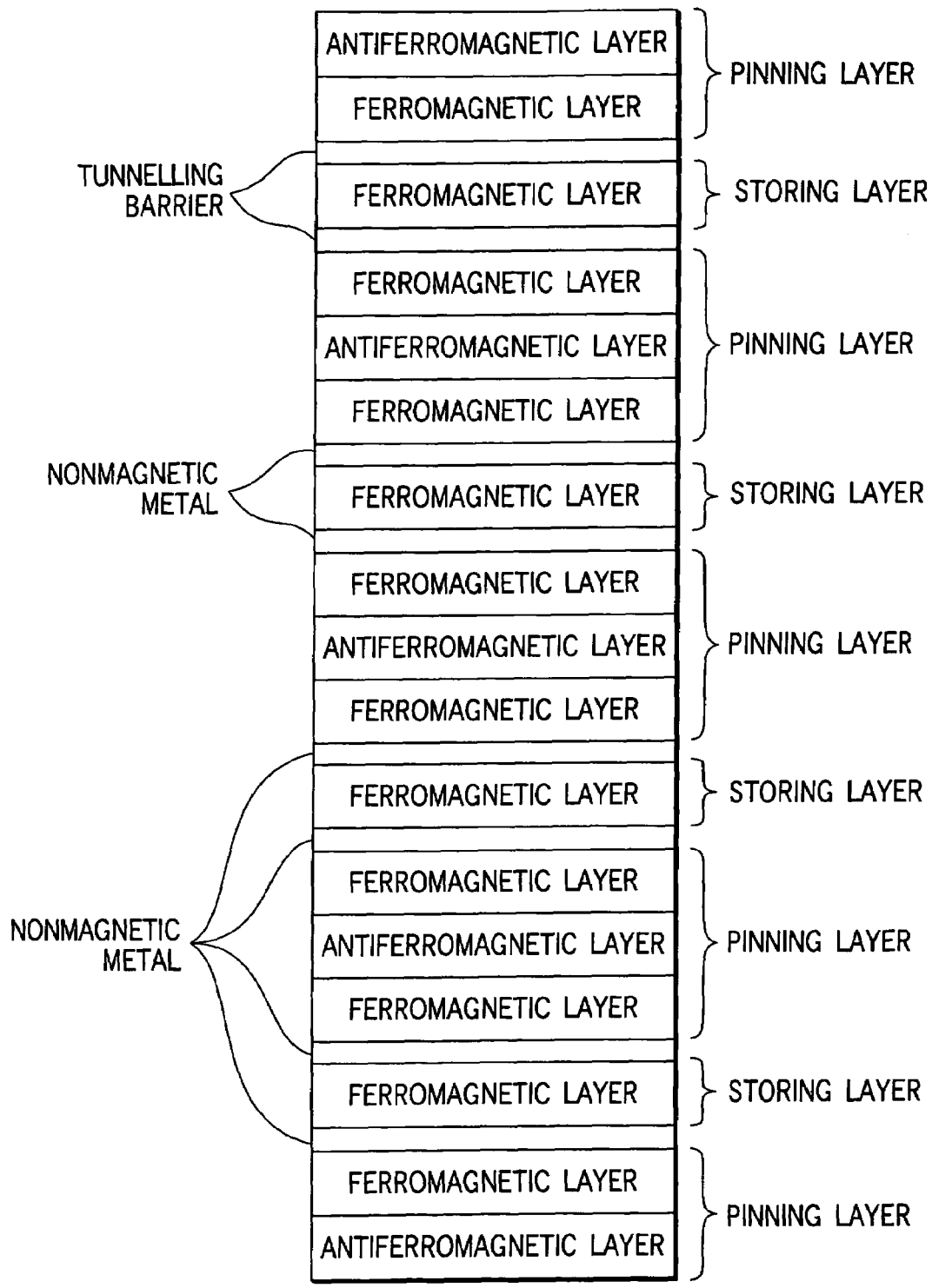
FIG. 62 is a view showing a structure example of the second TMR element having the second lowest resistance value.

FIG. 62 shows an example of the TMR element MTJ2.

The TMR element MTJ2 is constituted by eight units. Two in eight units are basic units having the tunneling barriers and the remaining six units are dummy units having no tunneling barrier (having the non-magnetic metal).

Therefore, the resistance value of the TMR element MTJ2 realized by this structure becomes the resistance value 2×R corresponding to two units (or tunneling barriers).

Figure 63:
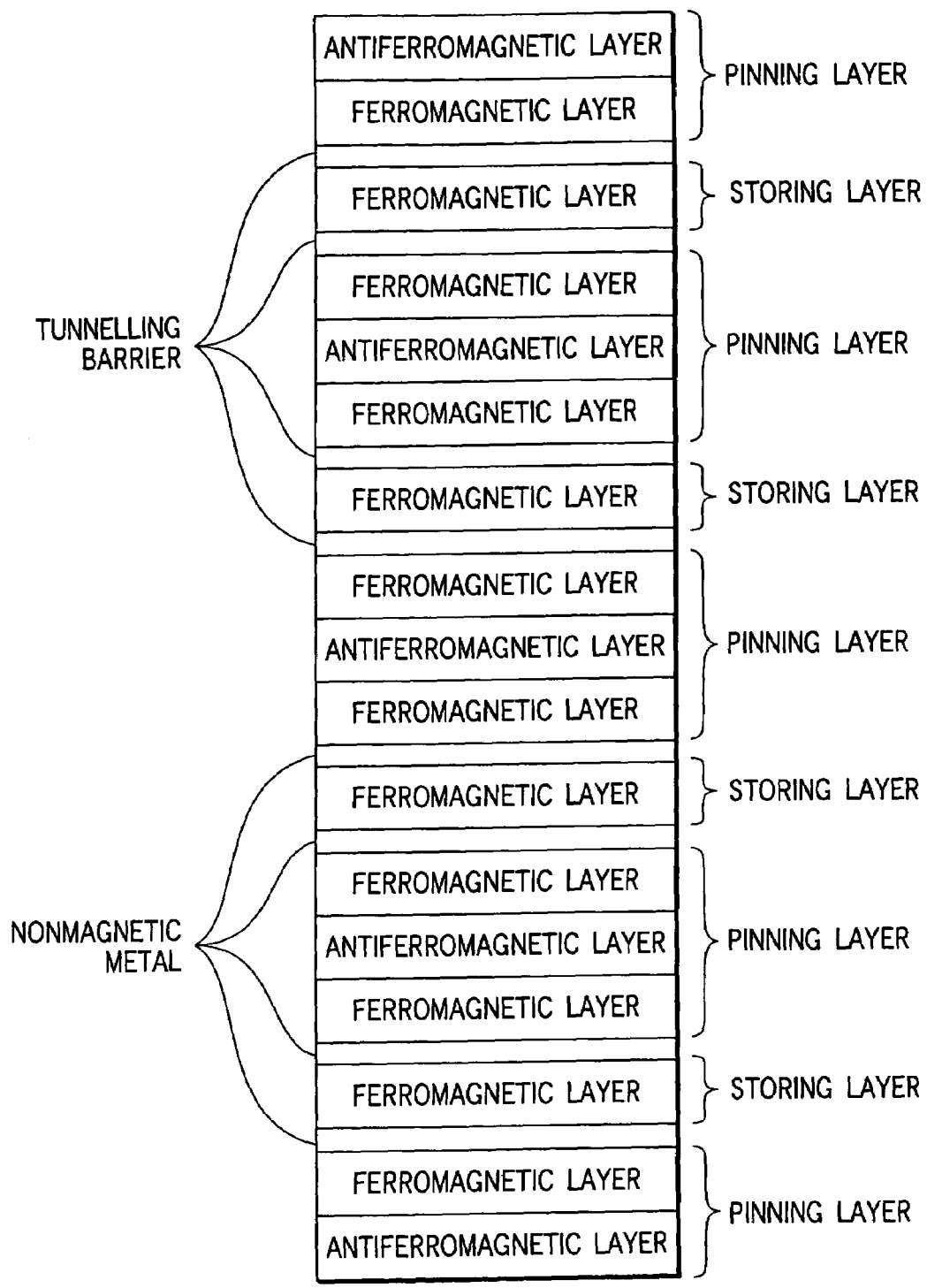
FIG. 63 is a view showing a structure example of the third TMR element having the third lowest resistance value.

FIG. 63 shows an example of the TMR element MTJ3.

The TMR element MTJ3 is constituted by eight units. Four in eight units are basic units having tunneling barriers and the remaining four units are dummy units having no tunneling barrier (having the non-magnetic metal).

Therefore, the resistance value of the TMR element MTJ3 realized by this structure becomes the resistance value 4×R corresponding to four units.

Figure 64:
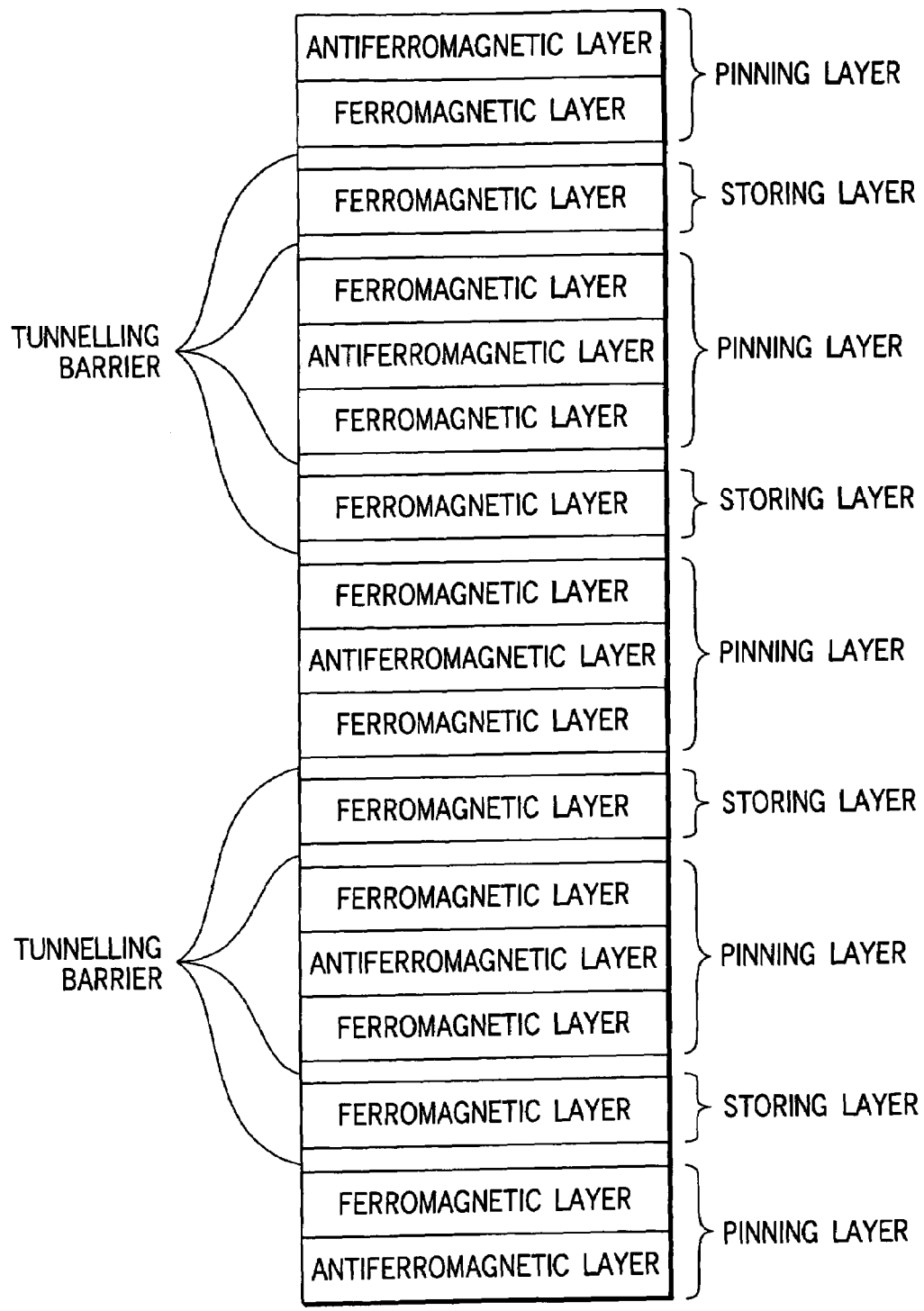
FIG. 64 is a view showing a structure example of the fourth TMR element having the highest resistance value.

FIG. 64 shows an example of the TMR element MTJ4.

The TMR element MTJ4 is constituted by eight units. All of the eight units are the basic units having the tunneling barriers.

Therefore, the resistance value of the TMR element MTJ4 realized by this structure becomes the resistance value 8×R corresponding to eight units (or tunneling barriers).

(3) Others

The present invention is characterized in that a plurality of the TMR elements in one block have different resistance values by changing a number of the tunneling barriers assuming that the magnetizing states of a plurality of the TMR elements in that block are the same.

Therefore, the above-described structure of the TMR element is one example, and various modifications are possible. For example, as to the TMR elements MTJ1, MTJ2 and MTJ3 shown in FIGS. 61 to 63, if a number of the tunneling barriers is the same, positions of the basic units having the tunneling barriers or positions of the dummy units having the non-magnetic metal can be arbitrarily changed.

3. Read Operation Principle

The read operation principle according to the present invention will now be described.

In the read operation principle according to the present invention, when performing the read operation in units of block, the resistance values of a plurality of the TMR elements connected to each other in series or parallel in the block during the read operation are different from each other when the magnetizing states are the same (parallel or anti-parallel). Further, by utilizing a difference in the resistance values, data of all the TMR elements in the block can be read at a time.

(1) Concrete Example 1

Concrete Example 1 will now be described.

In this example, as a prerequisite, one block (read block) is constituted by the four TMR elements MTJ1, MTJ2, MTJ3 and MTJ4 connected to each other in series.

It is to be noted that positions of the TMR elements MTJ1, MTJ2, MTJ3 and MTJ4 in the block are not restricted and these positions can be freely determined when designing. At least after completion of the memory device, the memory itself, of course, must recognize positions of the respective TMR elements MTJ1, MTJ2, MTJ3 and MTJ4 in the block.

If the positions of the respective MTJ1, MTJ2, MTJ3 and MTJ4 are not grasped, the TMR elements MTJ1, MTJ2, MTJ3 and MTJ4 used for writing can not be specified during the write operation.

Furthermore, resistance values of the four TMR elements MTJ1, MTJ2, MTJ3 and MTJ4 in the read block are set as shown in Table 1 during the read operation (when the read current is flowing).

TABLE 1

RESISTANCE VALUE OF TMR ELEMENT
IN ONE READ BLOCK IN READ OPERATION

| STORING DATA | TMR ELEMENT | | | |
|---|---|---|---|---|
| | MTJ1 | MTJ2 | MTJ3 | MTJ4 |
| "1" (PARALLEL) | R | 2R | 4R | 8R |
| "0" (ANTI-PARALLEL) | R + ΔR | 2R + 2ΔR | 4R + 4ΔR | 8R + 8ΔR |

That is, as to the TMR element MTJ1, it is assumed that the resistance value when the magnetizing state is parallel (state of "1") is R and the resistance value when the magnetizing state is anti-parallel (state of "0") is R+ΔR.

Moreover, as to the TMR element MTJ2, it is assumed that the resistance value when the magnetizing state is parallel (state of "1") is 2R and the resistance value when the magnetizing state is anti-parallel (state of "0") is 2R+2ΔR.

In addition, as to the TMR element MTJ3, it is assumed that the resistance value when the magnetizing state is parallel (state of "1") is 4R and the resistance value when the magnetizing state is anti-parallel (state of "0") is 4R+4ΔR.

Additionally, as to the TMR element MTJ4, it is assumed that the resistance value when the magnetizing state is parallel (state of "1") is 8R and the resistance value when the magnetizing state is anti-parallel (state of "0") is 8R+8ΔR.

At this time, the relationship between data of the TMR elements in one block and sum resistance values is as shown in Table 2.

TABLE 2

RELATIONSHIP BETWEEN DATA AND SUM RESISTANCE
VALUE, OF TMR ELEMENTS IN ONE READ BLOCK

| | MJT1 | MJT2 | MJT3 | MJT4 | SUM RESISTANCE VALUE |
|---|---|---|---|---|---|
| C1 | 1 | 1 | 1 | 1 | 15R |
| | 0 | 1 | 1 | 1 | 15 + ΔR |
| B1 | 1 | 0 | 1 | 1 | 15 + 2ΔR |
| | 0 | 0 | 1 | 1 | 15 + 3ΔR |
| C2 | 1 | 1 | 0 | 1 | 15 + 4ΔR |
| | 0 | 1 | 0 | 1 | 15 + 5ΔR |
| A | 1 | 0 | 0 | 1 | 15 + 6ΔR |
| | 0 | 0 | 0 | 1 | 15 + 7ΔR |
| C3 | 1 | 1 | 1 | 0 | 15 + 8ΔR |
| | 0 | 1 | 1 | 0 | 15 + 9ΔR |
| B2 | 1 | 0 | 1 | 0 | 15 + 10ΔR |
| | 0 | 0 | 1 | 0 | 15 + 11ΔR |
| C4 | 1 | 1 | 0 | 0 | 15 + 12ΔR |
| | 0 | 1 | 0 | 0 | 15 + 13ΔR |
| | 1 | 0 | 0 | 0 | 15 + 14ΔR |
| | 0 | 0 | 0 | 0 | 15 + 15ΔR |

That is, there are 16 combinations of data values of the four TMR elements MTJ1, MTJ2, MTJ3 and MTJ4 in one block, and there are also 16 combinations of sum resistance values in accordance with 16 combinations of the data values. A minimum value of the sum resistance value is 15R, and a maximum value of the same is 15R+15ΔR. In addition, a difference between the sum resistance values is ΔR.

During the read operation, when the read current (current value I) is caused to flow to the four TMR elements MTJ1, MTJ2, MTJ3 and MTJ4 in this one block, the potential of the read bit line BLj has a value according to the sum resistance value of the four TMR elements MTJ1, MTJ2, MTJ3 and MTJ4 in one block.

Assuming that the current value of the read current is I, a minimum value of the potential which appears in the read bit line BLj is I×(15R+r), and a maximum value of the same is I×(15R+15ΔR+r) Additionally, a difference between the respective potentials which appear in the read bit line BLj is I×ΔR.

Here, r is the sum of some accompanied resistances, for example, the read selection switch (MOS transistor) RSW. When designing the resistance r to be sufficiently smaller than the sum resistance value of the TMR elements MTJ1, MTJ2, MTJ3 and MTJ4, this r can be ignored.

In the read operation principle according to the present invention, when the read current is caused to flow to a plurality of the TMR elements in the read block during the read operation, the read potential Vtotal according to a combination of the data values of a plurality of the TMR elements appears in the read bit line BLj. Therefore, by detecting the read potential Vtotal by using a sense amplifier (for example, an analog/digital converter), data of a plurality of the TMR elements in the read block can be read at a time.

Tables 3 and 4 show the principle for judging the sum resistance value of the TMR elements MTJ1, MTJ2, MTJ3 and MTJ4, concretely, data values of the four TMR elements MTJ1, MTJ2, MTJ3 and MTJ4 in the read block from the read potential Vtotal which appears in the read bit line BLj.

TABLE 3

JUDGMENT 1 OF DATA VALUE OF
TMR ELEMENT IN ONE READ BLOCK

| | "1" (PARALLEL) | "0" (ANTI-PARALLEL) |
|---|---|---|
| MTJ4 | [1]Radd < $15R + 7\Delta R + \frac{\Delta R}{2}$ | [2]Radd > $15R + 7\Delta R + \frac{\Delta R}{2}$ |
| MTJ3 | CASE OF [1] | CASE OF [1] |
| | [3]Radd < $15R + 3\Delta R + \frac{\Delta R}{2}$ | [4]Radd > $15R + 3\Delta R + \frac{\Delta R}{2}$ |
| | CASE OF [2] | CASE OF [2] |
| | [5]Radd < $15R + 11\Delta R + \frac{\Delta R}{2}$ | [6]Radd > $15R + 11\Delta R + \frac{\Delta R}{2}$ |
| MTJ2 | CASE OF [3] | CASE OF [3] |
| | [7]Radd < $15R + \Delta R + \frac{\Delta R}{2}$ | [8]Radd > $15R + \Delta R + \frac{\Delta R}{2}$ |
| | CASE OF [4] | CASE OF [4] |
| | [9]Radd < $15R + 5\Delta R + \frac{\Delta R}{2}$ | [10]Radd > $15R + 5\Delta R + \frac{\Delta R}{2}$ |
| | CASE OF [5] | CASE OF [5] |
| | [11]Radd < $15R + 9\Delta R + \frac{\Delta R}{2}$ | [12]Radd > $15R + 9\Delta R + \frac{\Delta R}{2}$ |
| | CASE OF [6] | CASE OF [6] |
| | [13]Radd < $15R + 13\Delta R + \frac{\Delta R}{2}$ | [14]Radd > $15R + 13\Delta R + \frac{\Delta R}{2}$ |

TABLE 4

JUDGMENT 2 OF DATA VALUE OF
TMR ELEMENT IN ONE READ BLOCK

| | "1" (PARALLEL) | "0" (ANTI-PARALLEL) |
|---|---|---|
| MTJ1 | CASE OF [7] $\text{Radd} < 15R + \frac{\Delta R}{2}$ | CASE OF [7] $\text{Radd} > 15R + \frac{\Delta R}{2}$ |
| | CASE OF [8] $\text{Radd} < 15R + 2\Delta R + \frac{\Delta R}{2}$ | CASE OF [8] $\text{Radd} > 15R + 2\Delta R + \frac{\Delta R}{2}$ |
| | CASE OF [9] $\text{Radd} < 15R + 4\Delta R + \frac{\Delta R}{2}$ | CASE OF [9] $\text{Radd} > 15R + 4\Delta R + \frac{\Delta R}{2}$ |
| | CASE OF [10] $\text{Radd} < 15R + 6\Delta R + \frac{\Delta R}{2}$ | CASE OF [10] $\text{Radd} > 15R + 6\Delta R + \frac{\Delta R}{2}$ |
| | CASE OF [11] $\text{Radd} < 15R + 8\Delta R + \frac{\Delta R}{2}$ | CASE OF [11] $\text{Radd} > 15R + 8\Delta R + \frac{\Delta R}{2}$ |
| | CASE OF [12] $\text{Radd} < 15R + 10\Delta R + \frac{\Delta R}{2}$ | CASE OF [12] $\text{Radd} > 15R + 10\Delta R + \frac{\Delta R}{2}$ |
| | CASE OF [13] $\text{Radd} < 15R + 12\Delta R + \frac{\Delta R}{2}$ | CASE OF [13] $\text{Radd} > 15R + 12\Delta R + \frac{\Delta R}{2}$ |
| | CASE OF [14] $\text{Radd} < 15R + 14\Delta R + \frac{\Delta R}{2}$ | CASE OF [14] $\text{Radd} > 15R + 14\Delta R + \frac{\Delta R}{2}$ |

In the read operation principle according to the present invention, when the magnetizing states are the same (parallel, for example), the data value of the TMR element having the highest resistance value (in this example, the TMR element MTJ4, the resistance value=8R) is judged based on predetermined criteria.

For example, by setting a threshold value 15R+7ΔR+ΔR/2 and making judgment upon whether the sum resistance value Rtotal of the four TMR elements MTJ1, MTJ2, MTJ3 and MTJ4 exceeds the threshold value or is below the threshold value in this example, the data value of the TMR element MTJ4 can be determined.

Subsequently, when the magnetizing states are the same (parallel, for example), the data value of the TMR element having the second highest resistance value (in this example, the TMR element MTJ3, the resistance value=4R) is judged based on predetermined criteria.

The predetermined criteria in this example varies depending on the data value of the TMR element MTJ4.

For example, when it is determined that the data value of the TMR element MTJ4 is "1", the threshold value 15R+3ΔR+ΔR/2 is set, and judgment is made upon whether the sum resistance value Rtotal of the four TMR elements MTJ1, MTJ2, MTJ3 and MTJ4 exceeds the threshold value or is below the threshold value.

Further, when it is determined that the data value of the TMR element MTJ4 is "0", the threshold value 15R+11ΔR+ΔR/2 is set, and judgment is made upon whether the sum resistance value Rtotal of the four TMR elements MTJ1, MTJ2, MTJ3 and MTJ4 exceeds the threshold value or is below the threshold value.

With the above-described method, the data value of the TMR element MTJ3 can be determined.

Then, when the magnetizing states are the same (parallel, for example), the data value of the TMR element having the third highest resistance value (in this example, the TMR element MTJ2, the resistance value=2R) is judged based on predetermined criteria.

The predetermined criteria in this example varies depending on the data values of the two TMR elements MTJ4 and MTJ3.

For example, when it is determined that the data value of the TMR element MTJ4 is "1" and the data value of the TMR element MTJ3 is "1", the threshold value 15R+ΔR+ΔR/2 is set, and judgment is made upon whether the sum resistance value Rtotal of the four TMR elements MTJ1, MTJ2, MTJ3 and MTJ4 exceeds the threshold value or is below the threshold value.

Furthermore, when it is determined that the data value of the TMR element MTJ4 is "1" and the data the data value of the TMR element MTJ3 is "0", the threshold value 15R+5ΔR+ΔR/2 is set, and judgment is made upon whether the sum resistance value Rtotal of the four TMR elements MTJ1, MTJ2, MTJ3 and MTJ4 exceeds the threshold value or is below the threshold value.

Moreover, when it is determined that the data value of the TMR element MTJ4 is "0" and the data value of the TMR element MTJ3 is "1", the threshold value 15R+9ΔR+ΔR/2 is set, and judgment is made upon whether the sum resistance value Rtotal of the four TMR elements MTJ1, MTJ2, MTJ3 and MTJ4 exceeds the threshold value or is below the threshold value.

In addition, when it is determined that the data value of the MTJ4 is "0" and the data value of the TMR element MTJ3 is "0", the threshold value 15R+13ΔR+ΔR/2 is set, and judgment is made upon whether the sum resistance value Rtotal of the four TMR elements MTJ1, MTJ2, MTJ3 and MTJ4 exceeds the threshold value or is below the threshold value.

With the above-described operation, the data value of the TMR element MTJ2 can be determined.

Subsequently, when the magnetizing states are the same (parallel, for example), the data value of the TMR element having the lowest resistance value (in this example, the TMR element MTJ1, the resistance value=R) is judged based on predetermined criteria.

The predetermined criteria in this example varies depending on the data values of the three TMR elements MTJ4, MTJ3 and MTJ2.

For example, when it is determined that the data value of the TMR element MTJ4 is "1", the data value of the TMR element MTJ3 is "1" and the data value of the TMR element MTJ2 is "1", the threshold value 15R+ΔR/2 is set, and judgment is made upon whether the sum resistance value Rtotal of the four TMR elements MTJ1, MTJ2, MTJ3 and MTJ4 exceeds the threshold value or is below the threshold value.

Additionally, when it is determined that the data value of the TMR element MTJ4 is "1", the data value of the TMR element MTJ3 is "1" and the data value of the TMR element MTJ2 is "0", the threshold value 15R+2ΔR+ΔR/2 is set, and judgment is made upon whether the sum resistance value Rtotal of the four TMR elements MTJ1, MTJ2, MTJ3 and MTJ4 exceeds the threshold value or is below the threshold value.

Further, when it is determined that the data value of the TMR element MTJ4 is "1", the data value of the TMR element MTJ3 is "0" and the data value of the TMR element MTJ2 is "1", the threshold value 15R+4ΔR+ΔR/2 is set, and judgment is made upon whether the sum resistance value Rtotal of the four TMR elements MTJ1, MTJ2, MTJ3 and MTJ4 exceeds the threshold value or is below the threshold value.

Furthermore, when it is determined that the data value of the TMR element MTJ4 is "1", the data value of the TMR element MTJ3 is "0" and the data value of the TMR element MTJ2 is "0", the threshold value 15R+6ΔR+ΔR/2 is set, and judgment is made upon whether the sum resistance value of the four TMR elements MTJ1, MTJ2, MTJ3 and MTJ4 exceeds the threshold value or is below the threshold value.

Moreover, when it is determined that the data value of the TMR element MTJ4 is "0", the data value of the TMR element MTJ3 is "1" and the data value of the TMR element MTJ2 is "1", the threshold value 15R+8ΔR+ΔR/2 is set, and judgment is made upon the sum resistance value Rtotal of the four TMR elements MTJ1, MTJ2, MTJ3 and MTJ4 exceeds the threshold value or is below the threshold value.

In addition, when it is determined that the data value of the TMR element MTJ4 is "0", the data value of the TMR element MTJ3 is "1" and the data value of the TMR element MTJ2 is "0", the threshold value 15R+10 ΔR+ΔR/2 is set, and judgment is made upon whether the sum resistance value Rtotal of the four TMR elements MTJ1, MTJ2, MTJ3 and MTJ4 exceeds the threshold value or is below the threshold value.

Additionally, when it is determined that the data value of the TMR element MTJ4 is "0", the data value of the TMR element MTJ3 is "0" and the data value of the TMR element MTJ2 is "1", the threshold value 15R+12ΔR+ΔR/2 is set, and judgment is made upon whether the sum resistance value Rtotal of the four TMR elements MTJ1, MTJ2, MTJ3 and MTJ4 exceeds the threshold value or is below the threshold value.

Further, when it is determined that the data value of the TMR element MTJ4 is "0", the data value of the TMR element MTJ3 is "0" and the data value of the TMR element MTJ2 is "0", the threshold value 15R+14ΔR+ΔR/2 is set, and judgment is made upon whether the sum resistance value Rtotal of the four TMR elements MTJ1, MTJ2, MTJ3 and MTJ4 exceeds the threshold value or is below the threshold value.

With the above-described operation, the data value of the TMR element MTJ1 can be determined.

As described above, in the read operation principle according to the present invention, by detecting the read potential Vtotal read to the read bit line BLj by the sense amplifier (for example, an analog/digital converter), the data of a plurality of the TMR elements in the read block can be read at a time by one read operation.

Incidentally, in regard to the operation for judging the data values of the TMR elements MTJ1, MTJ2, MTJ3 and MTJ4, judgment on data of the respective TMR elements can be carried out in time series, and it can be also simultaneously carried out by using a plurality of reference currents.

The logic shown in Tables 3 and 4 can be readily realized by a predetermined logic circuit. That is, if the predetermined logic circuit is used, the read potential Vtotal is detected, and immediately thereafter the data values of the four TMR elements MTJ1, MTJ2, MTJ3 and MTJ4 in the read block can be judged.

A concrete example of the logic circuit will be described in the section of the read circuit.

(2) Concrete Example 2

In Concrete Example 1, it is presumed that a plurality of the TMR elements in the read block are connected to each other in series. On the contrary, in Concrete Example 2, it is presumed that a plurality of the TMR elements in the read block are connected to each other in parallel.

In cases where a plurality of the TMR elements in the read block are connected to each other in parallel, data values of a plurality of the TMR elements can be likewise judged based on the principle similar to the above-described read operation principle.

It is assumed that the resistance values of the TMR elements in one block during the read operation are the same as those in Concrete Example 1.

That is, as shown in Table 1, as to the TMR element MTJ1, it is assumed that the resistance value when the magnetizing state is parallel (state of "1") is R and the resistance value when the magnetizing state is anti-parallel (state of "0") is R+ΔR.

Furthermore, as to the TMR element MTJ2, it is assumed that the resistance value when the magnetizing state is parallel (state of "1") is 2R and the resistance value when the magnetizing state is anti-parallel (state of "0") is 2R+2ΔR.

Moreover, as to the TMR element MTJ3, it is assumed that the resistance value when the magnetizing state is parallel (state of "1") is 4R and the resistance value when the magnetizing state is anti-parallel (state of "0") is 4R+4ΔR.

In addition, as to the TMR element MTJ4, it is assumed that the resistance value when the magnetizing state is parallel (state of "1") is 8R and the resistance value when the magnetizing state is anti-parallel (state of "0") is 8R+8ΔR.

Since there are 16 combinations of the data values of the four TMR elements MTJ1, MTJ2, MTJ3 and MTJ4 in one block as similar to Concrete Example 1, there are also 16 sum resistance values in accordance with 16 combinations of the data values.

In Concrete Example 2, it is presumed that a plurality of the TMR elements in the read block are connected to each other in parallel. Therefore, in order to simplify the explanation, discussion will be given using the concept of "a sum of the inverse value of the resistance" as different from Concrete Example 1.

In Concrete Example 2, as shown in Table 5, a minimum value of a sum of the inverse value of the resistance is 15/8 (R+ΔR) and a maximum value is 15/8R. Additionally, in Concrete Example 2, as different from Concrete Example 1, a difference in the sum of the inverse value of the resistance becomes fixed instead of a difference in the resistance values. The difference is ΔR/8R(R+ΔR).

TABLE 5

| MTJ1 | MTJ2 | MTJ3 | MTJ4 | RECIPROCAL OF SUM RESISTANCE VALUE Radd |
|---|---|---|---|---|
| 1 | 1 | 1 | 1 | 15/8R = (15R + 15ΔR)/8R(R + ΔR) |
| 1 | 1 | 1 | 0 | (15R + 14ΔR)/8R(R + ΔR) |
| 1 | 1 | 0 | 1 | (15R + 13ΔR)/8R(R + ΔR) |
| 1 | 1 | 0 | 0 | (15R + 12ΔR)/8R(R + ΔR) |
| 1 | 0 | 1 | 1 | (15R + 11ΔR)/8R(R + ΔR) |
| 1 | 0 | 1 | 0 | (15R + 10ΔR)/8R(R + ΔR) |
| 1 | 0 | 0 | 1 | (15R + 9ΔR)/BR(R + ΔR) |
| 1 | 0 | 0 | 0 | (15R + 8ΔR)/8R(R + ΔR) |
| 0 | 1 | 1 | 1 | (15R + 7ΔR)/8R(R + ΔR) |
| 0 | 1 | 1 | 0 | (15R + 6ΔR)/8R(R + ΔR) |
| 0 | 1 | 0 | 1 | (15R + 5ΔR)/8R(R + ΔR) |
| 0 | 1 | 0 | 0 | (15R + 4ΔR)/8R(R + ΔR) |
| 0 | 0 | 1 | 1 | (15R + 3ΔR)/8R(R + ΔR) |
| 0 | 0 | 1 | 0 | (15R + 2ΔR)/8R(R + ΔR) |

TABLE 5-continued

| MTJ1 | MTJ2 | MTJ3 | MTJ4 | RECIPROCAL OF SUM RESISTANCE VALUE Radd |
|---|---|---|---|---|
| 0 | 0 | 0 | 1 | $(15R + 1\Delta R)/8R(R + \Delta R)$ |
| 0 | 0 | 0 | 0 | $15/8(R + \Delta R) = 15R/8R(R + \Delta R)$ |

In the read operation, when the read potential (difference in potential between both ends of the TMR element is determined as V) is applied to the four TMR elements MTJ1, MTJ2, MTJ3 and MTJ4 in the read block, the current flowing through the read bit line BLj has a value according to a sum of the inverse value of the resistance of the four TMR elements MTJ1, MTJ2, MTJ3 and MTJ4 in the read block.

Assuming that a difference in potential between both ends of the TMR element (MTJ element) is V, a minimum value of the current which appears in the read bit line BLj is $V \times 15/8$ $(R+\Delta R)$ and a maximum value of the same is $V \times 15/8R$. It is, however, assumed that the sum of some accompanied resistances, for example, the read selection switch (MOS transistor) RSW r is sufficiently smaller than the combination resistance value of the TMR elements MTJ1, MTJ2, MTJ3 and MTJ4.

In the read operation principle according to the present invention, when the read potential is applied to a plurality of the TMR elements in the read block during the read operation, the read current Itotal corresponding to a combination of the data values of a plurality of the TMR elements flows to the read bit line BLj. Therefore, by detecting the read current Itotal by the sense amplifier (for example, an analog/digital converter), the data of a plurality of the TMR elements in the read block can be read at a time by one read operation as similar to Concrete Example 1.

In regard to a concrete data judgment method, as contrary to Concrete Example 1, when the magnetizing states are the same (parallel, for example), the data value of the TMR element having the lowest resistance value (in this example, the TMR element MTJ1, the resistance value=R) is judged based on predetermined criteria.

Subsequently, based on its result, when the magnetizations states are the same (parallel, for example), the data value of the TMR element having the second lowest resistance value (in this example, the TMR element MTJ1, the resistance value=2R) is judged based on predetermined criteria.

Then, based on the two results mentioned above, when the magnetizing states are the same (parallel, for example), the data value of the TMR element having the third lowest resistance value (in this example, the TMR element MTJ3, the resistance value 4R) is judged based on predetermined criteria.

At last, based on all the results obtained thus far, when the magnetizing states are the same (parallel, for example), the data value of the TMR element having the highest resistance value (in this example, the TMR element MTJ4, the resistance value=8R) is judged based on predetermined criteria.

As described above, in the read operation principle according to the present invention, by detecting the current Itotal flowing to the read bit line BLj by the sense amplifier (for example, an analog/digital converter), the data of a plurality of the TMR elements in the read block can be read at a time by one read operation.

Incidentally, in regard to the operation for judging the data values of the TMR elements MTJ1, MTJ2, MTJ3 and MTJ4, judgment on the data of the respective TMR elements can be carried out in time series and also simultaneously performed by using a plurality of reference currents.

4. Read Circuit

Description will now be given as to a circuit example of the read circuit for realizing the read operation principle according to the present invention.

In the above-described read operation principle (Concrete Example 1), description has been given as to the fact that the read potential Vtotal according to the sum resistance value of a plurality of the TMR elements in the read block appears in the read bit line BLj during the read operation.

As to this sum resistance value, when a number of the TMR elements in the read block is N (N is a plural number), there are $2^N$ patterns corresponding to a number of combinations of the data values of the TMR elements as shown in Table 2.

Therefore, by detecting the read potential Vtotal which has appeared in the read bit line BLj by the read circuit (including the sense amplifier), the data of the TMR elements in the read block can be readily read at a time.

Further, in the read operation principle (Concrete Example 2), description has been given as to the fact that the read current Itotal according to the sum resistance value of a plurality of the TMR elements in the read block flows through the read bit line BLj during the read operation.

As to the inverse value of the sum resistance value, when a number of the TMR elements in the read block is N (N is a plural number), there are $2^N$ patterns corresponding to a number of combinations of the data values of the TMR elements as shown in Table 5.

Therefore, by detecting the read current Itotal flowing through the read bit line BLj by the read circuit (including the sense amplifier), the data of the TMR elements in the read block can be readily read at a time.

(1) Circuit Example 1

① Sense Amplifier

Figure 65:
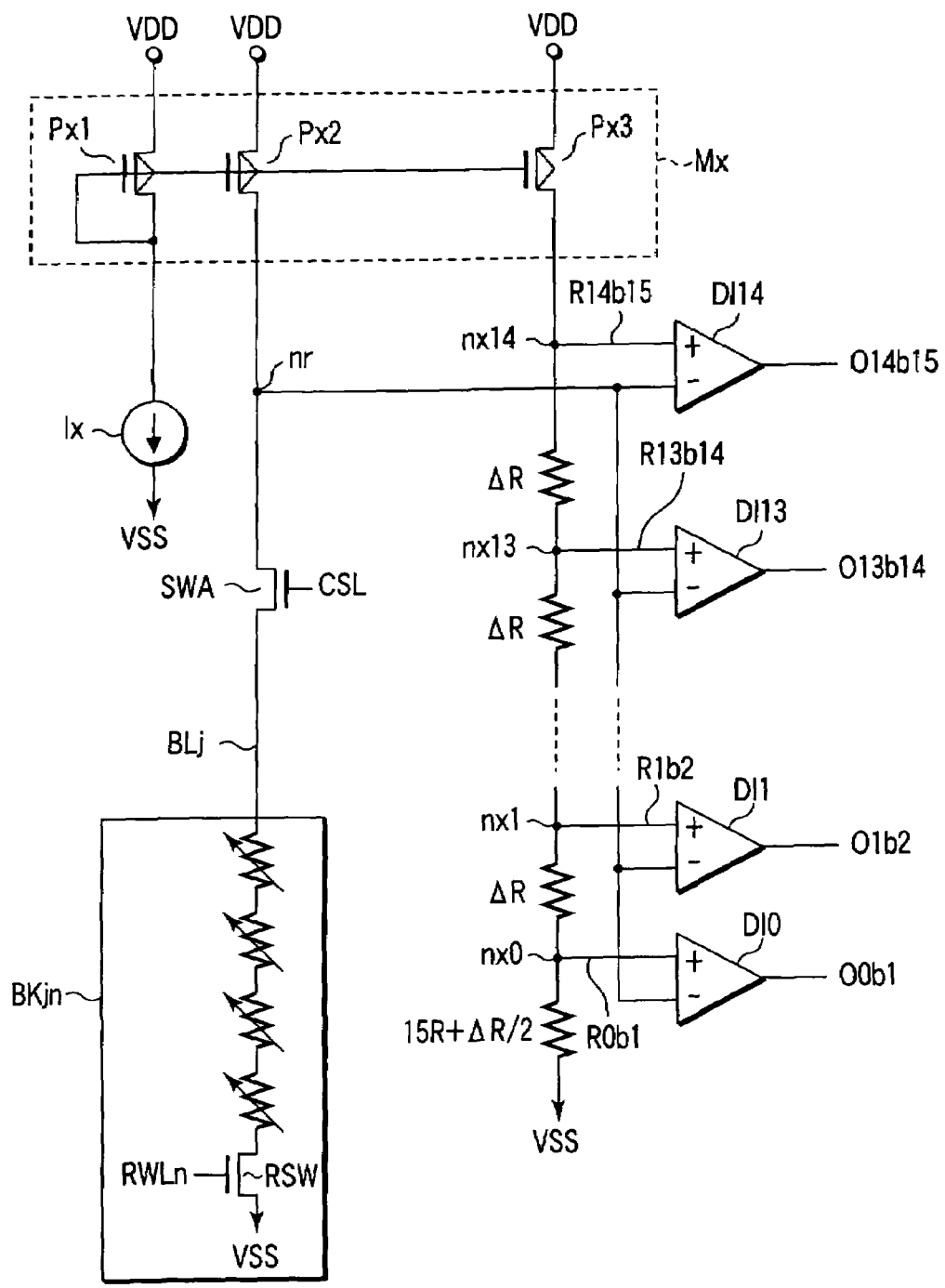
FIG. 65 is a view showing Circuit Example 1 of a read circuit concerning the present invention.

FIG. 65 shows Circuit Example 1 of the read circuit concerning the present invention.

This read circuit is constituted by an analog/digital converter (A/D converter) as a sense amplifier.

One end of a block BKjn consisting of four TMR elements connected to each other in series is connected to a power supply terminal through an N-channel MOS transistor SWA and a P-channel MOS transistor Px2, and the other end of the same is connected to a ground terminal. The four TMR elements in the block BKjn may be connected to each other in parallel rather than series.

A first current path means a path which runs from the power supply terminal to the ground terminal through the MOS transistors Px2 and SWA and a plurality of the TMR elements.

One end of 14 resistance elements having a resistance value $\Delta R$ is connected to the power supply terminal through the P-channel MOS transistor Px3, and the other end of the same is connected to the ground terminal through a resistance element having a resistance value $15R+\Delta R/2$. A second current path means a path which runs from the power supply terminal to the ground terminal through the MOS transistor Px3 and a plurality of the resistance elements.

Here, it is assumed that R and $\Delta R$ means the same as R and $\Delta R$ described in the section of the read operation principle.

The P-channel MOS transistors Px1, Px2 and Px3 constitute a current mirror circuit. Therefore, a constant current generated by a constant current source Ix flows to the above-described first and second current paths.

The current flowing through the first current path becomes a read current, and the read current flows through a plurality of the TMR elements. As a result, a read potential Vtotal according to the data values of the TMR elements in the block BKjn (sum resistance value) appears in a node nr. On the other hand, when the current flows through the second current path, a predetermined reference potential appears at connection points nx0, nx1, . . . nx13, and nx14 of the respective resistance elements.

Differential amplifier DI0, DI2, . . . DI13 and DI14 compare the read potential Vtotal in the node nr with a predetermined reference potential, and output a result of comparison as output signals O0b1, O1b2, . . . O13b14 and O14b15.

For example, a reference potential in the node nx0 is inputted to a plus side input terminal of the differential amplifier DI0, and a read potential Vtotal in the node nr is inputted to a minus side input terminal of the same. Similarly a reference potential in the node nx1 is inputted to the plus side input terminal of the differential amplifier DI1, and the read potential Vtotal in the node nr is inputted to the minus side input terminal of the same. The reference potential in the node nx14 is inputted to the plus side input terminal of the differential amplifier DI14, and the read potential Vtotal in the node nr is inputted to the minus side input terminal of the same.

② Operation

Table 6 shows the relationship between the data value of the TMR element MTJ4 and the output signal O7b8 of the A/D converter in case of using the read circuit shown in FIG. 65.

TABLE 6

| | MTJ4 | |
| --- | --- | --- |
| | DATA VALUE | |
| | "1" | "0" |
| READ POTENTIAL | Vtotal < R7b8 | R7b8 < Vtotal |
| OUTPUT SIGNAL O7b8 OF A/D CONVERTER | 1 | 0 |

The TMR element MTJ4 is an element having a highest resistance value $2^3R$ and a variation $2^3\Delta R$ of the highest resistance value in a plurality of the TMR elements in the read block.

Therefore, when the data value of the TMR element MTJ4 is "1", the read potential Vtotal depending on the sum resistance value Rtotal of a plurality of the TMR elements in the read block (minus side input signals of the differential amplifiers DI0, . . . , DI14) is a value constantly lower than the reference potential R7b8 of the A/D converter.

In this case, among the output signals O0b1, O1b2, . . . O13b14 and O14b15 from the A/D converter, O7b8 to O14b15 are constantly "1".

Furthermore, when the data value of the TMR element MTJ4 is "0", the read potential Vtotal depending on the sum resistance value Rtotal of a plurality of the TMR elements in the read block is a value constantly higher than the reference potential R7b8 of the A/D converter.

In this case, among the output signals O0b1, O1b2, . . . O13b14 and O14b15 from the A/D converter, O0b1 to O7b8 are constantly "0".

That is, among the output signals O0b1, O1b2, O13b14 and O14b15 from the A/D converter, O7b8 is constantly "1" when the data value is "1" and it is constantly "0" when the data value is "0".

Therefore, judgment can be made upon the data value of the TMR element MTJ4 based on O7b8.

Table 7 shows the relationship between the data value of the TMR element MTJ3 in the read block and the output signals O3b4, O7b8 and O11b12 from the A/D converter when using the read circuit shown in FIG. 65.

TABLE 7

| | MTJ3 | | | |
| --- | --- | --- | --- | --- |
| | DATA VALUE | | | |
| | "1" | "0" | "1" | "0" |
| READ POTENTIAL | Vtotal < R3b4 | R3b4 < Vtotal < R7b8 | R7b8 < Vtotal < R11b12 | R11b12 < Vtotal |
| OUTPUT SIGNAL OF A/D CONVERTER O3b4 | 1 | 0 | 0 | 0 |
| O7b8 | 1 | 1 | 0 | 0 |
| O11b12 | 1 | 1 | 1 | 0 |

The TMR element MTJ3 is an element having the second highest resistance value $2^2R$ and a variation $2^2\Delta R$ of the second highest value among a plurality of the TMR elements in the read block.

Therefore, when the data value of the TMR element MTJ3 is "1", the read potential Vtotal depending on the sum resistance value Rtotal of a plurality of the TMR elements in the read block is any of the following:

a value lower than the reference potential R3b4; or a value higher than the reference potential R7b8 and lower than the reference potential R11b12.

When the read potential Vtotal depending on the sum resistance value Rtotal is lower than the reference potential R3b4, among the output signals O0b1, O1b2, . . . O13b14 and O14b15 from the A/D converter, at least O3b4, O7b8 and O11b12 are constantly "1".

When the read potential Vtotal depending on the sum resistance value Rtotal is a value higher than the reference potential R7b8 and lower than the reference potential R11b12, among the output signals O0b1, O1b2, . . . O13b14 and O14b15 from the A/D converter, at least O3b4 and O7b8 are constantly "0" and O11b12 is constantly "1".

Moreover, when the data value of the TMR element MTJ3 is "0", the read potential Vtotal depending on the sum resistance value Rtotal of a plurality of the TMR elements in the read block is any of the following:

a value higher than the reference potential R3b4 and lower than the reference potential R7b8, or a value higher than the reference potential R11b12.

When the read potential Vtotal depending on the sum resistance value Rtotal is a value higher than the reference potential R3b4 and lower than the reference potential R7b8, among the output signals O0b1, O1b2, O13b14 and O14b15 from the A/D converter, at least O3b4 is constantly "0" and O7b8 and O11b12 are constantly "11".

When the read potential Vtotal depending on the sum resistance value Rtotal is a value higher than the reference potential R11b12, at least O3b4, O7b8 and O11b12 are constantly "0" among the output signals O0b1, O1b2, . . . O13b14 and O14b15 from the A/D converter.

In this manner, the relationship between the data value of the TMR element MTJ3 and the output signals O3$b$4, O7$b$8 and O11$b$12 from the A/D converter has been revealed.

Therefore, by processing the output signals O3$b$4, O7$b$8 and O11$b$12 from the A/D converter by using a logic circuit (which will be described later), the data value of the TMR element MTJ3 can be judged.

Tables 8 and 9 show the relationship between the data value of the TMR element MTJ2 in the read block and the output signals O1$b$2, O3$b$4, O5$b$6, O7$b$8, O9$b$10, O11$b$12 and O13$b$14 from the A/D converter.

TABLE 8

| | | MTJ2 | | | | |
|---|---|---|---|---|---|---|
| | | DATA VALUE | | | | |
| | | "1" | "0" | "1" | "0" | "1" |
| READ POTENTIAL | | Vtotal < R1$b$2 | R1$b$2 < Vtotal < R3$b$4 | R3$b$4 < Vtotal < R5$b$6 | R5$b$6 < Vtotal < R7$b$8 | R7$b$8 < Vtotal < R9$b$10 |
| OUTPUT SIGNAL OF A/D CONVERTER | O1$b$2 | 1 | 0 | 0 | 0 | 0 |
| | O3$b$4 | 1 | 1 | 0 | 0 | 0 |
| | O5$b$6 | 1 | 1 | 1 | 0 | 0 |
| | O7$b$8 | 1 | 1 | 1 | 1 | 0 |
| | O9$b$10 | 1 | 1 | 1 | 1 | 1 |
| | O11$b$12 | 1 | 1 | 1 | 1 | 1 |
| | O13$b$14 | 1 | 1 | 1 | 1 | 1 |

TABLE 9

| | | MTJ2 | | |
|---|---|---|---|---|
| | | DATA VALUE | | |
| | | "0" | "1" | "0" |
| READ POTENTIAL | | R9$b$10 < Vtotal < R11$b$12 | R11$b$12 < Vtotal < R13$b$14 | R13$b$14 < Vtotal |
| OUTPUT SIGNAL OF A/D CONVERTER | O1$b$2 | 0 | 0 | 0 |
| | O3$b$4 | 0 | 0 | 0 |
| | O5$b$6 | 0 | 0 | 0 |
| | O7$b$8 | 0 | 0 | 0 |
| | O9$b$10 | 0 | 0 | 0 |
| | O11$b$12 | 1 | 0 | 0 |
| | O13$b$14 | 1 | 1 | 0 |

Among a plurality of the TMR elements in the read block, the TMR element MTJ2 has a third highest resistance value $2^1 R$ and a variation $2^1 \Delta R$ of the third highest resistance value.

Therefore, when the data value of the TMR element MTJ2 is "1", the read potential Vtotal depending on the sum resistance value Rtotal of a plurality of the TMR elements in the read block is any one of the following:

a value lower than the reference potential R1$b$2; or a value higher than the reference potential R3$b$4 and lower than the reference potential R5$b$6; or a value higher than the reference potential R7$b$8 and lower than the reference potential R9$b$10; or a value higher than the reference potential R11$b$12 and lower than the reference potential R12$b$13.

When the read potential Vtotal depending on the sum resistance value Rtotal is a value lower than the reference potential R1$b$2, at least O1$b$2, O3$b$4, O5$b$6, O7$b$8, O9$b$10, O11$b$12 and O13$b$14 are constantly "1" among the output signals O0$b$1, O1$b$2, . . . O13$b$14 and O14$b$15 from the A/D converter.

When the read potential Vtotal depending on the sum resistance value Rtotal is a value higher than the reference potential R3$b$4 and lower than the reference potential R5$b$6, among the output signals O0$b$1, O1$b$2, . . . O13$b$14 and O14$b$15 from the A/D converter, at least O1$b$2 and O3$b$4 are constantly "0" and O5$b$6, O7$b$8, O9$b$10, O11$b$12 and O13$b$14 are constantly "1".

When the read potential Vtotal depending on the sum resistance value Rtotal is a value higher than the reference potential R7$b$8 and lower than the reference potential R9$b$10, among the output signals O0$b$1, O1$b$2, . . . O13$b$14 and O14$b$15 from the A/D converter, at least O1$b$2, O3$b$4, O5$b$6 and O7$b$8 are constantly "0" and O9$b$10, O11$b$12 and O13$b$14 are constantly "1".

When the read potential Vtotal depending on the sum resistance value Rtotal is a value higher than the reference potential R11$b$12 and lower than the reference potential R13$b$14, among the output signals O0$b$1, O1$b$2, . . . O13$b$14 and O14$b$15 from the A/D converter, at least O1$b$2, O3$b$4, O5$b$6, O7$b$8, O9$b$10 and O11$b$12 are constantly "0" and O13$b$14 is constantly "1".

Further, when the data value of the TMR element MTJ2 is "0", the read potential Vtotal depending on the sum resistance value Rtotal of a plurality of the TMR elements in the read block is any one of the following:

a value higher than the reference potential R1$b$2 and lower than the reference potential R3$b$4; or a value higher than the reference potential R5$b$6 and lower than the reference potential R7$b$8; or a value higher than the reference potential R9$b$10 and lower than the reference potential R11$b$12; or a value higher than the reference potential R13$b$14.

When the read potential Vtotal depending on the sum resistance value Rtotal is a value higher than the reference potential R1$b$2 and lower than the reference potential R3$b$4, among the output signals O0$b$1, O1$b$2, . . . O13$b$14 and O14$b$15 from the A/D converter, at least O1$b$2 is constantly "0" and O3$b$4, O5$b$6, O7$b$8, O9$b$10, O11$b$12 and O13$b$14 are constantly "1".

When the read potential Vtotal depending on the sum resistance value Rtotal is a value higher than the reference potential R5$b$6 and lower than the reference potential R7$b$8, among the output signals O0$b$1, O1$b$2, . . . O13$b$14 and O14$b$15 from the A/D converter, at least O1$b$2, O3$b$4 and O5$b$6 are constantly "0" and O7$b$8, O9$b$10, O11$b$12 and O13$b$14 are constantly "1".

When the read potential Vtotal depending on the sum resistance value Rtotal is a value higher than the reference potential R9$b$10 and lower than the reference potential R11$b$12, among output signals O0$b$1, O1$b$2, . . . O13$b$14 and O14$b$15 from the A/D converter, at least O1$b$2, O3$b$4, O5$b$6, O7$b$8 and O9$b$10 are constantly "0" and O11$b$12 and O13$b$14 are constantly "1".

When the read potential Vtotal depending on the sum resistance value Rtotal is a value higher than the reference potential R13$b$14, among the output signals O0$b$1, O1$b$2, . . . O13$b$14 and O14$b$15 from the A/D converter, at least O1$b$2, O3$b$4, O5$b$6, O7$b$8, O9$b$10, O11$b$12 and O13$b$14 are constantly "0".

In this manner, the relationship between the data value of the TMR element MTJ2 and the output signals O1$b$2, O3$b$4, O5$b$6, O7$b$8, O9$b$10, O11$b$12 and O13$b$14 has been revealed.

Therefore, by processing the output signals O1$b$2, O3$b$4, O5$b$6, O7$b$8, O9$b$10, O11$b$12 and O13$b$14 by using a logic circuit (which will be described later), the data value of the TMR element MTJ2 can be judged.

Tables 10 to 13 show the relationship between the data value of the TMR element MTJ1 in the read block and the output signals O0b1, O1b2, O2b3, O3b4, O4b5, O5b6, O6b7, O7b8, O8b9, O9b10, O10b11, O11b12, O12b13, O13b14 and O14b15 when using the read circuit illustrated in FIG. 65.

TABLE 10

| | | MTJ1 | | | |
|---|---|---|---|---|---|
| | | DATA VALUE | | | |
| | | "1" | "0" | "1" | "0" |
| READ POTENTIAL | | Vtotal < R0b1 | R0b1 < Vtotal < R1b2 | R1b2 < Vtotal < R2b3 | R2b3 < Vtotal < R3b4 |
| OUTPUT SIGNAL OF A/D CONVERTER | O0b1 | 1 | 0 | 0 | 0 |
| | O1b2 | 1 | 1 | 0 | 0 |
| | O2b3 | 1 | 1 | 1 | 0 |
| | O3b4 | 1 | 1 | 1 | 1 |
| | O4b5 | 1 | 1 | 1 | 1 |
| | O5b6 | 1 | 1 | 1 | 1 |
| | O6b7 | 1 | 1 | 1 | 1 |
| | O7b8 | 1 | 1 | 1 | 1 |
| | O8b9 | 1 | 1 | 1 | 1 |
| | O9b10 | 1 | 1 | 1 | 1 |
| | O10b11 | 1 | 1 | 1 | 1 |
| | O11b12 | 1 | 1 | 1 | 1 |
| | O12b13 | 1 | 1 | 1 | 1 |
| | O13b14 | 1 | 1 | 1 | 1 |
| | O14b15 | 1 | 1 | 1 | 1 |

TABLE 11

| | | MTJ1 | | | |
|---|---|---|---|---|---|
| | | DATA VALUE | | | |
| | | "1" | "0" | "1" | "0" |
| READ POTENTIAL | | R3b4 < Vtotal < R4b5 | R4b5 < Vtotal < R5b6 | R5b6 < Vtotal < R6b7 | R6b7 < Vtotal < R7b8 |
| OUTPUT SIGNAL OF A/D CONVERTER | O0b1 | 0 | 0 | 0 | 0 |
| | O1b2 | 0 | 0 | 0 | 0 |
| | O2b3 | 0 | 0 | 0 | 0 |
| | O3b4 | 0 | 0 | 0 | 0 |
| | O4b5 | 1 | 0 | 0 | 0 |
| | O5b6 | 1 | 1 | 0 | 0 |
| | O6b7 | 1 | 1 | 1 | 0 |
| | O7b8 | 1 | 1 | 1 | 1 |
| | O8b9 | 1 | 1 | 1 | 1 |
| | O9b10 | 1 | 1 | 1 | 1 |
| | O10b11 | 1 | 1 | 1 | 1 |
| | O11b12 | 1 | 1 | 1 | 1 |
| | O12b13 | 1 | 1 | 1 | 1 |
| | O13b14 | 1 | 1 | 1 | 1 |
| | O14b15 | 1 | 1 | 1 | 1 |

TABLE 12

| | | MTJ1 | | | |
|---|---|---|---|---|---|
| | | DATA VALUE | | | |
| | | "1" | "0" | "1" | "0" |
| READ POTENTIAL | | R7b8 < Vtotal < R8b9 | R8b9 < Vtotal < R9b10 | R9b10 < Vtotal < R10b11 | R10b11 < Vtotal < R11b12 |
| OUTPUT SIGNAL OF A/D CONVERTER | O0b1 | 0 | 0 | 0 | 0 |
| | O1b2 | 0 | 0 | 0 | 0 |
| | O2b3 | 0 | 0 | 0 | 0 |
| | O3b4 | 0 | 0 | 0 | 0 |
| | O4b5 | 0 | 0 | 0 | 0 |
| | O5b6 | 0 | 0 | 0 | 0 |
| | O6b7 | 0 | 0 | 0 | 0 |
| | O7b8 | 0 | 0 | 0 | 0 |
| | O8b9 | 1 | 0 | 0 | 0 |
| | O9b10 | 1 | 1 | 0 | 0 |
| | O10b11 | 1 | 1 | 1 | 0 |
| | O11b12 | 1 | 1 | 1 | 1 |
| | O12b13 | 1 | 1 | 1 | 1 |
| | O13b14 | 1 | 1 | 1 | 1 |
| | O14b15 | 1 | 1 | 1 | 1 |

TABLE 13

| | | MTJ1 | | | |
|---|---|---|---|---|---|
| | | DATA VALUE | | | |
| | | "1" | "0" | "1" | "0" |
| READ POTENTIAL | | R11b12 < Vtotal < R12b13 | R12b13 < Vtotal < R13b14 | R13b14 < Vtotal < R14b15 | R14b15 < Vtotal < R14b15 |
| OUTPUT SIGNAL OF A/D CONVERTER | O0b1 | 0 | 0 | 0 | 0 |
| | O1b2 | 0 | 0 | 0 | 0 |
| | O2b3 | 0 | 0 | 0 | 0 |
| | O3b4 | 0 | 0 | 0 | 0 |
| | O4b5 | 0 | 0 | 0 | 0 |
| | O5b6 | 0 | 0 | 0 | 0 |
| | O6b7 | 0 | 0 | 0 | 0 |
| | O7b8 | 0 | 0 | 0 | 0 |
| | O8b9 | 0 | 0 | 0 | 0 |
| | O9b10 | 0 | 0 | 0 | 0 |
| | O10b11 | 0 | 0 | 0 | 0 |
| | O11b12 | 0 | 0 | 0 | 0 |
| | O12b13 | 1 | 0 | 0 | 0 |
| | O13b14 | 1 | 1 | 0 | 0 |
| | O14b15 | 1 | 1 | 1 | 0 |

Among a plurality of the TMR elements in the read block, the TMR element MTJ1 has a lowest resistance value $2^0 R$ and a variation $2^0 \Delta R$ of the lowest resistance value.

Therefore, when the data value of the TMR element is "1", the read potential Vtotal depending on the sum resistance value Rtotal of a plurality of the TMR elements in the read block is any one of the following:

a value lower than the reference potential R0b1; or a value higher than the reference potential R1b2 and lower than the reference potential R2b3; or a value higher than the reference potential R3b4 and lower than the reference potential R4b5; or a value higher than the reference potential R5b6 and lower than the reference potential R6b7; or a value higher than the reference potential R7b8 and lower than the reference potential R8b9;

a value higher than the reference potential R9b10 and lower than the reference potential R10b11; or a value higher than the reference potential R11b12 and lower than the reference potential R12b13; or a value higher than the reference potential R13b14 and lower than the reference potential R14b15.

When the read potential Vtotal depending on the sum resistance value is a value lower than the reference potential R0b1, all of the output signals O0b1, O1b2, . . . O13b14 and O14b15 from the A/D converter are "1".

When the read potential Vtotal depending on the sum resistance value Rtotal is a value higher than the reference potential R1b2 and lower than the reference potential R2b3, among the output signals O0b1, O1b2, . . . O13b14 and O14b15 from the A/D converter, at least O0b1 and O1b2 are constantly "0" and the remaining output signals O2b3, O3b4, . . . O13b14 and O14b15 are constantly "1".

When the read potential Vtotal depending on the sum resistance value Rtotal is a value higher than the reference potential R3b4 and lower than the reference potential R4b5, among the output signals O0b1, O1b2, . . . O13b14 and O14b15 from the A/D converter, at least O0b1, O1b2, O2b3 and O3b4 are constantly "0" and the remaining output signals 04b5, O5b6, . . . O13b14 and O14b15 are constantly "1".

When the read potential Vtotal depending on the sum resistance value Rtotal is a value higher than the reference potential R5b6 and lower than the reference potential R6b7, among the output signals O0b1, O1b2, . . . O13b14 and O14b15 from the A/D converter, at least O0b1, O1b2, . . . O4b5 and O5b6 are constantly "0" and the remaining output signals O6b7, O7b8, . . . O13b14 and O14b15 are constantly "1".

When the read potential Vtotal depending on the sum resistance value Rtotal is a value higher than the reference potential R7b8 and lower than the reference potential R8b9, among the output signals 001b, O1b2, . . . O13b14 and O14b15 from the A/D converter, at least O0b1, O1b2, . . . O6b7 and O7b8 are constantly "0" and the remaining output signals O8b9, O9b10, . . . O13b14 and O14b15 are constantly "1".

When the read potential Vtotal depending on the sum reference value Rtotal is a value higher than the reference potential R9b10 and lower than the reference potential R10b11, among the output signals O0b1, O1b2, . . . O13b14 and O14b15 from the A/D converter, at least O0b1, O1b2, . . . O8b9 and O9b10 are constantly "0" and the remaining output signals O10b11, O11b12, . . . O13b14 and O14b15 are constantly "1".

When the read potential Vtotal depending on the sum resistance value Rtotal is a value higher than the reference potential R11b12 and lower than the reference potential R12b13, among the output signals 001b, O1b2, . . . O13b14 and O14b15 from the A/D converter, at least O0b1, O1b2, . . . O10b11 and O11b12 are constantly "0" and the remaining output signals 012b13, O13b14 and O14b15 are constantly "1".

When the read potential Vtotal depending on the sum resistance value Rtotal is a value higher than the reference potential R13b14 and lower than the reference potential R14b15, among the output signals O0b1, O1b2, . . . O13b14 and O14b15 from the A/D converter, at least O0b1, O1b2, . . . O12b13 and O13b14 are constantly "01 and the remaining output signal O14b15 is constantly "1".

Furthermore, when the data value of the TMR element MTJ1 is "0", the read potential Vtotal depending on the sum resistance value Rtotal of a plurality of the TMR elements in the read block is any one of the following:

a value higher than the reference potential R0b1 and lower than the reference potential R1b2; or a value higher than the reference potential R2b3 and lower than the reference potential R3b4; or a value higher than the reference potential R4b5 and lower than the reference potential R5b6; or a value higher than the reference potential R6b7 and lower than the reference potential R7b8; or a value higher than the reference potential R8b9 and lower than the reference potential R9b10; or a value higher than the reference potential R10b11 and lower than the reference potential R11b12; or a value higher than the reference potential R12b13 and lower than the reference potential R13b14; or a value higher than the reference potential R14b15.

When the read potential Vtotal depending on the sum resistance value Rtotal is a value higher than the reference potential R0b1 and lower than the reference potential R1b2, among the output signals O0b1, O1b2, . . . O13b14 and 014b15 from the A/D converter, at least O0b1 is constantly "0" and the remaining output signals O1b2, O2b3, . . . O13b14 and O14b15 are constantly "1".

The read potential Vtotal depending on the sum resistance value Rtotal is a value higher than the reference potential R2b3 and lower than the reference potential R3b4, among the output signals O0b1, O1b2, . . . O13b14 and O14b15 from the A/D converter, at least O0b1, O1b2, and O2b3 are constantly "0" and the remaining output signals O3b4, O4b5, . . . O13b14 and O14b15 are constantly "1".

When the read potential Vtotal depending on the sum resistance value Rtotal is a value higher than the reference potential R4b5 and lower than the reference potential R5b6, among the output signals O0b1, O1b2, . . . O13b14 and O14b15 from the A/D converter, at least O0b1, O1b2, . . . O3b4 and 04b5 are constantly "0" and the remaining output signals O5b6, O6b7, . . . O13b14 and O14b15 are constantly "1".

When the read potential Vtotal depending on the sum resistance value Rtotal is a value higher than the reference potential R6b7 and lower than the reference potential R7b8, among the output signals O0b1, O1b2, . . . O13b14 and O14b15 from the A/D converter, at least O0b1, O1b2, . . . O5b6 and O6b7 are constantly "0" and the remaining output signals O7b8, O8b9, . . . O13b14 and 014b15 are constantly "1".

When the read potential Vtotal depending on the sum resistance value Rtotal is a value higher than the reference potential R8b9 and lower than the reference potential R9b10, among the output signals O0b1, O1b2, . . . O13b14 and O14b15 from the A/D converter, at least O01b, O1b2, . . . O7b8 and O8b9 are constantly "0" and the remaining output signals O9b10, O10b11, . . . O13b14 and O14b15 are constantly "1".

When the read potential Vtotal depending on the sum resistance value Rtotal is a value higher than the reference potential R10b11 and lower than the reference potential R11b12, among the output signals O0b1, O1b2, . . . O13b14 and O14b15 from the A/D converter, at least O0b1, O1b2, . . . O9b10 and O10b11 are constantly "1" and the remaining output signals O11b12, O12b13, O13b14 and O14b15 are constantly "1".

When the read potential Vtotal depending on the sum resistance value Rtotal is a value higher than the reference potential R12b13 and lower than the reference potential R13b14, among the output signals O0b1, O1b2, . . . O13b14 and O14b15 from the A/D converter, at least O0b1, O1b2, . . . O11b12 and O12b13 are constantly "0" and the remaining output signals O13b14 and O14b15 are constantly "1".

When the read potential Vtotal depending on the sum resistance value Rtotal is a value higher than the reference potential R14b15, all of the output signals O0b1, O1b2, . . . O13b14 and O14b15 from the A/D converter are "0".

In this manner, the relationship between the data value of the TMR element MTJ2 and the output signals O0b1, O1b2, . . . O13b14 and O14b15 from the A/D converter has been revealed. Therefore, by processing the output signals O0b1, O1b2, . . . O13b14 and O14b15 from the A/D converter by using a logic circuit (which will be described later), the data value of the TMR element MTJ1 can be judged.

③ Logic Circuit

Description has been given as to Circuit Example 1 of the read circuit in ① and the operation of Circuit Example 1, namely, the relationship between the output signals from the A/D converter and the data value of the TMR element in the read block in ②.

Description will now be given on a logic circuit which actually judges data values of the TMR elements MTJ1, MTJ2, MTJ3 and MTJ4 in the read block based on the output signals O0b1, O1b2, . . . O13b14 and O14b15 from the A/D converter.

FIG. 66 shows an example of the logic circuit which judges the data value of the TMR element MTJ4 based on the output signals from the A/D converter.

This logic circuit is constituted so as to satisfy the relationship shown in Table 6. In this example, the data value of the TMR element MTJ4 is judged based on the output signal O7b8 among the output signals O0b1, O1b2, . . . O13b14 and O14b15 from the A/D converter.

Since the data value of the TMR element MTJ4 can be judged based on only a value of the output signal O7b8 as described above, the logic circuit which judges the data value of the TMR element MTJ4 is constituted by inverters IV1 and IV2 connected to each other in series.

FIG. 67 shows an example of the logic circuit which judges the data value of the TMR element MTJ3 based on the output signals from the A/D converter.

This logic circuit is constituted so as to satisfy the relationship shown in Table 7. In this example, the data value of the TMR element MTJ3 is judged based on the output signals O3b4, O7b8 and O11b12 among the output signals O0b1, O1b2, . . . O13b14 and O14b15 from the A/D converter.

Since the data value of the TMR element MTJ3 can be judged based on the output signals O3b4, O7b8 and O11b12 as described above, the logic circuit which judges the data value of the TMR element MTJ3 is constituted by inverters IV3 and IV4 and NOR gate circuits NR1 and NR2.

For example, when O3b4="1", the data value of the TMR element MTJ3 is judges as "1". Moreover, when O3b4="0" and O7b8="1", the data value of the TMR element MTJ3 is judged as "0". When O3b4="0", O7b8="0" and O11b12="1", the data value of the TMR element MTJ3 is judged as "1". When O3b4="0", O7b8="0" and O11b12="0", the data value of the TMR element MTJ3 is judged as "0".

FIG. 68 shows an example of the logic circuit which judges the data value of the TMR element MTJ12 based on the output signals from the A/D converter.

This logic circuit is constituted so as to satisfy the relationship shown in Tables 8 and 9. In this example, the data value of the TMR element MTJ2 is judged based on the output signals O1b2, O3b4, O5b6, O7b8, O9b10, O11b12 and O13b14 among the output signals O0b1, O1b2, . . . O13b14 and O14b15 from the A/D converter.

The logic circuit which judges the data value of the TMR element MTJ2 is constituted by inverters IV5, IV6, IV7 and IV8 and NOR gate circuits NR3, NR4, NR5 and NR6.

For example, when O1b2="1", the data value of the TMR element MTJ2 is judged as "1". Further, when O1b2="0" and O3b4="1", the data value of the TMR element MTJ2 is judged as "0". When O1b2="0", O3b4="0" and O5b6="1", the data value of the TMR element MTJ2 is judged as "1".

FIG. 69 shows an example of the logic circuit which judges the data value of the TMR element MTJ1 based on the output signals from the A/D converter.

This logic circuit is constituted so as to satisfy the relationship shown in Tables 10 to 13. In this example, the data value of the TMR element MTJ1 is judged based on all the output signals O0b1, O1b2, . . . O13b14 and O14b15 from the A/D converter.

The logic circuit which judges the data value of the TMR element MTJ1 is constituted by inverters IV9, IV10, IV11, IV12, IV13, IV14, IV15 and IV16 and the NOR gate circuits NR7, NR8, NR9, NR10, NR11, NR12, NR13 and NR14.

For example, when O0b1="1", the data value of the TMR element MTJ1 is judged as "1". In addition, when O0b1="0" and O1b2="1", the data value of the TMR element MTJ1 is judged as "0". When O0b1="0", O1b2="0" and O2b3="1", the data value of the TMR element MTJ1 is judged as "1".

Incidentally, there are three patterns of the output signals O0b1, O1b2, . . . O13b14 and O14b15 from the A/D converter, namely, a pattern that all the output signals are "1", a pattern that all the output signals are "0" and a pattern that both "0" and "1" exist.

Additionally, when both "0" and "1" exist, a border of "0" and "1" always exist. In this case, all the output signals on one side of the border are "0", and all the output signals on the other side of the same are "1".

(2) Circuit Example 2

In the above-described Circuit Example 1, a plurality of the reference potentials R0b1, R1b2, . . . R13b14 and R14b15 are generated by using a plurality of resistances connected to each other in series.

Thus, in Circuit Example 2, description will be given as to a technique which generates a reference potential or a reference current required for judging data of a plurality of the TMR elements in the read block by using the same TMR element as the memory cell.

① Sense Amplifier

FIG. 70 shows Circuit Example 2 of the read circuit concerning the present invention.

This read circuit is constituted by an analog/digital converter (A/D converter) as a sense amplifier.

One end of the block BKjn consisting of four TMR elements connected to each other in parallel is connected to the power supply terminal through an N-channel MOS transistor SWA and a P-channel MOS transistor QPx, and the other end is connected to the ground terminal. The four TMR elements in the block BKjn may be connected to each other in series rather than parallel.

A read current path means a path which runs from the power supply terminal to the ground terminal through the MOS transistors QPx and SWA and a plurality of the TMR elements.

A current which is equal to or in proportion to the read current flowing through the read current path is also caused to flow to the first to 15th current paths by a current mirror circuit constituted by P-channel MOS transistors QPx, QP0, . . . QP14 and a differential amplifier DI15.

A reference potential Vclamp is inputted to a minus side input terminal of the differential amplifier DI15, and a potential of a connection node between the MOS transistors QPx and SWA is inputted to the plus side input terminal. An output signal from the differential amplifier DI15 is inputted to gates of the P-channel MOS transistors QPx, QP0, ... QP14.

When the potential of the plus side input terminal of the differential amplifier DI15 is lower than Vclamp, the differential amplifier DI15 operates so as to lower the output potential and increase the current flowing through the P-channel MOS transistors, thereby heightening the potential of the plus side input terminal. Further, when the potential of the plus side input terminal of the differential amplifier DI15 is higher than Vclamp, the differential amplifier DI15 operates so as to heighten the output potential and reduce the current flowing through the P-channel MOS transistors, thereby lowering the potential of the plus side input terminal.

With such a negative feedback operation, the differential amplifier DI15 operates so as to make the potential of the plus side input terminal equal to Vclamp. When Vclamp is used as the read potential, the read current flows through the P-channel MOS transistor QPx. Furthermore, the read current also flows through the P-channel MOS transistors QP0, ... QP14 by the current mirror circuit.

The read current flowing through the respective transistors QP0, ... QP14 is compared with 14 types of the reference current outputted from reference current generation circuits 44-0, ... 44-14, and its result is outputted as output signals O0$b$1, ... O14$b$15.

The first current path means a path which runs from the power supply terminal to the ground terminal through the P-channel MOS transistor QP0 and the N-channel MOS transistor QN01. An inverter INV0 outputs an output signal O0$b$1 based on the potential of a connection node between the MOS transistors QP0 and QN01.

The N-channel MOS transistor QN00 is connected between the reference current generation circuit 44-0 and the ground point. A gate and a drain of the N-channel MOS transistor QN00 are connected to each other, and the gate is connected to a gate of the N-channel MOS transistor QN01.

The reference current generation circuit 44-0 outputs a reference potential R0$b$1. Actually, the reference current generation circuit 44-0 passes the current I00 to the N-channel MOS transistor QN00. Since the current I00 is subjected to current mirror by the N-channel MOS transistors QN00 and QN01, the current I01 equal to the current I00 also flows through the N-channel MOS transistor QN01.

On the other hand, a current IP0 according to the data values of a plurality of the TMR elements in the read block flows through the P-channel MOS transistor QP0.

When IP0 is larger than I01, the electric charge is supplied to the input node of the inverter INV0, and the potential of the node node0 hence increases. That is, the input signal of the inverter INV0 becomes "1" and the output signal O0$b$1 of the same becomes "0".

Furthermore, when IP0 is smaller than I01, the electric charge of the input node of the inverter INV0 is drawn out, and the potential of the node node0 hence lowers. That is, the input signal of the inverter INV0 becomes "0" and the output signal O0$b$1 of the same becomes "1".

In this manner, the output signal O0$b$1 of the inverter INV0 represents a result of comparison between the current IP0 flowing through the TMR element in the block BKjn and the output current I01 of the reference current generation circuit 44-0.

That is, when the current IP0 flowing through the TMR element in the block BKjn is larger than the output current I01 of the reference current generation circuit 44-0, the output signal O0$b$1 becomes "0". On the contrary, when it is smaller, the output signal O0$b$1 becomes "1".

The 15th current path is a path running from the power supply terminal to the ground terminal through the P-channel MOS transistor QP14 and the N-channel MOS transistor QN141. The inverter INV14 outputs an output signal O14$b$15 based on the potential of the connection node between the MOS transistors QP14 and QN141.

The N-channel MOS transistor QN140 is connected between the reference current generation circuit 44-14 and the ground point. A gate and a drain of the N-channel MOS transistor QN140 are connected to each other, and the gate is also connected to a gate of the N-channel MOS transistor QN141.

The reference current generation circuit 44-14 outputs a reference potential R14$b$15. Actually, the reference current generation circuit 44-14 passes the current I140 to the N-channel MOS transistor QN140. Since the current I140 is subjected to current mirror by the N-channel MOS transistors QN140 and QN141, the current I141 equal to the current I140 also flows through the N-channel MOS transistor QN141.

On the other hand, a current IP14 according to the data values of a plurality of the TMR elements in the read block flows through the P-channel MOS transistor QP14.

When IP14 is larger than the 1141, the electric charge is supplied to the input node of the inverter INV0, and the potential of the node node14 hence increases. That is, the input signal of the inverter INV14 becomes "1" and the output signal O14$b$15 becomes "0".

Furthermore, when IP14 becomes smaller than I141, the electric charge of the input node of the inverter INV14 is drawn out, and the potential of the node node14 hence lowers. That is, the input signal of the inverter INV14 becomes "0" and the output signal O14$b$15 becomes "1".

In this manner, the output signal O14$b$15 of the inverter INV14 represents a result of comparison between the current IP14 flowing through the TMR element in the block BKjn and the output current I141 of the reference current generation circuit 44-14.

That is, when the current IP14 flowing through the TMR element in the block BKjn is larger than the output current I141 of the reference current generation circuit 44-14, the output signal O14$b$15 becomes "0". On the contrary, when it is smaller, the output signal O14$b$15 becomes "1".

Incidentally, in regard to the structures of the second to 14th current paths, these current paths have the same structures as those of the first to 15th current paths except that a value of the reference current outputted from the reference current generation circuit is different.

FIG. 71 shows a concrete example of the reference current generation circuit illustrated in FIG. 70.

Each of the reference current generation circuits 44-i (i=0, 1, ... 14) includes eight TMR elements MTJ4A, MTJ3A, MTJ2A, MTJ1A, MTJ4B, MTJ3B, MTJ2B and MTJ1B.

The TMR elements MTJ4A, MTJ3A, MTJ2A and MTJ1A have substantially the same circuit configuration and substantially the same device structure as those of the TMR elements MTJ4, MTJ3, MTJ2 and MTJ1 in one block in the memory cell array.

Similarly, the TMR elements MTJ4B, MTJ3B, MTJ2B and MTJ1B have substantially the same circuit configuration and substantially the same device structure as those of the TMR elements MTJ4, MTJ3, MTJ2 and MTJ1 in one block in the memory cell array.

Therefore, the relationship between the resistance values of the TMR elements MTJ4A, MTJ3A, MTJ2A and MTJ1A and the their storage data is as shown in Table 1. Moreover, the relationship between the resistance values of the TMR elements MTJ4B, MTJ3B, MTJ2B and MTJ1B and their storage data is also as shown in Table 1.

In this example, the TMR elements MTJ4A, MTJ3A, MTJ2A and MTJ1A are connected to each other in parallel, and the TMR elements MTJ4B, MTJ3B, MTJ2B and MTJ1B are also connected to each other in parallel. That is, this example is applied to the magnetic random access memory in which the TMR elements MTJ4, MTJ3, MTJ2 and MTJ1 in one block in the memory cell array are connected to each other in parallel.

Figure 172:
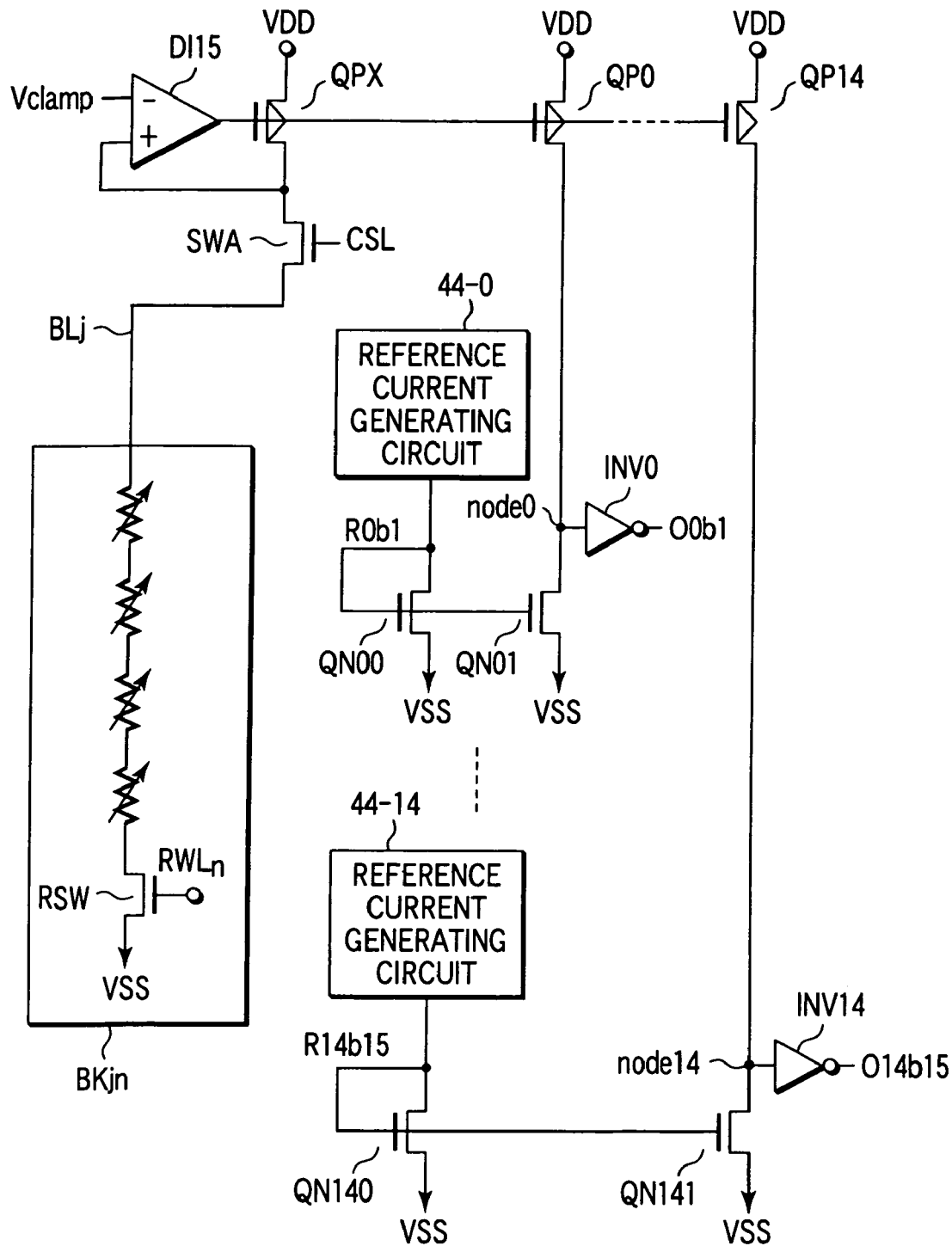
FIG. 172 is a view showing a modification of a read circuit according to the present invention.
Figure 173:
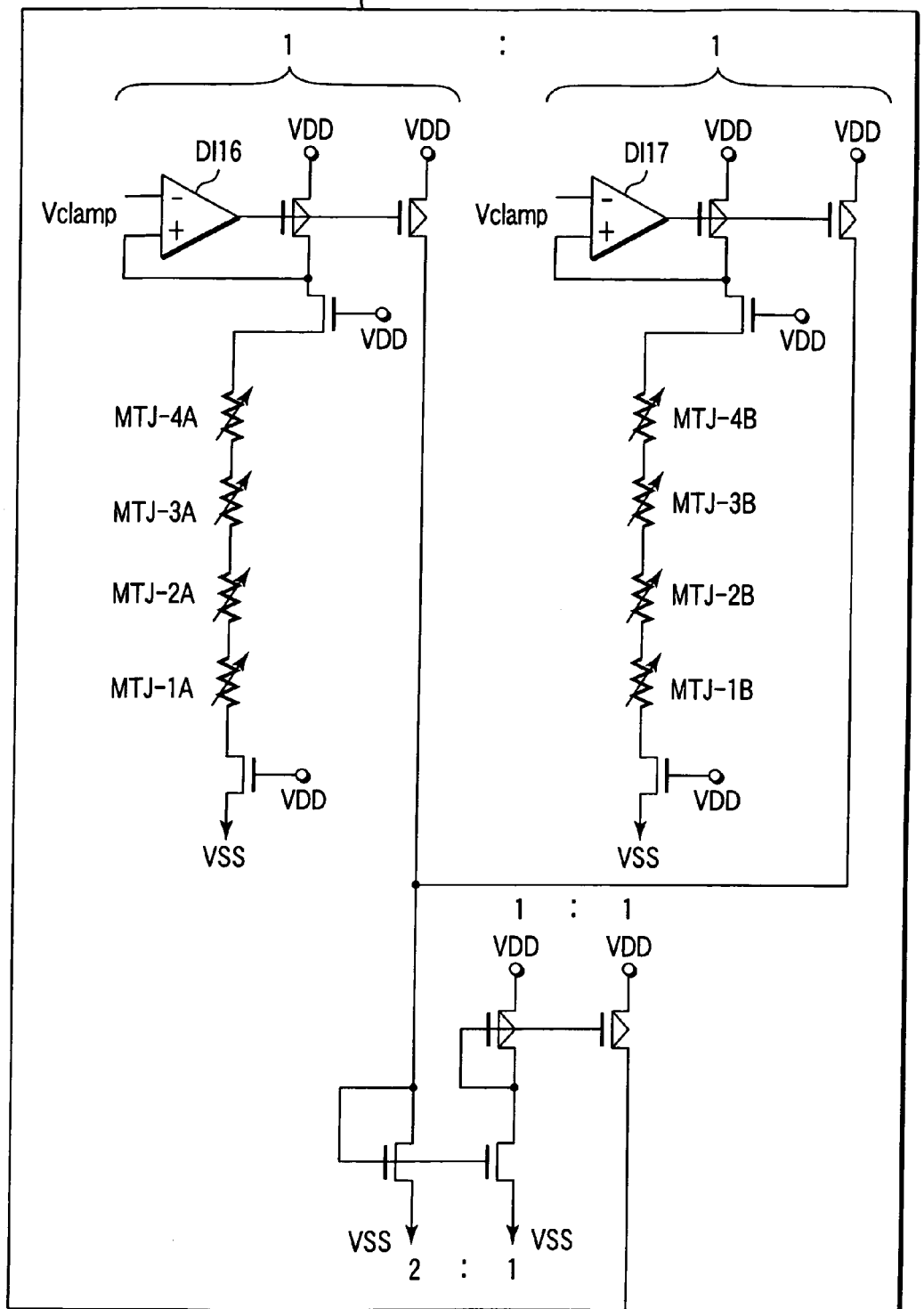
FIG. 173 is a view showing a modification of a reference current generation circuit according to the present invention.

Incidentally, as shown in FIGS. 172 and 173, when one block is constituted by four TMR elements connected to each other in series, the TMR elements MTJ4A, MTJ3A, MTJ2A and MTJ1A are connected to each other in series, and the TMR elements MTJ4B, MTJ3B, MTJ2B and MTJ1B are also connected to each other in series.

Predetermined data are stored in the TMR elements MTJ4A, MTJ3A, MTJ2A, MTJ1A, MTJ4B, MTJ3B, MTJ2B and MTJ1B in the reference current generation circuit 44-i in accordance with a value of the output signal (reference current) from the reference current generation circuit 44-i.

Tables 14 and 15 show the relationship between the output signals R0$b$1, R1$b$2, . . . R13$b$14 and R14$b$15 of the reference current generation circuit 44-i and the data values stored in the TMR elements MTJ4A, MTJ3A, MTJ2A, MTJ1A, MTJ4B, MTJ3B, MTJ2B and MTJ1B in the reference current generation circuit 44-i.

TABLE 14

| R$\alpha b\beta$ | MTJ-4A | MTJ-3A | MTJ-2A | MTJ-1A |
|---|---|---|---|---|
| R0b1 | 1 | 1 | 1 | 1 |
| R1b2 | 0 | 1 | 1 | 1 |
| R2b3 | 1 | 0 | 1 | 1 |
| R3b4 | 0 | 0 | 1 | 1 |
| R4b5 | 1 | 1 | 0 | 1 |
| R5b6 | 0 | 1 | 0 | 1 |
| R6b7 | 1 | 0 | 0 | 1 |
| R7b8 | 0 | 0 | 0 | 1 |
| R8b9 | 1 | 1 | 1 | 0 |
| R9b10 | 0 | 1 | 1 | 0 |
| R10b11 | 1 | 0 | 1 | 0 |
| R11b12 | 0 | 0 | 1 | 0 |
| R12b13 | 1 | 1 | 0 | 0 |
| R13b14 | 0 | 1 | 0 | 0 |
| R14b15 | 1 | 0 | 0 | 0 |

TABLE 15

| R$\alpha b\beta$ | MTJ-4B | MTJ-3B | MTJ-2B | MTJ-1B |
|---|---|---|---|---|
| R0b1 | 0 | 1 | 1 | 1 |
| R1b2 | 1 | 0 | 1 | 1 |
| R2b3 | 0 | 0 | 1 | 1 |
| R3b4 | 1 | 1 | 0 | 1 |
| R4b5 | 0 | 1 | 0 | 1 |
| R5b6 | 1 | 0 | 0 | 1 |
| R6b7 | 0 | 0 | 0 | 1 |
| R7b8 | 1 | 1 | 1 | 0 |
| R8b9 | 0 | 1 | 1 | 0 |
| R9b10 | 1 | 0 | 1 | 0 |
| R10b11 | 0 | 0 | 1 | 0 |
| R11b12 | 1 | 1 | 0 | 0 |
| R12b13 | 0 | 1 | 0 | 0 |
| R13b14 | 1 | 0 | 0 | 0 |
| R14b15 | 0 | 0 | 0 | 0 |

It is to be noted that "1:1" and "2:1" in the drawing mean ratios of the current flowing through the current path.

The reference current generation circuit 44-i has the TMR elements having the same structure as that of the memory cell. Since a potential difference between the both ends of the TMR element is the same as a potential difference V between the both ends of the TMR element in the memory cell, the output current corresponds to a mean value (intermediate value) of the current generated by the TMR elements MTJ4A, MTJ3A, MTJ2A and MTJ1A and the current generated by the TMR elements MTJ4B, MTJ3B, MTJ2B and MTJ1B.

Table 16 shows the relationship between the data values of the memory cells (TMR elements) MTJ1, MTJ2, MTJ3 and MTJ4 in one block and the read current. Table 17 shows the reference current outputted by the reference current generation circuit 44-I (i=0, 1, . . . 14).

TABLE 16

| MTJ1 | MTJ2 | MTJ3 | MTJ4 | READ CURRENT |
|---|---|---|---|---|
| 1 | 1 | 1 | 1 | V × 15/8R = V × (15R + 15ΔR)/8R(R + ΔR) |
| 1 | 1 | 1 | 0 | V × (15R + 14ΔR)/8R(R + ΔR) |
| 1 | 1 | 0 | 1 | V × (15R + 13ΔR)/8R(R + ΔR) |
| 1 | 1 | 0 | 0 | V × (15R + 12ΔR)/8R(R + ΔR) |
| 1 | 0 | 1 | 1 | V × (15R + 11ΔR)/8R(R + ΔR) |
| 1 | 0 | 1 | 0 | V × (15R + 10ΔR)/8R(R + ΔR) |
| 1 | 0 | 0 | 1 | V × (15R + 9ΔR)/8R(R + ΔR) |
| 1 | 0 | 0 | 0 | V × (15R + 8ΔR)/8R(R + ΔR) |
| 0 | 1 | 1 | 1 | V × (15R + 7ΔR)/8R(R + ΔR) |
| 0 | 1 | 1 | 0 | V × (15R + 6ΔR)/8R(R + ΔR) |
| 0 | 1 | 0 | 1 | V × (15R + 5ΔR)/8R(R + ΔR) |
| 0 | 1 | 0 | 0 | V × (15R + 4ΔR)/8R(R + ΔR) |
| 0 | 0 | 1 | 1 | V × (15R + 3ΔR)/8R(R + ΔR) |
| 0 | 0 | 1 | 0 | V × (15R + 2ΔR)/8R(R + ΔR) |
| 0 | 0 | 0 | 1 | V × (15R + 1ΔR)/8R(R + ΔR) |
| 0 | 0 | 0 | 0 | V × 15/8(R + ΔR) = V × 15R/8R(R + ΔR) |

TABLE 17

| 44-i | R$\alpha b\beta$ | REFERENCE CURRENT |
|---|---|---|
| i = 0 | R0b1 | V × (15R + 14.5ΔR)/8R(R + ΔR) |
| i = 1 | R1b2 | V × (15R + 13.5ΔR)/8R(R + ΔR) |
| i = 2 | R2b3 | V × (15R + 12.5ΔR)/8R(R + ΔR) |
| i = 3 | R3b4 | V × (15R + 11.5ΔR)/8R(R + ΔR) |
| i = 4 | R4b5 | V × (15R + 10.5ΔR)/8R(R + ΔR) |
| i = 5 | R5b2 | V × (15R + 9.5ΔR)/8R(R + ΔR) |
| i = 6 | R6b7 | V × (15R + 8.5ΔR)/8R(R + ΔR) |
| i = 7 | R7b8 | V × (15R + 7.5ΔR)/8R(R + ΔR) |
| i = 8 | R8b9 | V × (15R + 6.5ΔR)/8R(R + ΔR) |
| i = 9 | R9b10 | V × (15R + 5.5ΔR)/8R(R + ΔR) |
| i = 10 | R10b11 | V × (15R + 4.5ΔR)/8R(R + ΔR) |
| i = 11 | R11b12 | V × (15R + 3.5ΔR)/8R(R + ΔR) |
| i = 12 | R12b13 | V × (15R + 2.5ΔR)/8R(R + ΔR) |
| i = 13 | R13b14 | V × (15R + 1.5ΔR)/8R(R + ΔR) |
| i = 14 | R14b15 | V × (15R + 0.5ΔR)/8R(R + ΔR) |

Data which can be the criteria for judging a data value of each TMR element can be obtained by judging the relationship of largeness between the read current and a plurality of the reference currents.

According to the read circuit (sense amplifier) of this example, a plurality of the reference currents required for judging the data values are generated by using the TMR elements having the circuit configuration and the device structure equal to those of the TMR elements in one block in the memory cell array. As a result, the accurate reference currents can be generated, and the read operation can be stably executed.

Although the sense amplifier which compares the read current with a plurality of the reference currents is presumed in the above description, a plurality of the reference potentials can be also generated by using the TMR elements having the same structure as that of the memory cell in regard to the sense amplifier which compares the read potential with a plurality of the reference potentials.

Figure 76:
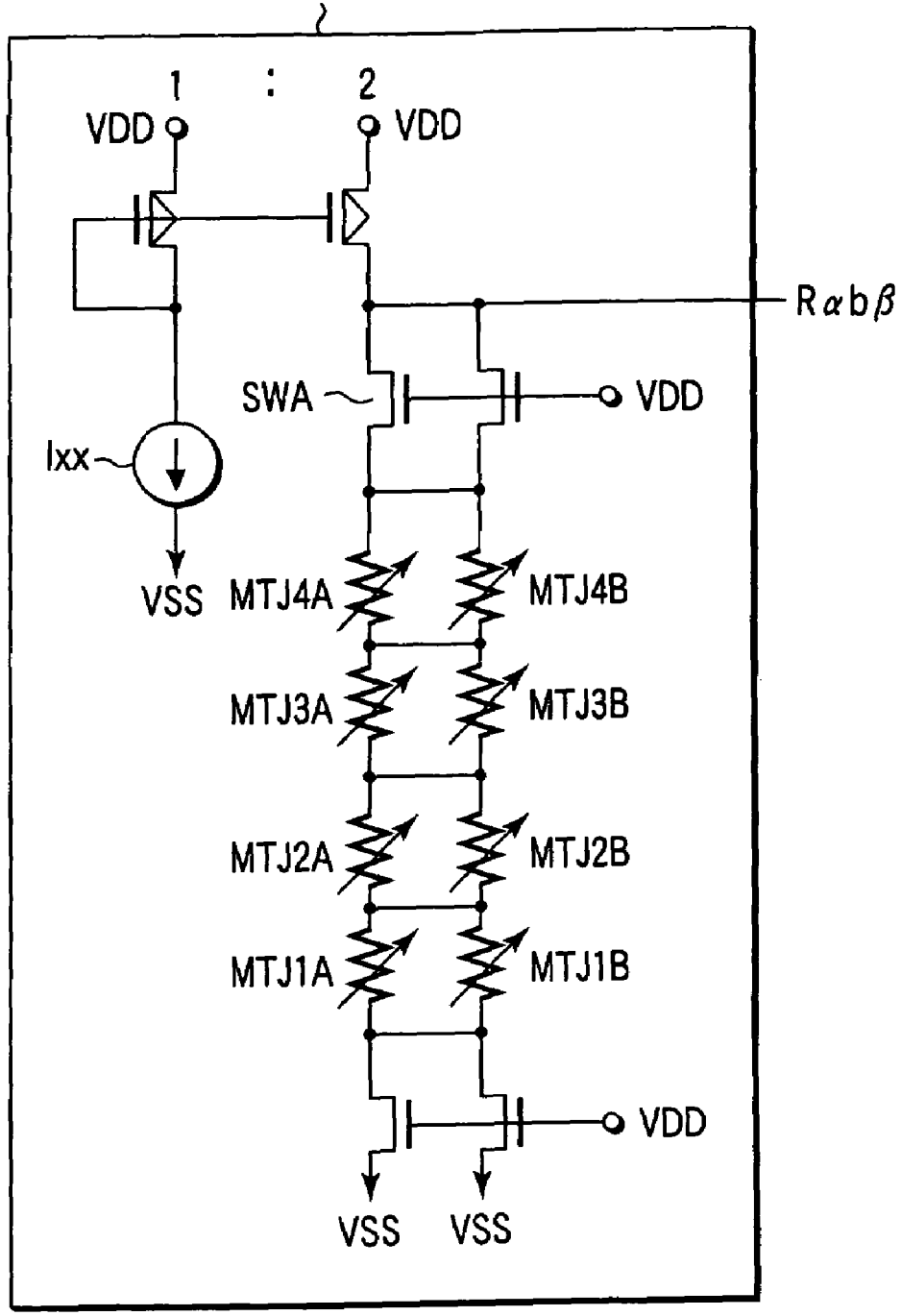
FIG. 76 is a view showing a concrete example of a reference potential generation circuit.

FIG. 76 shows a concrete example of the reference potential generation circuit.

Figure 174:
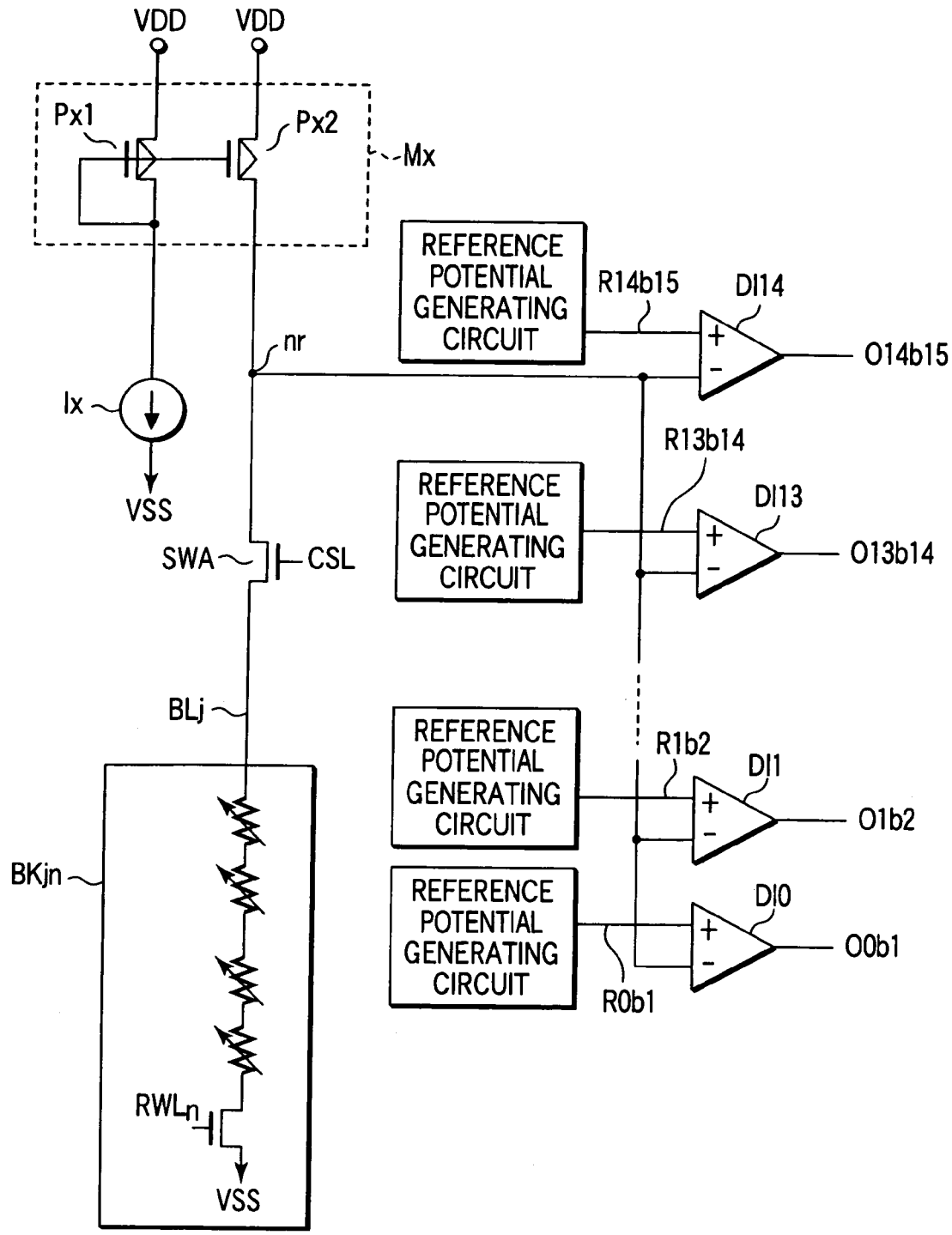
FIG. 174 is a view showing a modification of the read circuit according to the present invention.

For example, the 15 reference potential generation circuits of this example are used, and the reference potentials R0b1, R1b2, ... R14b15 of the read circuit shown in FIG. 65 are generated. The structure of the read circuit in this case is as shown in FIG. 174.

In the drawing, "2:1" represents a ratio of the current flowing through the current path.

A value of a constant current generated by a current source Ixx is the same as a value of the read current with respect to the memory cell, for example, a value of a constant current generated by a current source Ix shown in FIG. 65.

Tables 18 and 19 show data values of the TMR elements MTJ1A, MTJ2A, MTJ3A, MTJ4A, MTJ1B, MTJ2B, MTJ3B and MTJ4B in the 15 reference potential generation circuits which generate the output potential Rαbβ (α=0, ... 14, β=1, ... 15).

TABLE 19

| Rαbβ | MTJ4B | MTJ3B | MTJ2B | MTJ1B |
|---|---|---|---|---|
| R0b1 | 1 | 1 | 1 | 0 |
| R1b2 | 1 | 1 | 0 | 1 |
| R2b3 | 1 | 1 | 0 | 0 |
| R3b4 | 1 | 0 | 1 | 1 |
| R4b5 | 1 | 0 | 1 | 0 |
| R5b6 | 1 | 0 | 0 | 1 |
| R6b7 | 1 | 0 | 0 | 0 |
| R7b8 | 0 | 1 | 1 | 1 |
| R8b9 | 0 | 1 | 1 | 0 |
| R9b10 | 0 | 1 | 0 | 1 |
| R10b11 | 0 | 1 | 0 | 0 |
| R11b12 | 0 | 0 | 1 | 1 |
| R12b13 | 0 | 0 | 1 | 0 |
| R13b14 | 0 | 0 | 0 | 1 |
| R14b15 | 0 | 0 | 0 | 0 |

Table 20 shows the relationship between a sum resistance of MTJA (MTJ1A, MTJ2A, MTJ3A and MTJ4A) and MTJB (MTJ1B, MTJ2B, MTJ3B and MTJ4B) in the reference potential generation circuit and a potential difference generated by all the MTJs (which represents an output potential when the on resistance of the MOS transistor is ignored).

TABLE 20

| Rαbβ | SUM RESISTANCE VALUE OF MTJA AND MTJB | POTENTIAL DIFFERENCE GENERATING BASED ON ALL MTJ ELEMENTS |
|---|---|---|
| R0b1 | (15R + 0.5ΔR)/2 | 2I × (15R + 0.5ΔR)/2 = I × (15R + 0.5ΔR) |
| R1b2 | (15R + 1.5ΔR)/2 | 2I × (15R + 1.5ΔR)/2 = I × (15R + 1.5ΔR) |
| R2b3 | (15R + 2.5ΔR)/2 | 2I × (15R + 2.5ΔR)/2 = I × (15R + 2.5ΔR) |
| R3b4 | (15R + 3.5ΔR)/2 | 2I × (15R + 3.5ΔR)/2 = I × (15R + 3.5ΔR) |
| R4b5 | (15R + 4.5ΔR)/2 | 2I × (15R + 4.5ΔR)/2 = I × (15R + 4.5ΔR) |
| R5b6 | (15R + 5.5ΔR)/2 | 2I × (15R + 5.5ΔR)/2 = I × (15R + 5.5ΔR) |
| R6b7 | (15R + 6.5ΔR)/2 | 2I × (15R + 6.5ΔR)/2 = I × (15R + 6.5ΔR) |
| R7b8 | (15R + 7.5ΔR)/2 | 2I × (15R + 7.5ΔR)/2 = I × (15R + 7.5ΔR) |
| R8b9 | (15R + 8.5ΔR)/2 | 2I × (15R + 8.5ΔR)/2 = I × (15R + 8.5ΔR) |
| R9b10 | (15R + 9.5ΔR)/2 | 2I × (15R + 9.5ΔR)/2 = I × (15R + 9.5ΔR) |
| R10b11 | (15R + 10.5ΔR)/2 | 2I × (15R + 10.5ΔR)/2 = I × (15R + 10.5ΔR) |
| R11b12 | (15R + 11.5ΔR)/2 | 2I × (15R + 11.5ΔR)/2 = I × (15R + 11.5ΔR) |
| R12b13 | (15R + 12.5ΔR)/2 | 2I × (15R + 12.5ΔR)/2 = I × (15R + 12.5ΔR) |
| R13b14 | (15R + 13.5ΔR)/2 | 2I × (15R + 13.5ΔR)/2 = I × (15R + 13.5ΔR) |
| R14b15 | (15R + 14.5ΔR)/2 | 2I × (15R + 14.5ΔR)/2 = I × (15R + 14.5ΔR) |

TABLE 18

| Rαbβ | MTJ4A | MTJ3A | MTJ2A | MTJ1A |
|---|---|---|---|---|
| R0b1 | 1 | 1 | 1 | 1 |
| R1b2 | 1 | 1 | 1 | 0 |
| R2b3 | 1 | 1 | 0 | 1 |
| R3b4 | 1 | 1 | 0 | 0 |
| R4b5 | 1 | 0 | 1 | 1 |
| R5b6 | 1 | 0 | 1 | 0 |
| R6b7 | 1 | 0 | 0 | 1 |
| R7b8 | 1 | 0 | 0 | 0 |
| R8b9 | 0 | 1 | 1 | 1 |
| R9b10 | 0 | 1 | 1 | 0 |
| R10b11 | 0 | 1 | 0 | 1 |
| R11b12 | 0 | 1 | 0 | 0 |
| R12b13 | 0 | 0 | 1 | 1 |
| R13b14 | 0 | 0 | 1 | 0 |
| R14b15 | 0 | 0 | 0 | 1 |

In this example, the sum resistance is reduced to approximately half by the parallel resistance connection of the TMR elements. However, if the current flowing through the TMR elements is, for example, doubled, there occurs no problem, and a plurality of the reference potentials can be generated.

In such a read circuit (sense amplifier), a plurality of the reference potentials required for judging the data values are also generated by using the TMR elements having the circuit configuration and the device structure equal to those of the TMR elements in one block in the memory cell array. As a result, the accurate reference potentials can be generated, and the read operation can be stably executed.

② Operation

Table 21 shows the relationship between a data value of the TMR element MTJ1 in the read block and an output signal O7b8 from the A/D converter when using the read circuit shown in FIGS. 70 and 71.

TABLE 21

| | MTJ1 | | |
|---|---|---|---|
| | | DATA VALUE | |
| | | "1" | "0" |
| OUTPUT SIGNAL OF A/D CONVERTER | O7b8 | 1 | 0 |

Table 22 shows the relationship between a data value of the TMR element MTJ2 in the read block and output signals O3b4, O7b8 and O11b12 from the A/D converter.

TABLE 22

| | MTJ2 | | | | |
|---|---|---|---|---|---|
| | | DATA VALUE | | | |
| | | "1" | "0" | "1" | "0" |
| OUTPUT SIGNAL OF A/D CONVERTER | O3b4 | 1 | 0 | 0 | 0 |
| | O7b8 | 1 | 1 | 0 | 0 |
| | O11b12 | 1 | 1 | 1 | 0 |

Tables 23 and 24 show the relationship between a data value of the TMR element MTJ3 in the read block and output signals O1b2, O3b4, O5b6, O7b8, O9b10, O11b12 and O13b14 from the A/D converter when using the read circuit shown in FIGS. 70 and 71.

TABLE 23

| | MTJ3 | | | | | |
|---|---|---|---|---|---|---|
| | | DATA VALUE | | | | |
| | | "1" | "0" | "1" | "0" | "1" |
| OUTPUT SIGNAL OF A/D CONVERTER | O1b2 | 1 | 0 | 0 | 0 | 0 |
| | O3b4 | 1 | 1 | 0 | 0 | 0 |
| | O5b6 | 1 | 1 | 1 | 0 | 0 |
| | O7b8 | 1 | 1 | 1 | 1 | 0 |
| | O9b10 | 1 | 1 | 1 | 1 | 1 |
| | O11b12 | 1 | 1 | 1 | 1 | 1 |
| | O13b14 | 1 | 1 | 1 | 1 | 1 |

TABLE 24

| | MTJ3 | | | |
|---|---|---|---|---|
| | | DATA VALUE | | |
| | | "0" | "1" | "0" |
| OUTPUT SIGNAL OF A/D CONVERTER | O1b2 | 0 | 0 | 0 |
| | O3b4 | 0 | 0 | 0 |
| | O5b6 | 0 | 0 | 0 |
| | O7b8 | 0 | 0 | 0 |
| | O9b10 | 0 | 0 | 0 |
| | O11b12 | 1 | 0 | 0 |
| | O13b14 | 1 | 1 | 0 |

Tables 25 to 28 show the relationship between a data value of the TMR element MTJ4 in the read block and output signals O0b1, O1b2, O2b3, O3b4, O4b5, O5b6, O6b7, O7b8, O8b9, O9b10, O10b11, O11b12, O12b13, O13b14 and O14b15 from the A/D converter when using the read circuit shown in FIGS. 70 and 71.

TABLE 25

| | MTJ4 | | | | |
|---|---|---|---|---|---|
| | | DATA VALUE | | | |
| | | "1" | "0" | "1" | "0" |
| OUTPUT SIGNAL OF A/D CONVERTER | R0b1 | 1 | 0 | 0 | 0 |
| | R1b2 | 1 | 1 | 0 | 0 |
| | R2b3 | 1 | 1 | 1 | 0 |
| | R3b4 | 1 | 1 | 1 | 1 |
| | R4b5 | 1 | 1 | 1 | 1 |
| | R5b6 | 1 | 1 | 1 | 1 |
| | R6b7 | 1 | 1 | 1 | 1 |
| | R7b8 | 1 | 1 | 1 | 1 |
| | R8b9 | 1 | 1 | 1 | 1 |
| | R9b10 | 1 | 1 | 1 | 1 |
| | R10b11 | 1 | 1 | 1 | 1 |
| | R11b12 | 1 | 1 | 1 | 1 |
| | R12b13 | 1 | 1 | 1 | 1 |
| | R13b14 | 1 | 1 | 1 | 1 |
| | R14b15 | 1 | 1 | 1 | 1 |

TABLE 26

| | MTJ4 | | | | |
|---|---|---|---|---|---|
| | | DATA VALUE | | | |
| | | "1" | "0" | "1" | "0" |
| OUTPUT SIGNAL OF A/D CONVERTER | R0b1 | 0 | 0 | 0 | 0 |
| | R1b2 | 0 | 0 | 0 | 0 |
| | R2b3 | 0 | 0 | 0 | 0 |
| | R3b4 | 0 | 0 | 0 | 0 |
| | R4b5 | 1 | 0 | 0 | 0 |
| | R5b6 | 1 | 1 | 0 | 0 |
| | R6b7 | 1 | 1 | 1 | 0 |
| | R7b8 | 1 | 1 | 1 | 1 |
| | R8b9 | 1 | 1 | 1 | 1 |
| | R9b10 | 1 | 1 | 1 | 1 |
| | R10b11 | 1 | 1 | 1 | 1 |
| | R11b12 | 1 | 1 | 1 | 1 |
| | R12b13 | 1 | 1 | 1 | 1 |
| | R13b14 | 1 | 1 | 1 | 1 |
| | R14b15 | 1 | 1 | 1 | 1 |

TABLE 27

| | MTJ4 | | | | |
|---|---|---|---|---|---|
| | | DATA VALUE | | | |
| | | "1" | "0" | "1" | "0" |
| OUTPUT SIGNAL OF A/D CONVERTER | R0b1 | 0 | 0 | 0 | 0 |
| | R1b2 | 0 | 0 | 0 | 0 |
| | R2b3 | 0 | 0 | 0 | 0 |
| | R3b4 | 0 | 0 | 0 | 0 |
| | R4b5 | 0 | 0 | 0 | 0 |
| | R5b6 | 0 | 0 | 0 | 0 |
| | R6b7 | 0 | 0 | 0 | 0 |
| | R7b8 | 0 | 0 | 0 | 0 |
| | R8b9 | 1 | 1 | 0 | 0 |
| | R9b10 | 1 | 1 | 0 | 0 |
| | R10b11 | 1 | 1 | 1 | 0 |
| | R11b12 | 1 | 1 | 1 | 1 |
| | R12b13 | 1 | 1 | 1 | 1 |
| | R13b14 | 1 | 1 | 1 | 1 |
| | R14b15 | 1 | 1 | 1 | 1 |

TABLE 28

| | | MTJ4 | | | |
|---|---|---|---|---|---|
| | | DATA VALUE | | | |
| | | "1" | "0" | "1" | "0" |
| OUTPUT SIGNAL OF A/D CONVERTER | R0b1 | 0 | 0 | 0 | 0 |
| | R1b2 | 0 | 0 | 0 | 0 |
| | R2b3 | 0 | 0 | 0 | 0 |
| | R3b4 | 0 | 0 | 0 | 0 |
| | R4b5 | 0 | 0 | 0 | 0 |
| | R5b6 | 0 | 0 | 0 | 0 |
| | R6b7 | 0 | 0 | 0 | 0 |
| | R7b8 | 0 | 0 | 0 | 0 |
| | R8b9 | 0 | 0 | 0 | 0 |
| | R9b10 | 0 | 0 | 0 | 0 |
| | R10b11 | 0 | 0 | 0 | 0 |
| | R11b12 | 0 | 0 | 0 | 0 |
| | R12b13 | 1 | 0 | 0 | 0 |
| | R13b14 | 1 | 1 | 0 | 0 |
| | R14b15 | 1 | 1 | 1 | 0 |

③ Logic Circuit

FIG. 72 shows an example of the logic circuit which judges a data value of the TMR element MTJ1 based on an output signal from the A/D converter.

This logic circuit is constituted so as to satisfy the relationship shown in Table 21. In this example, the data value of the TMR element MTJ1 is judged based on the output signal O7b8 among the output signals O0b1, O1b2, . . . O13b14 and O14b15 from the A/D converter.

Since the data value of the TMR element MTJ1 can be judged based on only a value of the output signal O7b8 as mentioned above, the logic circuit which judges the data value of the TMR element MTJ1 is constituted by the inverters IV1 and IV2 connected to each other in series.

FIG. 73 shows an example of the logic circuit which judges a data value of the TMR element MTJ2 based on an output signal from the A/D converter.

This logic circuit is constituted so as to satisfy the relationship shown in Table 22. In this example, the data value of the TMR element MTJ2 is judged based on the output signals O3b4, O7b8 and O11b12 among the output signals O0b1, O1b2, . . . O13b14 and O14b15 from the A/D converter.

Since the data value of the TMR element MTJ2 can be judged based on values of the output signals O3b4, O7b8 and O11b12 as described above, the logic circuit which judges the data value of the TMR element MTJ2 is constituted by the inverters IV3 and IV4 and the NOR gate circuits NR1 and NR2.

For example, when O3b4="1", the data value of the TMR element MTJ2 is judged as "1". Further, when O3b4="0" and O7b8="1", the data value of the TMR element MTJ2 can be judged as "1". When O3b4="0", O7b8="0" and O11b12="1", the data value of the TMR element MTJ2 is judged as "1". When O3b4="0", O7b8="0" and O11b12="0", the data value of the TMR element MTJ2 is judged as "0".

FIG. 74 shows an example of the logic circuit which judges a data value of the TMR element MTJ3 based on an output signal from the A/D converter.

This logic circuit is constituted so as to satisfy the relationship shown in Tables 23 and 24. In this example, the data value of the TMR element MTJ3 is judged based on the output signals O1b2, O3b4, O5b6, O7b8, O9b10, O11b12 and O13b14 among the output signals O0b1, O1b2, . . . O13b14 and O14b15 from the A/D converter.

The logic circuit which judges a data value of the TMR element MTJ3 is constituted by the inverters IV5, IV6, IV7 and IV8 and the NOR gate circuits NR3, NR4, NR5 and NR6.

For example, when O1b2="1", the data value of the TMR element MTJ3 is judged as "1". Furthermore, when O1b2="0" and O3b4="1", the data value of the TMR element MTJ3 is judged as "0". When O1b2="0", O3b4="0" and O5b6="1", the data value of the TMR element MTJ3 is judged as "1".

Figure 75:
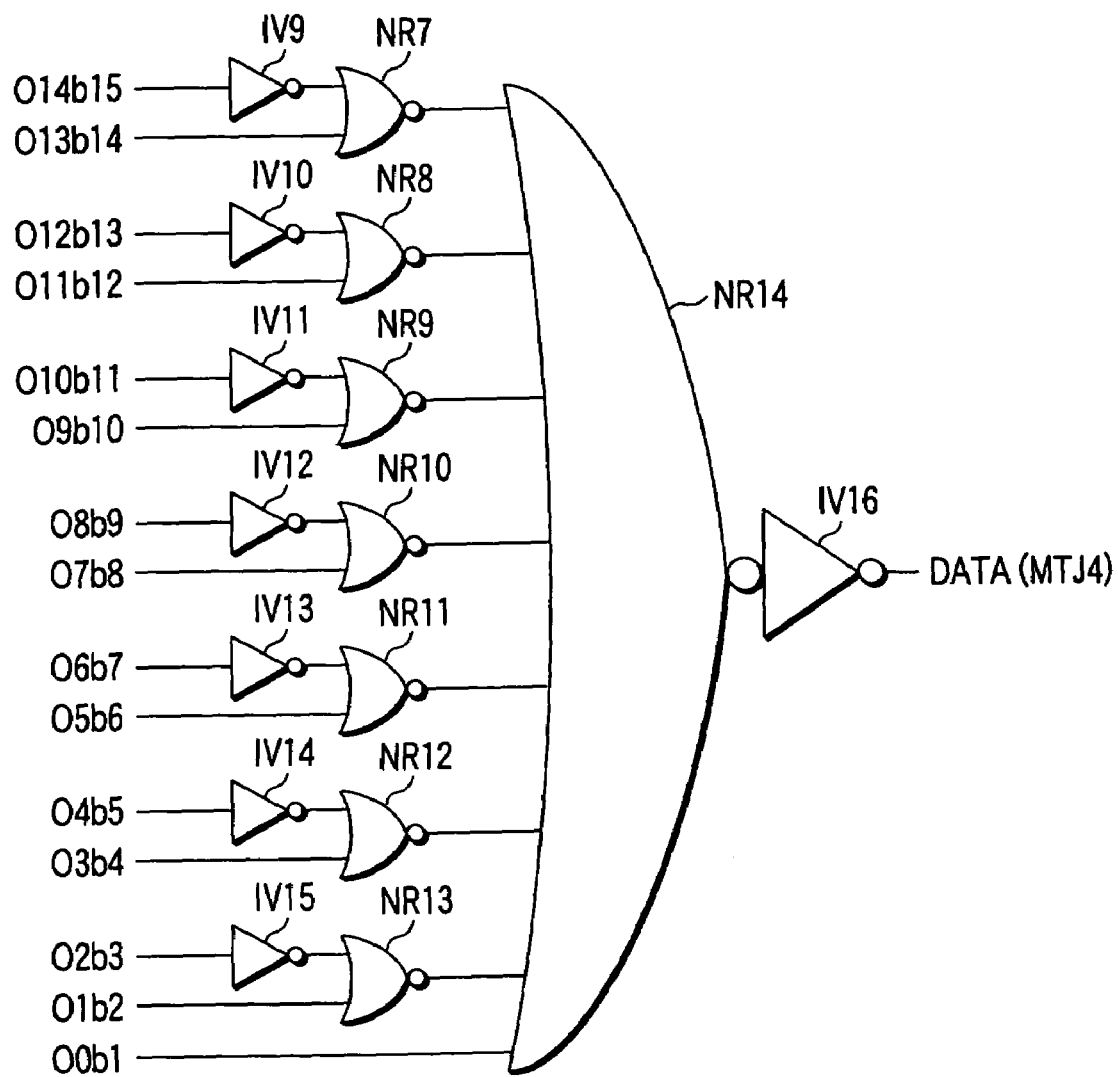
FIG. 75 is a view showing a logic circuit which judges a data value of the fourth TMR element.

FIG. 75 shows an example of the logic circuit which judges a data value of the TMR element MTJ4 based on an output signal from the A/D converter.

This logic circuit is constituted so as to satisfy the relationship shown in Tables 25 to 28. In this example, a data value of the TMR element MTJ4 is judged based on all the output signals O0b1, O1b2, . . . O13b14 and O14b15 from the A/D converter.

The logic circuit which judges a data value of the TMR element MTJ4 is constituted by inverters IV9, IV10, IV11, IV12, IV13, IV14, IV15 and IV16 and NOR gate circuits NR7, NR8, NR9, NR10, NR11, NR12, NR13 and NR14.

For example, when O0b1="1", the data value of the TMR element MTJ4 is judged as "1". Moreover, when O0b1="0" and O1b2="1", the data value of the TMR element MTJ4 is judged as "0". When O0b1="0", O1b2="0" and 02b3="1", the data value of the TMR element MTJ4 is judged as "1".

It is to be noted that there are three patterns of the output signals O0b1, O1b2, . . . O13b14 and O14b15 from the A/D converter, i.e., a pattern that all the signals are "1", a pattern that all the signals are "0" and a pattern that both "0" and "1" exist.

In addition, when both "0" and "1" exist, there is always a border of "0" and "1", and all the output signals on one side of the border are "0" whilst all the signals on the other side of the same are "1".

5. Circuit Examples Other Than Read Circuit

Description will now be given as to circuit examples other than the read circuit, namely, a circuit example of the write word line driver/sinker, a circuit example of the write bit line driver/sinker, a circuit example of the read word line driver and a circuit example of the column decoder.

(1) Write Word Line Driver/Sinker

FIG. 77 shows a circuit example of the write word line driver/sinker.

In this example, as explained in the section "1. Cell Array Structure", it is presumed that the TMR elements superposed in four stages and the three write word lines exist in one row. This drawing shows only one row of the write word line driver/sinker.

The write word line driver 23A-0 includes P-channel MOS transistors QP15, QP16 and QP17 and NAND gate circuits ND1, ND2 and ND3. The write word line sinker 24-0 is constituted by N-channel MOS transistors QN15, QN16 and QN17.

The P-channel MOS transistor QP15 is connected between the power supply terminal and the write word line WWL2 on the upper stage. An output signal from the NAND gate circuit ND1 is supplied to a gate of the P-channel MOS transistor QP15. The N-channel MOS transistor QN15 is connected between the write word line WWL2 on the upper stage and the ground terminal.

When an output signal from the NAND gate circuit ND1 is "0", the write current flows through the write word line WWL2.

The P-channel MOS transistor QP16 is connected between the power supply terminal and the write word line WWL1 on the intermediate stage. An output signal from the NAND gate circuit ND2 is supplied to a gate of the P-channel MOS transistor QP16. The N-channel MOS transistor QN16 is connected between the write word line WWL1 on the intermediate stage and the ground terminal.

When an output signal from the NAND gate circuit ND2 is "0", the write current flows through the write word line WWL1.

The P-channel MOS transistor QP17 is connected between the power supply terminal and the write word line WWL0 on the lower stage. An output signal from the NAND gate circuit ND3 is supplied to a gate of the P-channel MOS transistor QP17. The N-channel MOS transistor QN17 is connected between the write word line WWL0 on the lower stage and the ground terminal.

When an output signal from the NAND gate circuit ND3 is "0", the write current flows through the write word line WWL0.

Lower order two bits in row address signals having a plurality of bits are inputted to each of an NOR gate circuit NR15 and an exclusive OR gate circuit Ex-OR1. The inferior two bits are used for selecting one from the three write word line WWL0, WWL1 and WWL2 in a selected row.

An output signal from the NOR gate circuit NR15 is inputted to the NAND gate circuit ND1, and an output signal from the exclusive OR gate circuit Ex-OR1 is inputted to the NAND gate circuit ND2.

In such a write word line driver/sinker, in the write operation, a write signal WRITE becomes "1". Additionally, one of a plurality of rows is selected based on high order row address signals except the lower order two bits in row address signals having a plurality of bits. In the selected row, all bits in the high order row address signals become "1".

In the selected row, whether the write current is caused to flow through the write word lines WWL0, WWL1 and WWL2 is determined based on the lower order two bits RA0 and RA1 in the row address signals having a plurality of bits.

For example, in the write operation, when RA0="0" and RA1="1" in the selected row, all the input signals of the NAND gate circuit ND1 are "1". As a result, an output signal from the NAND gate circuit ND1 becomes "0", and the P-channel MOS transistor QP15 enters the on state. Then, the write current flows through the write word line WWL2.

Further, when RA0="1" and RA1="1", all the input signals to the NAND gate circuit ND3 become "1". As a result, an output signal from the NAND gate circuit ND3 becomes "0", and the P-channel MOS transistor QP17 enters the on state. Then, the write current flows through the write word line WWL0.

Furthermore, when RA0 and RA1 have different values (one is "0" and the other is "1"), all the input signals to the NAND gate circuit ND2 are "1". As a result, an output signal from the NAND gate circuit ND2 becomes "0", and the P-channel MOS transistor QP16 enters the on state. Then, the write current flows through the write word line WWL1.

(2) Write Bit Line Driver/Sinker

FIG. 78 shows a circuit example of the write bit line driver/sinker.

In this example, it is presumed that the TMR elements superposed in four stages and the two write bit lines exist in one column. This drawing shows only one column of the write bit line driver/sinker.

The write bit line driver/sinker 29A is constituted by P-channel MOS transistors QP18 and QP19, N-channel MOS transistors QN18 and QN19, NAND gate circuits ND4 and ND5, AND gate circuits AD1 and AD2, an NOR gate circuit NR16 and inverters IV17 and IV18.

The write bit line driver/sinker 31 is constituted by P-channel MOS transistors QP20 and QP21, N-channel MOS transistors QN20 and QN21, NAND gate circuits ND6 and ND7, AND gate circuits AD3 and AD4, an NOR gate circuit NR17 and inverters IV19 and IV20.

The P-channel MOS transistor QP18 is connected between the power supply terminal and the write bit line BL00 on the lower stage, and the N-channel MOS transistor QN18 is connected between the write bit line BL01 on the upper stage and the ground terminal. The P-channel MOS transistor QP20 is connected between the power supply terminal and the write bit line BL00 on the lower stage, and the N-channel MOS transistor QN20 is connected between the write bit line BL00 on the lower stage and the ground terminal.

When an output signal from the NAND gate circuit ND4 is "0" and an output signal from the AND gate circuit AD3 is "1", the write current which is directed from the write bit line driver/sinker 29A to the write bit line driver/sinker 31 flows through the write bit line BL00.

When an output signal from the NAND gate circuit ND6 is "0" and an output signal from the AND gate circuit AD1 is "1", the write current which is directed from the write bit line driver/sinker 31 to the write bit line driver/sinker 29A flows through the write bit line BL00.

The P-channel MOS transistor QP19 is connected between the power supply terminal and the write bit line BL01 on the upper stage, and the N-channel MOS transistor QN19 is connected between the write bit line BL01 on the upper stage and the ground terminal. The P-channel MOS transistor QP21 is connected between the power supply terminal and the write bit line BL01 on the upper stage, and the N-channel MOS transistor QN21 is connected between the write bit line BL01 on the upper stage and the ground terminal.

When an output signal from the NAND gate circuit ND5 is "0" and an output signal from the AND gate circuit AD4 is "1", the write current which is directed from the write bit line driver/sinker 29A to the write bit line driver/sinker 31 flows through the write bit line BL01.

When an output signal from the NAND gate circuit ND7 is "0" and an output signal from the AND gate circuit AD2 is "1", the write current which is directed from the write bit line driver/sinker 31 to the write bit line driver/sinker 29A flows through the write bit line BL01.

In such a write bit line driver/sinker, in the write operation, the write signal WRITE becomes "1". Further, in a selected column, all bits in column address signals having a plurality of bits become "1".

Furthermore, in this example, one of the two write bit lines BL00 and BL01 in one column is selected by using one bit RA1 in the row address signals having a plurality of bits. For example, when RA1 is "1", the write bit line BL01 is selected. When RA1 is "0", the write bit line BL00 is selected.

Moreover, a direction of the write current caused to flow through a selected write bit line in a selected column is determined in accordance with a value of write data DATA.

For example, when the write bit line BL01 is selected (when RA="1"), if the write data DATA is "1", an output signal from the NAND gate circuit ND5 becomes "0" and an output signal from the AND gate circuit AD4 becomes "1". As a result, the write current directed from the write bit line driver/sinker 29A to the write bit line driver/sinker 31 flows through the write bit line BL00.

In addition, when the write bit line BL01 is selected (when RA="1"), if the write data DATA is "0", an output signal from the NAND gate circuit ND7 becomes "0" and an output signal from the AND gate circuit AD2 becomes "1". As a result, the write current directed from the write bit line driver/sinker 31 to the write bit line driver/sinker 29A flows through the write bit line BL01.

Additionally, when the write bit line BL00 is selected (when RA="0"), if the write data DATA is "1", an output signal from the NAND gate circuit ND4 becomes "0" and an output signal from the AND gate circuit AD3 becomes "1". As a result, the write current directed from the write bit line driver/sinker 29A to the write bit line driver/sinker 31 flows through the write bit line BL01.

Further, when the write bit line BL00 is selected (when RA="0"), if the write data DATA is "0", an output signal from the NAND gate circuit ND6 becomes "0" and an output signal from the AND gate circuit AD1 becomes "1". As a result, the write current directed from the write bit line driver/sinker 31 to the write bit line driver/sinker 29A flows through the write bit line BL00.

Incidentally, when such a device structure as shown in FIGS. 2 and 3 is adopted, for example, the write bit line BLj0 is shared by the two TMR elements MTJ1 and MTJ2. Here, the write bit line BLj0 exists above the TMR element MTJ1 as seen from the TMR element MTJ1, and the write bit line BLj0 exists below the TMR element MTJ2 as seen from the TMR element MTJ2.

Therefore, when the write current is directed from the write bit line driver/sinker 29A to the write bit line driver/sinker 31 shown in FIG. 1 for example, a magnetic field applied to the TMR element MTJ1 and a magnetic field applied to the TMR element MTJ2 are opposite to each other.

In this manner, when one write bit line is shared by the two TMR elements, the magnetic fields acting on the two TMR elements are opposite to each other even if the direction of the write current flowing through the write bit line is the same in the two TMR elements, and attention must be paid to the point that the magnetizing directions are also opposite to each other.

This is also true to the two TMR elements MTJ3 and MTJ4 in the device structure shown in FIGS. 2 and 3, for example.

In regard to the respective TMR elements MTJ1, MTJ2, MTJ3 and MTJ4, if the direction of magnetization of the pinned layer can be individually set, the logic described in connection with the read operation principle and the read circuit mentioned above can be applied as it is by opposing the direction of magnetization of the pinned layer of the TMR element MTJ1 existing below the write bit line BLj0 and the direction of magnetization of the pinned layer of the TMR element MTJ2 existing above the write bit line BLj0, for example.

That is, it is possible to determined that the case when the magnetizing direction of the pinned layer is equal to the magnetizing direction of the storage layer is "1" and the case that the magnetizing direction of the pinned layer is different from the magnetizing direction of the storage layer is "0".

In regard to the respective TMR elements MTJ1, MTJ2, MTJ3 and MTJ4, if the directions of magnetization of the pinned layers are the same, the write operation or the read operation must be further cogitated when trying to apply the logic described in connection with the read operation principle and the read circuit as it stands.

For example, it is possible to determine that the case that the magnetizing direction of the pinned layer is equal to the magnetizing direction of the storage layer is "1" and the case that the magnetizing direction of the pinned layer is different from the magnetizing direction of the storage layer is "0" by separately executing writing in the TMR element below the write bit line and writing in the TMR element above the write bit line at different points in time in the write operation.

When the condition of "1"/"0" of the TMR element below the write bit line (relationship between the magnetizing direction of the pinned layer and the magnetizing direction of the storage layer) and the condition of "1"/"0" of the TMR element above the write bit line are opposite to each other, the logic for judging data during the read operation must be changed.

(3) Read Word Line Driver

Figure 79:
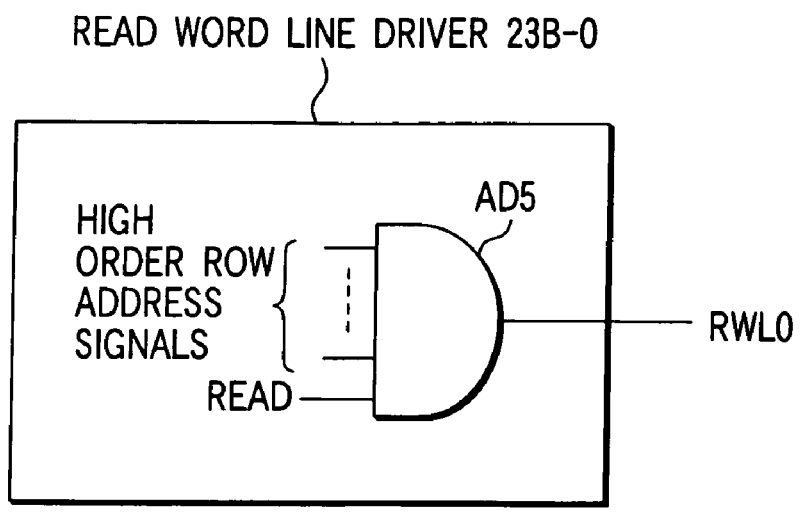
FIG. 79 is a view showing a circuit example of a read word line driver.

FIG. 79 shows a circuit example of the read word line driver.

The read word line driver 23b-0 is constituted by an AND gate circuit AD5. A read signal READ and high order row address signals are inputted to the AND gate circuit AD5.

The read signal becomes "1" during the read operation. The high order row address signals are the same as the high order row address signals in the write word line drier/sinker (FIG. 77). That is, a potential of the read word line RWL0 is determined based on the high order row address signals, which is used for selecting one row, in the row address signals.

In a selected row, since all the high order row address signals become "1", a potential of the read word line RWL0 is "1".

(4) Column Decoder

Figure 80:
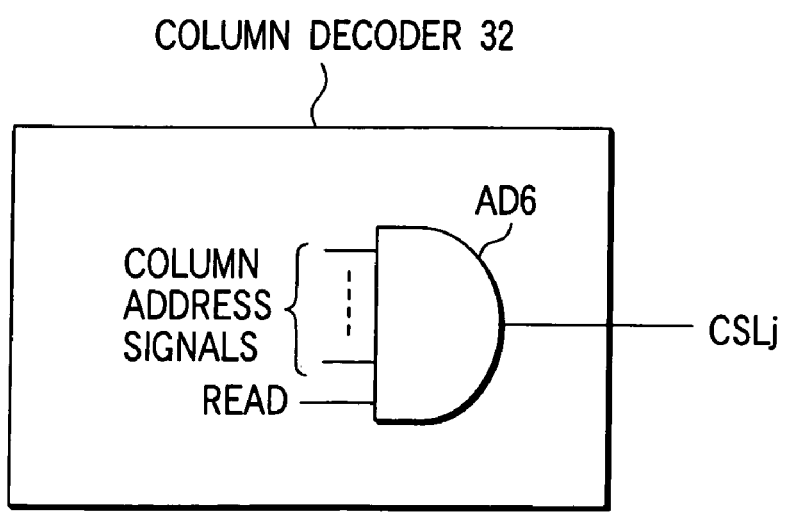
FIG. 80 is a view showing a circuit example of a column decoder.

FIG. 80 shows a circuit example of the column decoder.

The column decoder 32 is constituted by an AND gate circuit AD6. A read signal READ and column address signals are inputted to the AND gate circuit AD6. The read signal becomes "1" in the read operation. Further, in a selected column, since all the column address signals become "1", a potential of a column selection signal CSLj is "1".

6. Manufacturing Method

The cell array structure, the read operation principle, manufacture of the TMR element and the read circuit in the magnetic random access memory according to the present invention are as described above. Thus, description will now be finally given as to the manufacturing method for realizing the magnetic random access memory according to the present invention.

(1) Manufacturing Method 1

This manufacturing method 1 is applied to a magnetic random access memory having a cell array structure (one-switch and N-MTJ structure) in which a plurality of the TMR elements are superposed in multiple stages and a plurality of these TMR elements are connected to each other in series between the read bit line and the ground terminal.

The cell array structure completed by the manufacturing method according to the present invention will be first briefly described. The method for manufacturing the cell array structure will be thereafter described.

① Cell Array Structure Concerning Manufacturing Method 1

Figure 81:
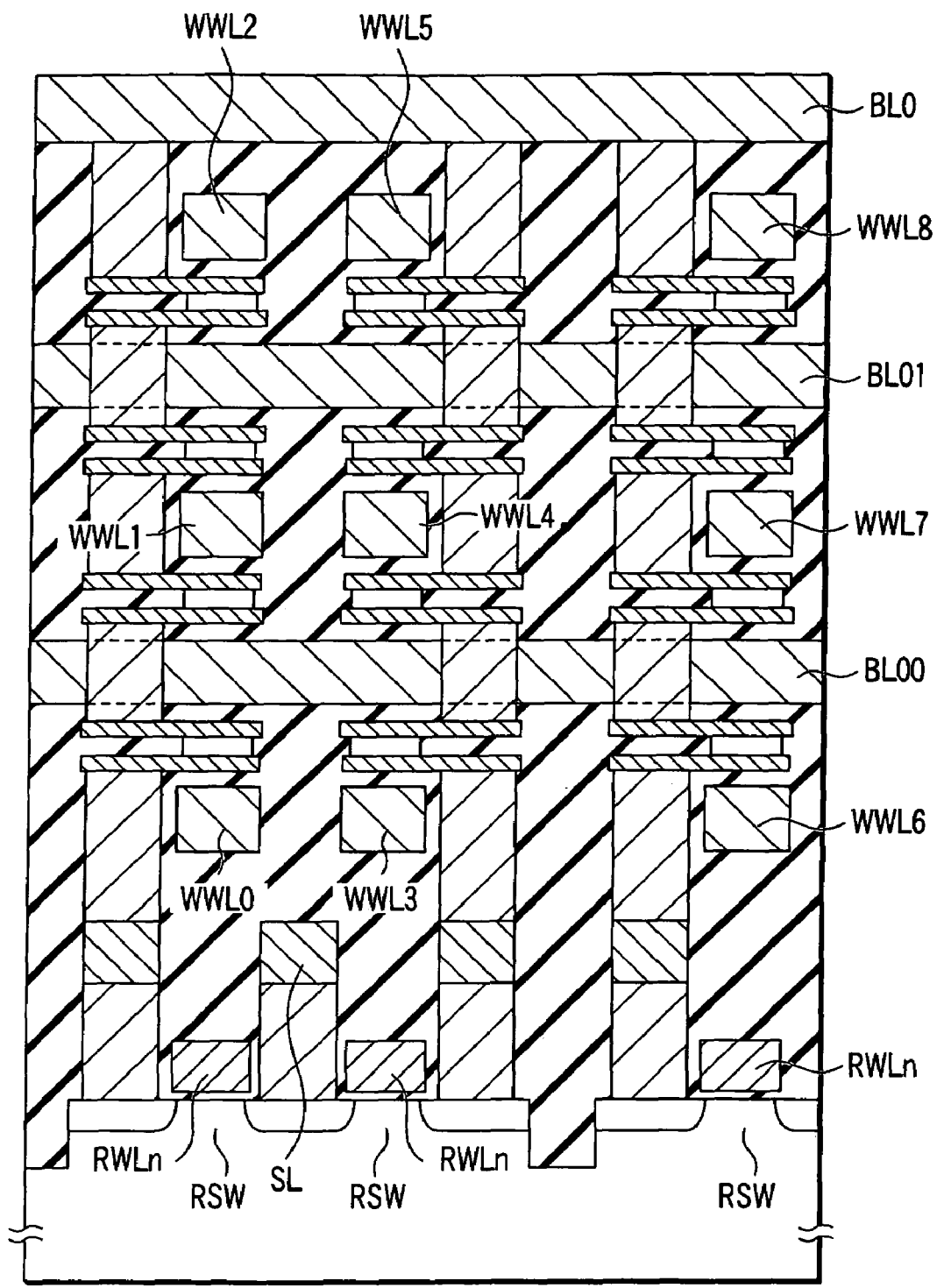
FIG. 81 is a view showing a device structure to which a manufacturing method 1 according to the present invention is applied.

FIG. 81 shows an example of the cell array structure of a magnetic random access memory in which one block is constituted by a plurality of the TMR elements connected to each other in series.

A characteristic of this cell array structure lies in that one read bit line is arranged in one column (Y-direction) and a plurality of the TMR elements connected to each other in series are arranged directly below this read bit line. A plurality of the TMR elements constitute one read block and are connected between the read bit line and the ground terminal.

A read selection switch (MOS transistor) RSW is arranged in a surface area of the semiconductor substrate. A source of the read selection switch RSW is connected to the ground terminal through a source line SL. The source line SL is shared by two read blocks adjacent to each other in the column direction. The source line SL extends in, e.g., the X-direction (direction vertical to a page space) straightway.

A gate of the read selection switch (MOS transistor) RSW is a read word line RWLn. The read word line RWLn extends in the X-direction. Four TMR elements (MTJ (Magnetic Tunnel Junction) elements) are respectively superposed on the read selection switch RSW.

The respective TMR elements are arranged between the lower electrode and the upper electrode and connected to each other in series by a contact plug. The lower electrode of the TMR element on the lowermost stage is connected to a drain of the read selection switch (MOS transistor) RSW. The upper electrode of the TMR electrode on the uppermost stage is connected to the read bit line BL0 extending in the Y-direction by the contact plug.

Three write word lines WWL0, WWL1 and WWL2 extending in the X-direction exist in one row, and two write bit lines BL00 and BL01 extending in the Y-direction exist in one column.

When the cell array structure is seen from the above of the semiconductor substrate, for example, a plurality of the superposed TMR elements are laid out so as to overlap each other. Further, the three write word lines also laid out so as to overlap each other. Furthermore, the read bit line and the two write bit lines are also laid out so as to overlap each other.

The contact plug used for connecting a plurality of the TMR elements to each other in series is laid out at a position such that it does not overlap the write word line or the write bit line. The upper and lower electrodes of the TMR element are formed with a pattern that they can easily contact the contact plug.

② Each Step in Manufacturing Method 1

Description will now be given as to the manufacturing method for realizing the cell array structure shown in FIG. 81. Here, since the embodied manufacturing method (for example, adoption of a dual damascene process) will be explained, attention should be paid to the fact that elements which do no exist in the cell array structure shown in FIG. 81 will be also explained. However, the outline of the finally completed cell array structure is substantially the same as that of the cell array structure illustrated in FIG. 81.

Element Separation Step

Figure 82:
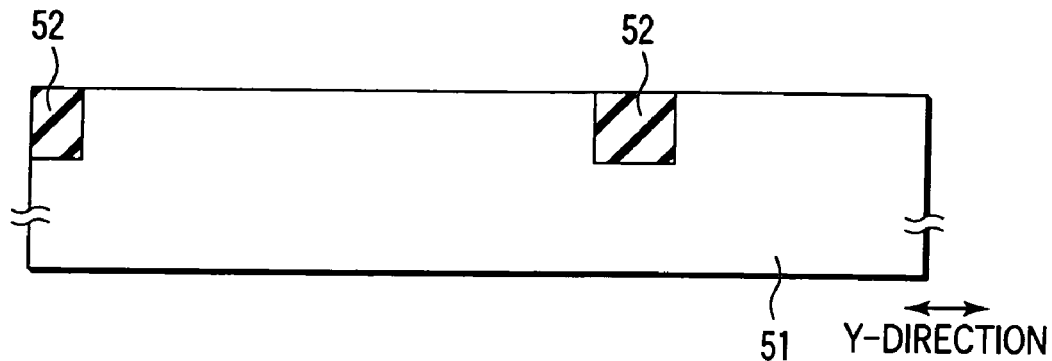
FIG. 82 is a sectional view showing one step of the manufacturing method 1 according to the present invention.

As shown in FIG. 82, the STI (Shallow Trench Isolation) structure 52 which is the shallow trenches are filled by filed oxide for isolating active areas is first formed in the semiconductor substrate.

The STI structure 52 can be formed by, e.g., the following process.

A mask pattern (for example, silicon nitride) is formed on the semiconductor substrate 51 by PEP (Photo Engraving Process). With this mask pattern being used as a mask, the semiconductor substrate 51 is etched by using RIE (Reactive Ion Etching), and trenches are formed on the semiconductor substrate 51. For example, these trenches are filled by insulating films (for example, silicon oxide) by using the CVD (Chemical Vapor Deposition) method and the CMP (Chemical Mechanical Polishing) method.

Thereafter, P type impurities (for example, B or $BF_2$) or N type impurities (for example, P or As) is injected into the semiconductor substrate by, e.g., ion implantation, and P type well regions or N type well regions is formed.

Step for Forming MOSFET

Figure 83:
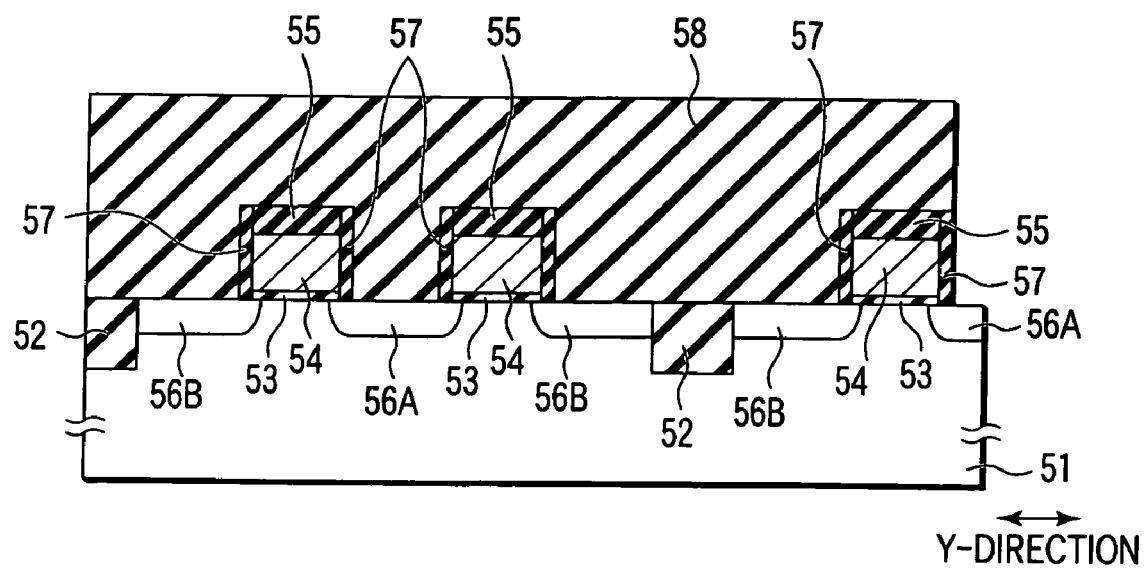
FIG. 83 is a sectional view showing one step of the manufacturing method 1 according to the present invention.

Subsequently, as shown in FIG. 83, an MOS transistor which functions as a read selection switch is formed in the surface area of the semiconductor substrate 51.

The MOS transistor can be formed by the following process, for example.

Impurities for controlling a threshold value of the MOS transistor is ion-implanted in necessitate channel portions in active areas surrounding by field oxides 52. A gate insulating film (for example, silicon oxide) 53 is formed on the active regions by thermal oxidation. A gate electrode material (for example, poly-silicon including impurities) and a cap insulating film (for example, silicon nitride) 55 are formed on the gate insulating film 53 by the CVD method.

After patterning the cap insulating film 55 by PEP, the gate electrode material and the gate insulating film 53 are etched by RIE with the cap insulating film 55 being used as a mask. As a result, gate electrodes 54 extending in the X-direction are formed on the semiconductor substrate 51.

With the cap insulating film 55 and the gate electrodes 54 being used as a mask, the P type impurities or the N type impurities are injected into the semiconductor substrate 51 by using ion plantation. Then, low concentration impurity regions (LDD regions or extension regions) are formed in the semiconductor substrate.

After forming the insulating film (for example, silicon nitride) on the entire semiconductor substrate 51 by the CVD method, the insulating film is etched by RIE and side wall spacers 57 are formed on the side walls of the gate electrode 54 and the cap insulating film 55. The cap insulating film 55, the gate electrode 54 and the side wall spacers 57 are used as a mask, and the P type impurities or the N type impurities are injected into the semiconductor substrate 51 by using the ion implantation. As a result, source regions 56A and drain regions 56B are formed in the semiconductor substrate 51.

Thereafter, an interlayer insulating film (for example, silicon oxide) 58 which completely covers the MOS transistor is formed on the entire semiconductor substrate 51 by the CVD method. Further, the surface of the interlayer insulating film 58 is made flat by utilizing the CMP technique.

Step for Forming Contact Hole

Figure 84:
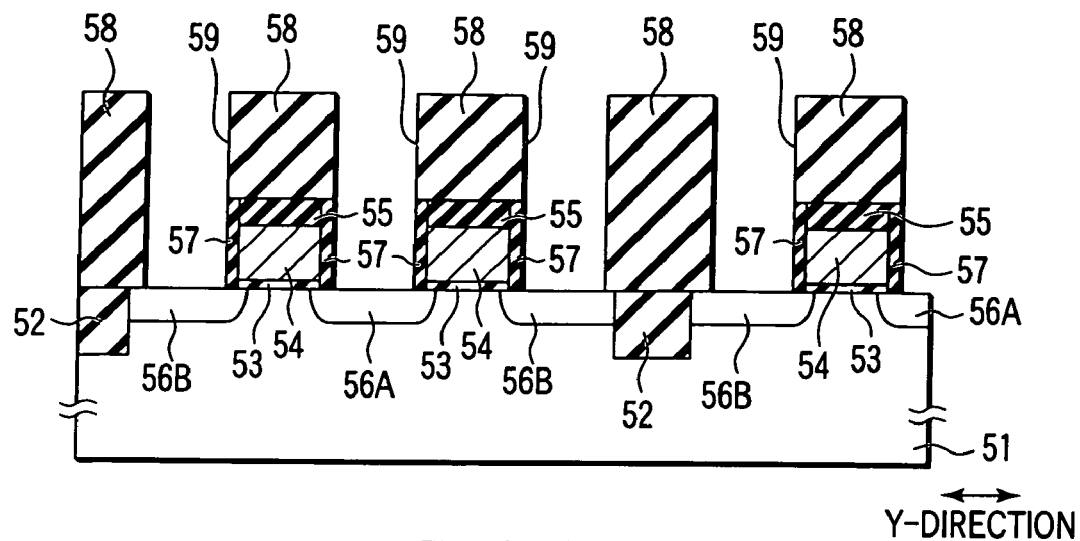
FIG. 84 is a sectional view showing one step of the manufacturing method 1 according to the present invention.

Subsequently, as show in FIG. 84, contact holes 59 which reaches the source region 56A and the drain region 56B of the MOS transistor are formed to the interlayer insulating film 58 on the semiconductor substrate 51.

The contact holes 59 can be readily formed by, e.g., forming a resist pattern on the interlayer insulating film 58 by PEP and etching the interlayer insulating film 58 by RIE with the photoresist pattern being used as a mask. After etching, the photoresist pattern is removed.

Step for Forming Wiring Groove

Figure 85:
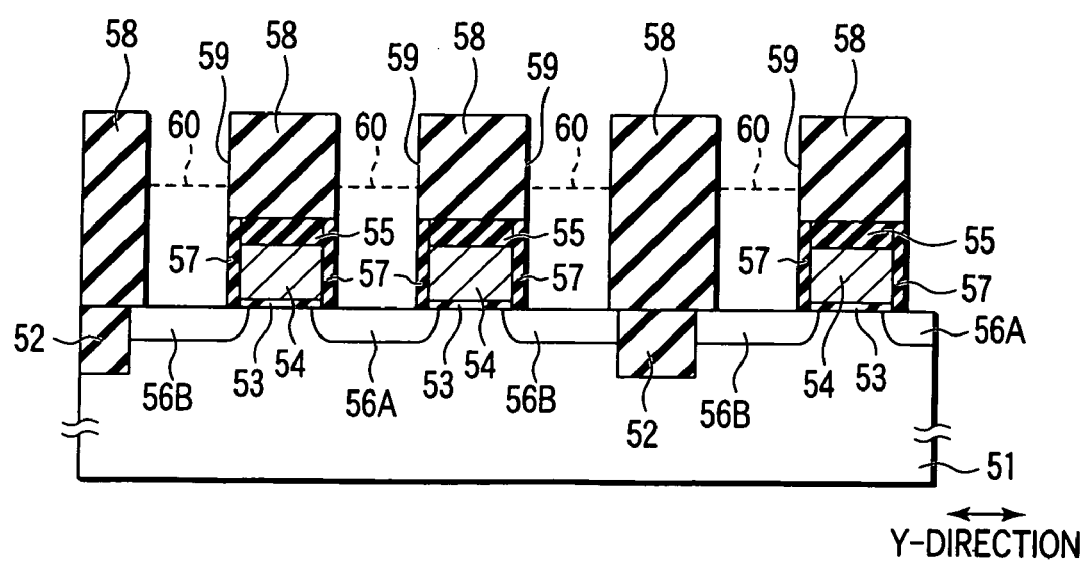
FIG. 85 is a sectional view showing one step of the manufacturing method 1 according to the present invention.

Then, as shown in FIG. 85, wiring grooves 60 are formed to the interlayer insulating film 58 on the semiconductor substrate 51. In this example, since the wiring grooves 60 extend in the X-direction, the wiring grooves 60 overlap the contact holes 59 when seen from the cross section along the Y-direction. Thus, in this drawing, the wiring grooves 60 are indicated by a broken line.

The wiring grooves 60 can be readily formed by, e.g., forming a photoresist pattern on the interlayer insulating film 58 by PEP and etching the interlayer insulating film 58 by RIE with the photoresist pattern being used as a mask. After etching, the photoresist pattern is removed.

Step for Forming First Wiring Layer

Figure 86:
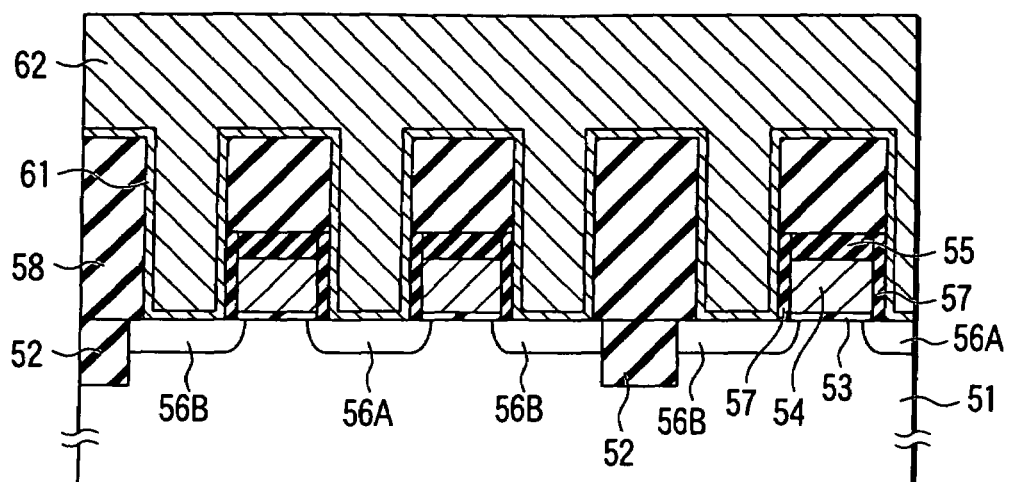
FIG. 86 is a sectional view showing one step of the manufacturing method 1 according to the present invention.

Subsequently, as shown in FIG. 86, barrier metal layers (for example, a lamination layer of Ti and TiN) 61 are formed on each of the interlayer insulating film 58, the inner surface of the contact holes 59 and the inner surface of the wiring grooves 60 by using, e.g., the sputtering method. Then, for example, a metal layer (for example, W) 62 which completely fills the contact holes 59 and the wiring grooves 60 is formed on the barrier metal layer 61 by, e.g., the sputtering method.

Figure 87:
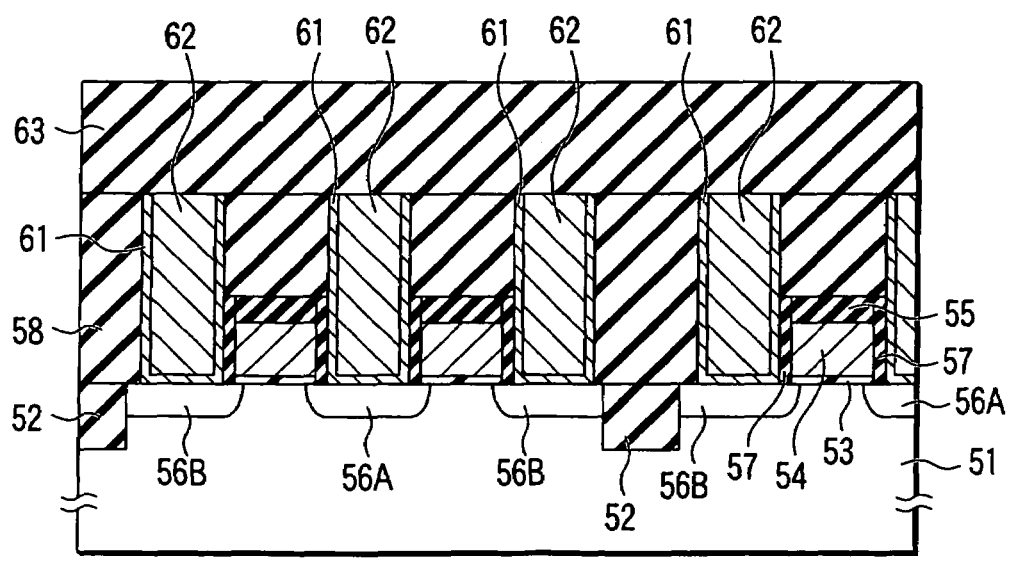
FIG. 87 is a sectional view showing one step of the manufacturing method 1 according to the present invention.

Thereafter, as shown in FIG. 87, the metal layer 62 is polished by using, e.g., the CMP method and the metal layer 62 is left only in the contact holes 59 and the wiring groove 60. The metal layer 62 remaining in the contact holes 59 becomes a contact plugs, and the metal layer 62 remaining in the wiring grooves 60 become a first wiring layer. Furthermore, an interlayer insulating film (for example, silicon oxide) 63 is formed on the interlayer insulating film 58 by, e.g., the CVD method.

It is to be noted that the steps consisting of the step for forming the contact holes, the step for forming the wiring grooves and the step for forming the first wiring layer are called the dual damascene process.

Step for Forming Wiring Groove

Figure 88:
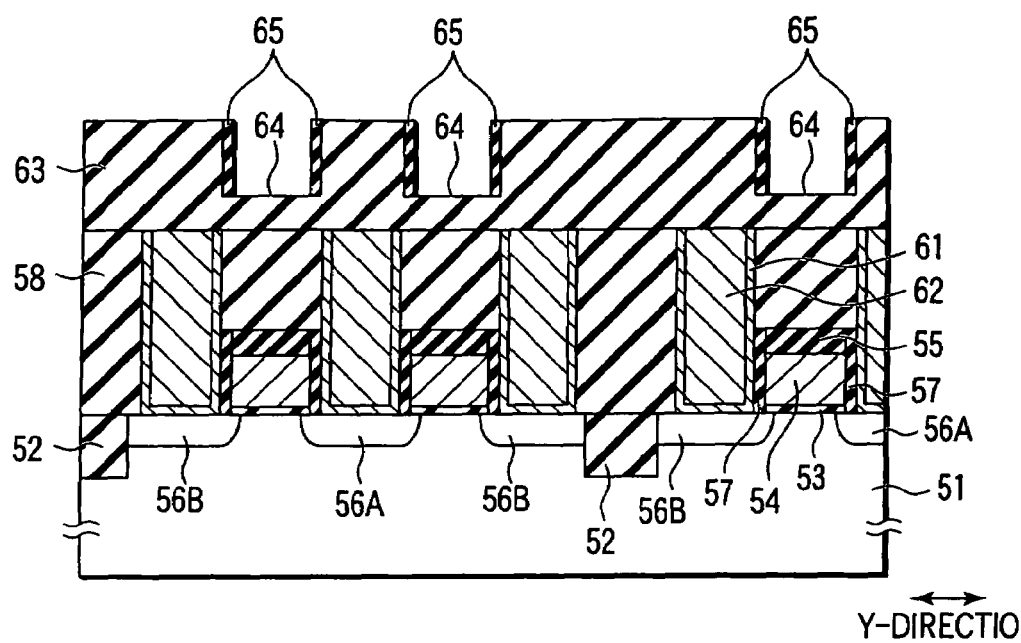
FIG. 88 is a sectional view showing one step of the manufacturing method 1 according to the present invention.

Then, as shown in FIG. 88, wiring grooves 64 are formed to the interlayer insulating film 63. In this example, the wiring grooves 64 are grooves used for forming the write word lines and extends in the X-direction. A side wall spacers (for example, silicon nitride) 65 for enhancing the insulation function is formed on the side surface of the wiring groove 64.

The wiring grooves 64 can be readily formed by, e.g., forming a photoresist pattern on the interlayer insulating film 63 by PEP and etching the interlayer insulating film 63 by RIE with this resist pattern being used as a mask. After etching, the resist pattern is removed.

The side wall spacers 65 can be easily formed by forming an insulating film (for example, silicon nitride) on the entire interlayer insulating film 63 by the CVD method and then etching the insulating film by RIE.

Step for Forming Second Wiring Layer

Figure 89:
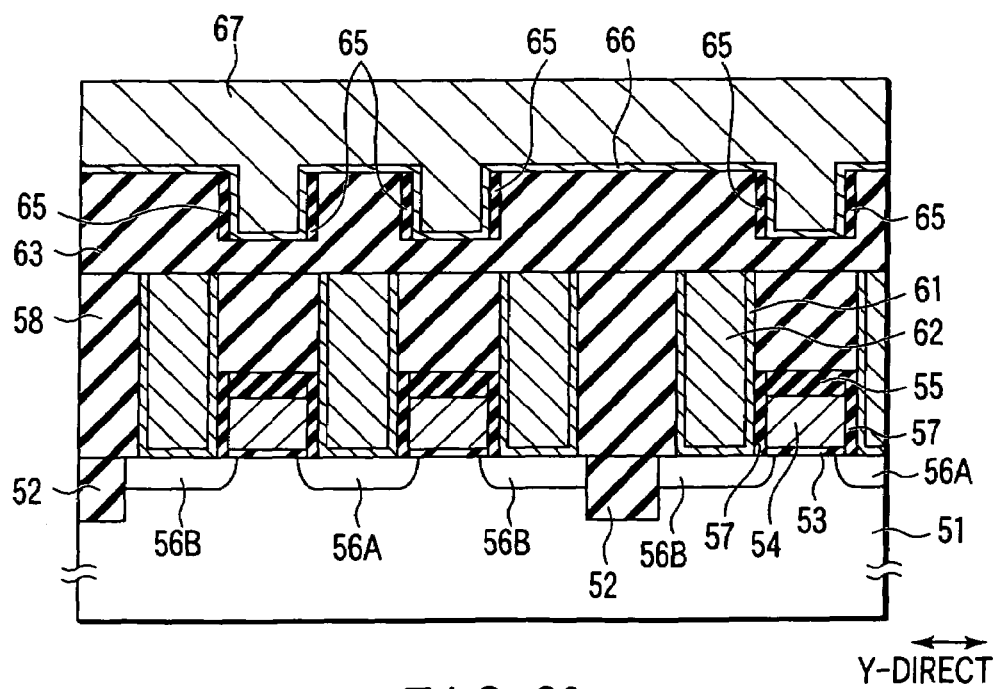
FIG. 89 is a sectional view showing one step of the manufacturing method 1 according to the present invention.

Subsequently, as shown in FIG. 89, barrier metal layers (for example, a lamination layer of Ta and TaN) 66 are formed on each of the interlayer insulating film 63, the inner surface of the wiring grooves 64 and the side wall spacers 65 by using, e.g., the sputtering method. Then, a metal layer (for example, Cu) 67 which completely fills the wiring grooves 64 is formed on the barrier metal layer 66 by, e.g., the sputtering method.

Figure 90:
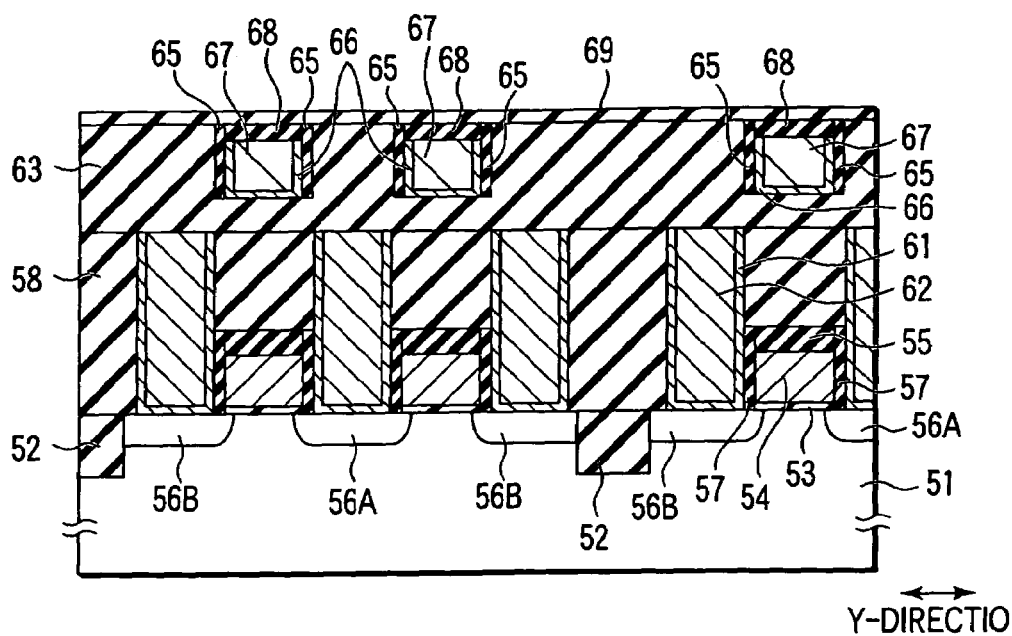
FIG. 90 is a sectional view showing one step of the manufacturing method 1 according to the present invention.

Thereafter, as shown in FIG. 90, the metal layer 67 is polished by using, e.g., the CMP method and the metal lines 67 are left only in the wiring grooves 64. The metal layer 67 remaining in the wiring grooves 64 becomes a second wiring layer which functions as the write word lines.

Moreover, a cap insulator (for example, silicon nitride) 68 is formed on the interlayer insulating film 63. If needed, the cap insulator 68 is polished by the CMP method, and the cap insulator 68 is left only on the metal layer 67 as the second wiring layer. Additionally, an interlayer insulating film (for example, silicon oxide) 69 which completely covers the metal layer 67 as the second wiring layer is formed on the interlayer insulating film 63.

It is to be noted that steps consisting of the step for forming the wiring groove and the step for forming the second wiring layer are called the damascene process.

Step for Forming Lower Electrode of First MTJ Element

Figure 91:
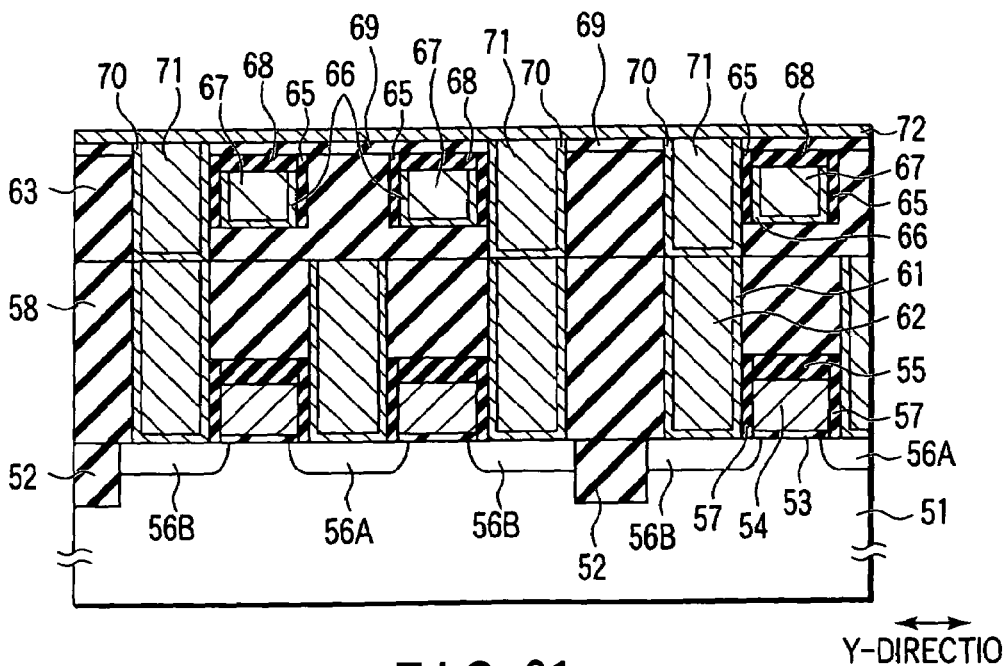
FIG. 91 is a sectional view showing one step of the manufacturing method 1 according to the present invention.

Subsequently, as shown in FIG. 91, a contact hole which reaches the metal layer 62 as the first wiring layer is formed to the interlayer insulating film 69.

The contact hole can be readily formed by forming a resist pattern on the interlayer insulating film 69 by, e.g., PEP and etching the interlayer insulating films 63 and 69 by RIE with this resist pattern being used as a mask. After etching, the resist pattern is removed.

Further, a barrier metal layer (for example, a lamination layer of Ti and TiN) 70 is formed on the inner surface of the contact hole by using, e.g., the sputtering method. Subsequently, a metal layer (for example, W) 71 which completely fills the contact hole is formed by the barrier metal layer 70 by, e.g., the sputtering method.

Thereafter, the metal layer 71 is polished by using, e.g., the CMP method, and the metal layer 71 is left only in the contact hole. The metal layer 71 remaining in the contact hole becomes a contact plug. Furthermore, a metal layer (for example, Ta) 72 which can be a lower electrode of the first MTJ element is formed on the interlayer insulating film 69 by, e.g., the CVD method.

Step for Forming First MTJ Element and Upper Electrode Thereof

Figure 92:
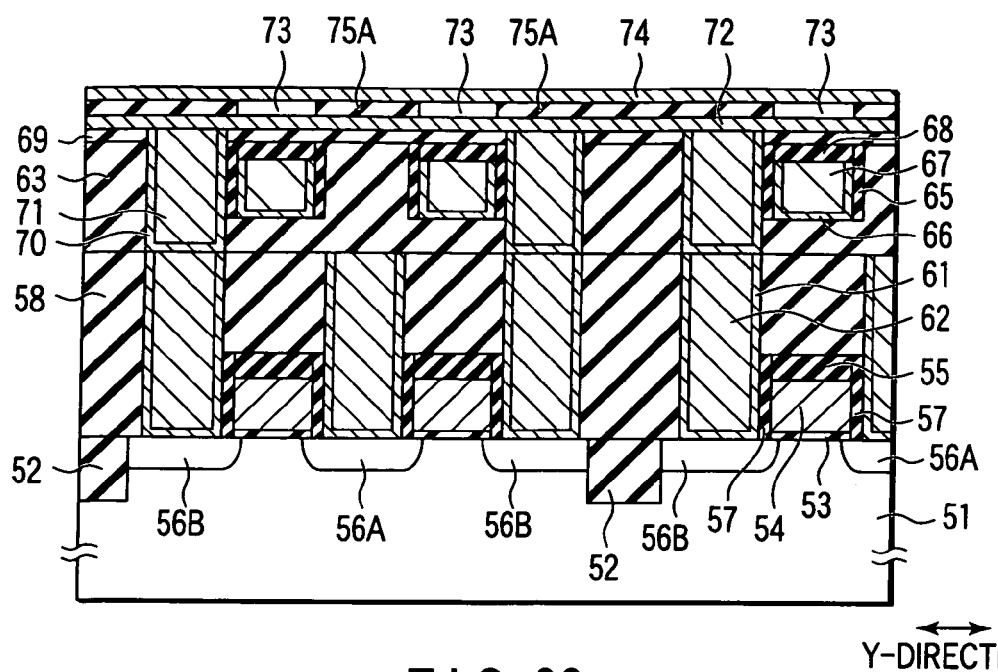
FIG. 92 is a sectional view showing one step of the manufacturing method 1 according to the present invention.

Subsequently, as shown in FIG. 92, a first MTJ element 73 is formed on the metal layer 72. The first MTJ element 73 is constituted by a tunneling barrier, two ferromagnetic layers sandwiching the tunneling barrier therebetween and an anti-ferromagnetic layer, and has, for example, such a structure as shown in FIG. 57.

An interlayer insulating film (for example, silicon oxide) 75A which completely covers the first MTJ element 73 is formed by using the CVD method. Furthermore, the interlayer insulating film 75A is polished by using, e.g., the CMP method, and the interlayer insulating film 75A is left only between the first MTJ elements 73.

Moreover, a metal layer (for example, Ta) 74 which can be an upper electrode of the first MTJ element 73 is formed on the interlayer insulating film 75A by the sputtering method.

Step for Patterning Lower/Upper Electrode of First MTJ Element

Figure 93:
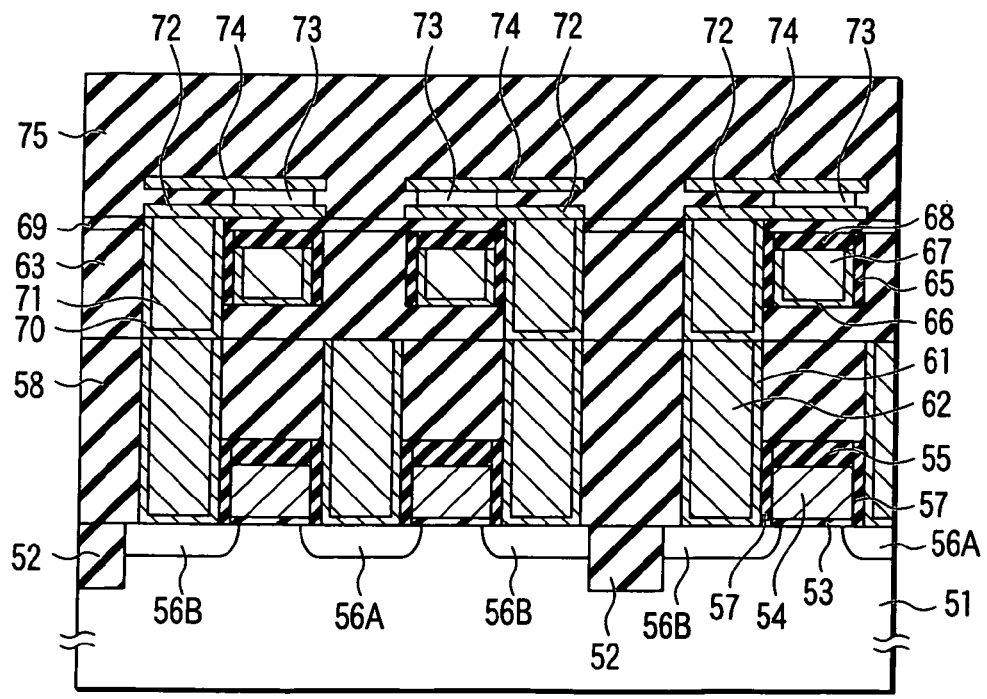
FIG. 93 is a sectional view showing one step of the manufacturing method 1 according to the present invention.

Subsequently, as shown in FIG. 93, the lower electrode 72 and the upper electrode 74 of the first MTJ element 73 are respectively patterned.

The lower/upper electrodes 72 and 74 of the first MTJ element 73 can be readily patterned by forming a resist pattern on the upper electrode 74 by PEP and then etching the lower/upper electrodes 72 and 74 by RIE with the resist pattern being used as a mask. Thereafter, the resist pattern is removed.

An interlayer insulating film 75 which completely covers the upper electrode 74 of the first MTJ element 73 is formed by using the CVD method.

Step for Forming Wiring Groove

Figure 94:
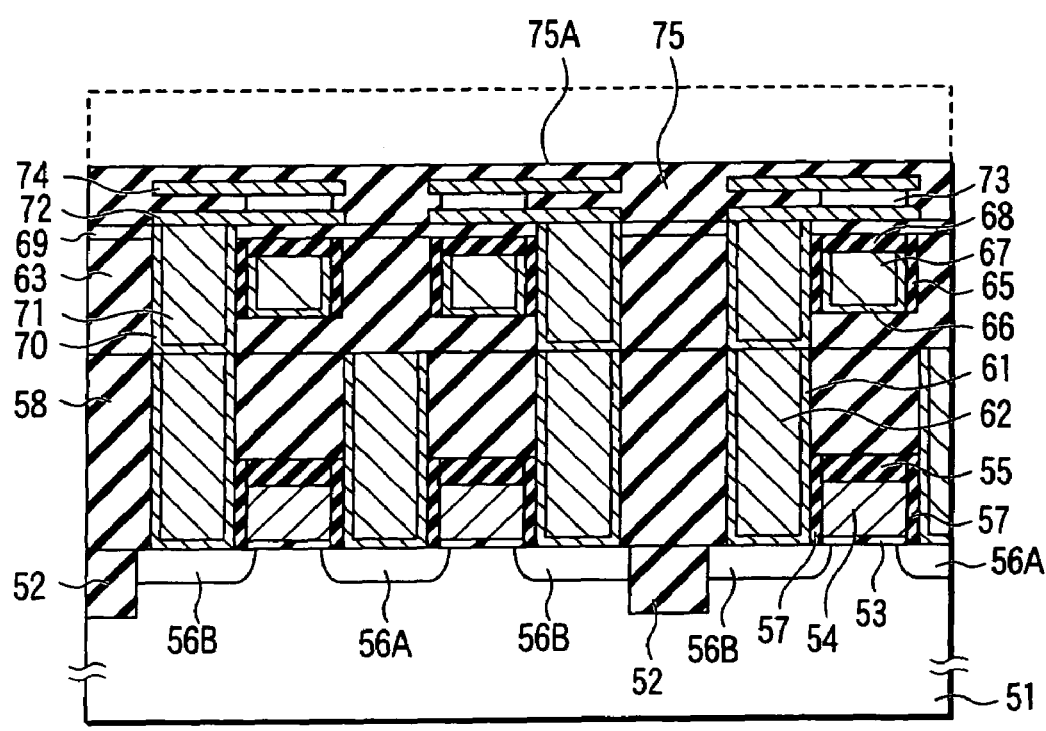
FIG. 94 is a sectional view showing one step of the manufacturing method 1 according to the present invention.

Then, as shown in FIG. 94, a wiring groove 75A is formed to the interlayer insulating film 75. In this example, the wiring groove 75A is a groove used for forming the write bit line and extends in the Y-direction. A side wall spacers (for example, silicon nitride) for enhancing the insulation function is formed on the side surface of the wiring groove 75A.

The wiring groove 75A can be easily formed by forming a resist pattern on the interlayer insulating film 75 by e.g., PEP and then etching the interlayer insulating film 75 by RIE with this resist pattern as a mask. After etching, the resist pattern is removed.

The side wall spacers can be readily formed by forming an insulating film (for example, silicon nitride) on the entire interlayer insulating film 75 by the CVD method and then etching the insulating film by RIE.

Step for Forming Third Wiring Layer

Figure 95:
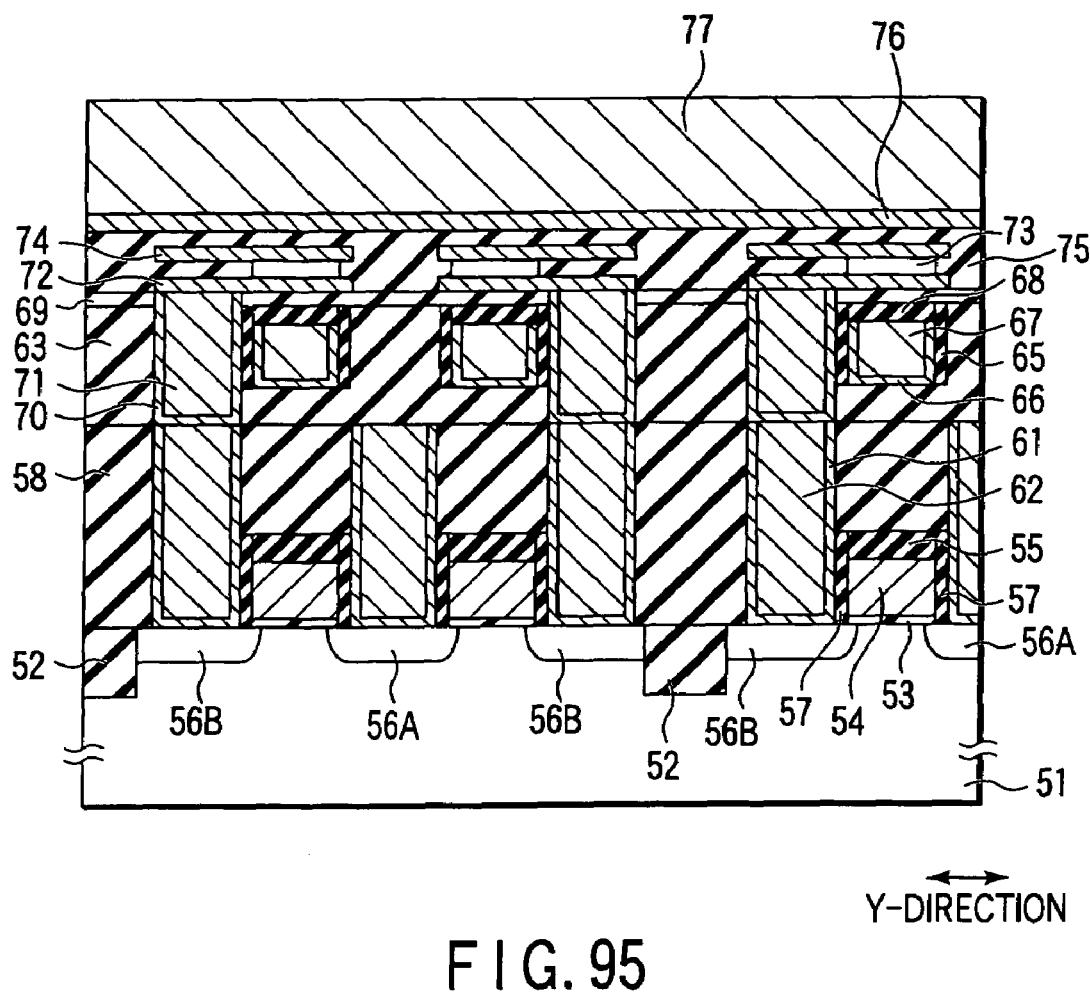
FIG. 95 is a sectional view showing one step of the manufacturing method 1 according to the present invention.

Then, as shown in FIG. 95, a barrier metal layer (for example, a lamination layer of Ta and TaN) 76 is formed on each of the interlayer insulating film 75, the inner surface of the wiring groove 75A and the side wall spacers by using, e.g., the sputtering method. Then, a metal layer (for example, Cu) 77 which completely fills the wiring groove 75A is formed on the barrier metal layer 76 by using, e.g., the sputtering method.

Figure 96:
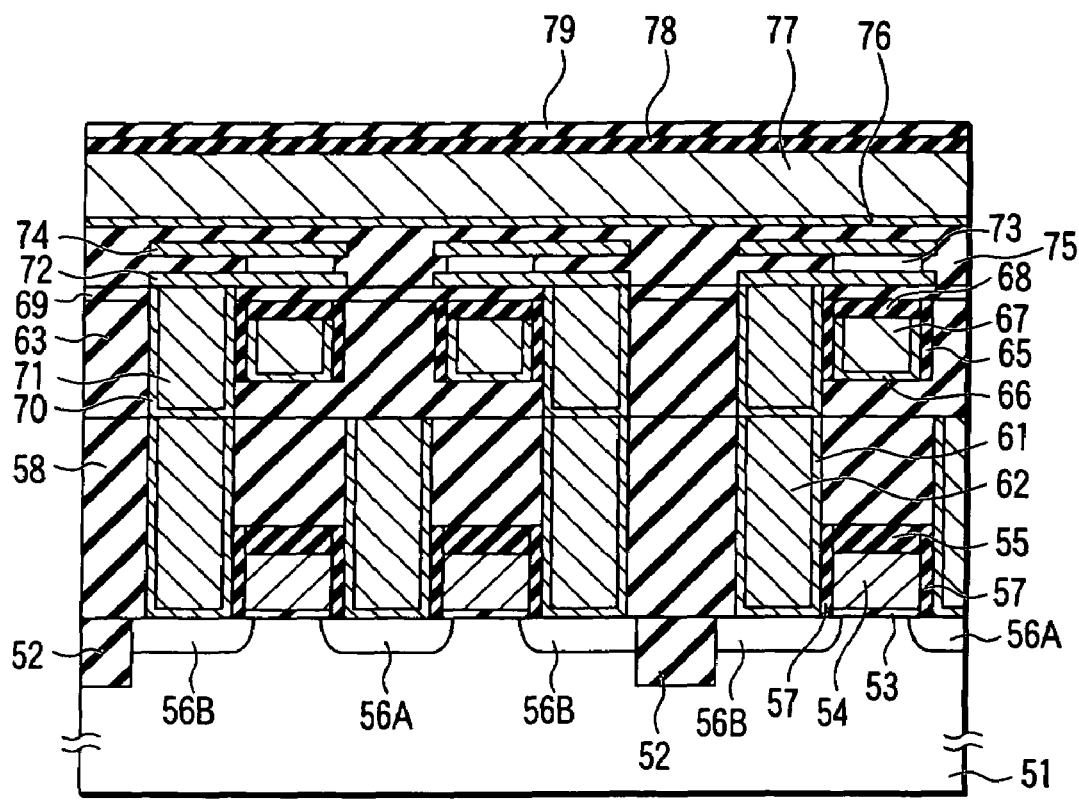
FIG. 96 is a sectional view showing one step of the manufacturing method 1 according to the present invention.

Thereafter, as shown in FIG. 96, the metal layer 77 is polished by using, e.g., the CMP method, and the metal layer 77 is left only in the wiring groove 75A. The metal layer 77 remaining in the wiring groove 75A becomes a third wiring layer which functions as the write bit line.

In addition, a cap insulator (for example, silicon nitride) 78 is formed on the interlayer insulating film 75 by the CVD method. If needed, the cap insulator 78 is polished by the CMP method, and the cap insulator 78 is left only on the metal layer 77 as the third wiring layer. Further, an interlayer insulating film (for example, silicon oxide) 79 which completely covers the metal layer 77 as the third wiring layer is formed on the interlayer insulating film 75.

Step for Forming Lower Electrode of Second MTJ Element

Figure 97:
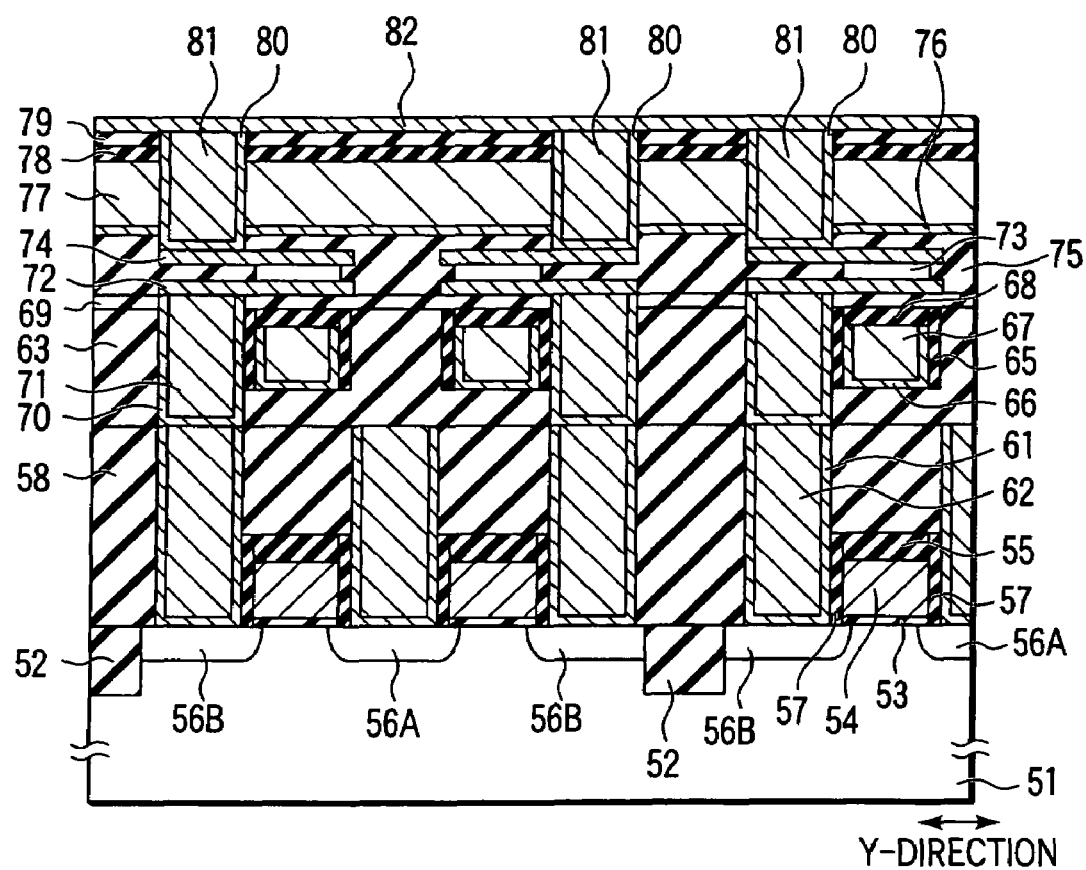
FIG. 97 is a sectional view showing one step of the manufacturing method 1 according to the present invention.

Subsequently, as shown in FIG. 97, a contact hole which reaches the upper electrode 74 of the first MTJ element is formed to the interlayer insulating films 75 and 79.

This contact hole can be readily formed by forming a resist pattern on the interlayer insulating film 79 by, e.g., PEP and then etching the interlayer insulating films 75 and 79 by RIE with this resist pattern being used as a mask. After etching, this resist pattern is removed.

Furthermore, for example, a barrier metal layer (for example, a lamination layer of Ti and TiN) 80 is formed on the inner surface of the contact hole by using, e.g., the sputtering method. Subsequently, a metal layer (for example, W) 81 which completely fills the contact hole is formed on the barrier metal layer 80 by, e.g., the sputtering method.

Thereafter, the metal layer 81 is polished by using, e.g., the CMP method, and the metal layer 81 is left only in the contact hole. The metal layer 81 remaining in the contact hole becomes a contact plug. Moreover, a metal layer (for example, Ta) 82 which can be a lower electrode of the second MTJ element is formed on the interlayer insulating film 79 by the sputtering method.

Step for Forming Second MTJ Element and Upper Electrode Thereof

Figure 98:
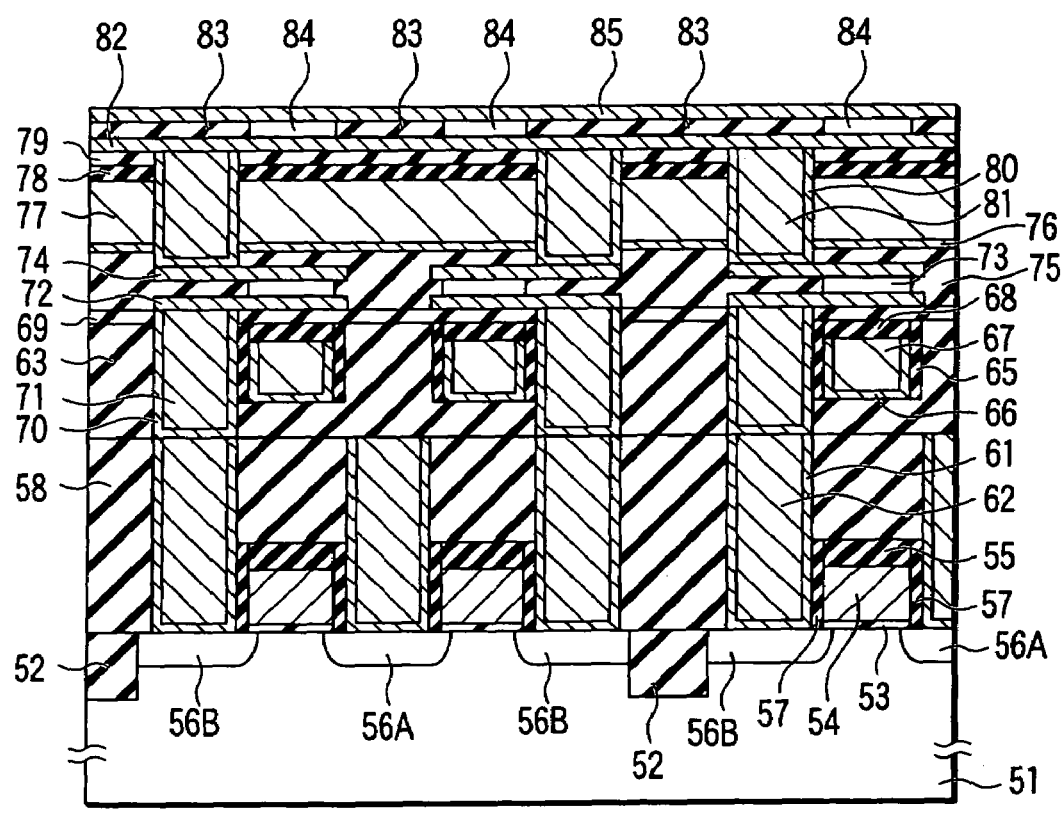
FIG. 98 is a sectional view showing one step of the manufacturing method 1 according to the present invention.

Subsequently, as shown in FIG. 98, a second MTJ element 84 is formed on the metal layer 82. The second MTJ element 84 is constituted by a tunneling barrier, two ferromagnetic layers sandwiching the tunneling barrier therebetween and an anti-ferromagnetic layer, and has, e.g., such a structure as shown in FIG. 58.

An interlayer insulating film (for example, silicon oxide) 83 which completely covers the second MTJ element 84 is formed by using the CVD method. In addition, the interlayer insulating film 83 is polished by, e.g., the CMP method and the interlayer insulating film 83 is left only between the second MTJ elements 84.

Additionally, a metal layer (for example, Ta) 85 which can be an upper electrode of the second MTJ element 84 is formed on the interlayer insulating film 83 by the sputtering method.

Step for Patterning Lower/Upper Electrodes of Second MTJ Elements

Figure 99:
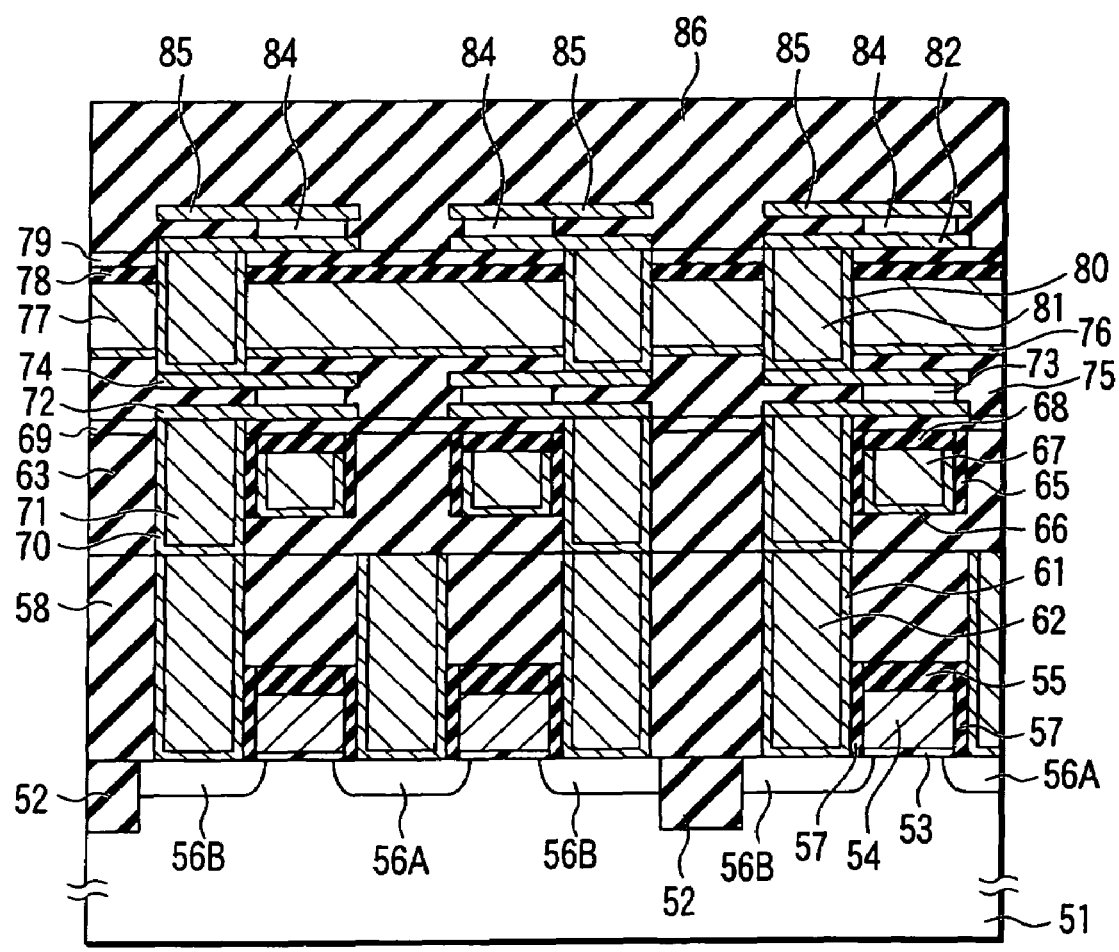
FIG. 99 is a sectional view showing one step of the manufacturing method 1 according to the present invention.

Then, as shown in FIG. 99, the lower electrode 82 and the upper electrode 85 of the second MTJ element 84 are respectively patterned.

The lower/upper electrodes 82 and 85 of the second MTJ element 84 can be readily patterned by forming a resist pattern on the upper electrode 85 by PEP and then etching the lower/upper electrodes 82 and 85 by RIE with this resist pattern being used as a mask. Thereafter, the resist pattern is removed.

An interlayer insulating film 86 which completely covers the upper electrode 85 of the second MTJ element 84 is formed by using the CVD method.

Step for Forming Wiring Groove

Subsequently, as shown in FIG. 100, a wiring groove 87 is formed to the interlayer insulating film 86. In this example, the wiring groove 87 is a groove used for forming the write word line and extends in the X-direction. A side wall spacers (for example, silicon nitride) 88 for enhancing the insulation function is formed on the side surface of the wiring groove 87.

The wiring groove 87 can be readily formed by forming a resist pattern on the interlayer insulating film 86 by, e.g., PEP and then etching the interlayer insulating film 86 by RIE with this resist pattern being used as a mask. After etching, the resist pattern is removed.

The side wall spacers 88 can be readily formed by forming an insulating film (for example, silicon nitride) on the entire interlayer insulating film 86 by the CVD method and then etching the insulating film by RIE.

Step for Forming Fourth Wiring Layer

Figure 101:
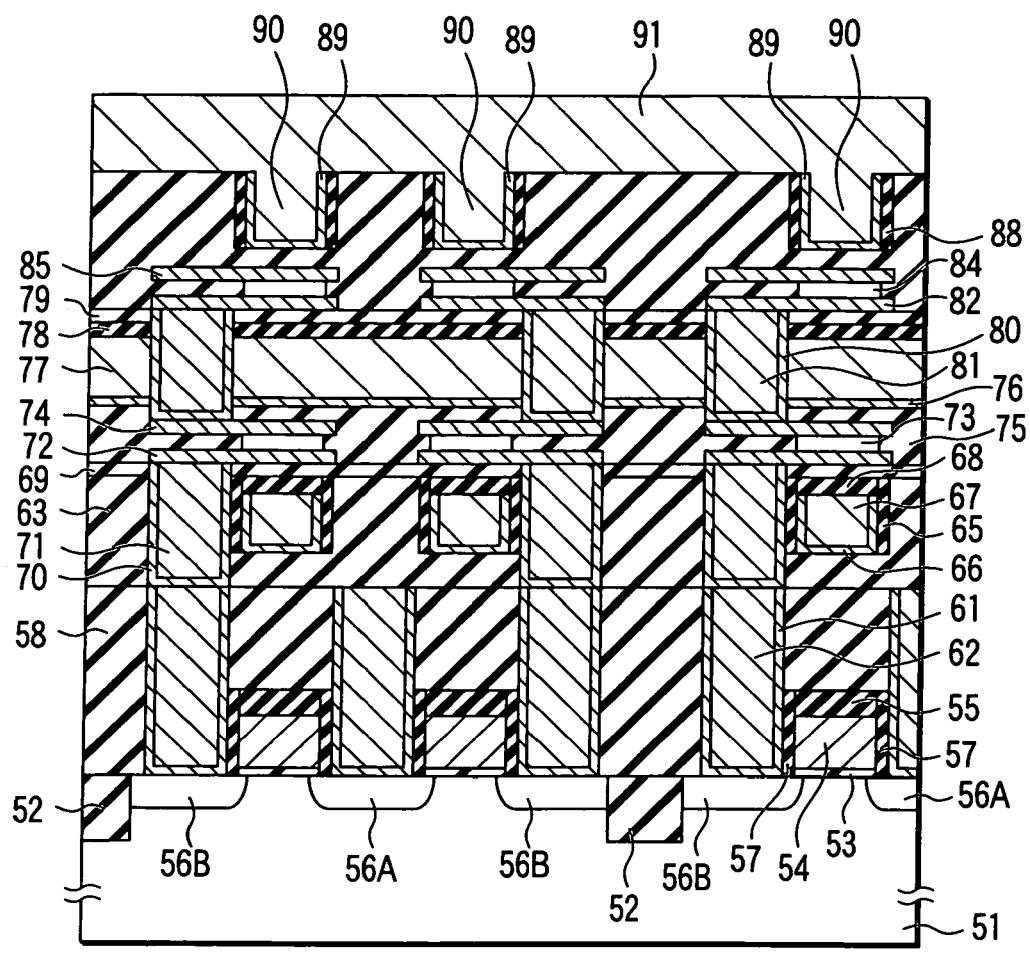
FIG. 101 is a sectional view showing one step of the manufacturing method 1 according to the present invention.

Subsequently, as shown in FIG. 101, a barrier metal layer (for example, a lamination layer of Ta and TaN) 89 is formed on each of the interlayer insulating film 86, the inner surface of the wiring groove 87 and the side wall spacers 88. Then, a metal layer (for example, Cu) 91 which completely fills the wiring groove 87 is formed on the barrier metal layer 89 by, e.g., the sputtering method.

Figure 102:
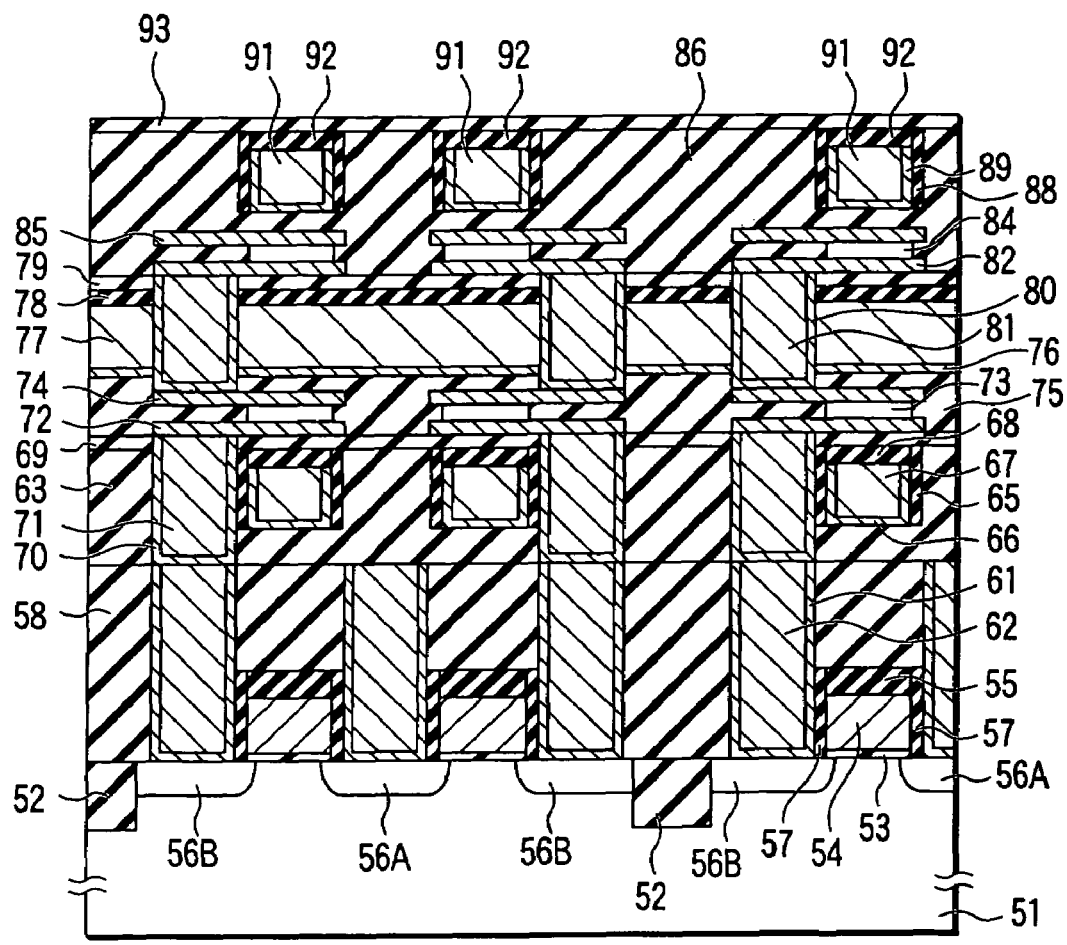
FIG. 102 is a sectional view showing one step of the manufacturing method 1 according to the present invention.

Thereafter, as shown in FIG. 102, the metal layer 91 is polished by using, e.g., the CMP method, and the metal layer 91 is left only in the wiring groove 87. The metal layer 91 remaining in the wiring groove 87 becomes a fourth wiring layer which functions as the write word line.

Moreover, a cap insulator (for example, silicon nitride) 92 is formed on the interlayer insulating film 86 by the CVD method. If needed, the cap insulator 92 is polished by the CMP method, and the cap insulator 92 is left only on the metal layer 91 as the fourth wiring layer. In addition, an interlayer insulating film (for example, silicon oxide) 93 which completely covers the metal layer 91 as the fourth wiring layer is formed on the interlayer insulating film 86.

Step for Forming Lower Electrode of Third MTJ Element

Subsequently, as shown in FIG. 103, a contact hole which reaches the upper electrode 85 of the second MTJ element is formed to the interlayer insulating films 86 and 93.

This contact hole can be readily formed by forming a resist pattern on the interlayer insulating film 93 by, e.g., PEP and etching the interlayer insulating films 86 and 93 by RIE with this resist pattern being used as a mask. After etching, the resist pattern is removed.

In addition, a barrier metal layer (for example, a lamination layer of Ti and TiN) 94 is formed on the inner surface of the contact hole by using, e.g., sputtering method. Then, a metal layer (for example, W) 95 which completely fills the contact hole is formed on the barrier metal layer 94 by, e.g., the sputtering method.

Thereafter, the metal layer 95 is polished by using, e.g., the CMP method, and the metal layer 95 is left only in the contact hole. The metal layer 95 remaining in the contact hole becomes a contact plug. Additionally, a metal layer (for example, Ta) 96 which can be a lower electrode of the third MTJ element is formed on the interlayer insulating film 93 by the sputtering method.

Step for Forming Third MTJ Element and Upper Electrode Thereof

Figure 104:
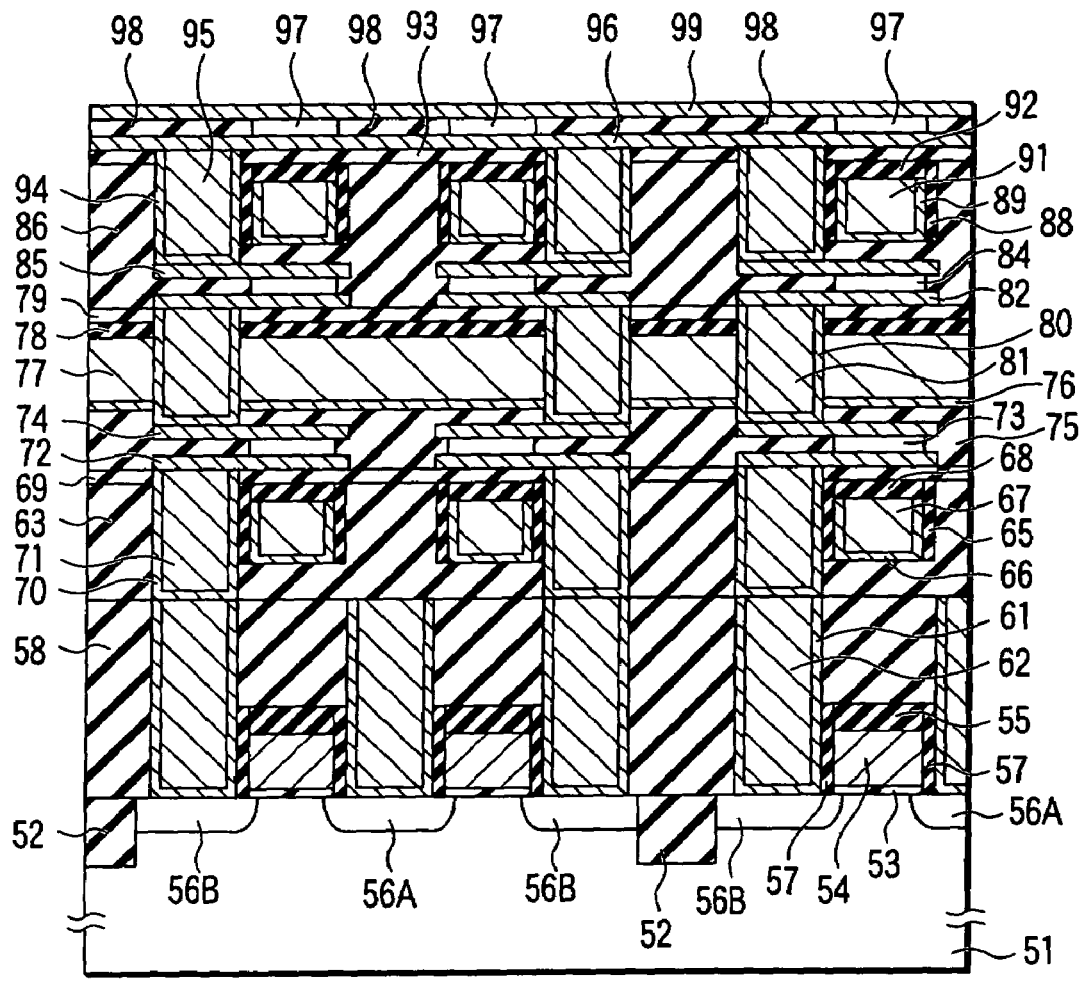
FIG. 104 is a sectional view showing one step of the manufacturing method 1 according to the present invention.

Subsequently, as shown in FIG. 104, a third MTJ element 97 is formed on the metal layer 96. The third MTJ element 97 is constituted by a tunneling barrier, two ferromagnetic layers sandwiching the tunneling barrier therebetween and an anti-ferromagnetic layer, and has, e.g., such a structure as shown in FIG. 59.

An interlayer insulating film (for example, silicon oxide) 98 which completely covers the third MTJ element 97 is formed by the CVD method. Further, the interlayer insulating film 98 is polished by, e.g., the CMP method, and the interlayer insulating film 98 is left only between the third MTJ elements 97.

Furthermore, a metal layer (for example, Ta) 99 which can be an upper electrode of the third MTJ element 97 is formed on the interlayer insulating film 98 by the sputtering method.

Step for Patterning Lower/Upper Electrodes of Third MTJ Elements

Figure 105:
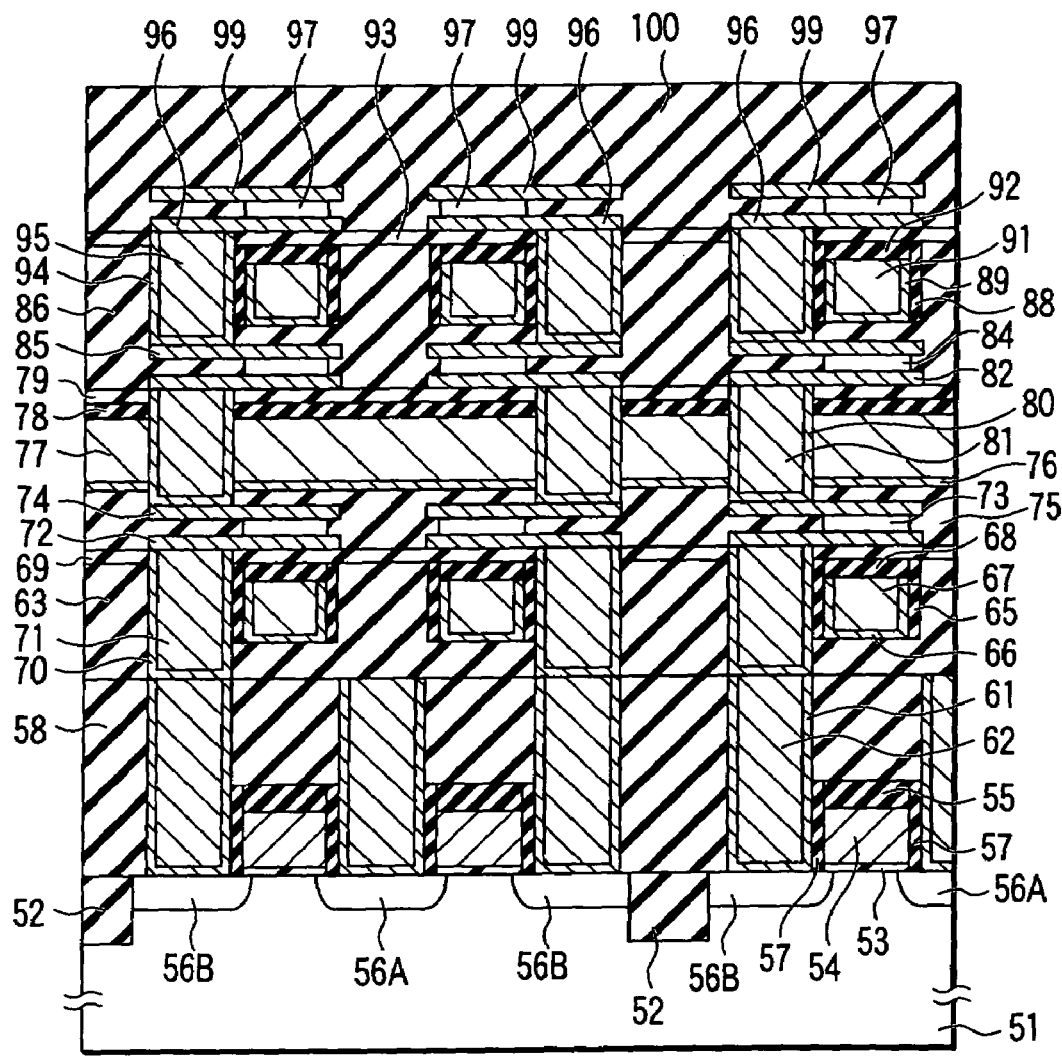
FIG. 105 is a sectional view showing one step of the manufacturing method 1 according to the present invention.

Then, as shown in FIG. 105, the lower electrode 96 and the upper electrode 99 of the third MTJ element 97 are respectively patterned.

The lower/upper electrodes 96 and 99 of the third MTJ element 97 can be readily patterned by forming a resist pattern on the upper electrode 99 by PEP and then etching the lower/upper electrodes 96 and 99 by RIE with this resist pattern being used as a mask. Thereafter, the resist pattern is removed.

An interlayer insulating film 100 which completely covers the upper electrode 99 of the third MTJ element 97 is formed by the CVD method.

Step for Forming Wiring Groove

Figure 106:
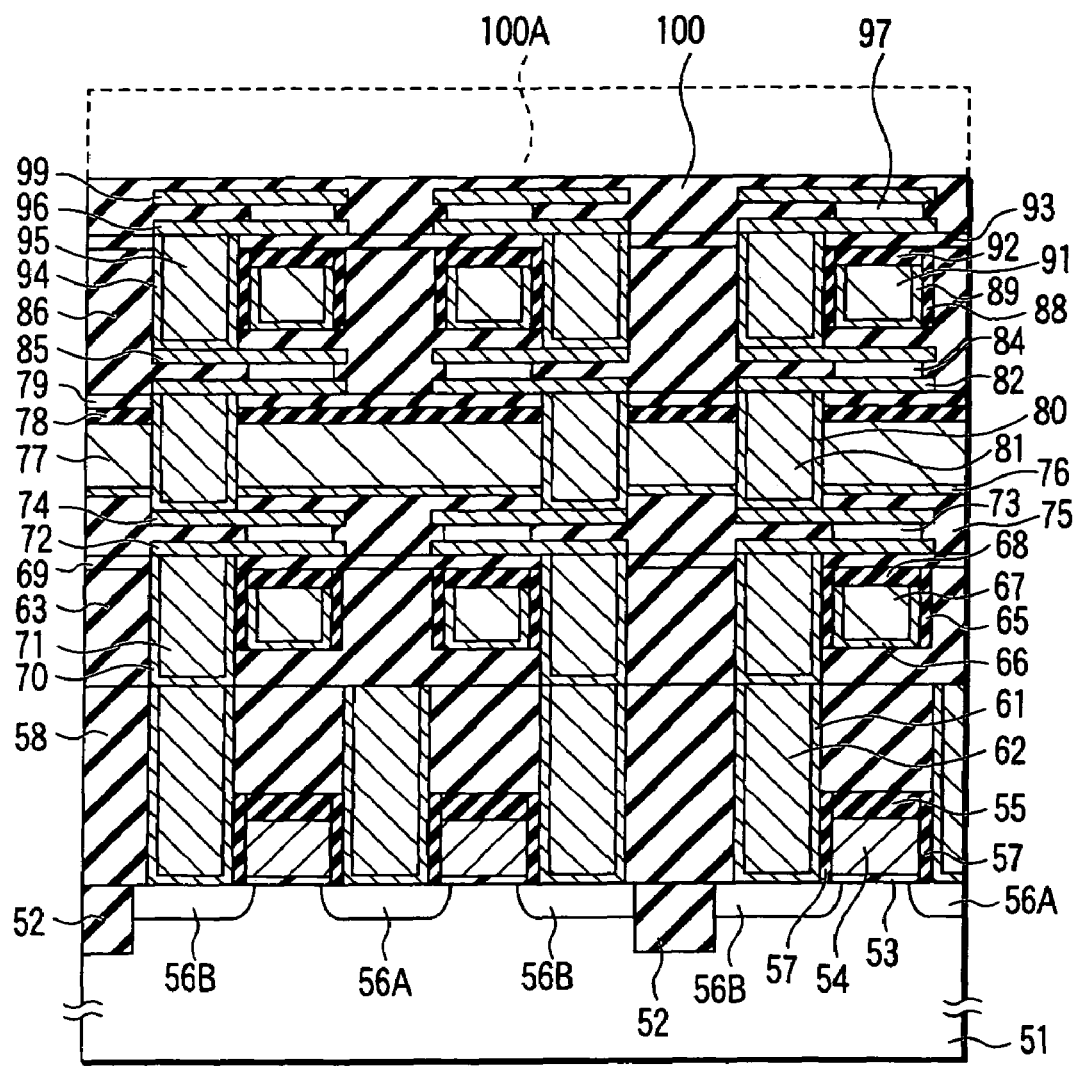
FIG. 106 is a sectional view showing one step of the manufacturing method 1 according to the present invention.

Subsequently, as shown in FIG. 106, a wiring groove 100A is formed to the interlayer insulating film 100. In this example, the wiring groove 100A is a groove used for forming the write bit line and extends in the Y-direction. A side wall spacers (for example, silicon nitride) for enhancing the insulation function is formed on the side surface of the wiring groove 100A.

The wiring groove 100A can be easily formed by forming a resist pattern on the interlayer insulating film 100 and etching the interlayer insulating film 100 by RIE with this resist pattern being used as a mask. After etching, the resist pattern is removed.

The side wall spacers can be easily formed by forming an insulating film (for example, silicon nitride) on the entire interlayer insulating film 100 by the CVD method and then etching the insulating film by RIE.

Step for Forming Fifth Wiring Layer

Subsequently, as shown in FIG. 107, a barrier metal layer (for example, a lamination layer of Ta and TaN) 101 is formed on each of the interlayer insulating film 100, the inner surface of the wiring groove 100A and the side wall insulating film by using, e.g., the sputtering method. Then, a metal layer (for example, Cu) 102 which completely fills the wiring groove 100A is formed on the barrier metal layer 101 by, e.g., the sputtering method.

Figure 108:
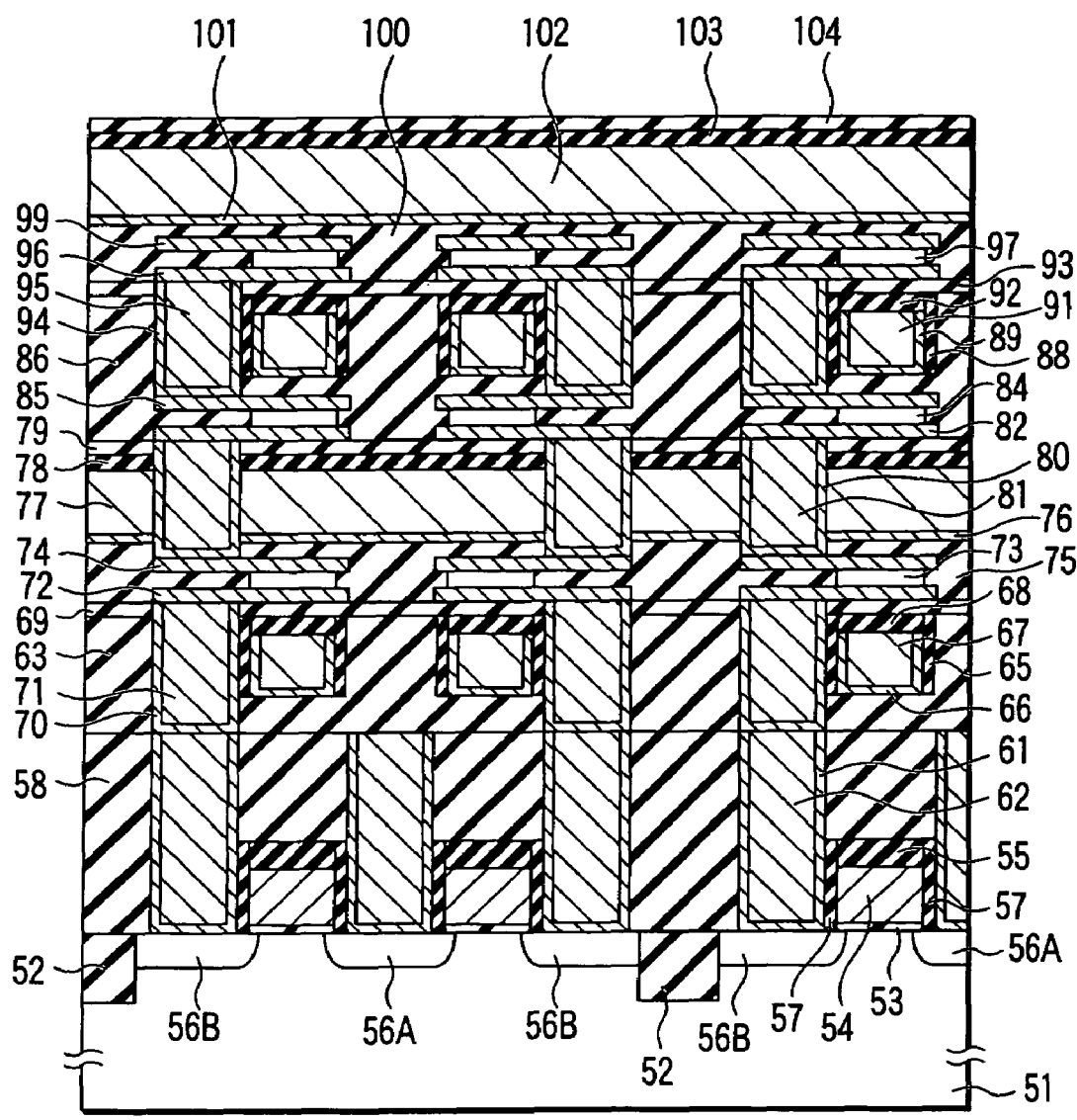
FIG. 108 is a sectional view showing one step of the manufacturing method 1 according to the present invention.

Thereafter, as shown in FIG. 108, the metal layer 102 is polished by using, e.g., the CMP method, and the metal layer 102 is left only in the wiring groove 100A. The metal layer 102 remaining in the wiring groove 100A becomes a fifth wiring layer which functions as the write bit line.

Moreover, a cap insulator (for example, silicon nitride) 103 is formed on the interlayer insulating film 100 by the CVD method. If needed, the cap insulator 103 is polished by the CMP method, and the cap insulator 103 is left only on the metal layer 102 as the fifth wiring layer. Additionally, an interlayer insulating film (for example, silicon oxide) 104 which completely covers the metal layer 102 as the fifth wiring layer is formed on the interlayer insulating film 100.

Step for Forming Lower Electrode of Fourth MTJ Element

Figure 109:
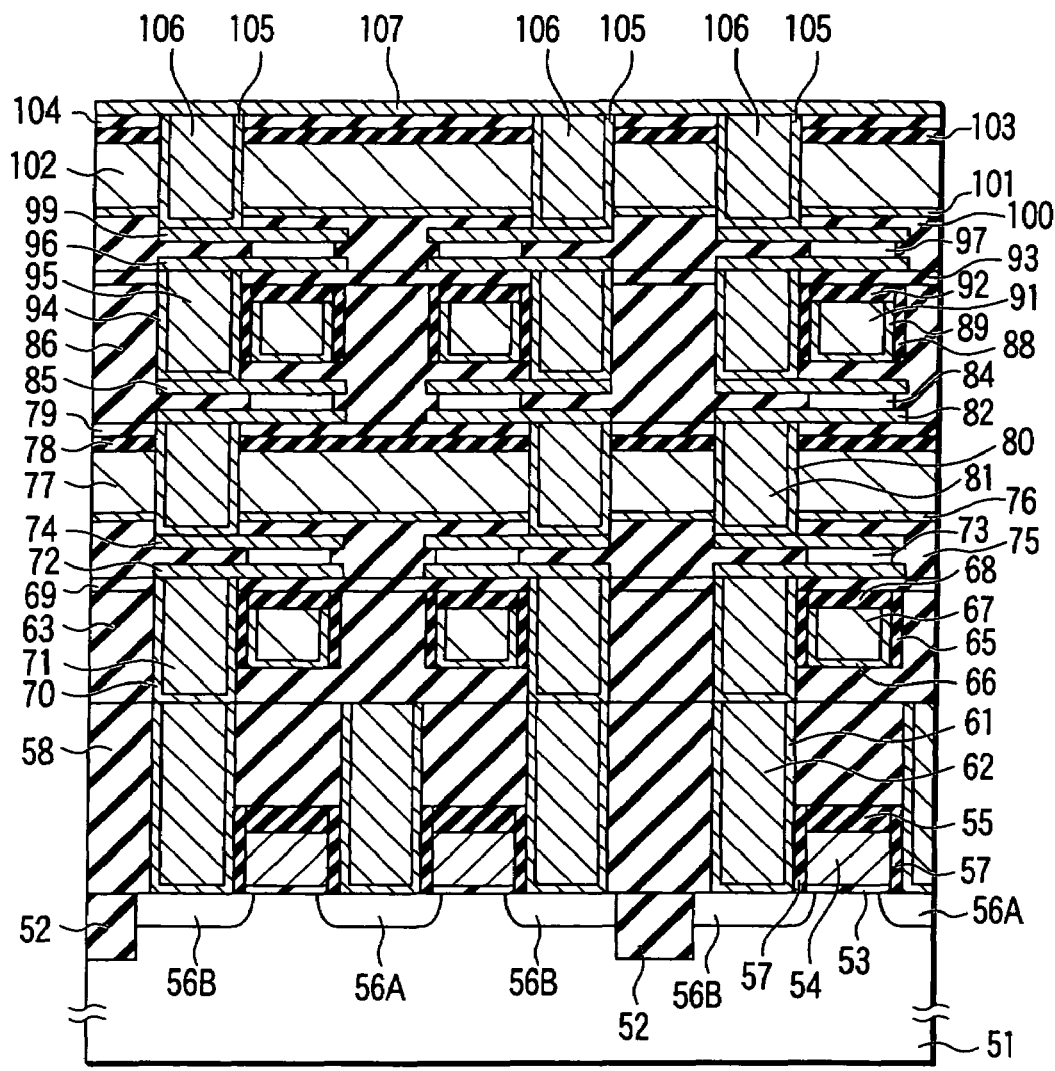
FIG. 109 is a sectional view showing one step of the manufacturing method 1 according to the present invention.

Subsequently, a contact hole which reaches the upper electrode 99 of the third MTJ element is formed to the interlayer insulating films 100 and 104 as shown in FIG. 109.

This contact hole can be readily formed by forming a resist pattern on the interlayer insulating film 104 by, e.g., PEP and etching the interlayer insulating films 100 and 104 by RIE with this resist pattern being used as a mask. After etching, the resist pattern is removed.

In addition, a barrier metal layer (for example, a lamination layer of Ti and TiN) 105 is formed on the inner surface of the contact hole by using, e.g., the sputtering method. Subsequently, a metal layer (for example, W) 106 which completely fills the contact hole is formed on the barrier metal layer 105 by, e.g., the sputtering method.

Then, the metal layer 106 is polished by using, e.g., the CMP method and the metal layer 106 is left only in the contact hole. The metal layer 106 remaining in the contact hole becomes a contact plug. Additionally, a metal layer (for example, Ta) 107 which can be a lower electrode of the fourth MTJ element is formed on the interlayer insulating film 104 by the sputtering method.

Step for Forming Fourth MTJ element and Upper Electrode Thereof

Subsequently, as shown in FIG. 110, a fourth MTJ element 108 is formed on the metal layer 107. The fourth MTJ element 108 is constituted by a tunneling barrier, two ferromagnetic layers sandwiching the tunneling barrier therebetween and an anti-ferromagnetic layer, and has, e.g., such a structure as shown in FIG. 60.

An interlayer insulating film (for example, silicon oxide) 109 which completely covers the fourth MTJ element 108 is formed by using the CVD method. Further, the interlayer insulating film 109 is polished by, e.g., the CMP method, and the interlayer insulating film 109 is left only between the fourth MTJ elements 108.

Furthermore, a metal layer (for example, Ta) 110 which can be an upper electrode of the fourth MTJ element 108 is formed on the interlayer insulating film 109 by the sputtering method.

Step for Patterning Lower/Upper Electrodes of Fourth MTJ Element

Figure 111:
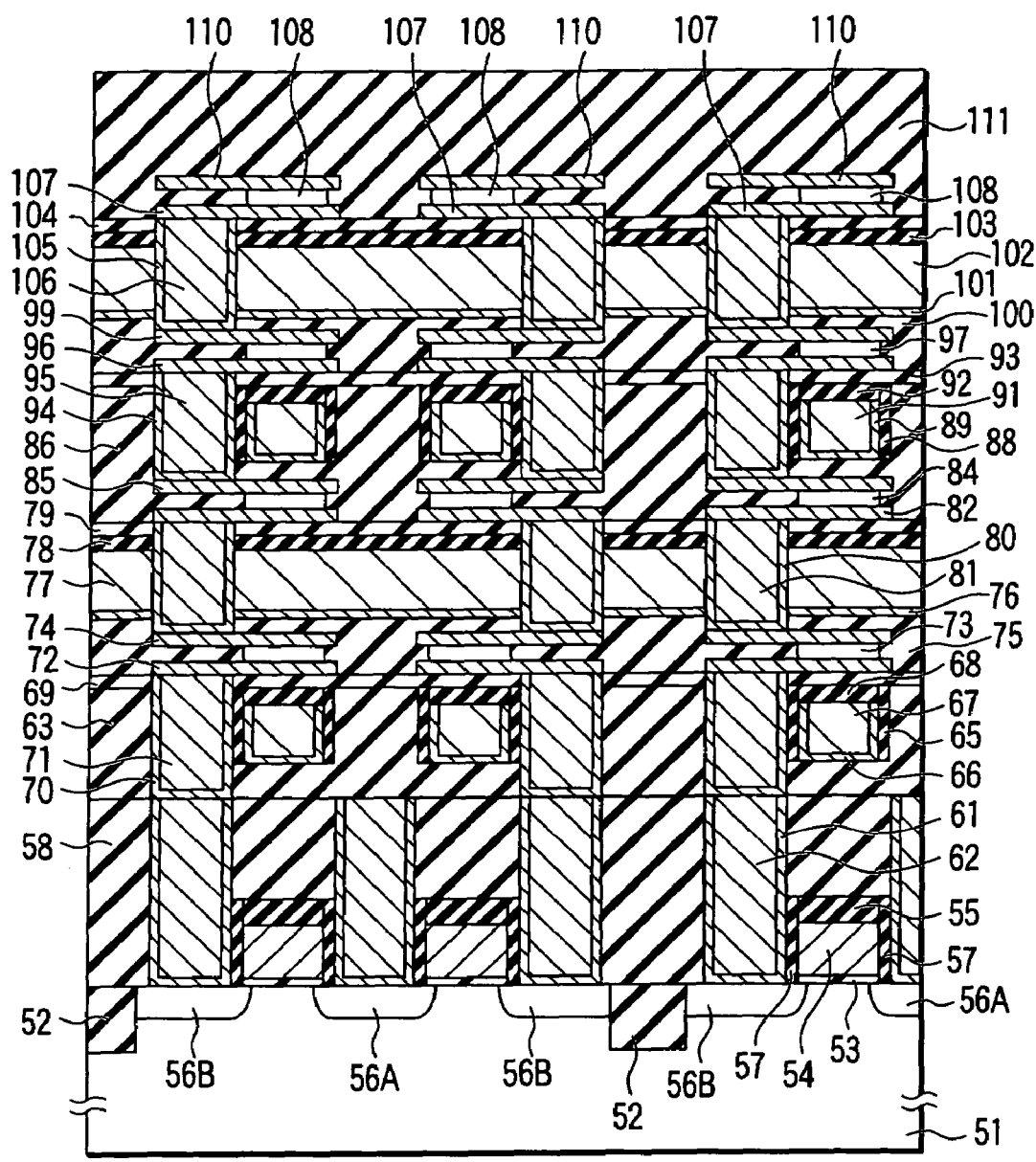
FIG. 111 is a sectional view showing one step of the manufacturing method 1 according to the present invention.

Then, as shown in FIG. 111, the lower electrode 107 and the upper electrode 110 of the fourth MTJ element 108 are respectively patterned.

The lower/upper electrodes 107 and 110 of the fourth MTJ element 108 can be readily patterned by forming a resist pattern on the upper electrode 110 by PEP and then etching the lower/upper electrodes 107 and 110 by RIE with this resist pattern being used as a mask. Thereafter, the resist pattern is removed.

An interlayer insulating film 111 which completely covers the upper electrode 110 of the fourth MTJ element 108 is formed by using the CVD method.

Step for Forming Wiring Groove

Figure 112:
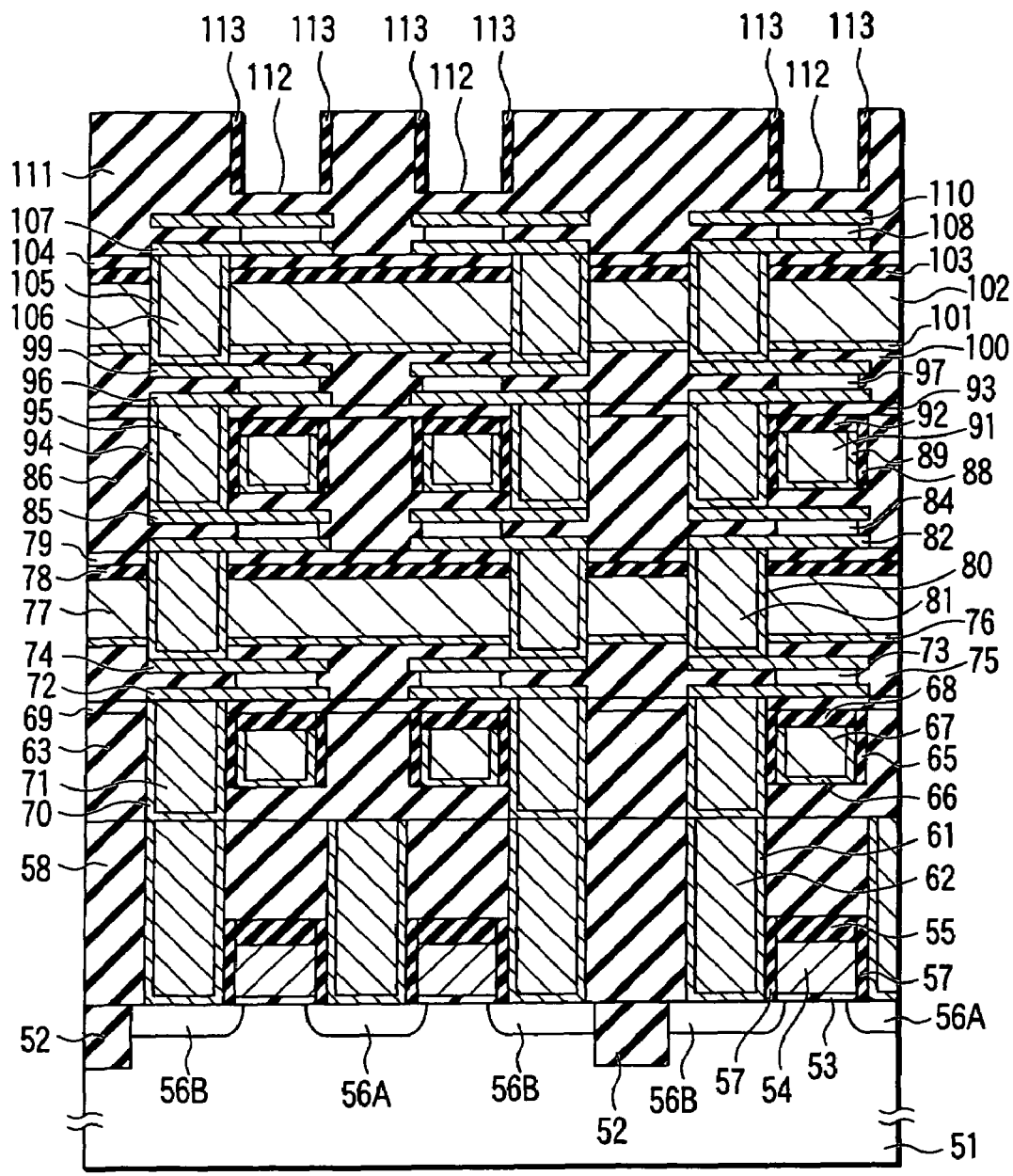
FIG. 112 is a sectional view showing one step of the manufacturing method 1 according to the present invention.

Then, as shown in FIG. 112, a wiring groove 112 is formed to an interlayer insulating film 111. The wiring groove 112 is a groove used for forming the write word line and extends in the X-direction. A side wall spacers (for example, silicon nitride) 113 for enhancing the insulation function is formed on the side surface of the wiring groove 112.

The wiring groove 112 can be easily formed by forming a resist pattern on the interlayer insulating film 111 by, e.g., PEP and etching the interlayer insulating film 111 by RIE with this resist pattern being used as a mask. After etching, the resist pattern is removed.

The side wall insulation layer 113 can be easily formed by forming an insulating film (for example, silicon nitride) on the entire interlayer insulating film 111 by the CVD method and then etching the insulating film by RIE.

Step for Forming Sixth Wiring Layer

Figure 113:
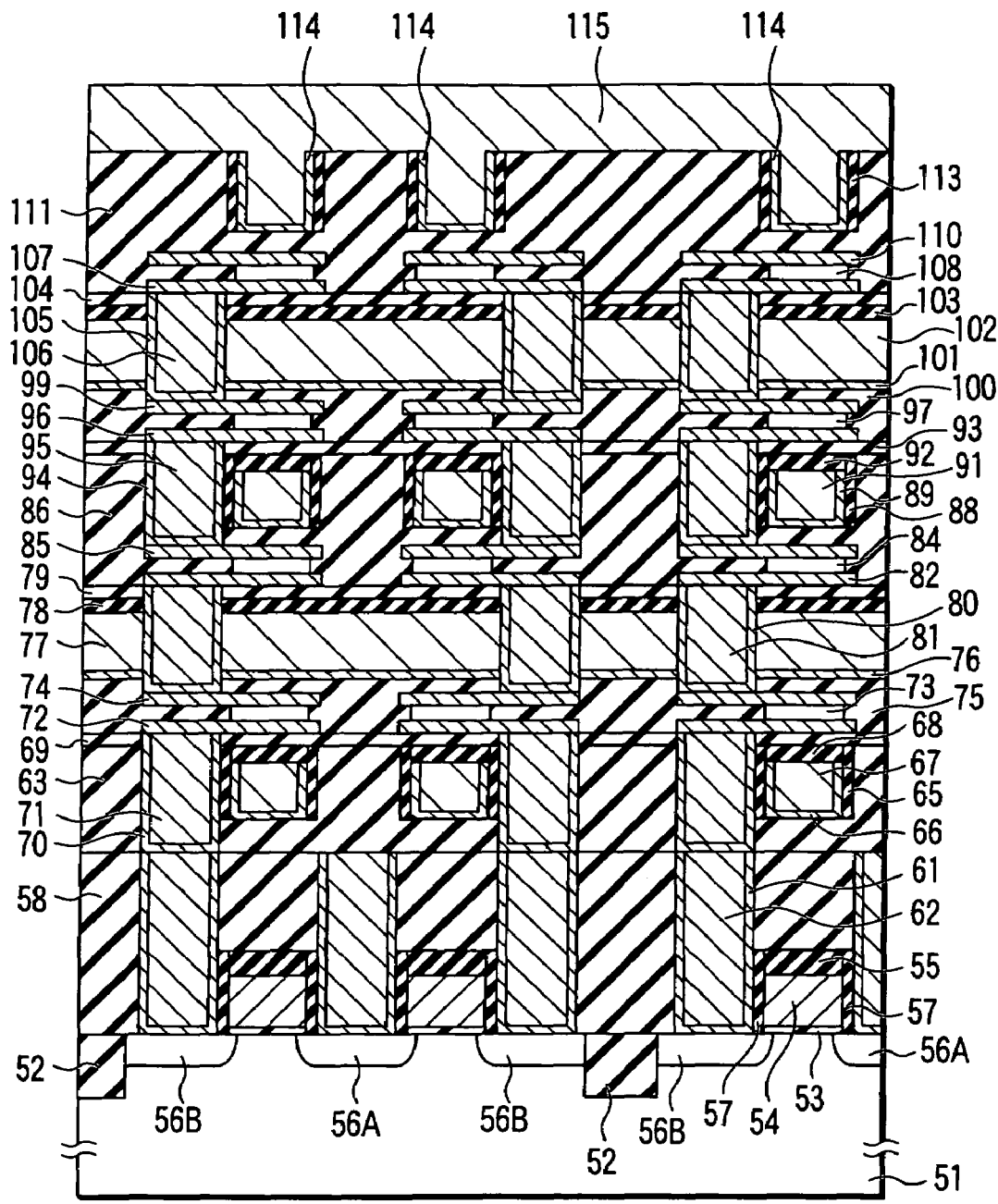
FIG. 113 is a sectional view showing one step of the manufacturing method 1 according to the present invention.

Then, as shown in FIG. 113, a barrier metal layer (for example, a lamination layer of Ta and TaN) 114 is formed on each of the interlayer insulating film 11, the inner surface of the wiring groove 112 and the side wall spacers 113 by using, e.g., the sputtering method. Subsequently, a metal layer (for example, Cu) 115 which completely fills the wiring groove 112 is formed on the barrier metal layer 114 by, e.g., the sputtering method.

Thereafter, as shown in FIG. 114, the metal layer 115 is polished by using, e.g., the CMP method, and the metal layer 115 is left only in the wiring groove 112. The metal layer 115 remaining in the wiring groove 112 becomes a sixth wiring layer which functions as the write word line.

Moreover, a cap insulator (for example, silicon nitride) 116 is formed on the interlayer insulating film 111 by the CVD method. If needed, the cap insulator 116 is polished by the CMP method, and the cap insulator 116 is left only on the metal layer 115 as the sixth wiring layer. In addition, an interlayer insulating film (for example, silicon oxide) 117 which completely covers the metal layer 115 as the sixth wiring layer is formed on the interlayer insulating film 111.

Step for Forming Seventh Wiring Layer

Subsequently, as shown in FIG. 115, a contact hole which reaches an upper electrode 110 of the fourth MTJ element is formed to the interlayer insulation films 111 and 117.

This contact hole can be readily formed by forming a resist pattern on the interlayer insulating film 117 by, e.g., PEP and etching the interlayer insulating films 111 and 117 by RIE with this resist pattern being used as a mask. After etching, the resist pattern is removed.

Additionally, a wiring groove used for forming the read bit line is formed to the interlayer insulating film 117.

This wiring groove can be easily formed by forming a resist pattern on the interlayer insulating film 117 by, e.g., PEP and etching the interlayer insulating film 117 by RIE with this resist pattern being used as a mask. After etching, the resist pattern is removed.

Thereafter, a barrier metal layer (for example, a lamination layer of Ti and TiN) 118 is formed on each of the interlayer insulating film 117, the inner surface of the contact hole and the inner surface of the wiring groove. Subsequently, a metal layer (for example, W) 119 which completely fills the contact hole and the wiring groove is formed on the barrier metal layer 118 by, e.g., the sputtering method.

Further, the metal layer 119 and the barrier metal layer 117 are polished by, e.g., the CMP method, and the metal layer 119 and the barrier metal layer 117 are left only in the contact hole and the wiring groove. The metal layer 119 remaining in the contact hole becomes a contact plug. Furthermore, the metal layer 119 remaining in the wiring groove becomes a seventh wiring layer which functions as the read bit line.

③ Overview

According to this manufacturing method 1, it is possible to realize the cell array structure (one-transistor and N-MTJ structure) in which a plurality of TMR elements are superposed in a plurality of stages and a plurality of these TMR elements are connected to each other in series between the read bit line and the ground terminal.

Incidentally, in this example, although the damascene process and the dual damascene process are adopted in order to form the wiring layer, a process which forms the wiring layer by etching may be adopted instead, for example.

(2) Manufacturing Method 2

This manufacturing method 2 is applied to a magnetic random access memory having a cell array structure (one-switch and N-MTJ structure) in which a plurality of TMR elements are superposed in a plurality of stages and a plurality of these TMR elements are connected to each other in parallel between the read bit line and the ground terminal.

The cell array structure completed by the manufacturing method according to the present invention will be first briefly explained. The method for manufacturing the cell array structure will be then described.

① Cell Array Structure Concerning Manufacturing Method 2

Figure 116:
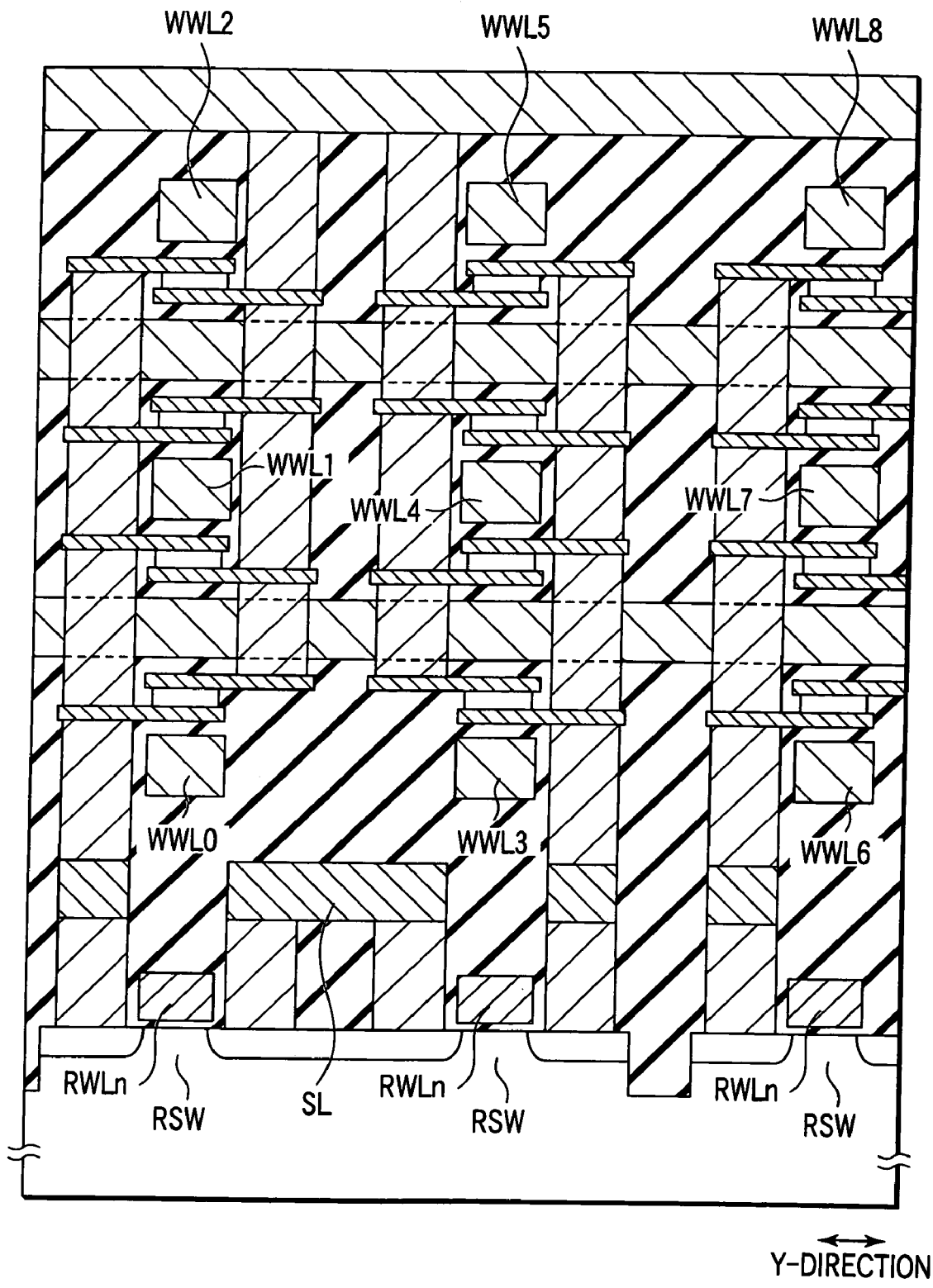
FIG. 116 is a view showing a device structure to which a manufacturing method 2 according to the present invention is applied.

FIG. 116 shows an example of the cell array structure of the magnetic random access memory in which one block is constituted by a plurality of TMR elements connected to each other in parallel.

A characteristic of this cell array structure lies in that one read bit line is arranged in one column (Y-direction) and a plurality of TMR elements connected to each other in parallel are arranged directly below this read bit line. A plurality of the TMR elements constitute one read block and are connected between the read bit line and the ground terminal.

Read selection switches (MOS transistor) RSW are arranged in a surface area of the semiconductor substrate. A source of the read selection switch RSW is connected to the ground terminal through a source line SL. The source line SL is shared by two read blocks adjacent to each other in the column direction. The source line SL extends straightway in, e.g., the X-direction (direction vertical to the page space).

A gate of the read selection switch (MOS transistor) RSW is a read word line RWLn. The read word line RWLn extends in the X-direction. Four TMR elements (MTJ (Magnetic Tunnel Junction) elements) are superposed on each read selection switch RSW.

Each of the respective TMR elements is arranged between the lower electrode and the upper electrode and these TMR elements are connected to each other by a contact plug. The lower electrode of the TMR element on the lowermost stage is connected to a drain of the read selection switch (MOS transistor) RSW. The upper electrode of the TMR element on the uppermost stage is connected to a read bit line BL0 extending in the Y-direction by the contact plug.

Three write word lines WWL0, WWL1 and WWL2 extending in the X-direction exist in one row, and two write bit lines BL00 and BL01 extending in the Y-direction exist in one column.

When the cell array structure is seen from the above of the semiconductor substrate, a plurality of the superposed TMR elements are laid out so as to overlap each other, for example. Moreover, the three write word lines are also laid out so as to overlap each other. In addition, the read bit line and the two write bit lines are also laid out so as to overlap each other.

The contact plug used for connecting a plurality of the TMR elements to each other in series is laid out at a position such that it does not overlap the write word lines or the write bit lines. The upper electrode and the lower electrode of the TMR element are formed with a pattern facilitating contact with the contact plug.

② Each Step of Manufacturing Method 2

Description will now be given as to the manufacturing method for realizing the cell array structure shown in FIG. 116. Here, since the embodied manufacturing method (for example, adoption of the dual damascene process) will be explained, it should be noted that elements which do not exist in the cell array structure shown in FIG. 116 are also described. However, the outline of the finally completed cell array structure is substantially the same as the cell array structure illustrated in FIG. 116.

Element Separation Step

Figure 117:
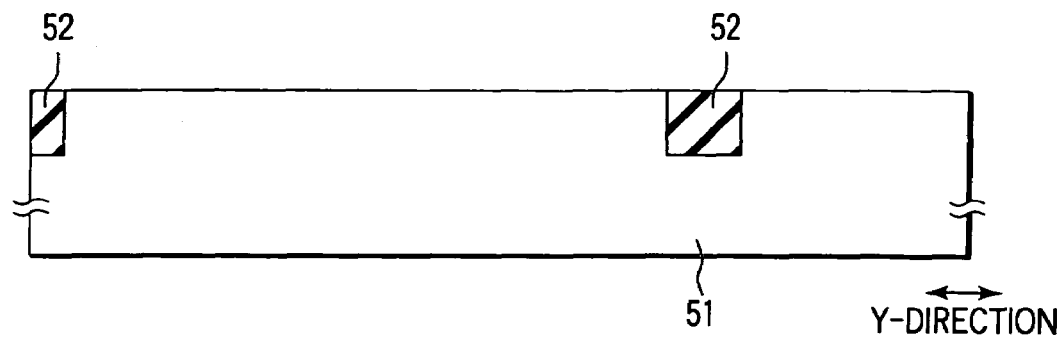
FIG. 117 is a sectional view showing one step of the manufacturing method 2 according to the present invention.

As shown in FIG. 117, the STI (Shallow Trench Isolation) structure 52 which is the shallow trenches are filled by filed oxide for isolating active areas is formed in the semiconductor substrate 51.

The STI structure 52 can be formed by the following process, for example.

A mask pattern (for example, silicon nitride) is formed on the semiconductor substrate 51 by PEP (Photo Engraving Process). The semiconductor substrate 51 is etched by using RIE (Reactive Ion Etching) with this mask pattern being utilized as a mask and a trench is formed on the semiconductor substrate 51. These trenches are filled by insulating films (for example, silicon oxide) by using, e.g., the CVD (Chemical Vapor Deposition) method and the CMP (Chemical Mechanical Polishing) method.

Thereafter, P type impurities (for example, B or $BF_2$) or N type impurities (for example, A or As) are injected into the semiconductor substrate by, e.g., ion implantation if necessary, and a P type well region or an N type well region is formed.

Step for Forming MOSFET

Figure 118:
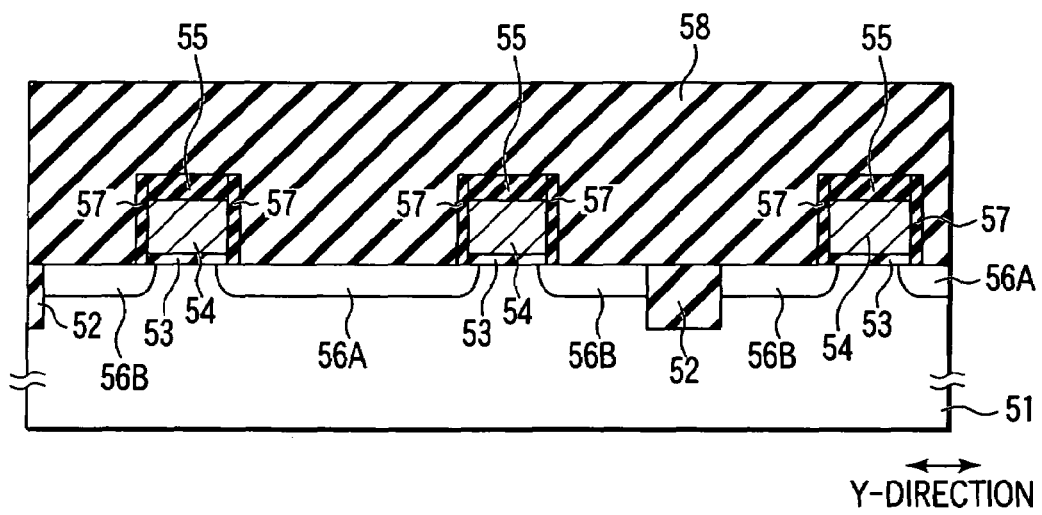
FIG. 118 is a sectional view showing one step of the manufacturing method 2 according to the present invention.

Subsequently, as shown in FIG. 118, a MOS transistor which functions as a read selection switch is formed in a surface area of the semiconductor substrate 51.

The MOS transistor can be formed by the following process, for example.

Impurities for controlling a threshold value of the MOS transistor are ion-implanted into necessitate channel portions in active areas surrounding by field oxides 52. A gate insulating film (for example, silicon oxide) 53 is formed in the active regions by thermal oxidation. A gate electrode material (for example, poly-silicon including impurities) and a cap insulating film (for example, silicon nitride) 55 are formed on the gate insulating film 53 by the CVD method.

After patterning the cap insulating film 55 by PEP, the gate electrode material and the gate insulating film 53 are processed (etched) by RIE with the cap insulating film 55 being used as a mask. As a result, a gate electrode 54 extending in the X-direction is formed on the semiconductor substrate 51.

P-type impurities or N-type impurities are injected into the semiconductor substrate by ion implantation with the cap insulating film 55 and the gate electrode 54 being used as a mask. Then, low concentration impurity regions (LDD regions or extension regions) are formed in the semiconductor substrate.

After forming the insulating film (for example, silicon nitride) on the entire semiconductor substrate 51 by the CVD method, the insulating film is etched by RIE and a side wall spacers 57 is formed on the side wall of the gate electrode 54 and the cap insulating film 55. The cap insulating film 55, the gate electrode 54 and the side wall spacers 57 are used as a mask, and the P type impurities or the N type impurities are injected into the semiconductor substrate 51 by using the ion implantation. As a result, a source region 56A and a drain region 56B are formed in the semiconductor substrate 51.

Thereafter, an interlayer insulating film (for example, silicon oxide) 58 which completely covers the MOS transistor is formed on the entire semiconductor substrate 51 by the CVD method. Further, the surface of the interlayer insulating film 58 is made flat by utilizing the CMP technique.

Step for Forming Contact Hole

Figure 119:
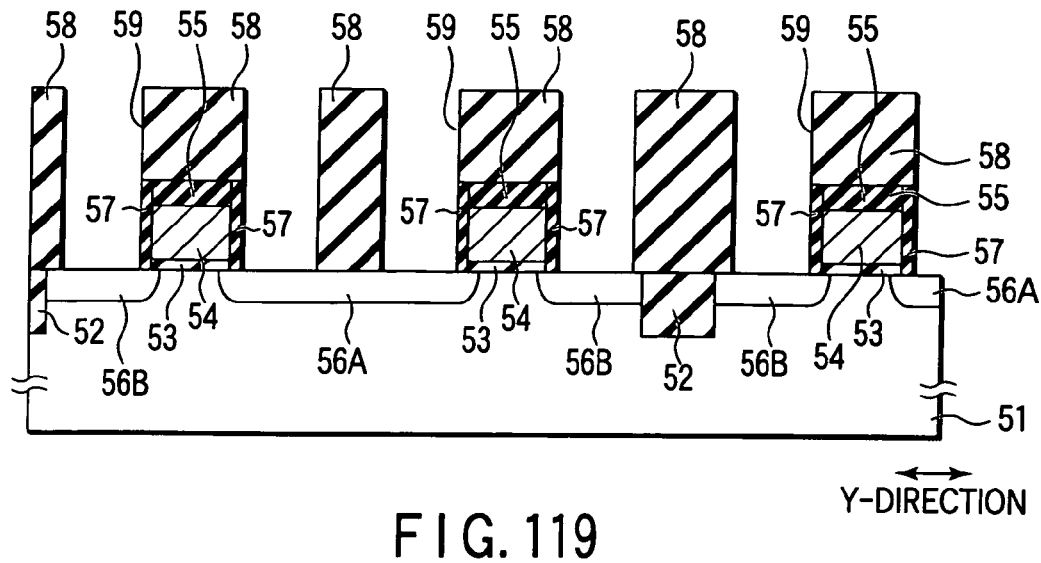
FIG. 119 is a sectional view showing one step of the manufacturing method 2 according to the present invention.

Subsequently, as shown in FIG. 119, a contact hole 59 which reaches the source region 56A and the drain region 56B of the MOS transistor is formed to the interlayer insulating film 58 on the semiconductor substrate 51.

The contact hole 59 can be readily formed by, e.g., forming a resist pattern on the interlayer insulating film 58 by PEP and etching the interlayer insulating film 58 by RIE with the resist pattern being used as a mask. After etching, the resist pattern is removed.

Step for Forming Wiring Groove

Figure 120:
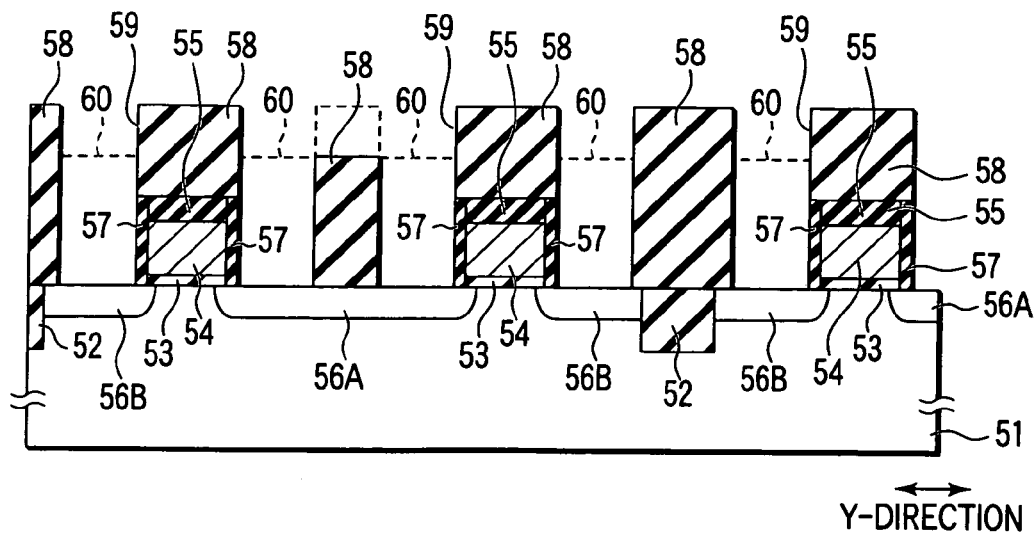
FIG. 120 is a sectional view showing one step of the manufacturing method 2 according to the present invention.

Then, as shown in FIG. 120, a wiring groove 60 is formed to the interlayer insulating film 58 on the semiconductor substrate 51. In this example, since the wiring groove 60 extends in the X-direction, the wiring groove 60 overlaps the contact hole 59 when seen from the cross section along the Y-direction. Thus, in this drawing, the wiring groove 60 is indicated by a broken line.

The wiring groove 60 can be easily formed by forming a resist pattern on the interlayer insulating film 58 by, e.g., PEP and etching the interlayer insulating film 58 by RIE with this resist pattern being used as a mask. After etching, the resist pattern is removed.

Step for Forming First Wiring Layer

Subsequently, as shown in FIG. 121, a barrier metal layer (for example, a lamination layer of Ti and TiN) 61 is formed on each of the interlayer insulating film 58, the inner surface of the contact hole 59 and the inner surface of the wiring groove 60 by using, e.g., the sputtering method. Then, a metal layer (for example, W) 62 which completely fills the contact hole 59 and the wiring groove 60 is formed on the barrier metal layer 61 by, e.g., the sputtering method.

Thereafter, as shown in FIG. 122, the metal layer 62 is polished by using, e.g., the CMP method, and the metal layer 62 is left only in the contact hole 59 and the wiring groove 60. The metal layer 62 remaining in the contact hole 59 becomes a contact plug, and the metal layer 62 remaining in the wiring groove 60 becomes a first wiring layer. Further, an interlayer insulating film (for example, silicon oxide) 63 is formed on the interlayer insulating film 58 by the CVD method.

It is to be noted that the steps consisting of the step for forming the contact hole, the step for forming the wiring groove and the step for forming the first wiring layer are called a dual damascene process.

Step for Forming Wiring Groove

Subsequently, as shown in FIG. 123, a wiring groove 64 is formed to the interlayer insulating film 63. In this example, the wiring groove 64 is a groove used for forming the write word line and extends in the X-direction. A side wall spacers (for example, silicon nitride) 65 for enhancing the insulation function is formed on the side surface of the wiring groove 64.

The wiring groove 64 can be readily formed by forming a resist pattern on the interlayer insulating film 63 and etching the interlayer insulating film 63 by RIE with this resist pattern being used as a mask. After etching, the resist pattern is removed.

The side wall spacers 65 can be easily formed by forming an insulating film (for example, silicon nitride) on the entire interlayer insulating film 63 by the CVD method and then etching that insulating film by RIE.

Step for Forming Second Wiring Layer

Subsequently, as shown in FIG. 124, a barrier metal layer (for example, a lamination layer of Ta and TaN) 66 is formed on each of the interlayer insulating film 63, the inner surface of the wiring groove 64 and the side wall spacers 65 by using, e.g., the sputtering method. Then, a metal layer (for example, Cu) 67 which completely fills the wiring groove 64 is formed on the barrier metal layer 66 by, e.g., the sputtering method.

Figure 125:
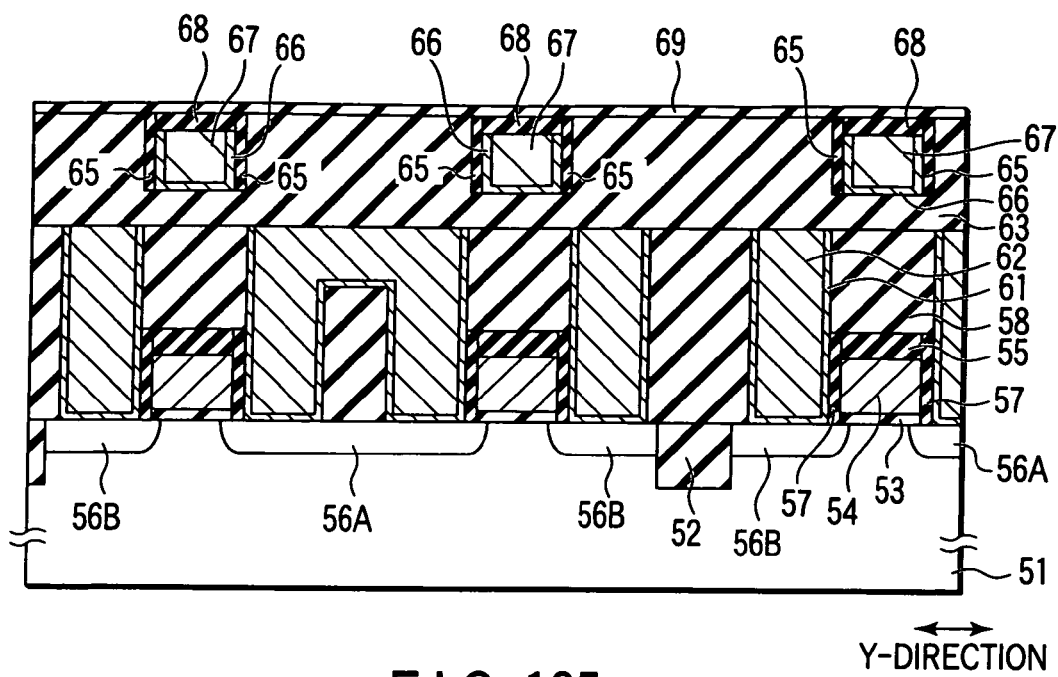
FIG. 125 is a sectional view showing one step of the manufacturing method 2 according to the present invention.

Thereafter, as shown in FIG. 125, the metal layer 67 is polished by using, e.g., the CMP method, and the metal layer 67 is left only in the wiring groove 64. The metal layer 67 remaining in the wiring groove 64 becomes a second wiring layer which functions as the write word line.

Furthermore, a cap insulator (for example, silicon nitride) 68 is formed on the interlayer insulating film 63 by the CVD method. Moreover, the cap insulator 68 is polished by the CMP method, and the cap insulator 68 is left only on the metal layer 67 as the second wiring layer. In addition, an interlayer insulating film (for example, silicon oxide) 69 which completely covers the metal layer 67 as the second wiring layer is formed on the interlayer insulating film 63.

It is to be noted that the steps consisting of the step for forming the wiring groove and the step for forming the second wiring groove are called a damascene process.

Step for Forming Lower Electrode of First MTJ Element

Figure 126:
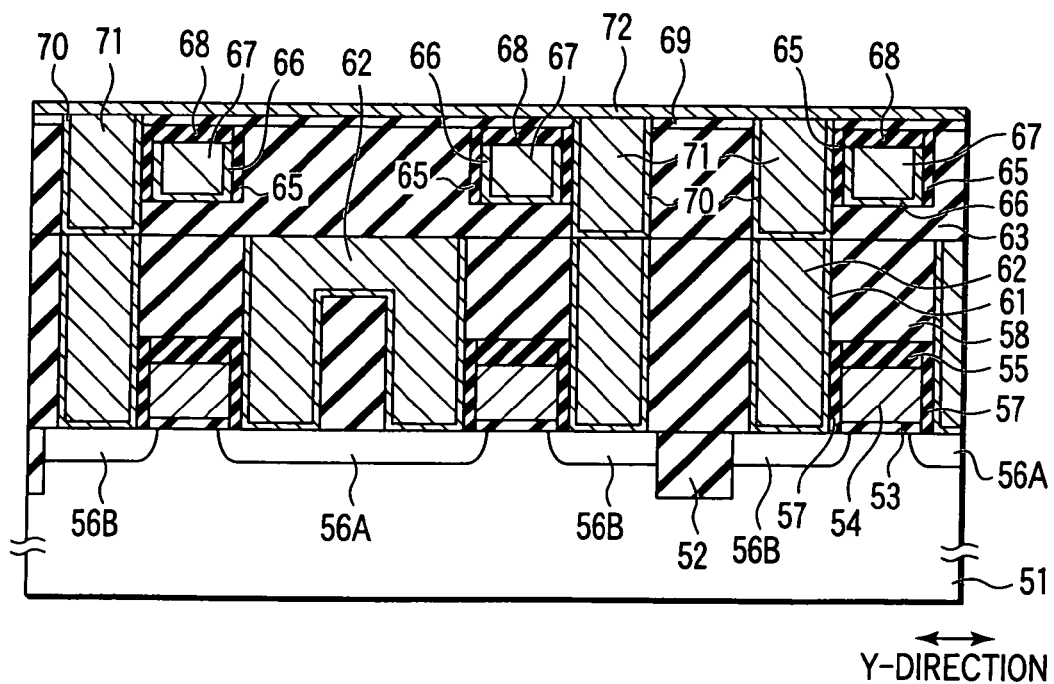
FIG. 126 is a sectional view showing one step of the manufacturing method 2 according to the present invention.

Subsequently, as shown in FIG. 126, a contact hole which reaches the metal layer 62 as the first wiring layer is formed to the interlayer insulating film 69.

This contact hole can be readily formed by forming a resist pattern on the interlayer insulating film 69 by, e.g., PEP and etching the interlayer insulating films 63 and 69 by RIE with this resist pattern being used as a mask. After etching, the resist pattern is removed.

Additionally, a barrier metal layer (for example, a lamination layer of Ti and TiN) 70 is formed on the inner surface of the contact hole by using, e.g., the sputtering method. Subsequently, a metal layer (for example, W) 71 which completely fills the contact hole is formed on the barrier metal layer 70 by, e.g., the sputtering method.

Thereafter, the metal layer 71 is polished by using, e.g., the CMP method and the metal layer 71 is left in the contact hole. The metal layer 71 remaining in the contact hole becomes a contact plug. Further, a metal layer 72 which becomes a lower electrode of the first MTJ element is formed on the interlayer insulating film 69 by the sputtering method.

Step for Forming First MTJ Element and Upper Electrode Thereof

Figure 127:
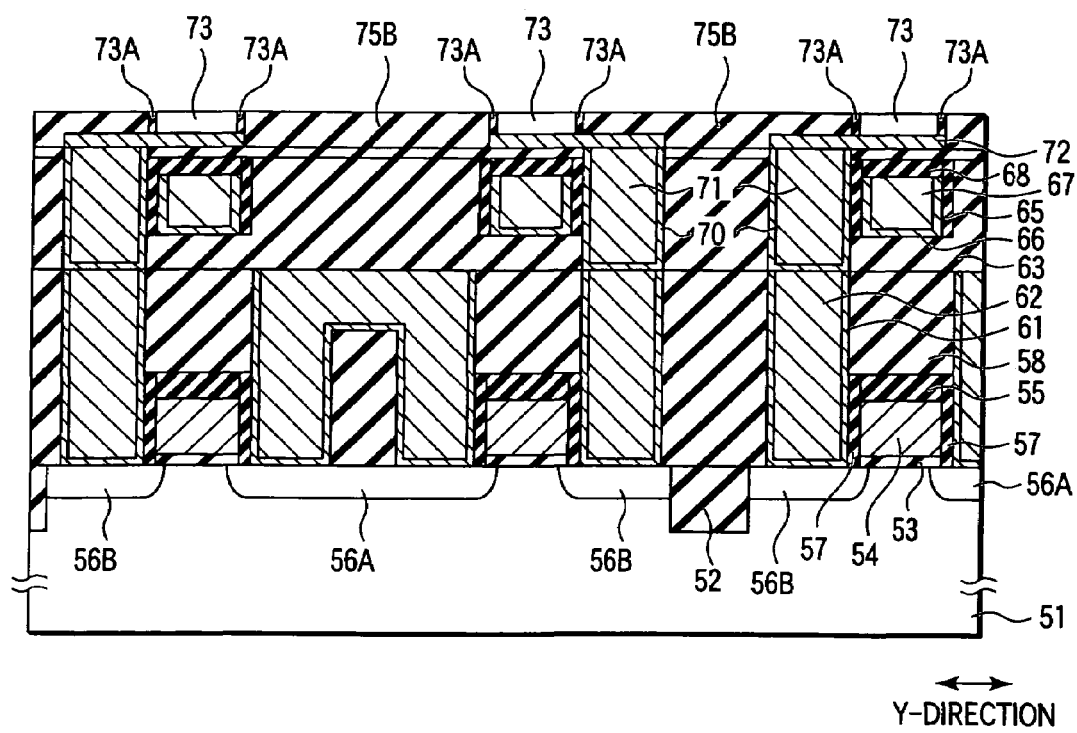
FIG. 127 is a sectional view showing one step of the manufacturing method 2 according to the present invention.

Then, as shown in FIG. 127, a first MTJ element 73 is formed on the metal layer 72. The first MTJ element 73 is constituted by a tunneling barrier, two ferromagnetic layers sandwiching the tunneling barrier therebetween and an anti-ferromagnetic layer, and has, e.g., such a structure as shown in FIG. 57.

Furthermore, in this example, a protection side wall spacers (for example, silicon oxide) 73A which protects the first MTJ element 73 is formed on the side surface of the first MTJ element 73. This protection side wall spacers 73A can be easily formed on the side surface of the first MTJ element 73 by using the CVD method and the RIE method.

An interlayer insulating film (for example, silicon oxide) 75B which completely covers the first MTJ element 73 is formed by using the CVD method. Moreover, the interlayer insulating film 75B is polished by, e.g., the CMP method, and the interlayer insulating film 75B is left only between the first MTJ elements 73.

Figure 128:
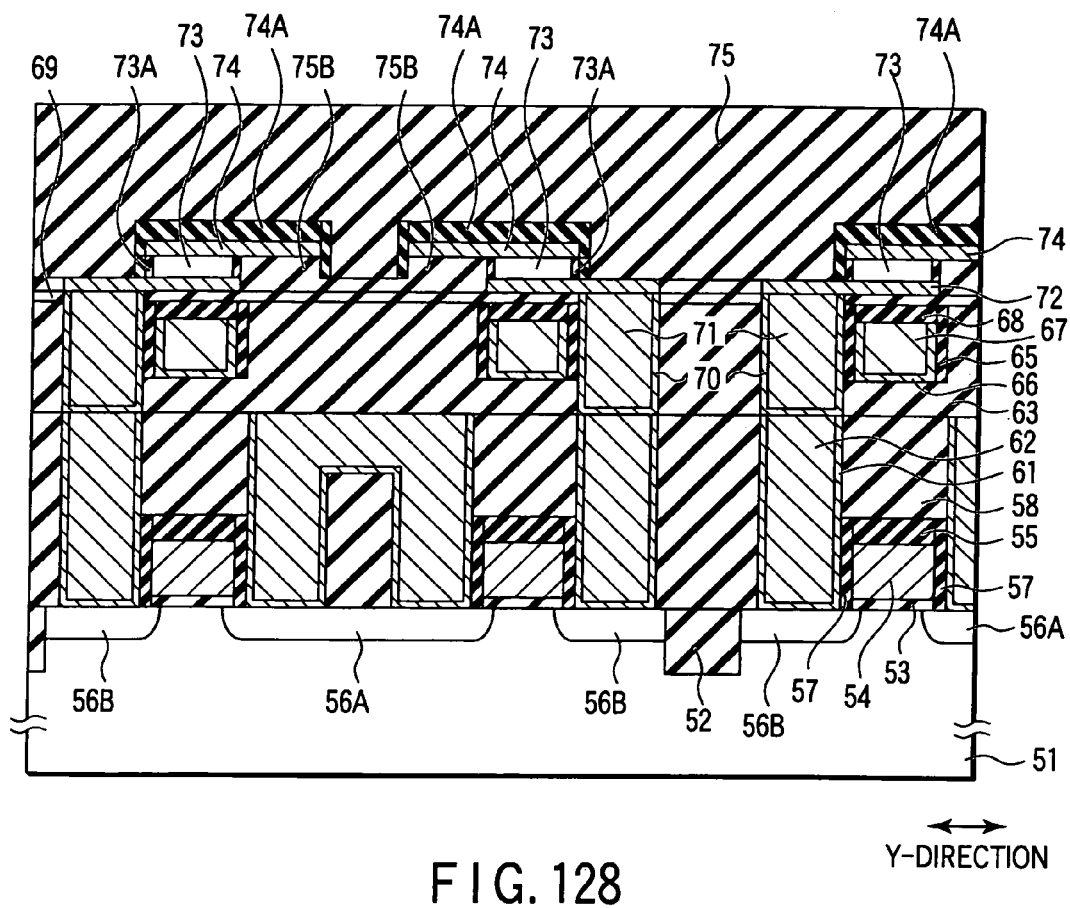
FIG. 128 is a sectional view showing one step of the manufacturing method 2 according to the present invention.

In addition, as shown in FIG. 128, a metal layer 74 which can be an upper electrode of the first MTJ element 73 is formed on the interlayer insulating film 75B by the sputtering method. Subsequently, an alumina layer 74A which protects the first MTJ element 73 is formed on the metal layer 74 by the CVD method.

Thereafter, a resist pattern is formed by PEP, and the alumina layer 74A, the metal layer 74 and the interlayer insulating film 75B are patterned with this resist pattern being used as a mask. At this moment, the surface of the metal layer 72 as the lower electrode of the first MTJ element 73 is exposed simultaneously with patterning.

After again forming an alumina layer 74A, the alumina layer 74A remains covering the top portion and the side wall portion of the metal layer 74 as the upper electrode and the first MTJ element 73 when the alumina layer 74A is etched by RIE.

Thereafter, the interlayer insulating film 75 which completely covers the first MTJ element 73 is formed by using the CVD method.

Step for Forming Wiring Groove

Figure 129:
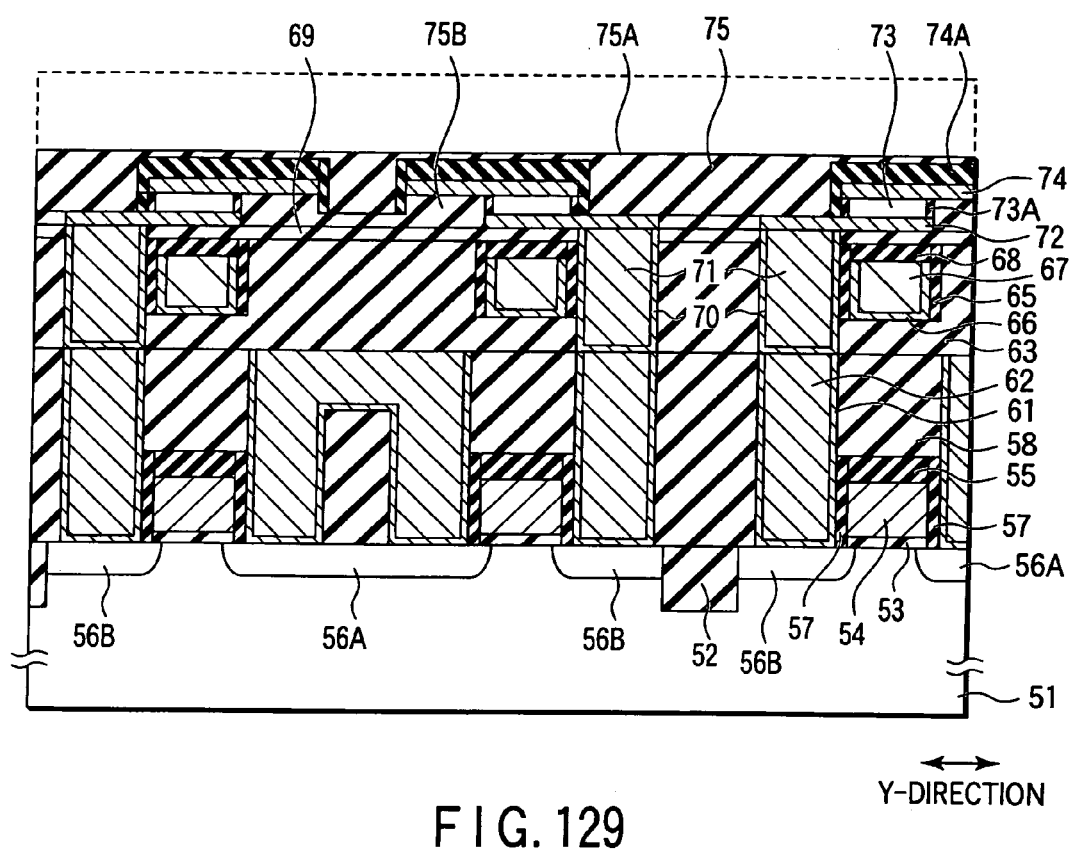
FIG. 129 is a sectional view showing one step of the manufacturing method 2 according to the present invention.

Subsequently, as shown in FIG. 129, a wiring groove 75A is formed to the interlayer insulating film 75 by RIE with the resist pattern being used as a mask, for example. At this moment, since the alumina layer 74A functions as a etching stopper, the bottom portion of the wiring groove 75A does not reach the metal layer 74 and the first MTJ element 73.

In this example, the wiring groove 75A is a groove used for forming the write bit line and extends in the Y-direction. A side wall spacers (for example, silicon nitride) for enhancing the insulation function is formed on the side surface of the wiring groove 75A.

The wiring groove 75A can be readily formed by forming a resist pattern on the interlayer insulating film 75 by, e.g., PEP and etching the interlayer insulating film 75 by RIE with this resist pattern being used as a mask. After etching, the resist pattern is removed.

The side wall spacers can be readily formed by forming an insulating film (for example, silicon nitride) on the entire interlayer insulating film 72 by the CVD method and etching the insulating film by RIE.

Step for forming Third Wiring Layer

Figure 130:
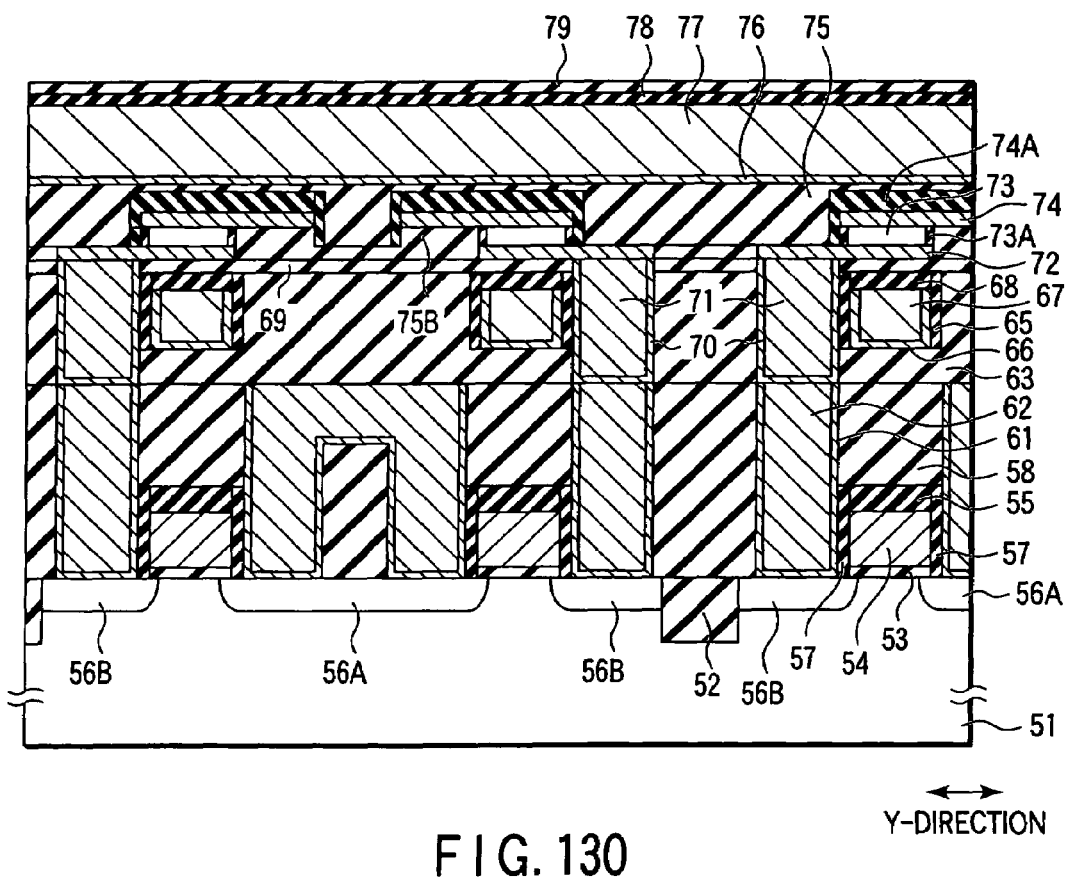
FIG. 130 is a sectional view showing one step of the manufacturing method 2 according to the present invention.

Subsequently, as shown in FIG. 130, a barrier metal layer (for example, a lamination layer of Ta and TaN) 76 is formed on each of the interlayer insulating film 75, the inner wall of the wiring groove 75A and the side wall spacers by using, e.g., the sputtering method. Then, a metal layer (for example, Cu) 77 which completely fills the wiring groove 75A is formed on the barrier metal layer 76 by, e.g., the sputtering method.

Thereafter, the metal layer 77 is polished by using, e.g., the CMP method, and the metal layer 77 is left only in the wiring groove 75A. The metal layer 77 remaining in the wiring groove 75A becomes a third wiring layer which functions as the write bit line.

Additionally, a cap insulator (for example, silicon nitride) 78 is formed on the interlayer insulating film 75 by the CVD method. Further, the cap insulator 78 is polished by the CMP method, and the cap insulator 78 is caused to remain only on the metal layer 77 as the third wiring layer. Furthermore, an interlayer insulating film (for example, silicon oxide) 79 which completely covers the metal layer 77 as the third wiring layer is formed on the interlayer insulating film 75.

Step for Forming Lower Electrode of Second MTJ Element

Figure 131:
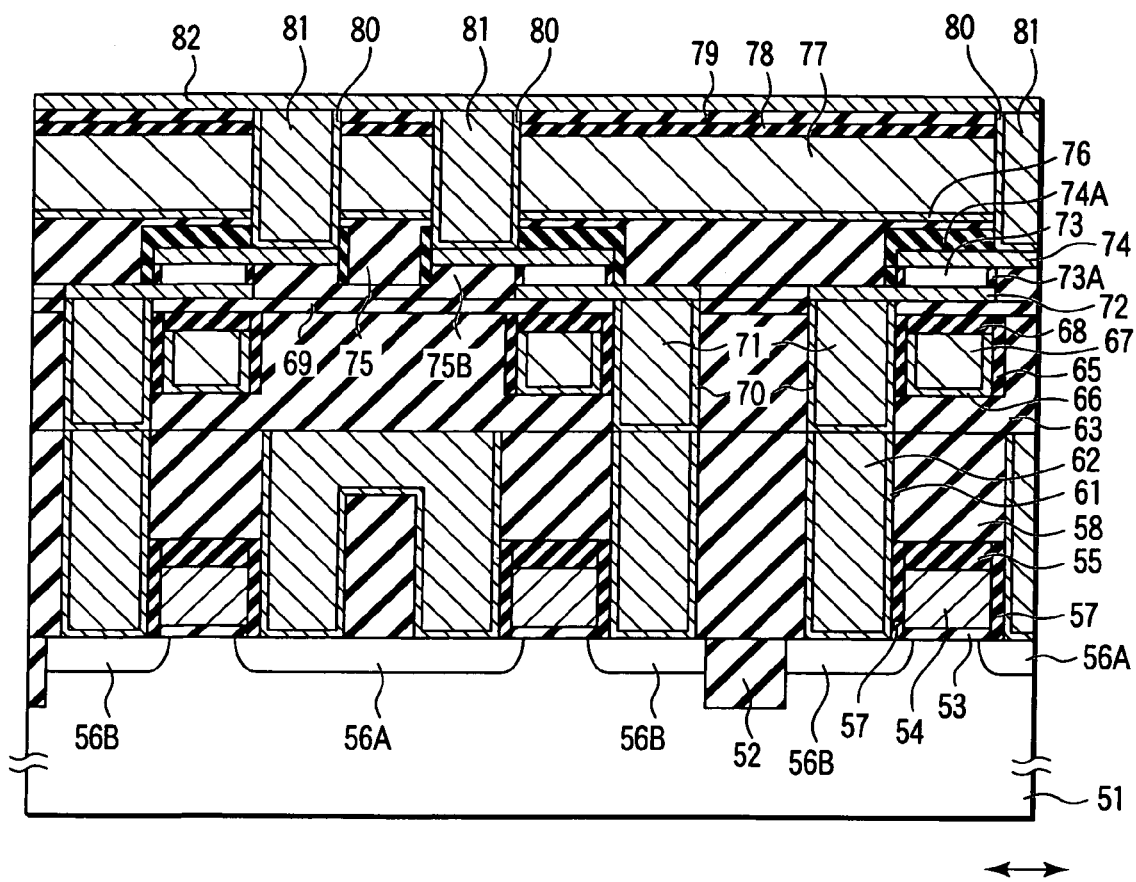
FIG. 131 is a sectional view showing one step of the manufacturing method 2 according to the present invention.

Subsequently, as shown in FIG. 131, a contact hole which reaches the upper electrode 74 of the first MTJ element is formed to the interlayer insulating films 75 and 79 and the alumina layer 74A.

This contact hole can be readily formed by forming a resist pattern on the interlayer insulating film 79 by, e.g., PEP and etching the interlayer insulating films 75 and 79 and the alumina layer 74A by RIE with this resist pattern being used as a mask. After etching, the resist pattern is removed.

Moreover, a barrier metal layer (for example, a lamination layer of Ti and TiN) 80 is formed on the inner surface of the contact hole by using, e.g., the sputtering method. Subsequently, a metal layer (for example, W) 81 which completely fills the contact hole is formed on the barrier metal layer 80 by, e.g., the sputtering method.

Thereafter, the metal layer 81 is polished by using the CMP method, and the metal layer 81 is left only in the contact hole. The metal layer 81 remaining in the contact hole becomes a contact plug. In addition, a metal layer 82 which can be a lower electrode of the second MTJ element is formed on the interlayer insulating film 79 by the sputtering method.

Step for Forming Second MTJ Element and Upper Electrode Thereof

Figure 132:
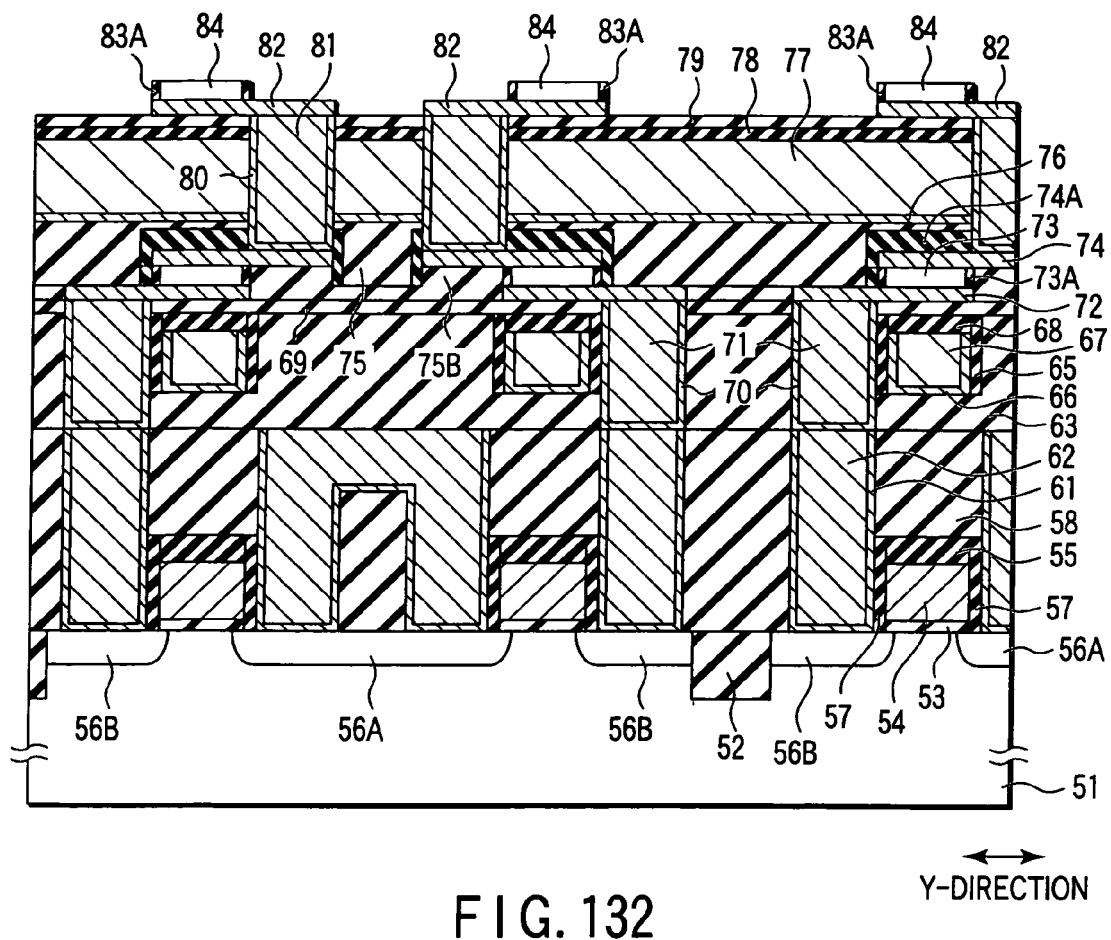
FIG. 132 is a sectional view showing one step of the manufacturing method 2 according to the present invention.

Then, as shown in FIG. 132, a second MTJ element 84 is formed on the metal layer 82. The second MTJ element 84 is constituted by a tunneling barrier, two ferromagnetic layers sandwiching the tunneling barrier therebetween and an anti-ferromagnetic layer, and has, for example, such a structure as shown in FIG. 58.

Additionally, in this example, a protection side wall spacers (for example, silicon oxide) 83A which protects the second MTJ element 84 is formed on the side surface of the second MTJ element 84. This protection side wall spacers 83A can be easily formed on the side surface of the second MTJ element 84 by using the CVD method and the RIE method.

Thereafter, the lower electrode 82 of the second MTJ element 84 is patterned. The lower electrode 82 of the second MTJ element 84 can be easily patterned by forming a resist pattern on the lower electrode 82 by PEP and then etching the lower electrode 82 by RIE with this resist pattern being used as a mask. Thereafter, the resist pattern is removed.

Figure 133:
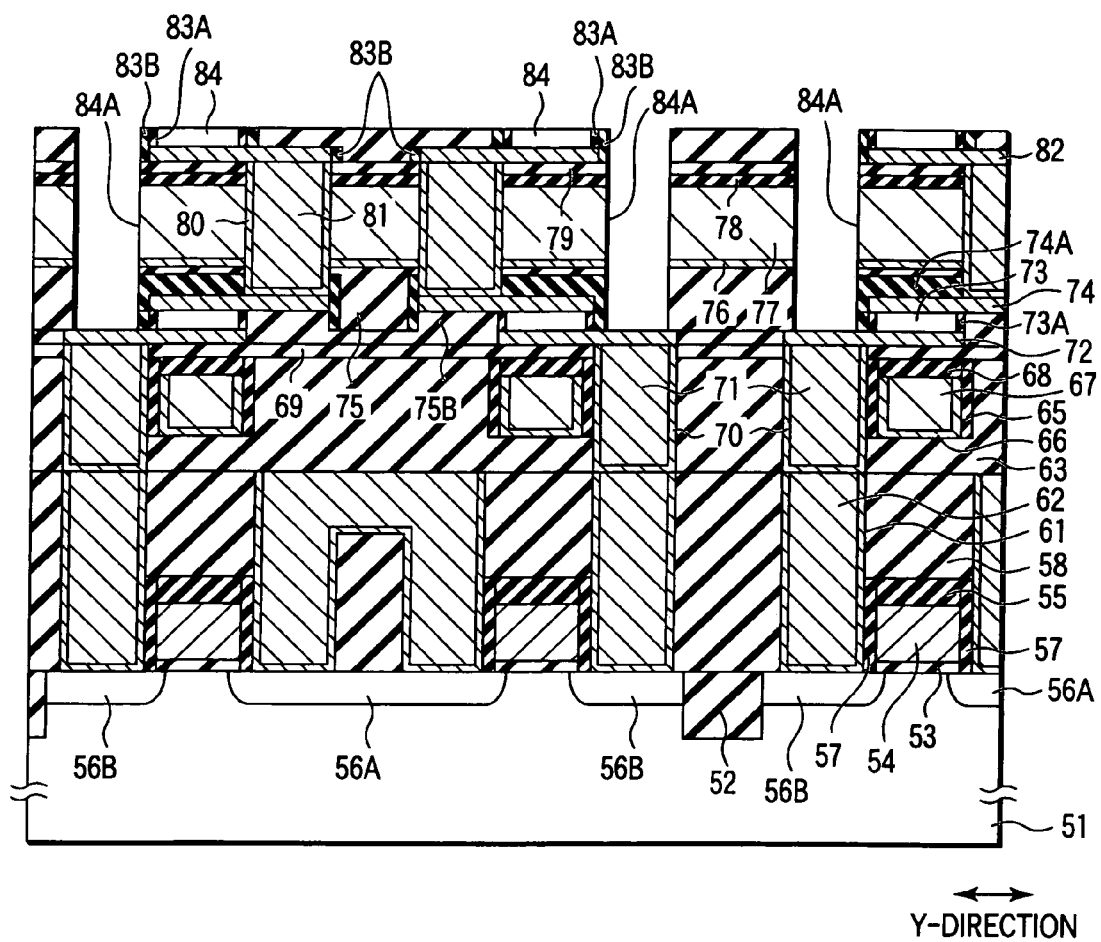
FIG. 133 is a sectional view showing one step of the manufacturing method 2 according to the present invention.

Subsequently, as shown in FIG. 133, an alumina layer 83B which protects the second MTJ element 84 is formed on the second MTJ element 84 by the CVD method. Thereafter, the alumina layer 83B is etched by RIE, and the alumina layer 83B consequently remains on the side wall portion of the second MTJ element 84.

An interlayer insulating film (for example, silicon oxide) 84B which completely covers the second MTJ element 84 is formed by using the CVD method. Further, the interlayer insulating film 84B is polished by the CMP method, and the interlayer insulating film 84B is left only between the second MTJ elements 84.

Furthermore, a contact hole which reaches the lower electrode 72 of the first MTJ element is formed to the interlayer insulating films 75, 79 and 84B.

This contact hole can be readily formed by forming a resist pattern on the interlayer insulating film 84B by, e.g., PEP and etching the interlayer insulating films 75, 79 and 84B by RIE with this resist pattern being used as a mask. After etching, the resist pattern is removed.

It is to be noted that at this etching step, an etching rate of the alumina layers 74A and 83B is set so as to be sufficiently smaller than an etching rate of the interlayer insulating films 75, 79 and 84B.

That is, according to this example, even if the contact hole is out of alignment, the first and second MTJ elements 73 and 84 are not etched since the alumina layers 74A and 83B protect the first and second MTJ elements 73 and 84.

Figure 134:
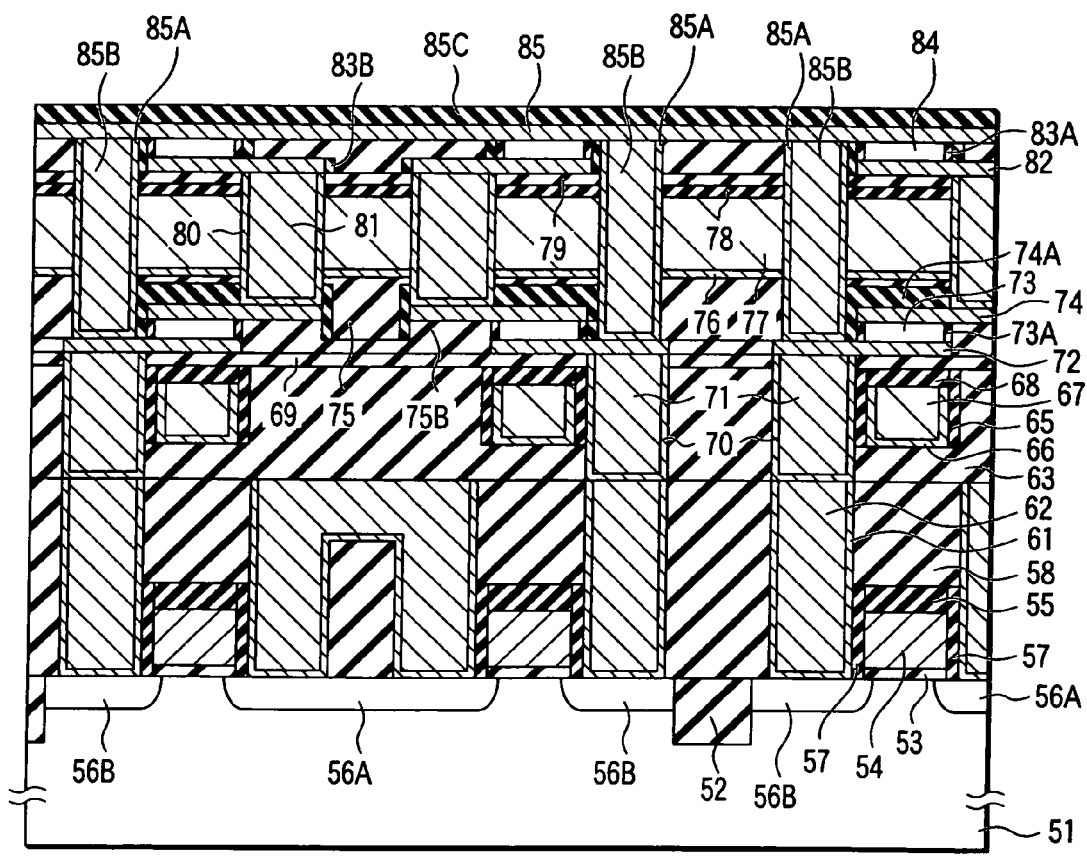
FIG. 134 is a sectional view showing one step of the manufacturing method 2 according to the present invention.

Subsequently, as shown in FIG. 134, a barrier metal layer (for example, a lamination layer of Ti and TiN) 85A is formed on the inner surface of the contact hole by using, e.g., the sputtering method. For example, a metal layer (for example, W) 85B which completely fills the contact hole is formed on the barrier metal layer 85A by the sputtering method.

Thereafter, the metal layer 85B is polished by using, e.g., the CMP method, and the metal layer 85B is left only in the contact hole. The metal layer 85B remaining in the contact hole becomes a contact plug. Furthermore, a metal layer 85 which becomes an upper electrode of the second MTJ element 84 is formed on the interlayer insulating film 84 by the sputtering method. Then, an alumina layer 85C which protects the second MTJ element 84 is formed on the metal layer 85 by the CVD method.

Thereafter, a resist pattern is formed by PEP, and the alumina layer 85C and the metal layer 85 are patterned with this resist pattern being used as a mask. After again forming an alumina layer 85C, when the alumina layer 85C is etched by RIE, the alumina layer 85C remains covering the top portion and the side wall portion of the metal layer 85 as the upper electrode and the second MTJ element 84.

Thereafter, an interlayer insulating film 86 which completely covers the second MTJ element 85 is formed by using the CVD method.

Step for Forming Wiring Groove

Figure 136:
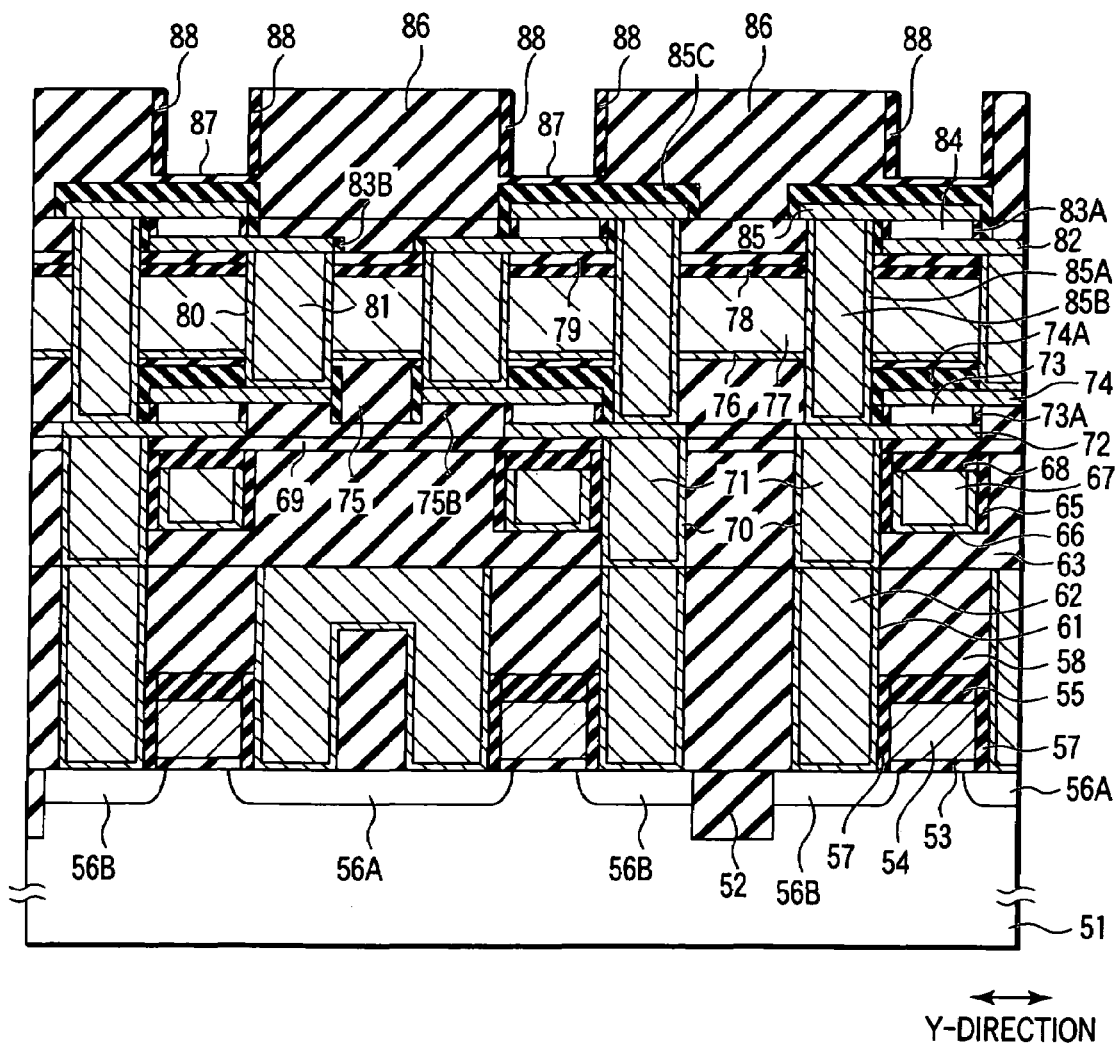
FIG. 136 is a sectional view showing one step of the manufacturing method 2 according to the present invention.

Subsequently, as shown in FIG. 136, a wiring groove 87 is formed to the interlayer insulating film 86 by RIE with the resist pattern being used as a mask, for example. At this moment, since the alumina layer 85C functions as an etching stopper, the bottom portion of the wiring groove 87 does not reach the metal layer 85 and the second MTJ element 84.

In this example, since the wiring groove 87 is a groove used for forming the write word line and extends in the X-direction. A side wall spacers (for example, silicon nitride) 88 for enhancing the insulation function is formed on the side surface of the wiring groove 87.

The wiring groove 87 can be readily formed by forming a resist pattern on the interlayer insulating film 86 by, e.g., PEP and etching the interlayer insulating film 86 by RIE with this resist pattern being used as a mask. After etching, the resist pattern is removed.

The side wall spacers 88 can be readily formed by forming an insulating film (for example, silicon nitride) on the entire interlayer insulating film 86 by the CVD method and then etching the insulating film by RIE.

Step for Forming Fourth Wiring Layer

Figure 137:
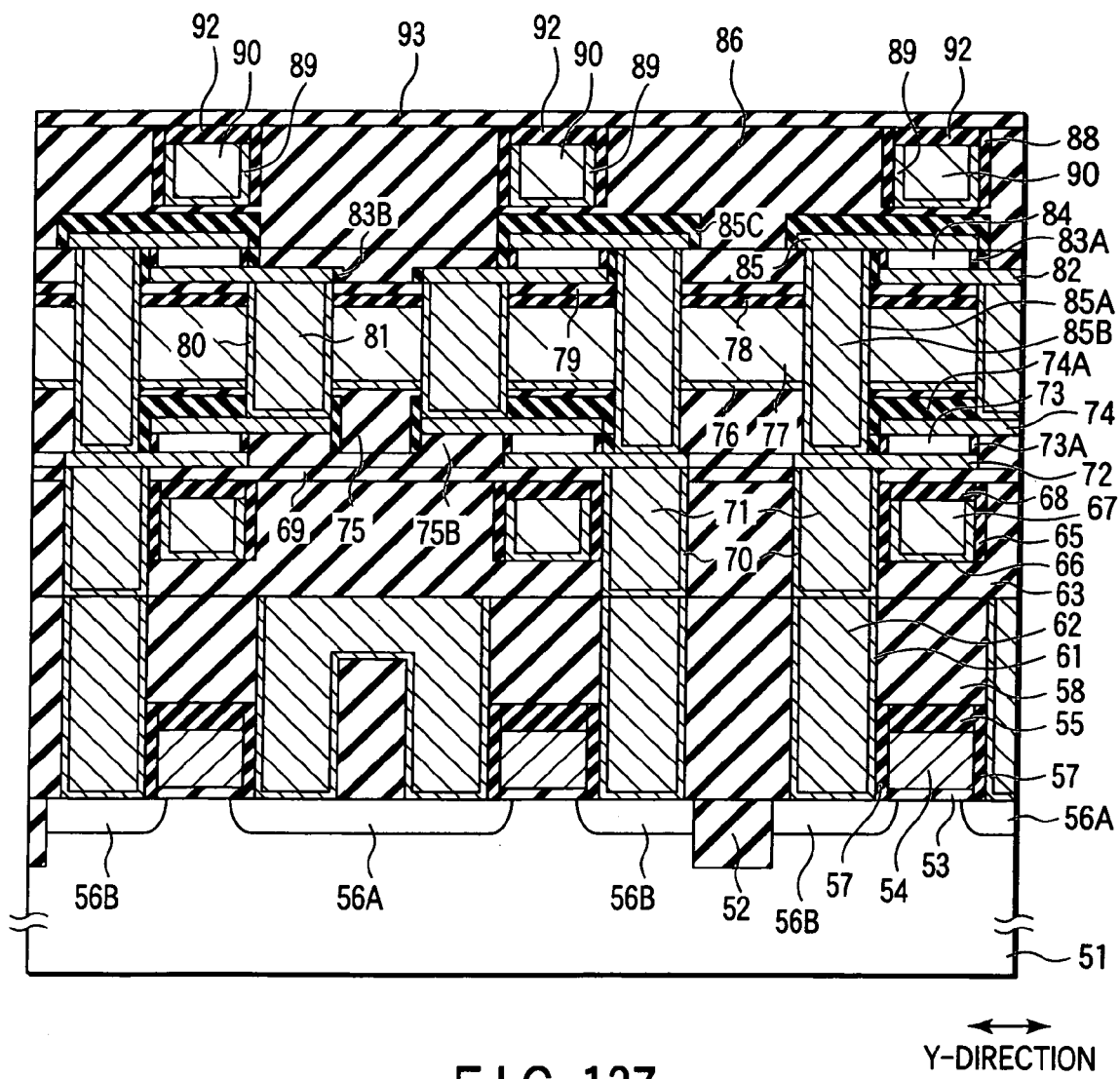
FIG. 137 is a sectional view showing one step of the manufacturing method 2 according to the present invention.

Subsequently, as shown in FIG. 137, a barrier metal layer (for example, a lamination layer of Ta and TaN) 89 is formed on each of the interlayer insulating film 86, the inner surface of the wiring groove 87 and the side wall spacers 88 by using, e.g., the sputtering method. Subsequently, a metal layer (for example, Cu) 90 which completely fills the wiring groove 87 is formed on the barrier metal layer 89 by, e.g., the sputtering method.

Thereafter, the metal layer 90 is polished by using, e.g., the CMP method, and the metal layer 90 is left only in the wiring groove 87. The metal layer 90 remaining in the wiring groove 87 becomes a fourth wiring layer which functions as the write word line.

Moreover, a cap insulator (for example, silicon nitride) 92 is formed on the interlayer insulating film 86 by the CVD method. In addition, the cap insulator 92 is polished by the CMP method, and the cap insulator 92 is left only on the metal layer 90 as the fourth wiring layer. Additionally, an interlayer insulating film (for example, silicon oxide) 93 which completely covers the metal layer 90 as the fourth wiring layer is formed on the interlayer insulating film 86.

Step for Forming Lower Electrode of Third MTJ Element

Figure 138:
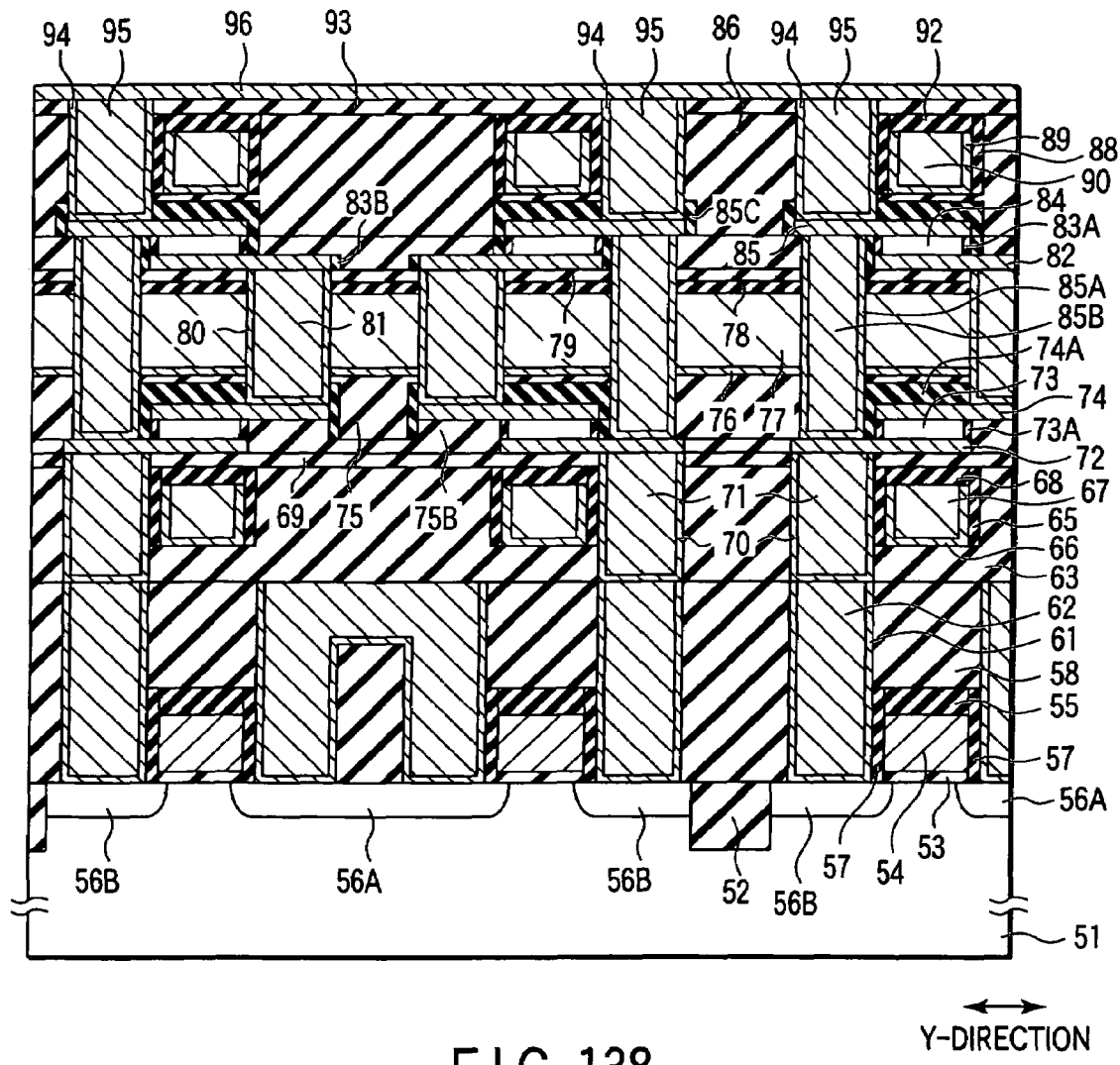
FIG. 138 is a sectional view showing one step of the manufacturing method 2 according to the present invention.

Subsequently, as shown in FIG. 138, a contact hole which reaches the upper electrode 85 of the second MTJ element 84 is formed to the interlayer insulating films 86 and 93.

This contact hole can be easily formed by forming a resist pattern on the interlayer insulating film 93 by, e.g., PEP and etching the interlayer insulating films 86 and 93 by RIE with this resist pattern being used as a mask. After etching, the resist pattern is removed.

Further, a barrier metal layer (for example, a lamination layer of Ti and TiN) 94 is formed on the inner surface of the contact hole by using, e.g., the sputtering method. Then, a metal layer (for example, W) 95 which completely fills the contact hole is formed on the barrier metal layer 94 by, e.g., the sputtering method.

Thereafter, the metal layer 95 is polished by using, e.g., the CMP method, and the metal layer 95 is left only in the contact hole. The metal layer 95 remaining in the contact hole becomes a contact plug. Furthermore, a metal layer 96 which becomes a lower electrode of the third MTJ element is formed on the interlayer insulating film 93 by the CVD method.

Step for Forming Third MTJ Element and Upper Electrode Thereof

Figure 139:
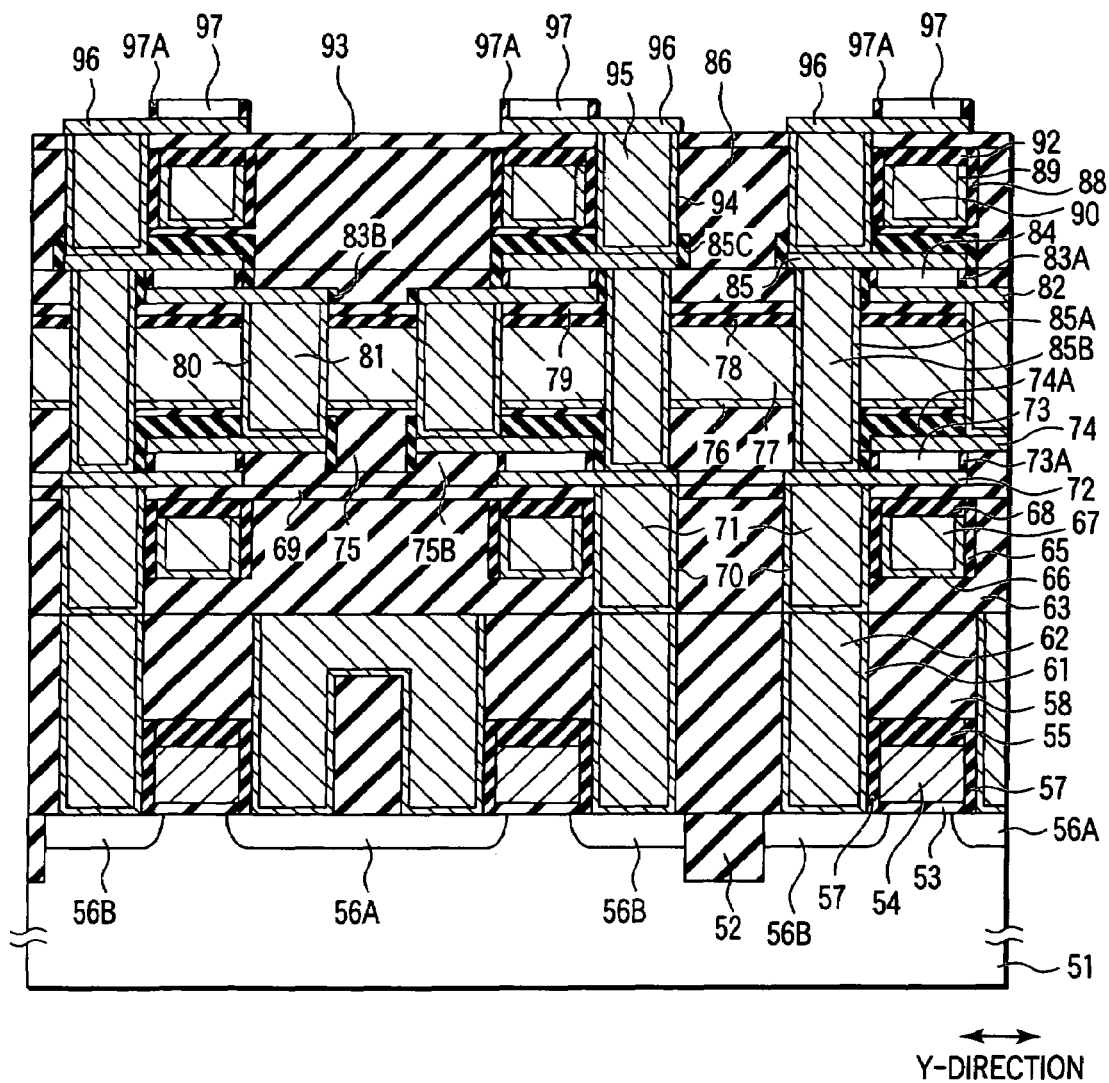
FIG. 139 is a sectional view showing one step of the manufacturing method 2 according to the present invention.

Then, as shown in FIG. 139, a third MTJ element 97 is formed on a metal layer 96. The third MTJ element 97 is constituted by a tunneling barrier, two ferromagnetic layers sandwiching the tunneling barrier therebetween and an anti-ferromagnetic layer, and has, e.g., such a structure as shown in FIG. 59.

Moreover, in this example, a protection side wall spacers (for example, silicon oxide) 97A which protects the third MTJ element 97 is formed on the side surface of the third MTJ element 97. This protection side wall spacers 97A can be easily formed on the side surface of the third MTJ element 97 by using the CVD method and the RIE method.

Thereafter, the lower electrode 96 of the third MTJ element 97 is patterned. The lower electrode 96 of the third MTJ element 97 can be readily patterned by forming a resist pattern on the lower electrode 96 by PEP and then etching the lower electrode 96 by RIE with this resist pattern being used as a mask. Thereafter, the resist pattern is removed.

Figure 140:
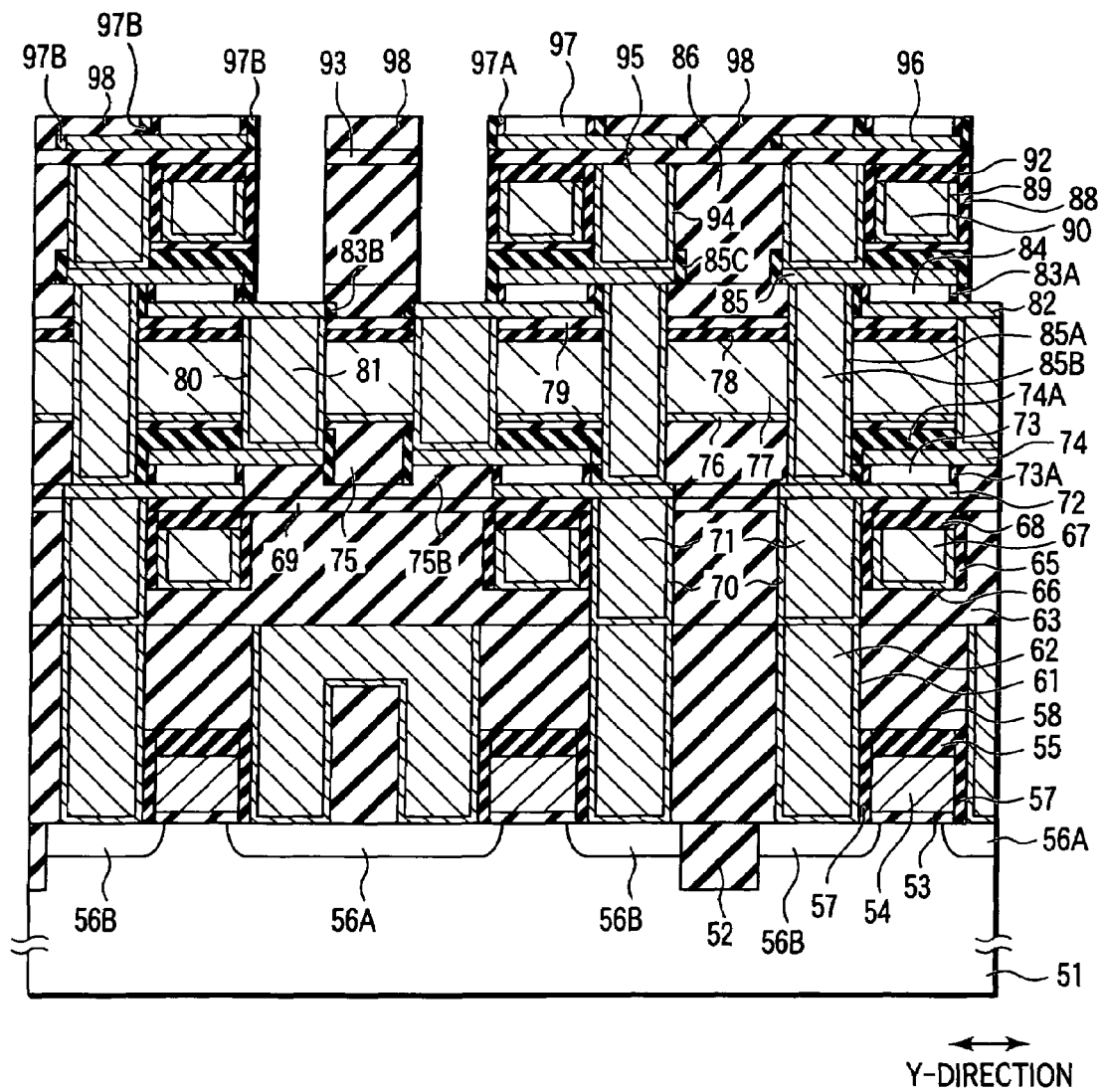
FIG. 140 is a sectional view showing one step of the manufacturing method 2 according to the present invention.

Subsequently, as shown in FIG. 140, an interlayer insulating film (for example, silicon oxide) 98 which completely covers the third MTJ element 97 is formed by using the CVD method. In addition, the interlayer insulating film 98 is polished by, e.g., the CMP method, and the interlayer insulating film 98 is left only between the third MTJ elements 97.

Thereafter, a contact hole which reaches the lower electrode 82 of the second MTJ element 84 is formed to the interlayer insulating films 86, 93 and 98.

This contact hole can be easily formed by forming a resist-pattern on the interlayer insulating film 98 by, e.g., PEP and etching the interlayer insulating films 86, 93 and 98 by RIE with this resist pattern being used as a mask. After etching, the resist pattern is removed.

Figure 141:
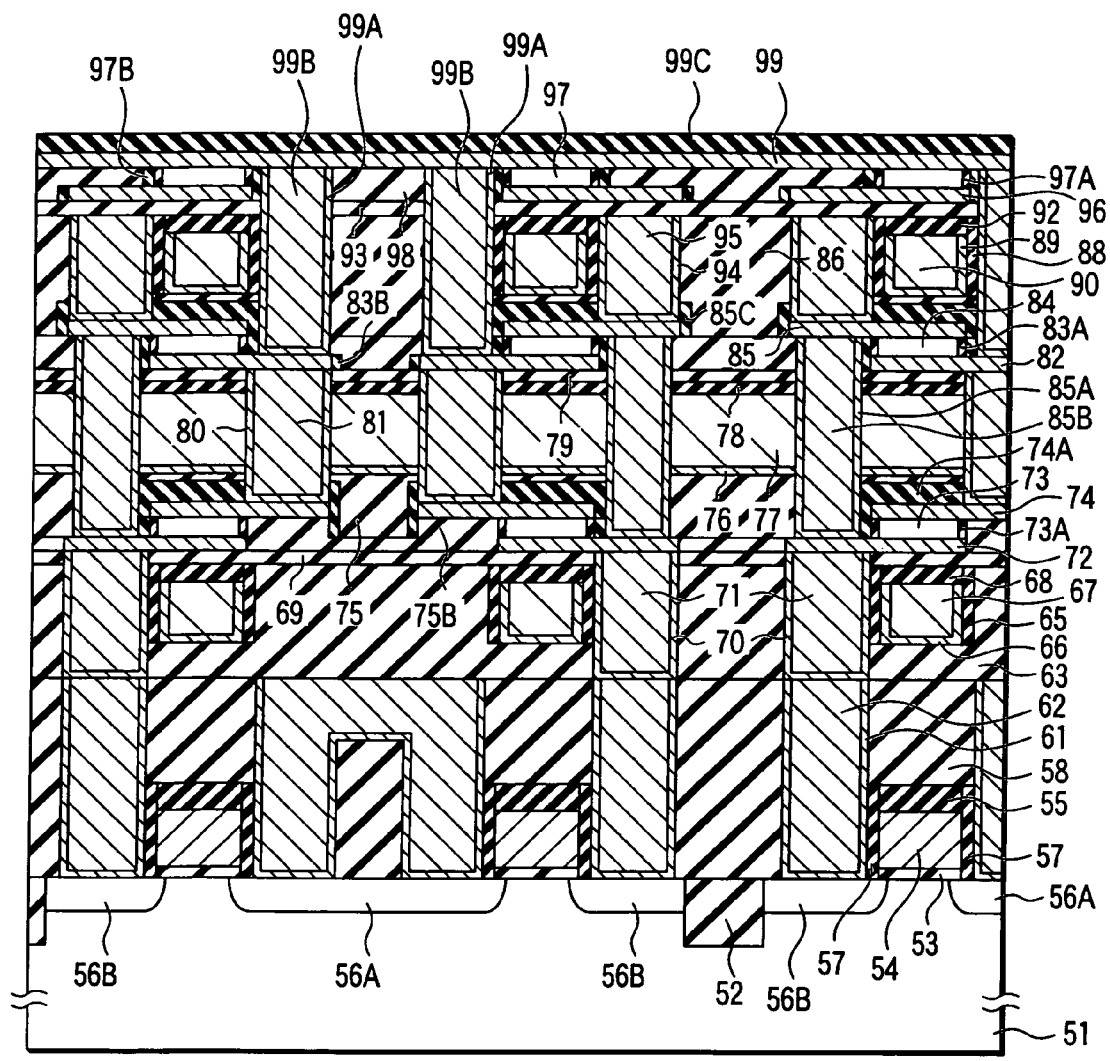
FIG. 141 is a sectional view showing one step of the manufacturing method 2 according to the present invention.

Then, as shown in FIG. 141, a barrier metal layer (for example, a lamination layer of Ti and TiN) 99A is formed on the inner surface of the contact hole by using, e.g., the sputtering method. Subsequently, a metal layer (for example, W) 99B which completely fills the contact hole is formed on the barrier metal layer 99A by using, e.g., the sputtering method.

Thereafter, the metal layer 99B is polished by using, e.g., the CMP method, and the metal layer 99B is left only in the contact hole. The metal layer 99B remaining in the contact hole becomes a contact plug. Additionally, a metal layer 99 which becomes an upper electrode of the third MTJ element is formed on the interlayer insulating film 98 by the CVD method.

Further, an alumina layer 99C which protects the third MTJ element 97 is formed on the upper electrode 99 of the third MTJ element 97.

Figure 142:
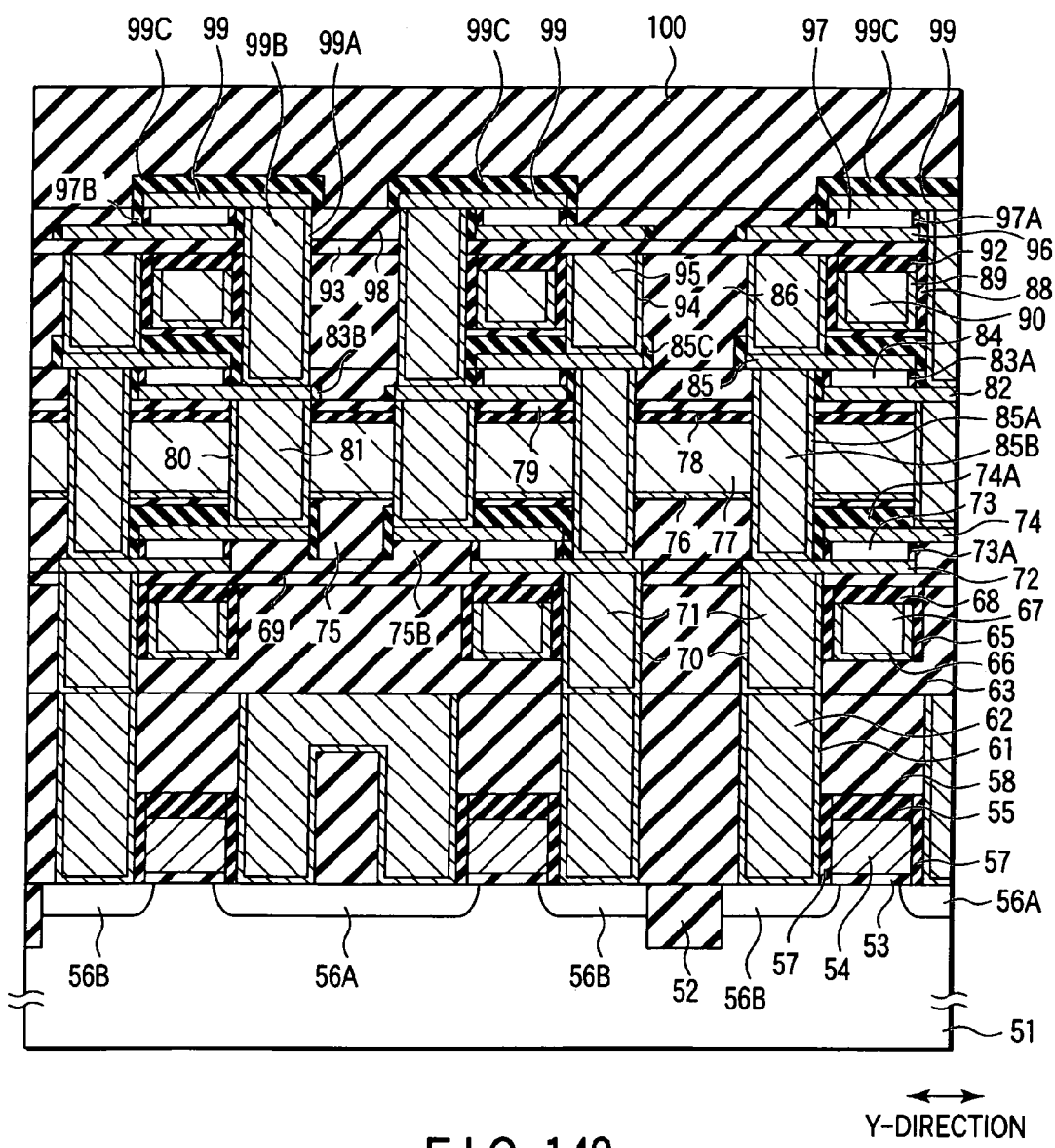
FIG. 142 is a sectional view showing one step of the manufacturing method 2 according to the present invention.

Then, as shown in FIG. 142, a resist pattern is formed by PEP and the alumina layer 99C and the metal layer 99 are patterned with this resist pattern being used as a mask. After again forming the alumina layer 99C, when the alumina layer 99C is etched by RIE, this alumina layer 99C remains covering the top portion and the side wall portion of the metal layer 99 as the upper electrode and the third MTJ element 97.

Thereafter, an interlayer insulating film 100 which completely covers the third MTJ element 97 is formed by using the CVD method.

Step for Forming Wiring Groove

Figure 143:
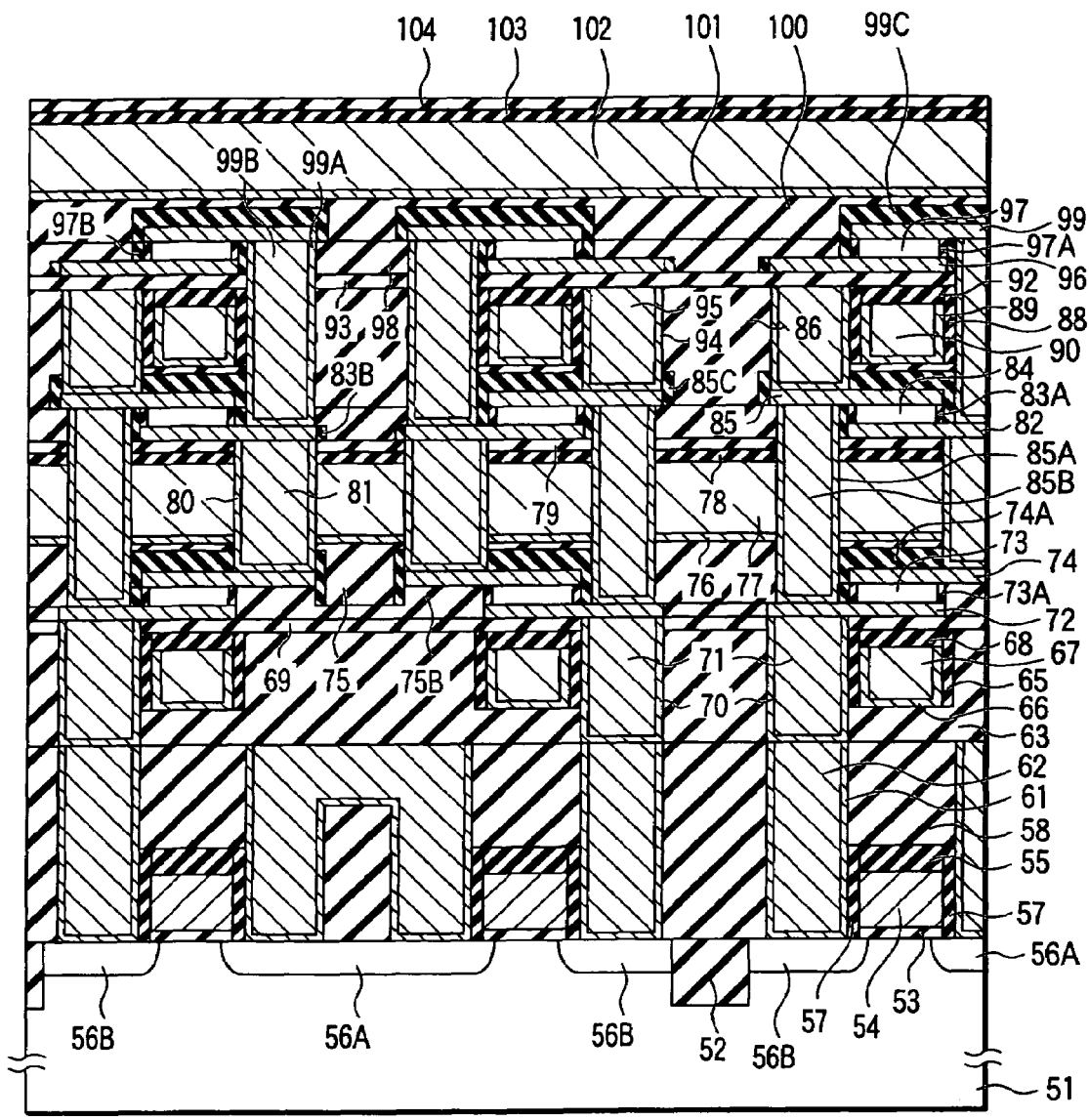
FIG. 143 is a sectional view showing one step of the manufacturing method 2 according to the present invention.

Then, as shown in FIG. 143, a wiring groove extending in the Y-direction is formed to the interlayer insulating film 100 by RIE with the resist pattern being used as a mask, for example. At this moment, since the alumina layer 99C functions as an etching stopper, the bottom portion of the wiring groove does not reach the metal layer 99 and the third MTJ element 97.

In this example, the wiring groove is a groove used for forming the write bit line and extends in the Y-direction. A side wall spacers (for example, silicon nitride) for enhancing the insulation function is formed on the side surface of the wiring groove.

The wiring groove can be easily formed by forming a resist pattern on the interlayer insulating film 100 by, e.g., PEP and etching the interlayer insulating film 100 by RIE with this resist pattern being used as a mask. After etching, the resist pattern is removed.

The side wall spacers can be easily formed by forming an insulating film (for example, silicon nitride) on the entire interlayer insulating film 100 by the CVD method and then etching the insulating film by RIE.

Step for Forming Fifth Wiring Groove

Subsequently, as shown in FIG. 143, a barrier metal layer (for example, a lamination layer of Ta and TaN) 101 is formed on each of the interlayer insulting film 100, the inner surface of the wiring groove and the side wall insulating film by using, e.g., the sputtering method. Subsequently, a metal layer (for example, Cu) 102 which completely fills the wiring groove is formed on the barrier metal layer 101 by, e.g., the sputtering method.

Thereafter, the metal layer 102 is polished by using, e.g., the CMP method, and the metal layer 102 is left only in the wiring groove. The metal layer 102 remaining in the wiring groove becomes a fifth wiring layer which functions as the write bit line.

Further, a cap insulator (for example, silicon nitride) 103 is formed on the interlayer insulating film 100 by the CVD method. Furthermore, the cap insulator 103 is polished by the CMP method, and the cap insulator 103 is left on only the metal layer 102 as the fifth wiring layer. Moreover, an interlayer insulating film (for example, silicon oxide) 104 which completely covers the metal layer 102 as the fifth wiring layer is formed on the interlayer insulating film 100.

Step for Forming Lower Electrode of Fourth MTJ Element

Figure 144:
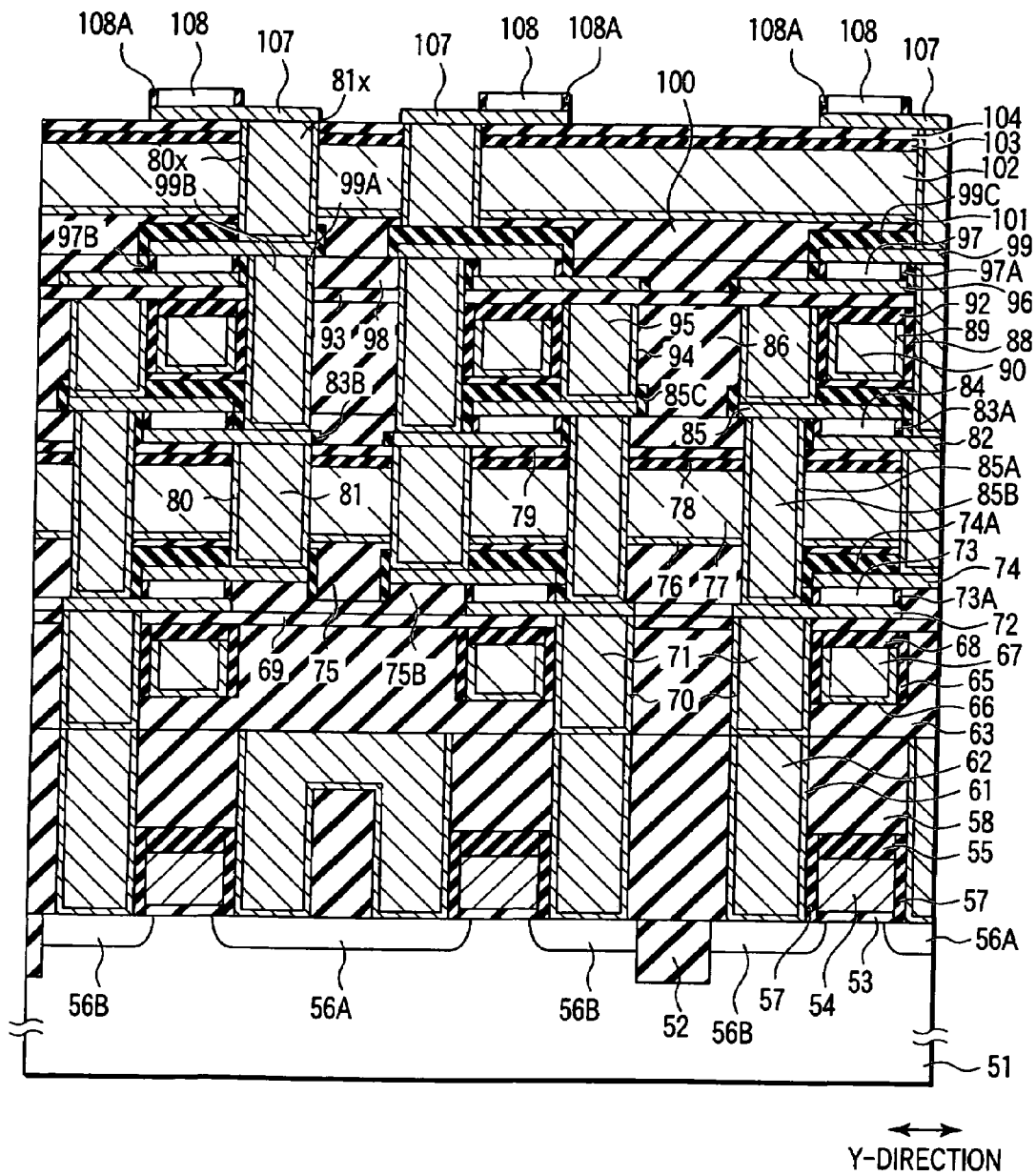
FIG. 144 is a sectional view showing one step of the manufacturing method 2 according to the present invention.

Then, as shown in FIG. 144, a contact hole which reaches the upper electrode 99 of the third MTJ element 97 is formed to the interlayer insulating films 100 and 104 and the alumina layer 99C.

This contact hole can be readily formed by forming a resist pattern on the interlayer insulating film 104 by, e.g., PEP and etching the interlayer insulating films 100 and 104 and the alumina layer 99C by RIE with this resist pattern being used as a mask. After etching, the resist pattern is removed.

In addition, a barrier metal layer (for example, a lamination layer of Ti and TiN) 80X is formed on the inner surface of the contact hole by using, e.g., the sputtering method. Subsequently, a metal layer (for example, W) 81X which completely fills the contact hole is formed by, e.g., the sputtering method.

Thereafter, the metal layer 81X is polished by using, e.g., the CMP method, and the metal layer 81X is left only in the contact hole. The metal layer 81X remaining in the contact hole becomes a contact plug. Additionally, a metal layer 107 which becomes a lower electrode of the fourth MTJ element is formed on the interlayer insulating film 104 by the sputtering method.

Step for Forming Fourth MTJ Element and Upper Electrode Thereof

Then, as shown in FIG. 144, a fourth MTJ element 108 is formed on the metal layer 107. The fourth MTJ element 108 is constituted by a tunneling barrier, two ferromagnetic layers sandwiching the tunneling barrier therebetween and an anti-ferromagnetic layer, and has, e.g., such a structure as shown in FIG. 60.

Further, in this example, a protection side wall spacers (for example, silicon oxide) 108A which protects the fourth MTJ element 108 is formed on the side surface of the fourth MTJ element 108. This protection side wall spacers 108A can be easily formed on the side surface of the fourth MTJ element 108 by using the CVD method and the RIE method.

Then, the lower electrode 107 of the fourth MTJ element 108 is patterned. The lower electrode 107 of the fourth MTJ element 108 can be easily patterned by forming a resist pattern on the lower electrode 107 and then etching the lower electrode 107 by RIE with this resist pattern being used as a mask. Thereafter, the resist pattern is removed.

Figure 145:
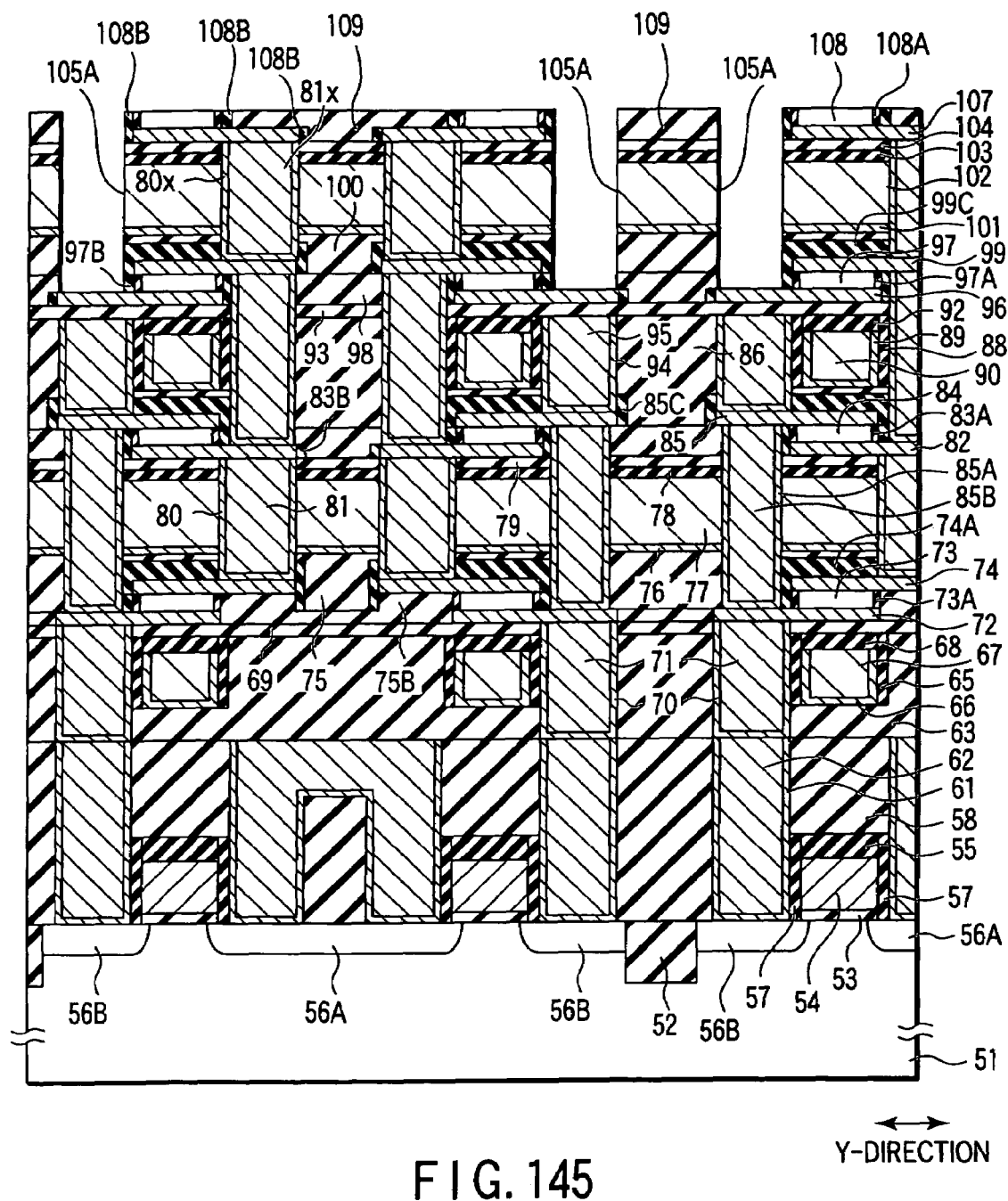
FIG. 145 is a sectional view showing one step of the manufacturing method 2 according to the present invention.

Subsequently, as shown in FIG. 145, an alumina layer 108D which protects the fourth MTJ element 108 is formed on the fourth MTJ element 108 by the CVD method. Then, the alumina layer 108B is etched by RIE, and the alumina layer 108B consequently remains on the side wall portion of the fourth MTJ element 108.

An interlayer insulating film (silicon oxide) 109 which completely covers the fourth MTJ element 108 is formed by using the CVD method. Furthermore, the interlayer insulating film 109 is polished by, e.g., the CMP method, and the interlayer insulating film 109 is left only between the fourth MTJ elements 108.

Moreover, a contact hole which reaches the lower electrode 96 of the third MTJ element is formed to the interlayer insulating films 100, 104 and 109.

This contact hole can be readily formed by forming a resist pattern on the interlayer insulating film 109 by, e.g., PEP and then etching the interlayer insulating films 100, 104 and 109 by RIE with this resist pattern being used as a mask. After etching, the resist pattern is removed.

It is to be noted that, in this etching step, an etching rate of the alumina layers 99C and 108B is set so as to be sufficiently smaller than an etching rate of the interlayer insulating films 100, 104 and 109.

That is, according to this example, even if the contact hole is out of displacement, since the alumina layers 99C and 108B protect the fourth MTJ elements 97 and 108, the third and fourth MTJ elements 97 and 108 are not etched.

Figure 146:
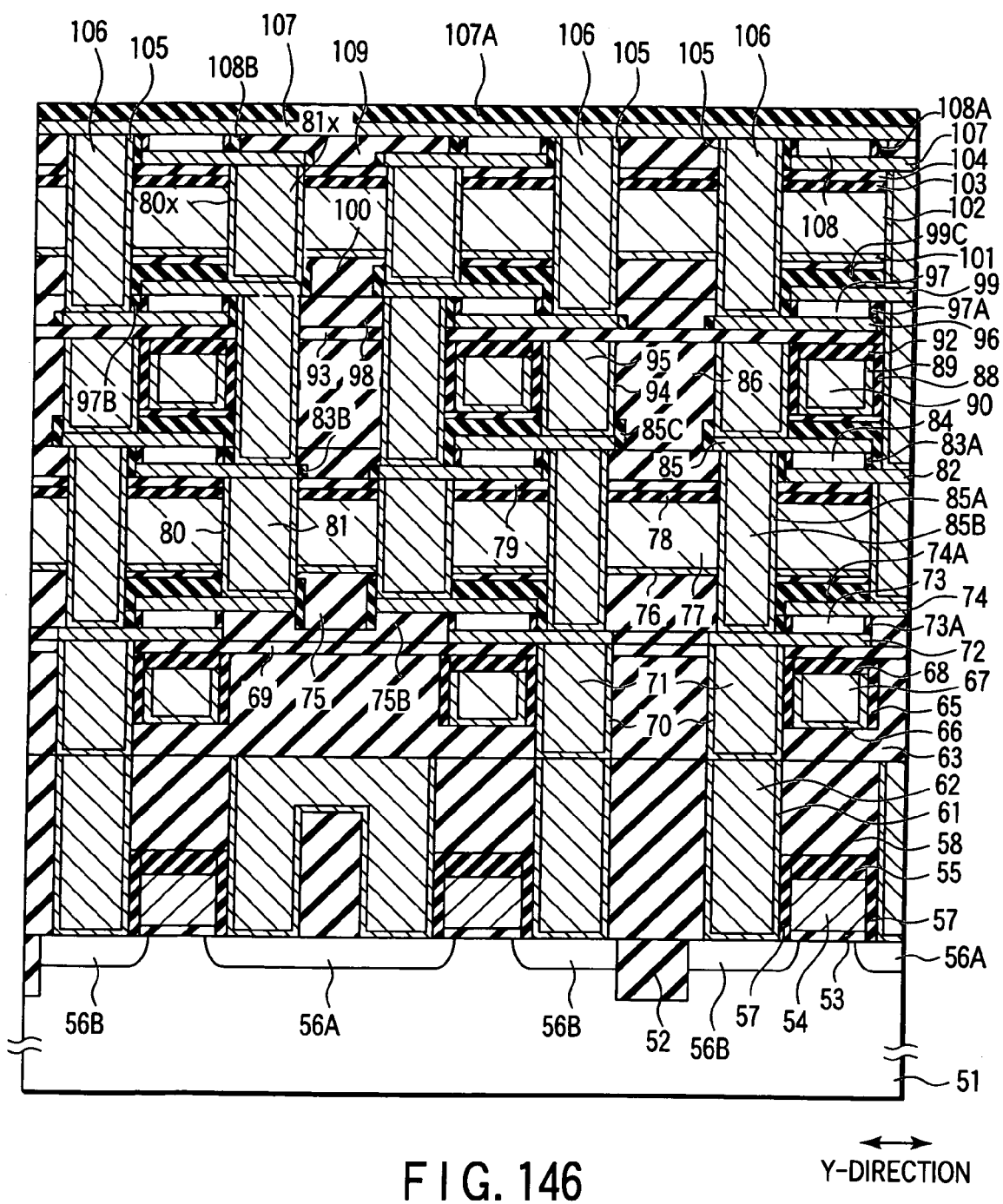
FIG. 146 is a sectional view showing one step of the manufacturing method 2 according to the present invention.

Subsequently, as shown in FIG. 146, a barrier metal layer (for example, a lamination layer of Ti and TiN) 105 is formed on the inner surface of the contact hole by using, e.g., the sputtering method. Then, a metal layer (for example, W) 106 which completely fills the contact hole is formed on the barrier metal layer 105 by, e.g., the sputtering method.

Thereafter, the metal layer 106 is polished by using, e.g., the CMP method, and the metal layer 106 is left only in the contact hole. The metal layer 106 remaining in the contact hole becomes a contact plug. In addition, a metal layer 107 which becomes an upper electrode of the fourth MTJ element 108 is formed on the interlayer insulating film 109 by the sputtering method. Then, an alumina layer 107A which protects the fourth MTJ element 108 is formed on the metal layer 107 by the CVD method.

Figure 147:
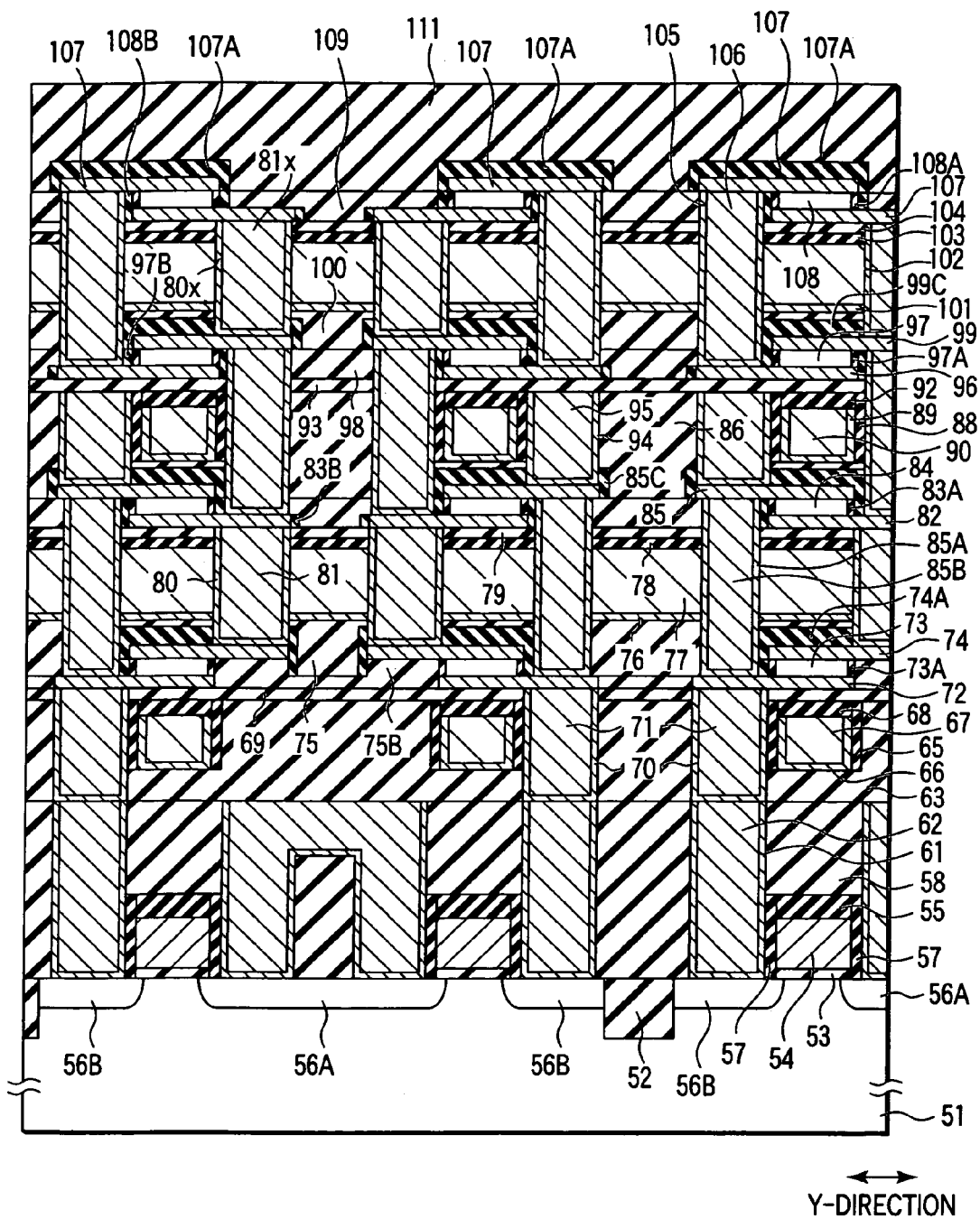
FIG. 147 is a sectional view showing one step of the manufacturing method 2 according to the present invention.

Subsequently, as shown in FIG. 147, a resist pattern is formed by PEP, and the alumina layer 107A and the metal layer 107 are patterned with this resist pattern being used as a mask.

After again forming the alumina layer 107A, when the alumina layer 107A is etched by RIE, this alumina layer 107A remains covering the top portion and the side wall portion of the metal layer 107 as the upper electrode and the fourth MTJ element 108.

Thereafter, an interlayer insulating film 111 which completely covers the fourth MTJ element 108 is formed by the CVD method.

Step for Forming Wiring Groove

Figure 148:
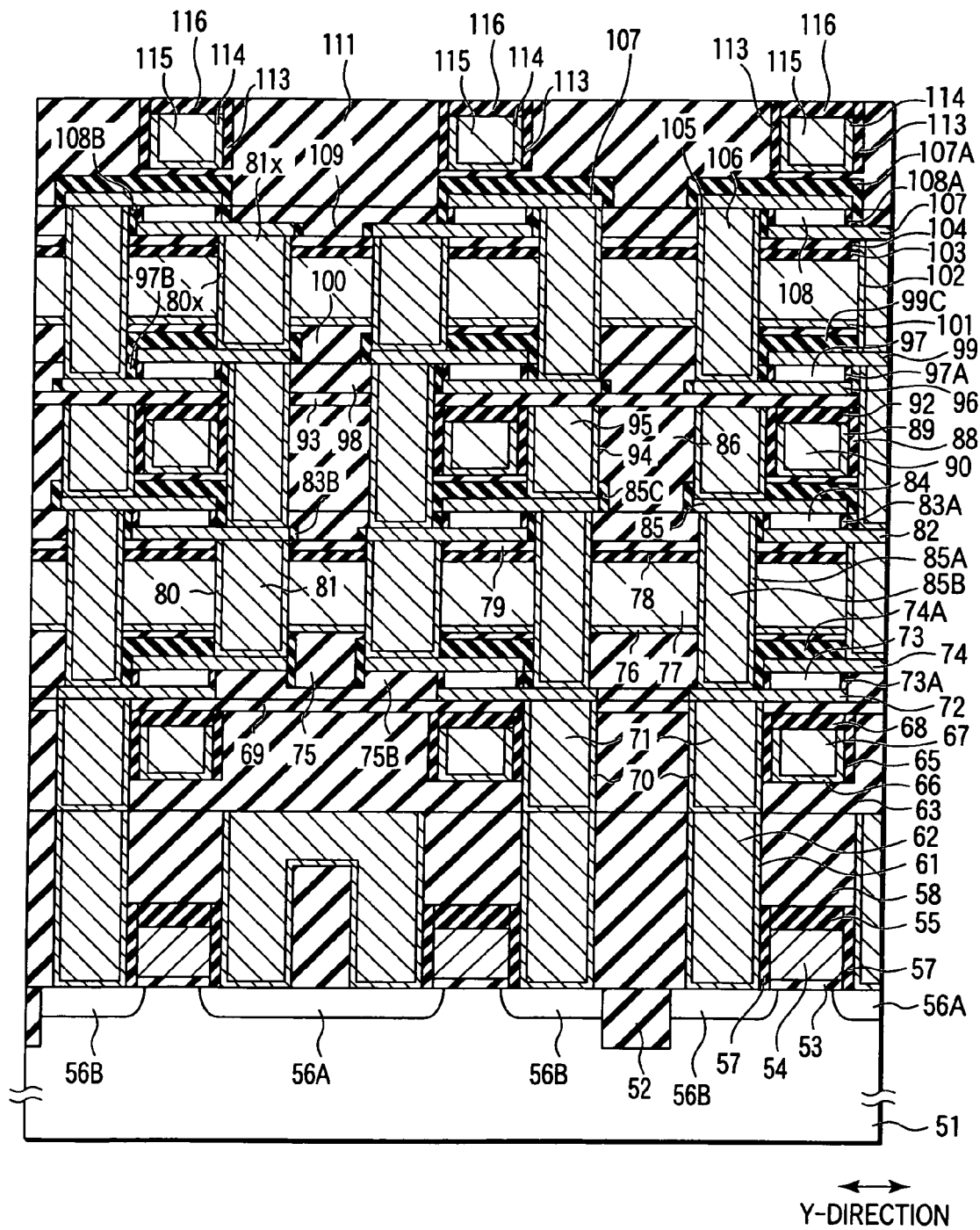
FIG. 148 is a sectional view showing one step of the manufacturing method 2 according to the present invention.

Then, as shown in FIG. 148, a wiring groove 112 extending in the X-direction is formed to the interlayer insulating film 111 by RIE with the resist pattern being used as a mask. At this moment, since the alumina layer 107A functions as an etching stopper, the bottom portion of the wiring groove 112 does not reach the metal layer 107 and the fourth MTJ element 108.

In this example, the wiring groove 112 is a groove used for forming the write word line and extends in the X-direction. A side wall spacers (for example, silicon nitride) 113 for enhancing the insulation function is formed on the side surface of the wiring groove 112.

The wiring groove 112 can be easily formed by forming a resist pattern on the interlayer insulating film 111 by, e.g., PEP and etching the interlayer insulating film 111 by RIE with this resist pattern being used as a mask. After etching, the resist pattern is removed.

The side wall spacers 113 can be easily formed by forming an insulating film (for example, silicon nitride) on the entire interlayer insulating film 111 by the CVD method and then etching the insulating film by RIE.

Step for Forming Sixth Wiring Layer

Subsequently, as shown in FIG. 148, a barrier metal layer (for example, a lamination layer of Ta and TaN) 114 is formed on each of the interlayer insulating film 111, the inner surface of the wiring groove 112 and the side wall spacers 113 by using, e.g., the sputtering method. Subsequently, a metal layer (for example, Cu) 115 which completely fills the wiring groove 112 is formed on the barrier metal layer 114 by, e.g., the sputtering method.

Then, the metal layer 115 is polished by using, for example, the CMP method, and the metal layer 115 is left only in the wiring groove 112. The metal layer 115 remaining in the wiring groove 112 becomes a sixth wiring layer which functions as the write word line.

Additionally, a cap insulator (for example, silicon nitride) 116 is formed on the interlayer insulating film 111 by the CVD method. Further, the cap insulator 116 is polished by the CMP method, and the cap insulator 116 is left only on the metal layer 115 as the sixth wiring layer.

Step for Forming Seventh Wiring Layer

Figure 149:
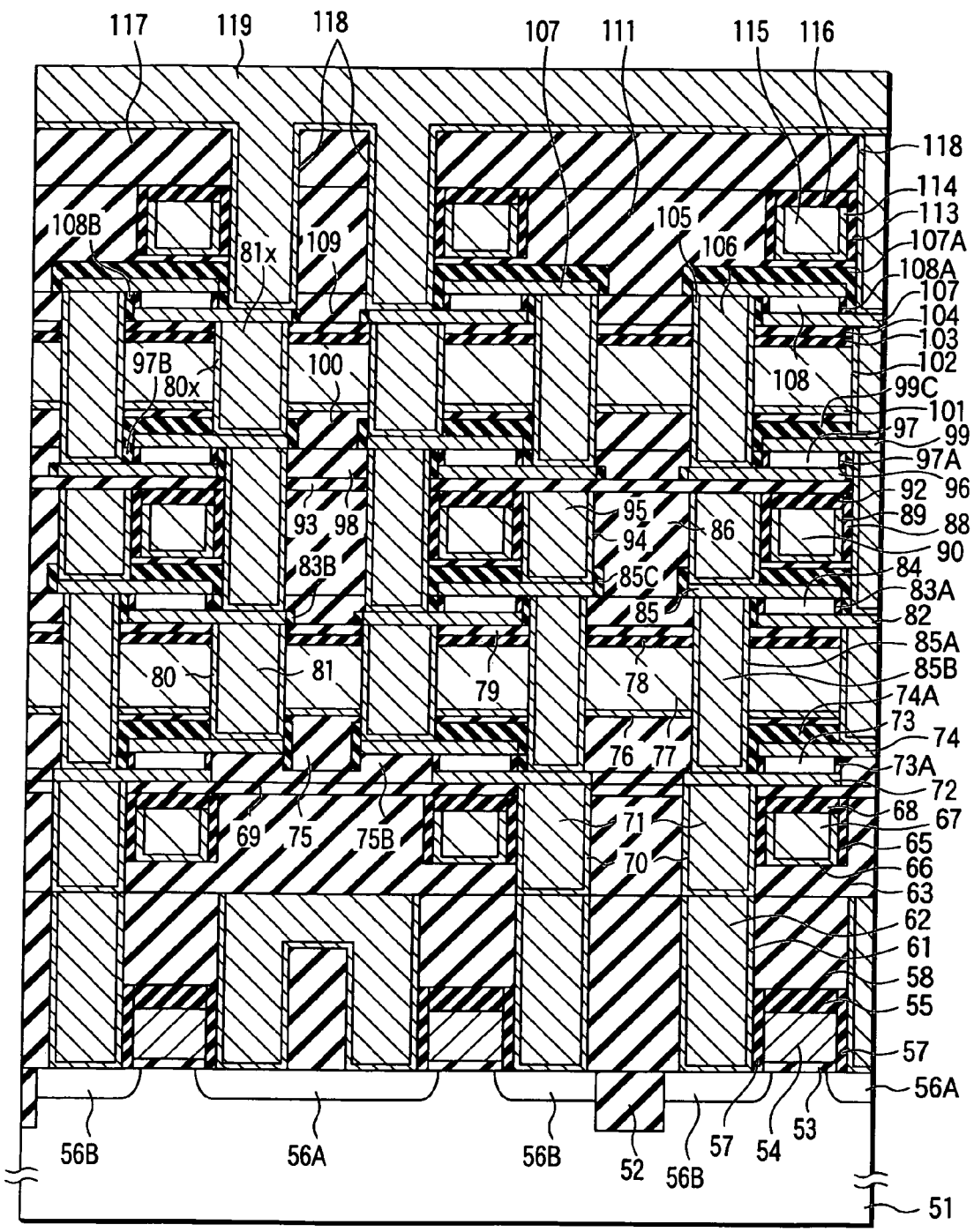
FIG. 149 is a sectional view showing one step of the manufacturing method 2 according to the present invention.

Subsequently, as shown in FIG. 149, an interlayer insulating film (for example, silicon oxide) 117 which completely covers the metal layer 115 as the sixth wiring layer is formed on the interlayer insulating film 111. A contact hole which reaches the upper electrode 110 of the fourth MTJ element is formed to the interlayer insulating films 111 and 117.

This contact hole can be easily formed by forming a resist pattern on the interlayer insulating film 117 by, e.g., PEP and etching the interlayer insulating films 111 and 117 by RIE with this resist pattern being used as a mask. After etching, the resist pattern is removed.

Further, a wiring groove for forming the read bit line is formed to the interlayer insulating film 117.

This wiring groove can be easily formed by forming a resist pattern on the interlayer cap insulator 117 and etching the interlayer insulating film 117 by RIE with this resist pattern being used as a mask. After etching, the resist pattern is removed.

Thereafter, a barrier metal layer (for example, a lamination layer of Ti and TiN) 118 is formed on each of the interlayer insulating film 117, the inner surface of the contact hole and the inner surface of the wiring groove by using, e.g., the sputtering method. Subsequently, a metal layer (for example, W) 119 which completely fills the contact hole and the wiring groove is formed on the barrier metal layer 118 by, e.g., the sputtering method.

Furthermore, the metal layer 119 and the barrier metal layer 117 are polished by, e.g., the CMP method, and the metal layer 119 and the barrier metal layer 117 are left only in the contact hole and the wiring groove. The metal layer 119 remaining in the contact hole becomes a contact plug.

Moreover, the metal layer 119 remaining in the wiring groove becomes a seventh wiring layer which functions as the read bit line.

③ Overview

According to this manufacturing method 2, it is possible to realize the cell array structure (one-transistor and N-MTJ structure) in which a plurality of the TMR elements are superposed in a plurality of stages and a plurality of these TMR elements are connected to each other in parallel between the read bit line and the ground terminal.

Incidentally, in this example, although the damascene process and the dual damascene process are adopted in order to form the wiring layer, a process for forming the wiring layer by etching may be adopted instead, for example.

(3) Manufacturing Method 3

This manufacturing method 3 is applied to the magnetic random access memory having a cell array structure (one-switch and N-MTJ structure) in which a plurality of the TMR elements constituting one block are connected to each other in parallel between the read bit line and the ground terminal.

In this cell array structure, a plurality of the TMR elements constituting one block are aligned in the horizontal direction (in this example, the Y-direction) without being superposed in the vertical direction. An advantage of this cell array structure lies in that the method for manufacturing the TMR elements is simplified.

That is, when adopting the read operation principle according to this invention, a plurality of the TMR elements in one block must have different resistant values. Here, when adopting the structure shown in FIGS. 61 to 64 as the structure of the TMR elements, a plurality of the TMR elements can be simultaneously formed at the same step in this cell array structure.

Description will be first briefly given as to the cell array structure completed by the manufacturing method according to the present invention. Then, the method for manufacturing the cell array structure will be explained.

① Cell Array Structure Concerning Manufacturing Method 3

Figure 150:
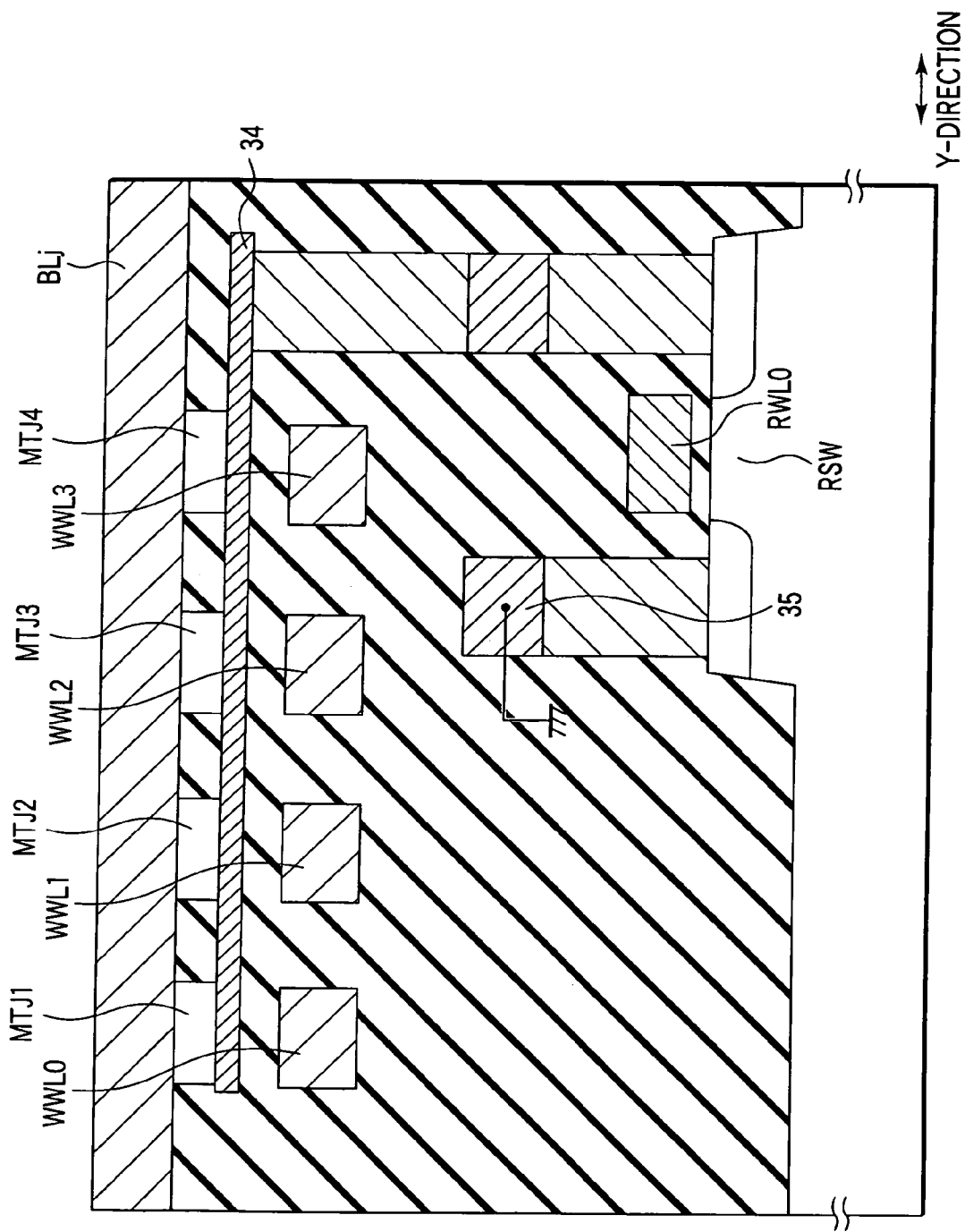
FIG. 150 is a view showing a device structure to which a manufacturing method 3 according to the present invention is applied.

FIG. 150 shows an example of the cell array structure of the magnetic random access memory in which one block is constituted by a plurality of the TMR elements connected to each other in parallel.

This cell array structure is characterized in that one read bit line BLj is arranged in one column (Y-direction) and a plurality of the TMR elements MTJ1, MTJ2, MTJ3 and MTJ4 connected to each other in parallel are arranged directly below the read bit line BLj. A plurality of the TMR elements MTJ1, MTJ2, MTJ3 and MTJ4 constitute one read block and are connected between the read bit line BLj and the ground terminal.

A read selection switch (MOS transistor) RSW is arranged in a surface area of the semiconductor substrate. A source of the read selection switch RSW is connected to the ground terminal through a source line SL. The source line SL is shared by two read blocks adjacent to each other in the column direction. The source line SL extends straightway, for example, in the X-direction (direction vertical to a page space).

A gate of the read selection switch (MOS transistor) RSW is a read word line RWLn. The read word line RWLn extends in the X-direction. Four TMR elements (MTJ (Magnetic Tunnel Junction) elements) MTJ1, MTJ2, MTJ3 and MTJ4 are arranged on the read selection switch RSW in the Y-direction.

The respective TMR elements MTJ1, MTJ2, MTJ3 and MTJ4 are arranged between a lower electrode 34 and a read bit line BLj as an upper electrode. The lower electrode 34 is connected to a drain of the read selection switch (MOS transistor) RSW.

Four write word lines WWL0, WWL1, WWL2 and WWL3 are arranged directly below the four TMR elements MTJ1, MTJ2, MTJ3 and MTJ4 in one block in accordance with these TMR elements MTJ1, MTJ2, MTJ3 and MTJ4. The respective write word lines WWL0, WWL1, WWL2 and WWL3 extend in the X-direction.

In the cell array structure in this example, the read bit line BLj functions as the write bit line in the write operation. That is, there is no wiring which is exclusively used as the write bit line. In this manner, by arranging the wiring which has both the function as the write bit line and the function as the read bit line in one column, a number of steps for processing the wiring (or a number of PEPs) is decreased, thereby obtaining the advantage of reduction in the manufacturing cost or improvement in the characteristic of the TMR elements.

② Each Step in Manufacturing Method 3

Description will now be given as to the manufacturing method for realizing the cell array structure shown in FIG. 150. Here, since the embodied manufacturing method (for example, adoption of the dual damascene process) will be explained, attention should be paid to the point that elements which do not exist in the cell array structure shown in FIG. 150 will be also described. However, the outline of the finally completed cell array structure is substantially equal to the cell array structure illustrated in FIG. 150.

Element Separation Step

As shown in FIG. 151, the STI (Sallow Trench Isolation) structure 52 which is the shallow trenches are filled by filed oxide for isolating active areas is first formed in the semiconductor substrate 51.

The STI structure 52 can be formed by the following process, for example.

A mask pattern (for example, silicon nitride) is formed on the semiconductor substrate 51 by PEP (Photo Engraving Process). The semiconductor substrate 51 is etched by using RIE (Reactive Ion Etching) with this mask pattern being used as a mask, and a trench is formed on the semiconductor substrate 51. These trenches are filled by insulating films (for example, silicon oxide) by using, e.g., the CVD (Chemical Vapor Deposition) method and the CMP (Chemical Mechanical Polishing) method.

Thereafter, P type impurities (for example, B or $BF_2$) or N type impurities (for example, P or As) are injected into the semiconductor substrate by, e.g., the ion implantation method, and a P type well region or an N type well region is formed.

Step for Forming MOSFET

Subsequently, as shown in FIG. 152, a MOS transistor which functions as a read selection switch is formed in the surface area of the semiconductor substrate 51.

The MOS transistor can be formed by the following process, for example.

Impurities used for controlling a threshold value of the MOS transistor are ion-implanted in necessitate channel portions in active areas surrounding by field oxides 52. A gate insulating film (for example, silicon oxide) 53 is formed in the active regions by the thermal oxidation method. A gate electrode material (for example, poly-silicon including impurities) and a cap insulating film (for example, silicon nitride) 55 are formed on the gate insulating film 53 by the CVD method.

After patterning the cap insulating film 55 by PEP, the gate electrode material and the gate insulating film 53 are processed (etched) by RIE with the cap insulating film 55 being used as a mask. As a result, a gate electrode 54 extending in the X-direction is formed on the semiconductor substrate 51.

The P type impurities or the N type impurities are injected into the semiconductor substrate 51 by using the ion implantation method with the cap insulating film 55 and the gate electrode 54 being used as a mask. Then, low concentration impurity regions (LDD regions or extension regions) are formed in the semiconductor substrate.

After forming the insulating film (for example, silicon nitride) on the entire semiconductor substrate 51 by the CVD method, the insulating film is etched by RIE, and a side wall spacers 57 is formed on the side walls of the gate electrode 54 and the cap insulating film 55. The P type impurities or the N type impurities are injected into the semiconductor substrate 51 by using the ion implantation method with the cap insulating film 55, the gate electrode 54 and the side wall spacers 57 being used as a mask. As a result, a source region 56A and a drain region 56B are formed in the semiconductor substrate 51.

Thereafter, an interlayer insulating film (for example, silicon oxide) 58 which completely covers the MOS transistor is formed on the entire semiconductor substrate 51 by the CVD method. Further, the surface of the interlayer insulating film 58 is made flat by utilizing the CMP technique.

Step for Forming Contact Hole

Then, as shown in FIG. 153, a contact hole 59 which reaches the source region 56A and the drain region 56B of the MOS transistor is formed to the interlayer insulating film 58 on the semiconductor substrate 51.

The contact hole 59 can be readily formed by forming a resist pattern on the interlayer insulating film 58 by, e.g., PEP and etching the interlayer insulating film 58 by RIE with this resist pattern being used as a mask. After etching, the resist pattern is removed.

Step for Forming Contact Plug

Subsequently, as shown in FIG. 154, a barrier metal layer (for example, a lamination layer of Ti and TiN) 61 is formed on each of the interlayer insulating film 58 and the inner surface of the contact hole 59 by using, e.g., the sputtering method. Then, a metal layer (for example, W) 62 which completely fills the contact hole 59 is formed on the barrier metal layer 61 by, e.g., the sputtering method.

Figure 155:
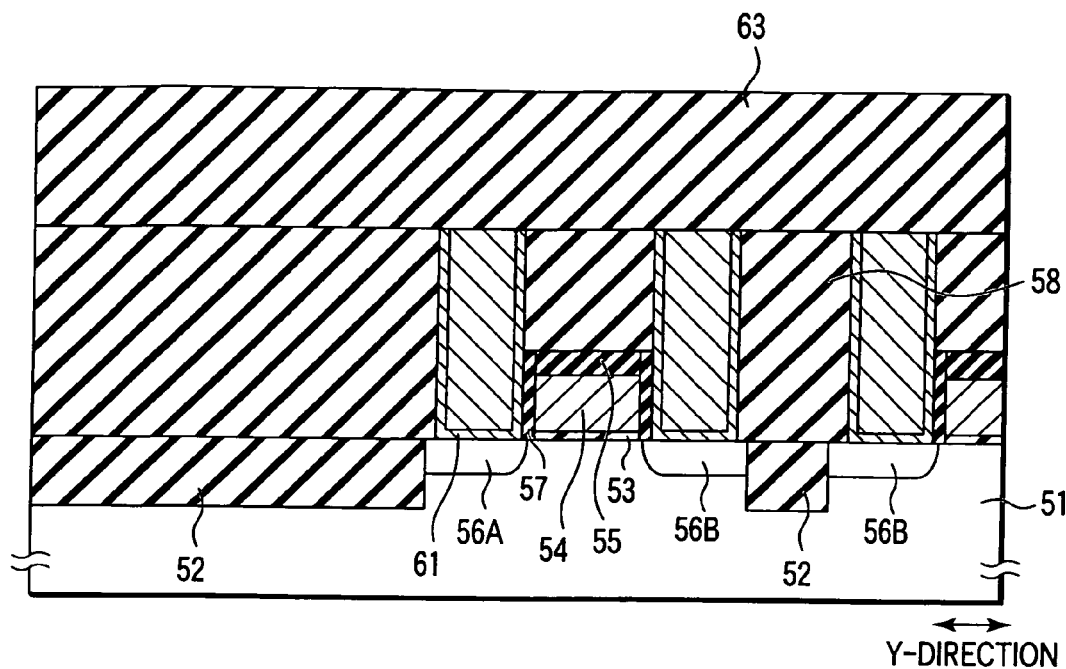
FIG. 155 is a sectional view showing one step of the manufacturing method 3 according to the present invention.

Thereafter, as shown in FIG. 155, the metal layer 62 is polished by using, e.g., the CMP method, and the metal layer 62 is left only in the contact hole 59. The metal layer 62 remaining in the contact hole 59 becomes a contact plug. Furthermore, an interlayer insulating film (for example, silicon oxide) 63 is formed on the interlayer insulating film 58 by the CVD method.

Step for Forming Wiring Groove

Figure 156:
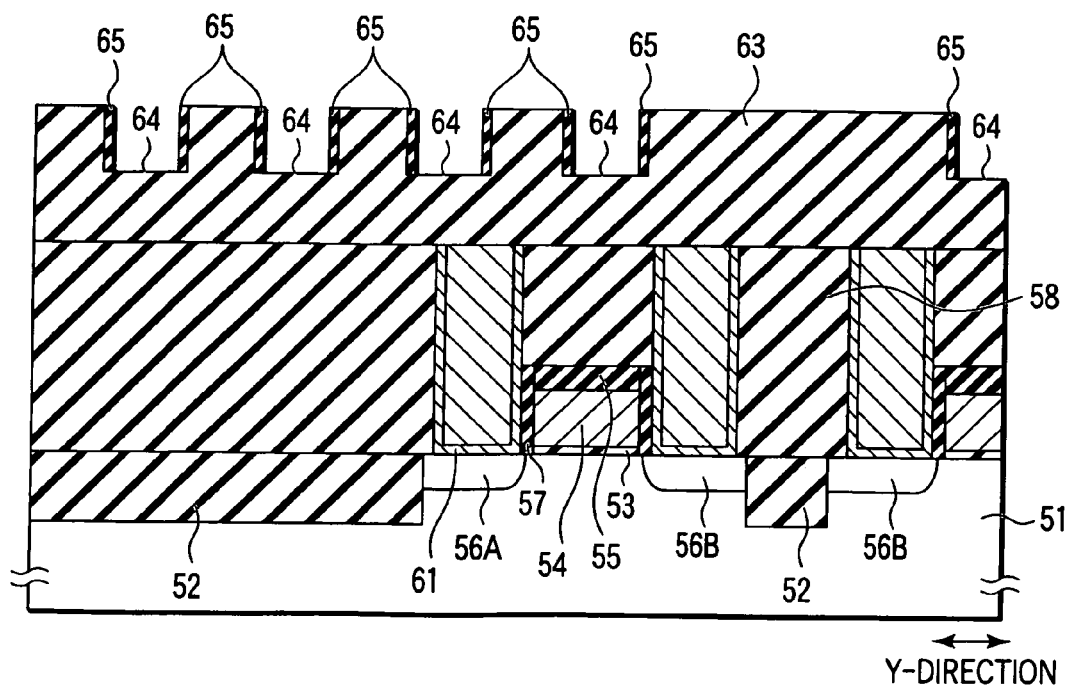
FIG. 156 is a sectional view showing one step of the manufacturing method 3 according to the present invention.

Subsequently, as shown in FIG. 156, a wiring groove 64 is formed to the interlayer insulating film 63. In this example, the wiring groove 64 is a groove used for forming the write word line and extends in the X-direction. A side wall spacers (for example, silicon nitride) 65 for enhancing the insulation function is formed on the side surface of the wiring groove 64.

The wiring groove 64 can be easily formed by forming a resist pattern on the interlayer insulating film 63 by, e.g., PEP and etching the interlayer insulating film 63 by RIE with this resist pattern being used as a mask. After etching, the resist pattern is removed.

The side wall spacers 65 can be readily formed by forming an insulating film (for example, silicon nitride) on the entire interlayer insulating film 63 by the CVD method and then etching the insulating film by RIE.

Step for Forming First Wiring Layer

Subsequently, as shown in FIG. 157, a barrier metal layer (for example, a lamination layer of Ta and TaN) 66 is formed on each of the interlayer insulating film 63, the inner surface of the wiring groove 64 and the side wall spacers 65 by using, e.g., the sputtering method. Then, a metal layer (for example, Cu) 67 which completely fills the wiring groove 64 is formed on the barrier metal layer 66 by, e.g., the sputtering method.

Then, the metal layer 67 is polished by using, e.g., the CMP method, and the metal layer 67 is left only in the wiring groove 64. The metal layer 67 remaining in the wiring groove 64 becomes a first wiring layer which functions as the write word line.

Moreover, a cap insulator (for example, silicon nitride) 68 is formed on the interlayer insulating film 63 by the CVD method. If needed, the cap insulator 68 is polished, and the cap insulator 68 is left only on the metal layer 67 as the first wiring layer. Additionally, an interlayer insulating film (for example, silicon oxide) 69 which completely covers the metal layer 67 as the first wiring layer is formed on the interlayer insulating film 63.

Step for Forming Lower Electrode of MTJ Element

Subsequently, as shown in FIG. 158, a contact hole which reaches the metal layer 62 as the contact plug is formed to the interlayer insulating film 69.

This contact hole can be easily formed by forming a resist pattern on the interlayer insulting film 69 by, e.g., PEP and etching the interlayer insulating films 63 and 69 by RIE with this resist pattern being used as a mask. After etching, the resist pattern is removed.

Further, a barrier metal layer (for example, a lamination layer of Ti and TiN) 70 is formed on the inner surface of the contact hole by using, e.g., the sputtering method. Subsequently, a metal layer (for example, W) 71 which completely fills the contact hole is formed on the barrier metal layer 70 by, e.g., the sputtering method.

Thereafter, the metal layer 71 is polished by using, e.g., the CMP method, and the metal layer 71 is left only in the contact hole. The metal layer 71 remaining in the contact hole becomes a contact plug. Furthermore, a metal layer (for example, Ta) 72 which becomes a lower electrode of the MTJ element is formed on the interlayer insulating film 69 by the sputtering method.

Step for Forming MTJ Element

Subsequently, as shown in FIGS. 159 to 166, the MTJ elements are formed on the metal layer 72. The MTJ elements have such a structure as shown in FIGS. 61 to 64 and are simultaneously formed by the same process.

Figure 159:
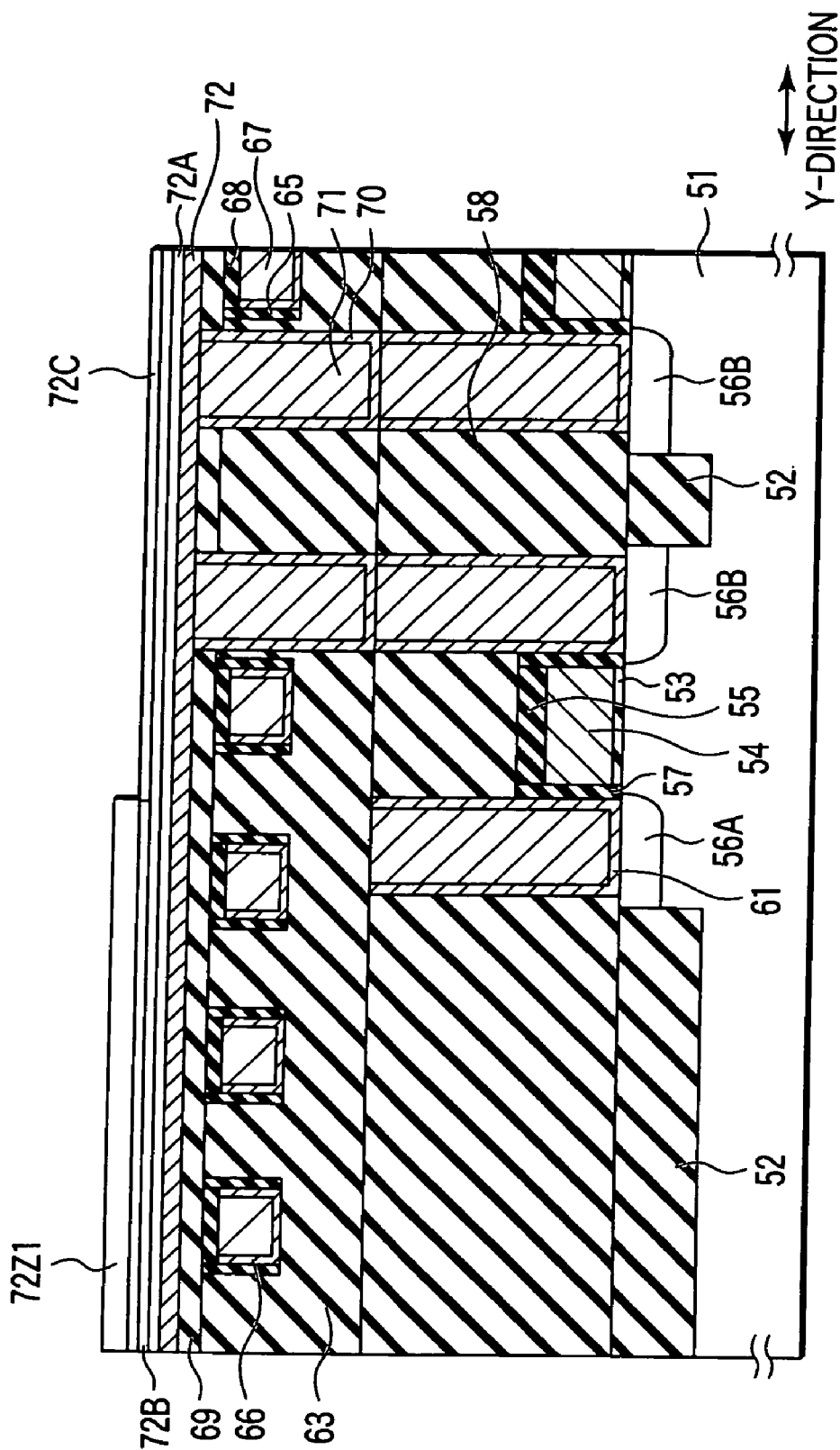
FIG. 159 is a sectional view showing one step of the manufacturing method 3 according to the present invention.

As shown in FIG. 159, an anti-ferromagnetic layer 72A, a ferromagnetic layer 72B and a non-magnetic metal layer (for example, aluminium) 72C are sequentially formed on the metal layer 72. Then, a silicon nitride layer 72Z1 is formed on the non-magnetic metal layer 72C.

Thereafter, a resist pattern is formed by PEP, and the silicon nitride layer 72Z1 is patterned by RIE with this resist pattern being used as a mask. As a result, a mask consisting of the silicon nitride layer 72Z1 is formed.

Furthermore, oxidation of the non-magnetic metal layer 72C is performed with the silicon nitride layer 72Z1 being used as a mask. The non-magnetic metal layer 72C which is not covered with the silicon nitride layer 72Z1 is oxidized, and a tunneling barrier layer 72C1 is consequently selectively formed as shown in FIG. 160.

On the other hand, since the non-magnetic metal layer 72C covered with the silicon nitride layer 72Z1 is not oxidized, the non-magnetic metal layer 72C2 remains as it is as shown in FIG. 160. Thereafter, the silicon nitride layer 72Z1 is eliminated.

Subsequently, as shown in FIG. 160, a ferromagnetic layer 72D is formed on the tunneling barrier layer 72C1 and the non-magnetic metal layer 72C2. Moreover, an anti-ferromagnetic layer 72E, a ferromagnetic layer 72F and a non-magnetic metal layer (for example, aluminium) 72G are sequentially formed on the anti-ferromagnetic layer 72D. Then, a silicon nitride layer 72Z2 is formed on the non-magnetic metal layer 72G.

Thereafter, a resist patter is formed by PEP, and the silicon nitride layer 72Z2 is patterned by RIE with this resist pattern being used as a mask. As a result, a mask consisting of the silicon nitride layer 72Z2 is formed.

In addition, oxidation of a non-magnetic metal layer 72G is performed with the silicon nitride layer 72Z2 being used as a mask. The non-magnetic metal layer 72G which is not covered with the silicon nitride layer 72Z2 is oxidized, and a tunneling barrier 72G1 is consequently selectively formed as shown in FIG. 161.

Figure 161:
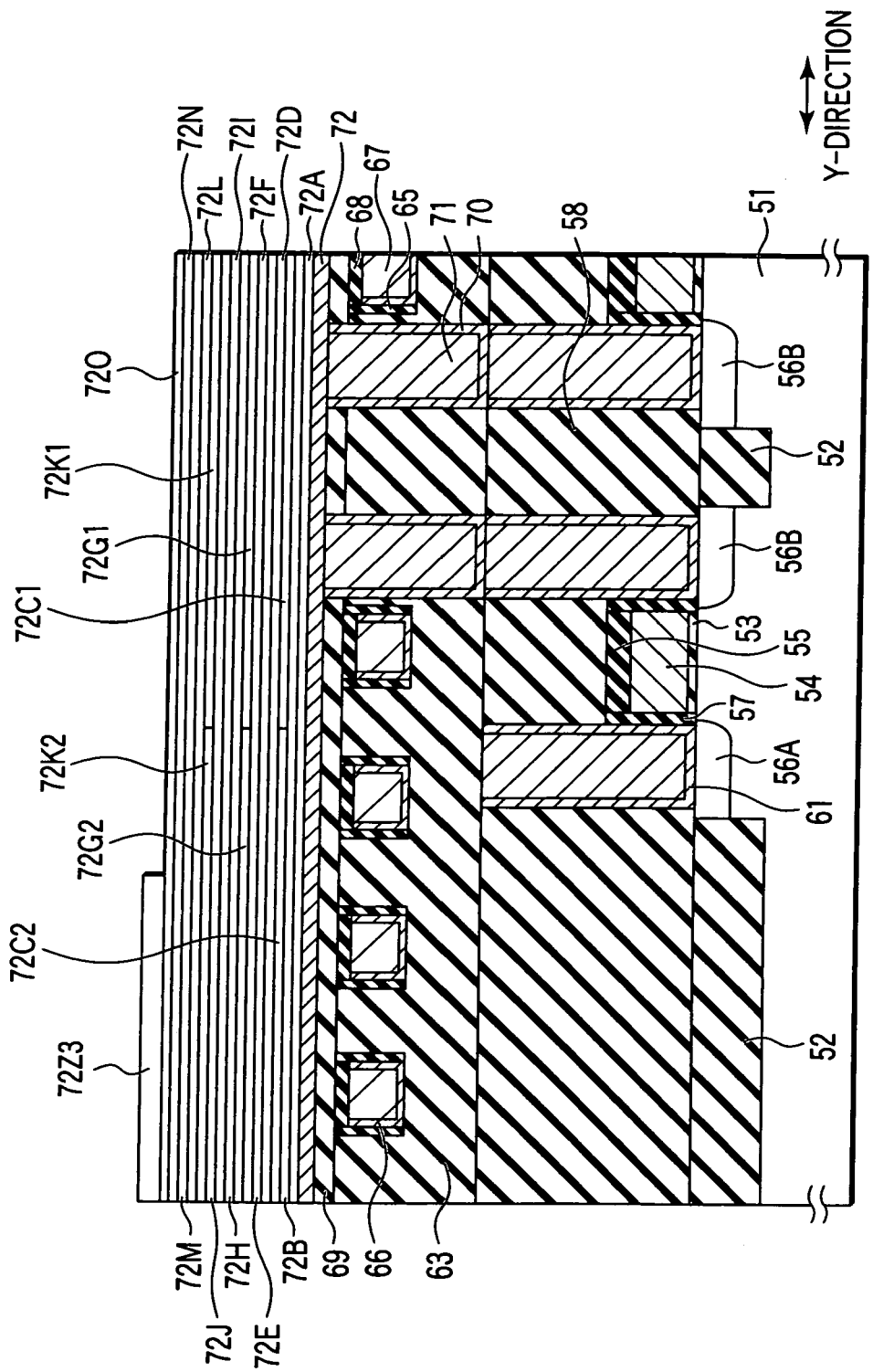
FIG. 161 is a sectional view showing one step of the manufacturing method 3 according to the present invention.

On the other hand, since the non-magnetic metal layer 72G covered with the silicon nitride layer 72Z2 is not oxidized, the non-magnetic metal layer 72G2 remains as it is as shown in FIG. 161. Thereafter, the silicon nitride layer 72Z2 is eliminated.

Then, as shown in FIG. 161, a ferromagnetic layer 72H is formed on the tunneling barrier layer 72G1 and the non-magnetic layer 72G2. Additionally, an anti-ferromagnetic layer 72I, a ferromagnetic layer 72J and a non-magnetic metal layer (for example, aluminium) are sequentially formed on the ferromagnetic layer 72H.

As similar to selectively oxidizing the non-magnetic metal layers 72C and 72E, oxidation of the non-magnetic metal layer is selectively carried out with a pattern of the silicon nitride layer being used as a mask. As a result, as shown in the drawing, a tunneling barrier layer 72K1 is selectively formed. A part covered with the silicon nitride layer remains as the non-magnetic metal layer 7K2. Thereafter, the silicon nitride layer is eliminated.

Further, a ferromagnetic layer 72L is formed on the tunneling barrier layer 72K1 and the non-magnetic metal layer 72K2. Furthermore, an anti-ferromagnetic layer 72M, a ferromagnetic layer 72N and a non-magnetic metal layer (for example, aluminium) 72O are sequentially formed on the ferromagnetic layer 72L. Subsequently, a silicon nitride layer 72Z3 is formed on the non-magnetic metal layer 72O.

Thereafter, a resist pattern is formed by PEP, and the silicon nitride layer 72Z3 is patterned by RIE with this resist pattern being used as a mask. As a result, a mask consisting of the silicon nitride layer 72Z3 is formed.

Furthermore, oxidation of the non-magnetic metal layer 72O is performed with the silicon nitride layer 72Z3 being used as a mask. The non-magnetic metal layer 72O which is not covered with the silicon nitride layer 72Z3 is oxidized, and a tunneling barrier layer 72O1 is consequently selectively formed as shown in FIG. 162.

Figure 162:
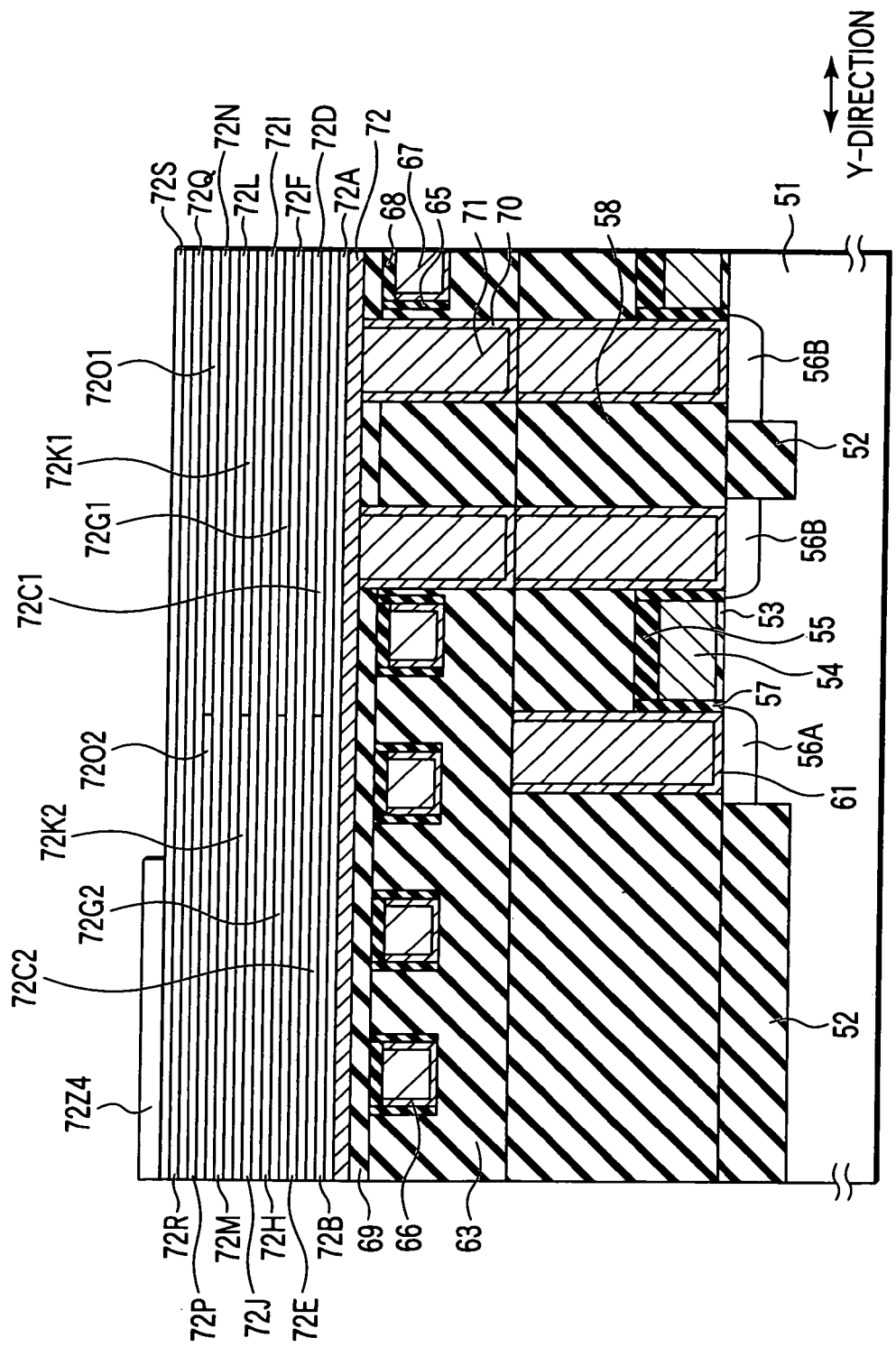
FIG. 162 is a sectional view showing one step of the manufacturing method 3 according to the present invention.

On the other hand, since the non-magnetic metal layer 72O covered with the silicon nitride layer 72Z3 is not oxidized, the non-magnetic metal layer 72O2 remains as it is as shown in FIG. 162. Thereafter, the silicon nitride layer 72Z3 is eliminated.

Subsequently, as shown in FIG. 162, a ferromagnetic layer 72P is formed on the tunneling barrier layer 72O1 and the non-magnetic metal layer 72O2. Moreover, an anti-ferromagnetic layer 72Q, a ferromagnetic layer 72R and a non-magnetic metal layer (for example, aluminium) 72S are sequentially formed on the ferromagnetic layer 72P. Then, a silicon nitride layer 72Z4 is formed on the non-magnetic metal layer 72S.

Thereafter, a resist pattern is formed by PEP, and the silicon nitride layer 72Z4 is patterned by RIE with this resist pattern being used as a mask. As a result, a mask consisting of the silicon nitride layer 72Z4 is formed.

Moreover, oxidation of the non-magnetic metal layer 72S is performed with the silicon nitride layer 72Z4 being used as a mask. The non-magnetic metal layer 72S which is not covered with the silicon nitride layer 72Z4 is oxidized, and a tunneling barrier layer 72S1 is consequently selectively formed as shown in FIG. 163.

Figure 163:
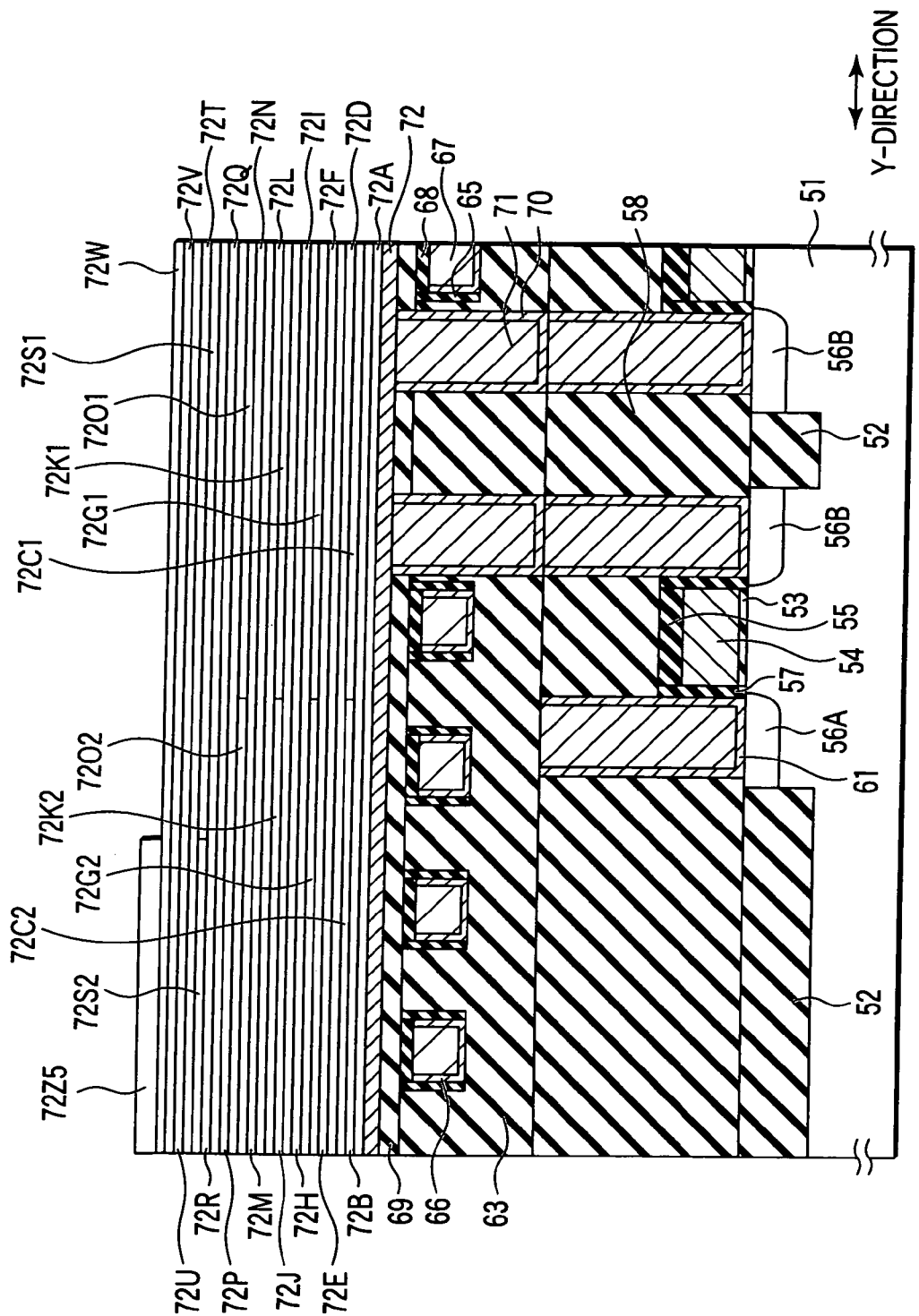
FIG. 163 is a sectional view showing one step of the manufacturing method 3 according to the present invention.

On the other hand, since the non-magnetic metal layer 72S covered with the silicon nitride layer 72Z4 is not oxidized, the non-magnetic metal layer 72S remains as it is as shown in FIG. 163.

Subsequently, as shown in FIG. 163, a ferromagnetic layer 72T is formed on the tunneling barrier layer 72S1 and the non-magnetic metal layer 72S2. Further, an anti-ferromagnetic layer 72U, a ferromagnetic layer 72B and a non-magnetic metal layer (for example, aluminium) 72W are sequentially formed on the ferromagnetic layer 72T. Then, a silicon nitride layer 72Z5 is formed on the non-magnetic metal layer 72W.

Thereafter, a resist pattern is formed by PEP, and the silicon nitride layer 72Z5 is patterned by RIE with this resist pattern being used as a mask. As a result, a mask consisting of the silicon nitride layer 72Z5 is formed.

Furthermore, oxidization of the non-magnetic metal layer 72W is carried out with the silicon nitride layer 72Z5 being used as a mask. The non-magnetic metal layer 72W which is not covered with the silicon nitride layer 72Z5 is oxidized, and a tunneling barrier layer 72W1 is consequently selectively formed as shown in FIG. 164.

Figure 164:
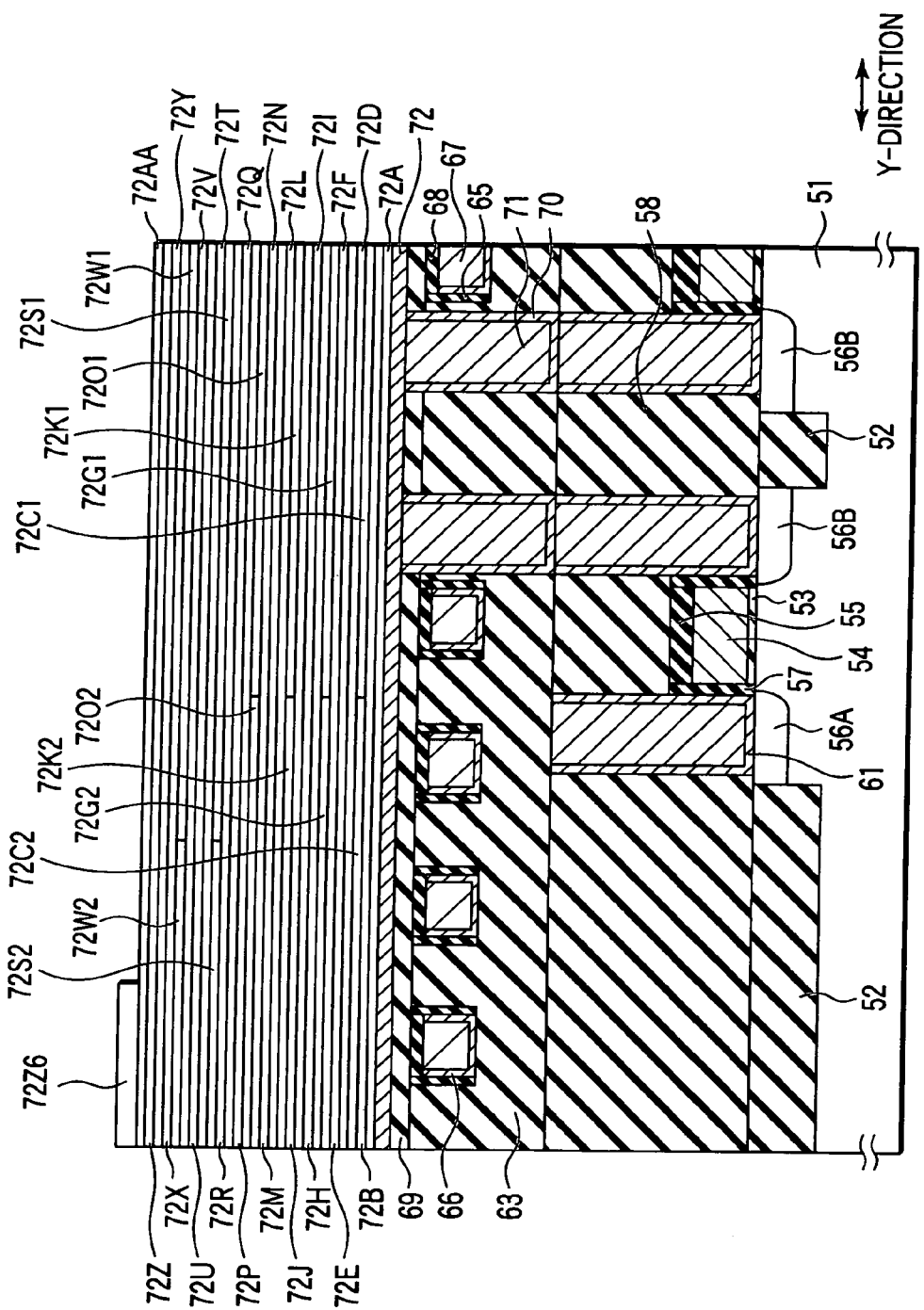
FIG. 164 is a sectional view showing one step of the manufacturing method 3 according to the present invention.

On the other hand, since the non-magnetic metal layer 72W covered with the silicon nitride layer 72Z5 is not oxidized, the non-magnetic metal layer 72W2 remains as it is as shown in FIG. 164. Thereafter, the silicon nitride layer 72Z5 is eliminated.

Subsequently, as shown in FIG. 164, a ferromagnetic layer 72X is formed on the tunneling barrier layer 72W1 and the non-magnetic metal layer 72W2. In addition, an anti-ferromagnetic layer 72Y, a ferromagnetic layer 72Z and a non-magnetic metal layer (for example, aluminium) 72AA are sequentially formed on the ferromagnetic layer 72X. Then, a silicon nitride layer 72Z6 is formed on the non-magnetic metal layer 72AA.

Thereafter, a resist pattern is formed by PEP, and the silicon nitride layer 72Z6 is patterned by RIE with this resist pattern being used as a mask. As a result, a mask consisting of the silicon nitride layer 72Z6 is formed.

Additionally, oxidation of the non-magnetic metal layer 72AA is performed with the silicon nitride layer 72Z6 being used as a mask. The non-magnetic metal layer 72AA which is not covered with the silicon nitride layer 72Z6 is oxidized, and a tunneling barrier layer 72AA1 is consequently selectively formed as shown in FIG. 165.

Figure 165:
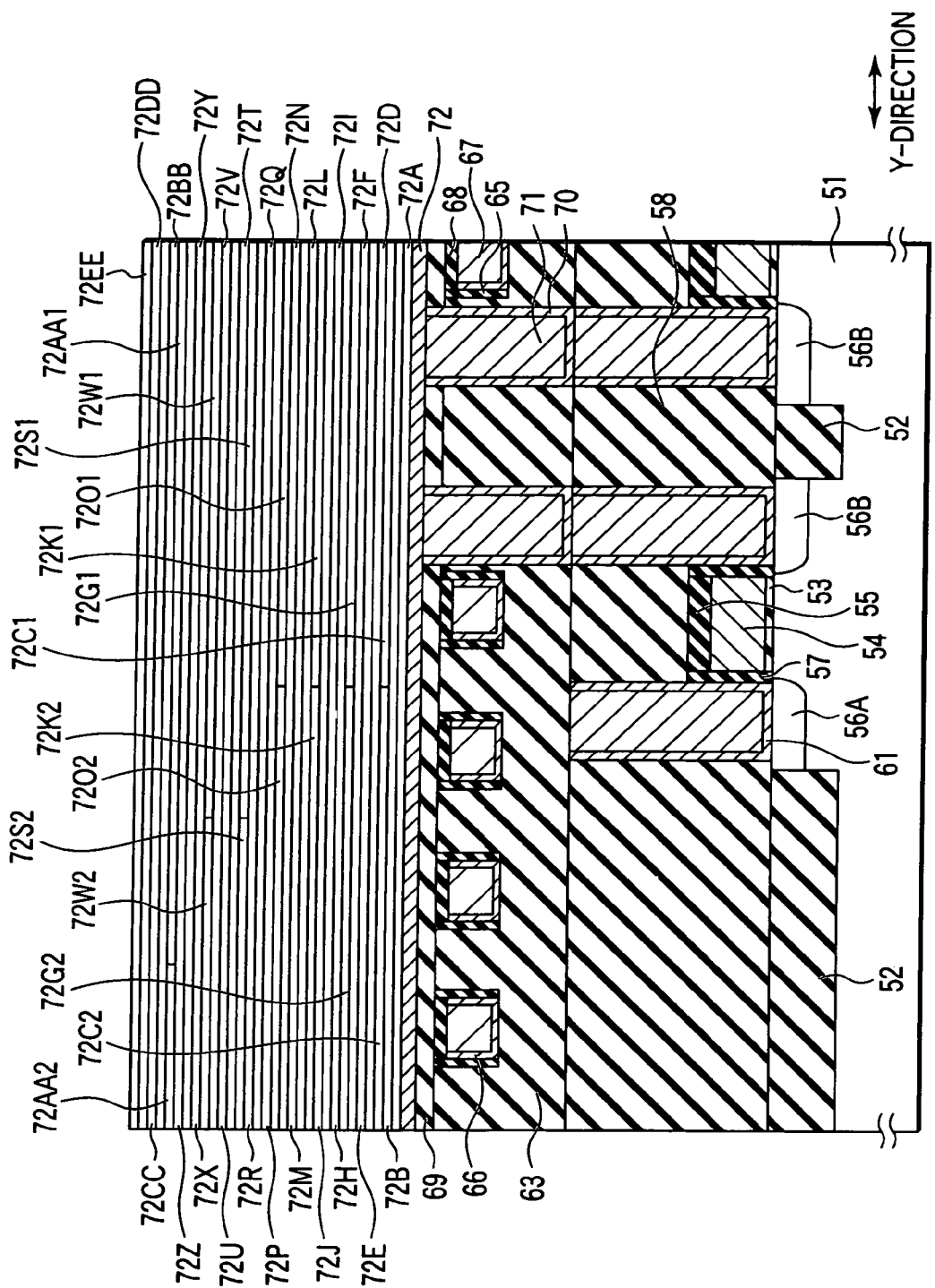
FIG. 165 is a sectional view showing one step of the manufacturing method 3 according to the present invention.

On the other hand, since the non-magnetic metal layer 72AA which is covered with the silicon nitride layer 72Z6 is not oxidized, the non-magnetic metal layer 72AA2 remains as it is as shown in FIG. 165. Thereafter, the silicon nitride layer 72Z6 is eliminated.

Subsequently, as shown in FIG. 165, a ferromagnetic layer 72BB is formed on the tunneling barrier layer 72AA1 and the non-magnetic metal layer 72AA2. Further, an anti-ferromagnetic layer 72CC, a ferromagnetic layer 72DD and a non-magnetic metal layer (for example, aluminium) 72EE are sequentially formed on the ferromagnetic layer 72BB. Subsequently, a silicon nitride layer is formed on the non-magnetic metal layer 72EE.

Thereafter, a resist pattern is formed by PEP, and the silicon nitride layer is patterned by RIE with this resist pattern being used as a mask. As a result, a mask consisting of the silicon nitride layer is formed.

Incidentally, since all the non-magnetic metal layers 72EE in one block are oxidized at this step, the silicon nitride layer is not illustrated. Furthermore, when all the non-magnetic metal layers 72EE on a wafer (or a chip region) can be oxidized, a step for forming the silicon nitride layer can be omitted.

Oxidation of the non-magnetic metal layer 72EE is carried out with the silicon nitride layer being used as a mask. The non-magnetic metal layer 72EE which is not covered with the silicon nitride layer is oxidized, and a tunneling barrier layer 72EE1 is consequently selectively formed as shown in FIG. 166.

Figure 166:
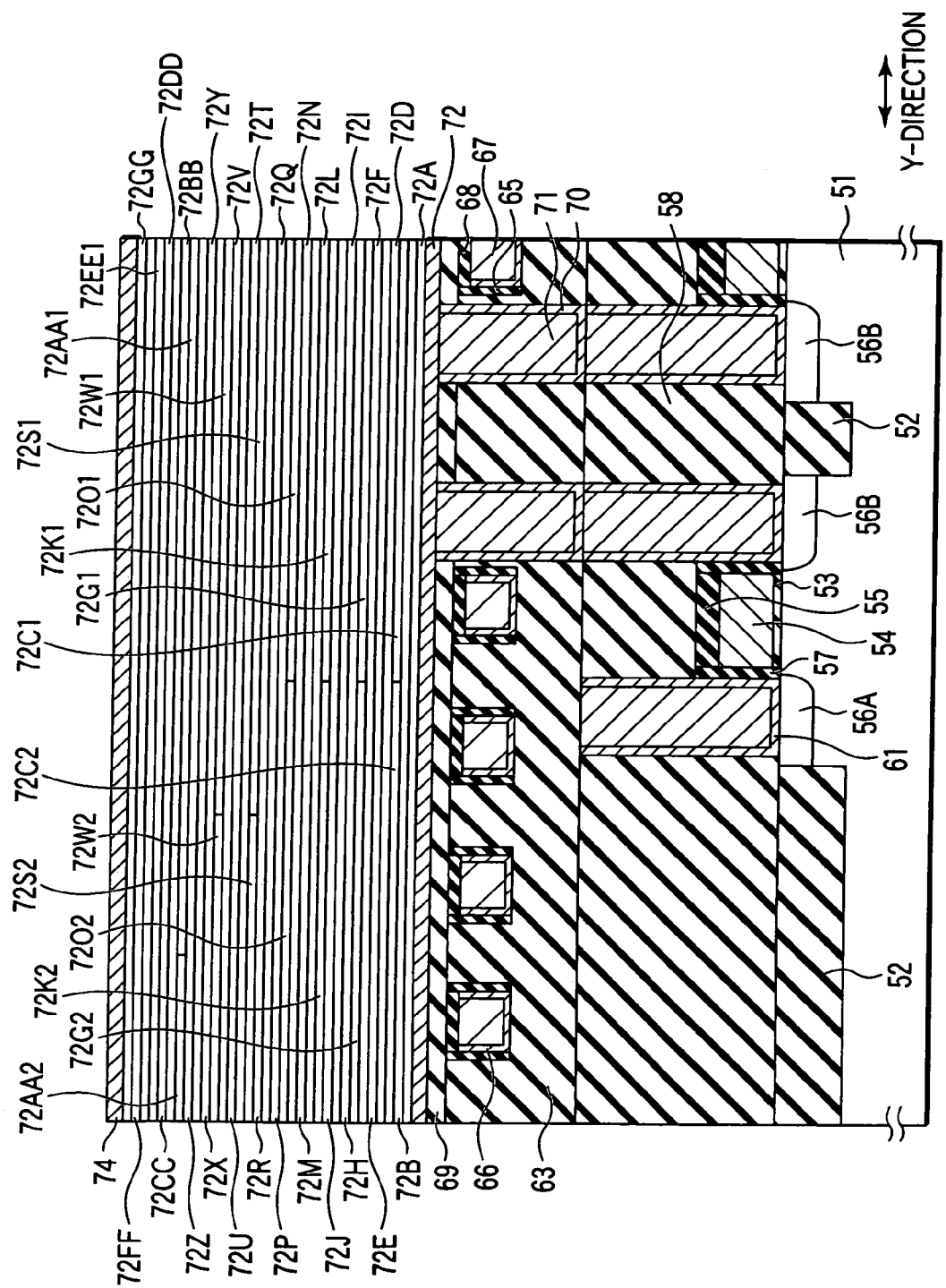
FIG. 166 is a sectional view showing one step of the manufacturing method 3 according to the present invention.

Subsequently, as shown in FIG. 166, a ferromagnetic layer 72FF is formed on the tunneling barrier layer 72EE1. Moreover, an anti-ferromagnetic layer 72GG is formed on the ferromagnetic layer 72FF. Then, a metal layer (for example, Ta) 74 which becomes an upper electrode of the MTJ element is formed on the anti-ferromagnetic layer 72GG.

Step for Patterning MTJ Element

Figure 167:
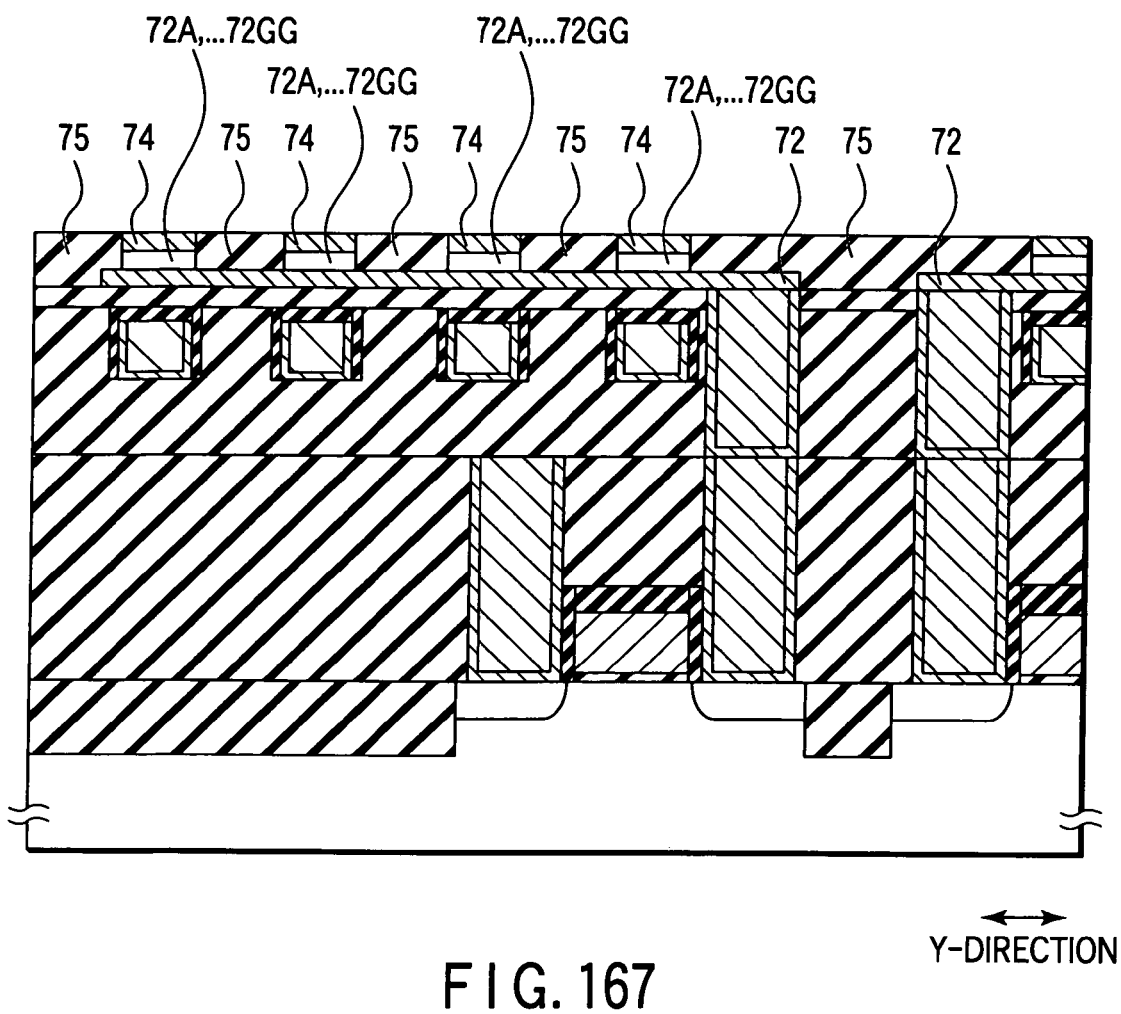
FIG. 167 is a sectional view showing one step of the manufacturing method 3 according to the present invention.

Subsequently, as shown in FIG. 167, patterning of the MTJ element and patterning of the lower electrode 72 and the upper electrode 74 thereof are effected. It is to be noted that the structure of the MTJ elements 72A, . . . 72GG is simplified in the drawing in order to simplify the figure.

The MTJ element and the upper electrode 74 thereof can be easily patterned by forming a resist pattern on the upper electrode 74 by PEP and then etching the MTJ element and the upper electrode 74 thereof by RIE with this resist pattern being used as a mask. Thereafter, the resist pattern is removed.

Moreover, after forming the cap insulator, this cap insulator is etched by RIE, and a protection layer which protects the MTJ element is formed on the side wall portion of the MTJ element.

Thereafter, the lower electrode 72 of the MTJ element is patterned. The lower electrode 72 of the MTJ element can be easily patterned by forming a resist pattern on the lower electrode 72 by PEP and then etching the lower electrode 72 by RIE with this resist pattern being used as a mask. Thereafter, the resist pattern is removed.

In addition, an interlayer insulating film 75 which completely covers the MTJ element, and the lower electrode 72 and the upper electrode 74 thereof is formed by using the CVD method. The surface of the interlayer insulating film 75 is made flat by the CMP method, and the upper electrode 74 of the MTJ element is exposed.

Step for Forming Wiring Groove

Figure 168:
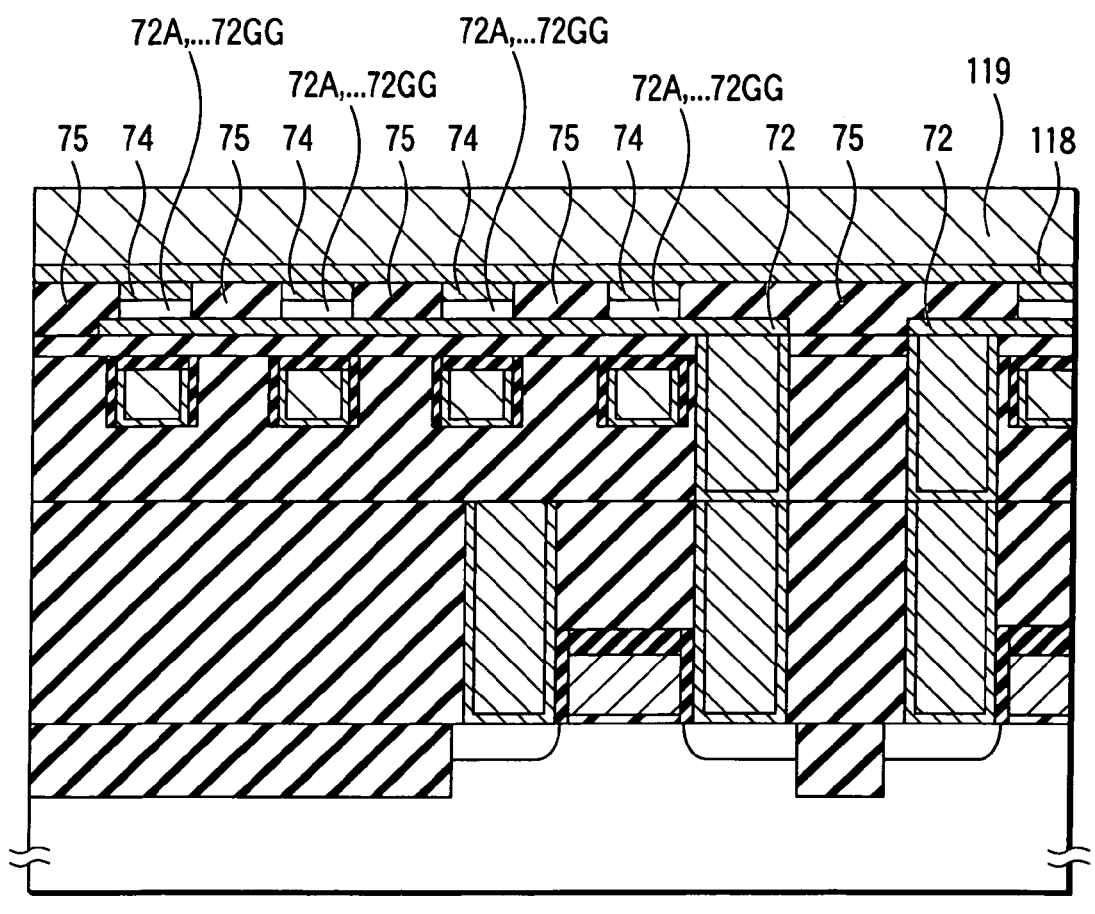
FIG. 168 is a sectional view showing one step of the manufacturing method 3 according to the present invention.

Then, as shown in FIG. 168, an interlayer insulating film is formed, and a wiring groove which extends in the Y-direction is formed to this interlayer insulating film. Incidentally, since the wiring groove extends in the Y-direction, the interlayer insulating film having the wiring groove is not illustrated in this drawing.

This wiring groove is a groove used for forming a wiring functioning as the read bit line and the write bit line, and a side wall spacers (for example, silicon nitride) for enhancing the insulation function is formed on the side surfaces of the wiring groove.

The wiring groove can be easily formed by forming a resist pattern on the interlayer insulating film by, e.g., PEP and etching the interlayer insulating film by RIE with this resist pattern being used as a mask. After etching, the resist pattern is removed.

The side wall spacers can be easily formed by forming an insulating film (for example, silicon nitride) on the entire interlayer insulating film by the CVD method and then etching the insulating film by RIE.

Step for Forming Second Wiring Layer

Subsequently, as shown in FIG. 168, a barrier metal layer (for example, a lamination layer of Ti and TiN) 118 is formed on each of the interlayer insulating film and the inner surface of the wiring groove by using, e.g., the sputtering method. Then, a metal layer (for example, W) 119 which completely fills the wiring groove is formed on the barrier metal layer 118 by, e.g., the sputtering method.

Additionally, the metal layer 119 and the barrier metal layer 117 are polished by, e.g., the CMP method, and the metal layer 119 and the barrier metal layer 117 are left only in the wiring groove. The metal layer 119 remaining in the wiring groove becomes a second wiring layer which functions as the read bit line and the write bit line.

③ Overview

According to this manufacturing method 3, it is possible to realize the cell array structure (one-switch and N-MTJ structure) in which a plurality of the TMR elements are connected to each other in parallel between the read bit line and the ground terminal.

Incidentally, although the damascene process and the dual damascene process are adopted in order to form the wiring layer in this example, a process which forms the wiring layer by etching may be adopted instead.

7. Others

Although it is presumed that the TMR element is used as the memory cell of the magnetic random access memory in the above description, the present invention, namely, various kinds of cell array structures, read operation principles, and concrete examples of the read circuit can be applied even if the memory cell is a GMR (Giant Magnet Resistance) element.

Further, the structure of the TMR element or the GMR element or materials constituting these elements are not restricted in particular when applying the present invention.

Although description has been given as to the MOS transistor, the bipolar transistor and the diode as the read selection switch of the magnetic random access memory, any other switch element, for example, an MIS (Metal Insulator Semiconductor) transistor (including MOSFET), an MES (Metal Semiconductor) transistor and a junction transistor can be used as the read selection switch.

As described above, according to the present invention, it is possible to provide the magnetic random access memory having the new cell array structure suitable for increase in the memory capacity, and the manufacturing method thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory, comprising:
   memory cells which are connected in series and use a magneto resistive effect, wherein resistance values of the memory cells are different from each other when magnetizing states of the memory cells are the same;
   a bit line which is connected to one end of the memory cells and extends in a first direction; and
   a read circuit connected to the bit line.

2. The magnetic random access memory according to claim 1,
   wherein the resistance values of the memory cells sequentially double from a resistance value of a memory cell having the smallest resistance value when the magnetizing states of the memory cells are the same.

3. The magnetic random access memory according to claim 1,
   wherein variations of the resistance values of the memory cells sequentially double from a variation of a resistance value of a memory cell having the smallest resistance value when the magnetizing states of the memory cells are the same.

4. The magnetic random access memory according to claim 1,
   wherein each of the memory cells has tunneling barriers whose number is different in accordance with the each of the memory cells.

5. The magnetic random access memory according to claim 1,
   wherein areas of the memory cells are equal to each other.

6. The magnetic random access memory according to claim 1,
   wherein each of the memory cells has MTJ layers including pinned layers, free layers and tunneling barriers, and a number of the MTJ layers is different in accordance with the each of the memory cells.

7. The magnetic random access memory according to claim 1,
   wherein each of the memory cells includes anti-ferromagnetic layers, ferromagnetic layers and tunneling barriers, and a number of the tunneling barriers is different in accordance with the each of the memory cells.

8. The magnetic random access memory according to claim 1,
   wherein each of the memory cells includes anti-ferromagnetic layers, ferromagnetic layers, non-magnetic layers and tunneling barriers, and a number of the non-magnetic layers is different in accordance with the each of the memory cells.

9. The magnetic random access memory according to claim 1,
   wherein the memory cells are superposed on a semiconductor substrate.

10. The magnetic random access memory according to claim 1,
    wherein the memory cells are arranged in a direction in parallel with a surface of a semiconductor substrate.

11. A magnetic random access memory, comprising:
    memory cells which are connected in parallel and use a magneto resistive effect, wherein resistance values of the memory cells are different from each other when magnetizing states of the memory cells are the same;

a bit line which is connected to one end of the memory cells and extends in a first direction; and a read circuit connected to the bit line.

12. The magnetic random access memory according to claim 11, wherein the resistance values of the memory cells sequentially double from a resistance value of a memory cell having the smallest resistance value when the magnetizing states of the memory cells are the same.

13. The magnetic random access memory according to claim 11, wherein variations of the resistance values of the memory cells sequentially double from a variation of a resistance value of a memory cell having the smallest resistance value when the magnetizing states of the memory cells are the same.

14. The magnetic random access memory according to claim 11, wherein each of the memory cells has tunneling barriers whose number is different in accordance with the each of the memory cells.

15. The magnetic random access memory according to claim 11, wherein areas of the memory cells are equal to each other.

16. The magnetic random access memory according to claim 11, wherein each of the memory cells has MTJ layers including pinned layers, free layers and tunneling barriers, and a number of the MTJ layers is different in accordance with the each of the memory cells.

17. The magnetic random access memory according to claim 11, wherein each of the memory cells includes anti-ferromagnetic layers, ferromagnetic layers and tunneling barriers, and a number of the tunneling barriers is different in accordance with the each of the memory cells.

18. The magnetic random access memory according to claim 11, wherein each of the memory cells includes anti-ferromagnetic layers, ferromagnetic layers, non-magnetic layers and tunneling barriers, and a number of the non-magnetic layers is different in accordance with the each of the memory cells.

19. The magnetic random access memory according to claim 11, wherein the memory cells are superposed on a semiconductor substrate.

20. The magnetic random access memory according to claim 11, wherein the memory cells are arranged in a direction in parallel with a surface of a semiconductor substrate.

* * * * *